(12) United States Patent
Kano et al.

(10) Patent No.: US 7,056,642 B2
(45) Date of Patent: *Jun. 6, 2006

(54) METHOD OF GRAFT POLYMERIZATION AND VARIETY OF MATERIALS UTILIZING THE SAME AS WELL AS PRODUCING METHOD THEREOF

(75) Inventors: Takeyoshi Kano, Shizuoka-ken (JP); Koichi Kawamura, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 97 days.

This patent is subject to a terminal disclaimer.

(21) Appl. No.: 10/662,458

(22) Filed: Sep. 16, 2003

(65) Prior Publication Data

US 2004/0067434 A1 Apr. 8, 2004

(30) Foreign Application Priority Data

| Sep. 18, 2002 | (JP) | 2002-271578 |
| Sep. 30, 2002 | (JP) | 2002-287814 |
| Sep. 30, 2002 | (JP) | 2002-287815 |
| Sep. 30, 2002 | (JP) | 2002-287816 |
| Sep. 30, 2002 | (JP) | 2002-287821 |
| Mar. 31, 2003 | (JP) | 2003-093867 |
| Mar. 31, 2003 | (JP) | 2003-094690 |
| Apr. 25, 2003 | (JP) | 2003-122061 |
| May 30, 2003 | (JP) | 2003-154551 |

(51) Int. Cl.
*G03F 7/004* (2006.01)

(52) U.S. Cl. ........... 430/271.1; 430/271.1; 430/281.1; 430/286.1; 430/302; 430/306; 430/309; 430/434; 430/494

(58) Field of Classification Search .......... 430/270.1, 430/271.1, 281.1, 286.1, 287.1, 288.1, 302, 430/306, 309, 434, 494, 944, 945

See application file for complete search history.

(56) References Cited

U.S. PATENT DOCUMENTS

| 3,188,165 A | 6/1965 | Magat et al. | |
| 3,745,042 A | 7/1973 | Lim et al. | |
| 3,892,575 A | 7/1975 | Watts et al. | |
| 4,275,092 A | 6/1981 | Nakayama et al. | |
| 4,355,053 A | 10/1982 | Nezu et al. | |
| 5,889,073 A | 3/1999 | Zhang et al. | |
| 6,306,492 B1 * | 10/2001 | Yamada et al. | 428/317.7 |
| 6,566,029 B1 | 5/2003 | Kawamura et al. | |
| 6,593,059 B1 | 7/2003 | Kawamura et al. | |
| 6,607,866 B1 * | 8/2003 | Kawamura et al. | 430/270.1 |
| 2003/0186162 A1 | 10/2003 | Takahashi et al. | |
| 2004/0209203 A1* | 10/2004 | Kano et al. | 430/324 |

FOREIGN PATENT DOCUMENTS

| DE | 1145135 | 8/1959 |
| DE | 2052397 | 10/1970 |
| EP | 0 709 228 A1 | 1/1996 |
| EP | 1088679 A2 | 4/2001 |
| EP | 1 172 696 A1 | 1/2002 |
| EP | 1 211 096 A1 | 6/2002 |
| EP | 1 302 504 A1 | 4/2003 |
| EP | 1 400 544 A1 * | 3/2004 |
| JP | 53-17407 A | 2/1978 |
| JP | 54-74102 A | 6/1979 |
| JP | 59-101651 A | 6/1984 |
| JP | 59-101657 A | 6/1984 |
| JP | 6-18706 A | 1/1994 |
| JP | 7-1849 A | 1/1995 |
| JP | 7-1853 A | 1/1995 |
| JP | 8-507727 A | 8/1996 |
| JP | 8-272087 A | 10/1996 |
| JP | 8-292558 A | 11/1996 |
| JP | 10-17688 A | 1/1998 |
| JP | 10-53658 A | 2/1998 |
| JP | 2828374 B2 | 9/1998 |
| JP | 11-43614 A | 2/1999 |
| JP | 11-84658 A | 3/1999 |
| JP | 11-119413 A | 4/1999 |
| JP | 2938397 B2 | 6/1999 |
| JP | 2000-80189 A | 3/2000 |
| JP | 2000-247799 A | 9/2000 |
| JP | 2001-166491 A | 6/2001 |
| JP | 2002-273209 A | 9/2002 |
| JP | 2002-283530 A | 10/2002 |
| JP | 2002-324966 A | 11/2002 |

OTHER PUBLICATIONS

"Langmuir, vol. 15" by Takehisa Matsuda, et al., 1999, pp. 5560-5566.

E. Kim, Y. Xia, G.M. Whitesides, "Advanced Materials", vol. 8, WileyInterscience, 1996, pp. 245-247.

Hiroo Iwata, "Surface Graft Reaction on Separation Membrance and Dynamic Function of Grafted Chains", Surface, vol. 32, No. 3 (1994) pp. 28-34 published by Koushinsha.

Martin S. Kunz, et al., "Colloidal Gold Dispersions in Polymeric Matrices", Journal of Colloid and Interface Science 156, pp. 240-249 (1993) published by Academic Press, Inc.

* cited by examiner

Primary Examiner—Barbara L. Gilliam
(74) Attorney, Agent, or Firm—Sughrue Mion, PLLC

(57) ABSTRACT

A method of graft polymerization which includes a step of forming a polymerization initiating layer in which a polymer having, on a side chain thereof, a crosslinking group and a functional group having polymerization initiating capability is immobilized on a support by a crosslinking reaction, and a step of conatacting a compound having a polymerizable functional group with the polymerization initiating layer, and then bonding the compound to the polymerization initiating layer supplying energy thereto, as well as a hydrophilic member, a printing plate precursor, a pattern forming material, a pattern forming method, a method of producing a particle-adsorbed material, and a method of producing a metal particle-dispersed thin layer film, to which the above-mentioned method of graft polymerization can be applied.

22 Claims, No Drawings

METHOD OF GRAFT POLYMERIZATION AND VARIETY OF MATERIALS UTILIZING THE SAME AS WELL AS PRODUCING METHOD THEREOF

CROSS-REFERENCE TO RELATED APPLICATION

This application claims priority under 35 USC 119 from Japanese Patent Application Nos. 2002-271578, 2002-287814, 2002-287815, 2002-287821, 2002-287816, 2003-93867, 2003-94690, 2003-122061 and 2003-154551, the disclosures of which are incorporated by reference herein.

BACKGROUND OF THE INVENTION

1. Field of the Invention

The present invention relates to a method of graft polymerization by which can be formed a graft structure in which all of the polymer chains are directly bonded to the polymerization initiating layer.

The invention also relates to a variety of uses to which the above-mentioned method of graft polymerization is applied. That is, the invention relates to highly hydrophilic members applicable to a variety of uses; i.e., a highly sensitive and reduced scumming printing plate precursors which are adaptable to both of positive and negative types; pattern forming materials and a pattern forming method in which positive and negative patterns can be formed in a convenient operation; as well as highly sensitive and reduced scumming planographic printing plate precursors which need no development process and are adaptable to both of the positive and negative types. Moreover, the invention relates to pattern forming materials and a pattern forming method, as well as planographic printing plate precursors, in which a pattern can be formed directly by operating infrared laser based on the digital signals. Moreover, the invention relates to a method of producing a particle-adsorbed material, in which a particle-adsorbed material having functional surfaces prepared by adsorbing a variety of functional particles such as surface roughing members, electrically conductive members or shading members. The invention also relates to a method of producing a metal particle-dispersed thin layer film in which a metal particle-dispersed thin layer film is prepared by forming a thin film of metal particles, i.e. silver or copper particles, on a substrate, to thereby obtain a dense, highly durable and highly productive metal particle-dispersed thin layer film useful as anti-electromagnetic wave film or magnetic film.

2. Description of the Related Art

In convwentional graft polymerization, for example, as desclosed in Hiroo Iwata "Surface", vol.32, No.3, Mar. 1, 1994, Koshin-sha, p.190–196, most methods have been based on graft formation using an active point formed by irradiation of plasma, γ-ray or EB mainly to an organic substrate. Since a large-scale apparatus such as a plasma, γ-ray or EB generator has to be used in this method, it has been desired to provide a more convenient method of graft polymerization.

In order to solve this problem, a technique using UV irradiation for graft polymerization has been proposed. As such a technique, for example, there is a method in which a polymerization initiator having a functional group chemically bonded to the substrate surface is allowed to react on a glass substrate or an organic substrate having a reactive group on the surface to immobilize the initiator on the surface, and the substrate is then irradiated with UV to carry out graft polymerization. In one method, for example, a terminal silane-coupling agent having an initiator is reacted with a glass substrate to form a sol-gel layer so as to obtain a glass substrate whose surface is modified with the initiator, and the obtained glass substrate is immersed in a monomer solution and then irradiated with UV to carry out graft polymerization (see, e.g., Hiroo Iwata, "Surface", vol.32, p.190–196, as mentioned above).

In the above-mentioned technique, however, there is a problem in that immobilization of the initiator on the substrate is difficult due to low reactivity because the introduction of the initiator is based on reaction with a solid surface.

In order to solve this problem, some methods for providing a polymerization initiating layer on the surface of a substrate have been proposed. As the technique for the graft polymerization reaction, a method for providing a polymerization initiating layer comprising an initiator and a poly-functional monomer is disclosed in Japanese Patent Apppli-cation Laid-Open (JP-A) No.2000-80189. Additionally, a method for providing a polymerization initiating layer comprising a polymer having a pendent peroxide group for graft polymerization reaction is disclosed in JP-A No. 11-43614.

Other examples of such techiques inclide: a method in which a polymerization initiating layer comprising an initiator and a poly-functional monomer is provided for graft polymerization reaction as disclosed in JP-A No.2000-80189; a method in which a polymerization initiating layer comprising a polymer having a peroxide group is provided for graft polymerization reaction as disclosed in JP-A No.11-43614; a method in which a polymerization initiating layer comprising an initiator and a polymer is provided for graft polymerization reaction as disclosed in JP-A No.53-17407; a method in which a polymerization initiating layer comprising an initiator and a poly-functional monomer is provided for graft polymerization reaction as disclosed in JP-A No.2000-80189; and a method in which a polymerization initiating layer comprising a polymer having a initiating group is provided for graft polymerization reaction as disclosed in JP-A Nos.10-17688 and 11-43614.

The present inventors have investigated these graft polymerization reactions and found that there is a problem in these reactions in that, for example, when a hydrophobic monomer is used in graft polymerization, an initiator contained in the initiation layer or a polymer having the function of initiation is dissolved in a contacting hydrophobic monomer solution because of low capacitity as a film of the initiation layer for polymerization, and as a result, the polymerization occurs in the hydrophobic monomer solution to yield on the surface homopolymer as a by-product which has not been bonded to the initiation layer for polymerization.

A large number of uses are expected by providing hydrophilicity to the surface of a variety of members. Specifically, this can be applied to materials, for example, molded products or biocompatible molded products to which proteins, colloids, bacteria, humin, fats and oils, or air pollutants are scarcely adsorbed, and which are used in such fields as the food industry, medical care (including medical equipment such as artificial organs), the pharmaceutical industry, waste water treatment, coating, printing, and so on; carriers for immobilization which do not make enzymes or cells denatured, or anti-fogging members such as anti-fogging film or anti-fogging coating used in the fields of commerce, agriculture, traffic, household articles, optical instruments, paint, and so on; and surface-hydrophilic members which can be used for static prevention used in fields such asa the electronics industry.

The surface characteristics required for the hydrophilic members used in the above-mentioned fields include repressibility of adsorption of proteins, fats and oils, or humin to the surface of materials, anti-fogging property, biocompatibility, antistatic property, and so on. These functions can be attained by high hydrophilicity. For example, in the field of paint, anti-stain coating to which oily material in rain does not adhere is desired, and in use on a sensor surface, it is desired to provide a surface specifically adsorbing no such materials. An anti-fogging surface on which water drops expand to form a wet state by strong hydrophilicity is required to have high optical transparency and smoothness in addition to the hydrophilicity. Concerning biocompatibility in the medical care field such as artificial organs, the surface is required to inhibit thrombosis, hemolysis, sensitization property, or antigen-antibody reaction. The generation of static prevetion capability by hydrophilicity is particularly important in electronics industry.

As an example of providing hydrophilicity on a surface to satisfy such requirements, a method for grafting the surface of a hydrophilic monomer is known.

The specifically disclosed method (see, e.g., JP-A No.53-17407) comprises coating a hydrophilic radical polymeric compound on the surface of a lipophilic substrate containing as a major component lipophilic resin which contains a certain number of hydrogen groups attached to a carbon-carbon double bond and/or tertiary carbon, and irradiating it with an active ray to form a hydrophilic layer on the surface.

As a process for producing a surface-hydrophilic molded product, however, although the hydrophilic layer is readily made, it is sometimes difficult to coat a hydrophilic radical polymeric compound that is poor in film-forming ability evenly on the surface, resulting in uneven coating in most cases and insufficient hydrophilicity.

Accordingly, a method for grafting a hydrophilic polymer on the surface of a lower layer formed by coating a photopolymerization initiating layer (photopolymerization initiator comprising a monomer and/or an oligomer) on the surface of a substrate, by supplying energy under contact with a hydrophobic monomer has been developed (see, e.g., JP-A No.10-53658). In this technique, however, there is a problem in that, since the photopolymerization initiator is not firmly fixed in the photopolymerization initiating layer, the initiator contained in the initiation layer is dissolved in a hydrophilic monomer solution during surface graft polymerization, and as a result, polymerization occurs in the hydrophilic monomer solution to yield a homopolymer as a by-product, which has not been bonded to the initiation layer for photo polymerization, on the surface of the layer. This problem is disadvantageous for application to the food industry or biocompatible materials because the homopolymer peels off easily as contaminants from the substrate, having an adverse effect on performance.

In order to solve this problem, for example, in JP-A No. 11-43614, a method for immobilizing a photopolymerization initiator on a layer for initiation of photopolymerization has been proposed. This method comprises using a photopolymerization initiator bonded to polymer. The present inventors have tried to coat this polymer on the substrate surface to carry out the graft polymerization reaction in the same manner as above and found that the polymer to which the photopolymerization initiator is attached is itselfs dissolved in a solution containing the hydrophilic monomer to similarly yield on the surface a homopolymer as a by-product which is not bonded to the photopolymerization initiating layer. Thus, the above problem could not be solved.

The method of planographic printing comprises using a plate material having a lipophilic area receiving ink and an ink-repellent area receiving, not ink but dampening water (hydrophilic region). At present, a photosensitive planographic printing plate pecursor (PS plate) is widely used.

As the PS plate, those in which a photosensitive layer is provided on a support such as an aluminum plate are widely in practical use. On such a PS plate, the sensitized layer of a non-image area is removed by image exposure and development, and printing is conducted thereon utilizing the hydrophilicity on the substrate surface and the lipophilicity of the photosensitive layer of the image area. In the PS plate, the non-image area is required to be removed with no generation of residual film, while in the image area it is required that the recording layer tightly adheres suitably to the support without easily peeling off. Further, in the non-image area, the hydrophilic surface of the support is exposed after removal of the recording layer by development processing, and when the surface of the support has insufficient hydrophilicity, it is spotted due to ink adhering thereto. Therefore, the surface of the support is required to have high hydrophilicity in view of prevention of spots on the non-image area.

As for the hydrophilic substrate used as a support for a planographic printing plate or a hydrophilic layer, an anodically oxidized aluminum substrate, or a substrate or a hydrophilic layer in which the aluminum substrate is further processed with an undercoating agent such as silicate, polyvinylphosphonic acid, or polyvinylbenzoic acid for further improving the hydrophilicity has been used so far (see, e.g., JP-A No.7-1853). Study of hydrophilic substrates or hydrophilic layers using such aluminum supports has actively been conducted. In addition, a technique using a polymer having sulfonic acid groups in an undercoating layer which is formed under photosensitive layers has also been desclosed (see, e.g., JP-A No.59-101651)

On the other hand, concerning the hydrophilic layer on a flexible support such as PET (polyethylene terephthalate), cellulose acetate, and so on, without using such a metallic support as aluminum, the following techniques are known: a swelling hydrophilic layer comprising a hydrophilic polymer and a hydrophobic polymer (see, e.g., JP-A No.8-292558), a PET support having a surface of microporous hydrophilically crosslinking silicate (see, e.g., EP 0709228A1), and a hydrophilic layer cured with a hydrolyzed tetraalkyl orthosilicate containing a hydrophilic polymer (see, e.g., JP-A No.8-272087 or No.8-507727).

Although these hydrophilic layers provide planographic printing plates which can produce printed matter with no scumming at the start of printing, from a practical standpoint it has been desired to further improve the hydrophilicity of the hydrophilic layer to obtain a planographic printing plate precursor producing a printed matter with no scumming even under more severe printing conditions.

In order to solve the above problem, a new hydrophilic layer has been developed utilizing a hydrophilic surface graft layer (see, e.g., JP-A No.2001-166491). In this method, however, there is a problem in production applicability in that a plasma, γ-ray or electron beam has to be irradiated during graft polymerization.

In addition, in order to solve the above problem, another technique has been developed wherein energy is supplied to a lower layer coated on the surface of a substrate with an photopolymerization initiating layer (photopolymerization initiator comprising a monomer and/or an oligomer) in a condition contacting with a hydrophilic monomer to make a hydrophilic polymer graft on the lower layer surface (see, e.g., JP-A No.10-53658). In this technique, however, there is a problem in that, since the photopolymerization initiator is not firmly fixed in the photopolymerization initiating layer, the initiator contained in the initiation layer is dissolved in a hydrophilic monomer solution during surface graft polymerization, and as a result, polymerization occurs in the hydrophilic monomer solution to yield a homopolymer as a by-product, which has not been bonded to the initiation layer for photopolymerization, on the surface of the layer. Because of this problem, a part of the polymer terminal in the generated polymer cannot be chemically bonded to the substrate, and dampening water tends to be invited into the image area of the planographic printing plate precursor, whereby insufficient adhesion between the recording layer and the substrate occurs so as to decrease printing performance, and especially press life.

In another method, a photopolymerization initiator-fixed layer is formed with a photopolymerization initiator bonded to a polymer, on which a hydrophilic surface graft layer is formed as a hydrophilic layer (see, e.g., JP-A No.11-43614). The present inventors have examined this method and found that there is a problem in that, when graft polymerization is carried out by contacting a monomer solution with a photopolymerization initiating layer to form a hydrophilic layer, the initiator component contained in the initiating layer is dissolved in the monomer solution, and as a result, polymerization occurs in the hydrophilic monomer solution to yield a homopolymer on the surface of the layer as a by-product which has not been bonded to the initiating layer for polymerization. Because of this problem, a portion of the polymer chain terminals in the generated polymer cannot be chemically bonded to the substrate, and dampening water tends to be invited into the image area, whereby insufficient adhesion between the recording layer and the substrate occurs so as to decrease printing performance, especially press life.

The pattern of hydrophilicity/hydrophobicity has been utilized in a variety of fields. In particular, in the printing industry, and particularly in the field of planographic printing, a planographic printing plate precursor has been known, which can be used in printing directly after exposure, without requiring any complicated wet development process, by controlling the hydrophilicity/hydrophobicity of the surface to form a desired pattern.

As a planographic printing plate precursor to which such a pattern consisting of hydrophilicity/ hydrophobicity has been applied, a positive planographic printing plate precursor which is prepared by crosslinking a polymer containing a group thermally convertible from a hydrophobic group to a hydrophilic group, such as a sulfonic acid ester group or an alkoxyalkyl ester group, is proposed in JP-A No.11-84658. Additionally, JP-A No.7-1849 proposes a negative planographic printing plate precursor in which microcapsules containing a hydrophobic composition that can react with a hydrophilic group are dispersed in a crosslinked hydrophilic layer.

In these planographic printing plate precursors, since the image-recording layer has a crosslinking structure, the image area and non-image area are not formed by removal of the corresponding area of image recording layer, but rather by change of the polarity of the surface, and thus, the plate is of non-treating type requiring no development treatment.

In these planographic printing plate precursors of the surface polarity-changing type, it is considered that a water-holding capacity of the non-image area is necessary in order to generate the hydrophilicity with no scumming at printing. For that purpose, it is considered that the polarity change is required to occur to some depth of non-image area, and not only at the surface. Therefore, in the above-mentioned sensitive materials, much higher energy is required to cause the polarity change in the depths of non-image area, and a usual amount of image recording energy sometimes results in low sensitivity. In order to raise the sensitivity at usual amount of image recording energy, making an image recording layer thinner has been considered, but in conventional planographic printing plate precursors, when the thickness is reduced, the water-holding capacity is reduced so as to provide a product that is worse with respect to scumming property. Therefore it has been impossible to sufficiently discriminate the hydrophilicity and the lipophilicity. Further, a thinner layer causes another problem in that the preess life of the planographic printing plate is deteriorated.

In order to solve the problems, a method for raising the water-holding capacity by forming an image-recording layer comprising graft polymer having a polarity-changing group through a photopolymerization initiating layer on a support has been proposed. In such a planographic printing plate precursor, however, there is a problem in that, at the time of graft polymerization, an initiator contained in the initiating layer is dissolved in the monomer solution when the monomer solution having a polarity-changing group is contacted with the photopolymerization initiating layer. As a result, polymerization occurs in the monomer solution, and homopolymers, which have not been bonded to the initiating layer, are yielded on the surface of the layer as a by-product. Moreover, there is an another problem in that the homopolymers are released from the image-recording layer at printing so as to disturb stable supply of printed matter.

Further, JP-A No. 11-43614 proposes a technique for immobilizing a photopolymerization initiator in a photopolymerization initiating layer using a photopolymerization initiator bonded to a polymer. In this method, however, there is also a problem in that it is not possible to completely prevent dissolution of the photopolymerization initiator in the photopolymerization initiating layer, and as a result, a homopolymer is yielded as a by-product.

Hitherto, a variety of members having surface layers with various functions which are prepared by adsorbing functional particles on optional substrates have been proposed. Examples of the members having the particle-adsorbed surface layers include antireflection members on which unevenness is provided using resin or metal particles, conductive members on which electrically conductive particles are adsorbed, anti-pollutive and anti-bacterial members on which anti-bacterial metal (oxide) particles are adsorbed, gas-barrier films which lower gas transparency utilizing a laminated structure of particles, and shading members made with particle materials which block ultraviolet rays, infrared rays or visible light. In addition, the members in which particles are adsorbed on the surface are involved in an important technique which permits a high degree of functionalization such as considerable expansion of the surface area, elevation of image resolution and increase of the density of materials used in catalysts, recording materials, sensors, electronic devices, optical devices, etc. Under such circumstances, studies of such techniques have actively been made.

The following describes typical members whose surface are roughed with particles, which members are useful as antireflection materials for controlling the refraction index of the surface to prevent light reflection because they have predetermined small unevenness.

Further, in recent years, image displays typified by liquid crystal displays (LCD), plasma display panels (PDP), cathode-ray tube displays (CRT), electroluminescence (EL) lamps, and the like have widely been used in televisions, computers, and a variety of recently prevalent mobile devices and have experienced remarmable development. High image quality, reduction of electricity consumption, and so on, have been demanded of such displays, accompanying functional improvement in a variety of devices in which the displays are used. With respect to improvement of image quality, it is an important factor to prevent reflection of light such as that from lighting on the surface of a display, i.e., antireflection, in addition to improvement of the pixel density of images and realization of clear color tone.

In particular, mobile terminal displays which have rapidly become precalent in recent years are naturally expected to be used outdoors. Therefore, it has been necessary to develop a highly antireflective display in which reflection of outdoor light such as sunlight or fluorescence can be prevented.

In addition, LCDs which are characterized by being lightweight, compact and generally versatile have widely been used. In mobile devices equipped with such an LCD (portable terminal), input of touch-panel type, i.e., a system of handling in which an operation is carried out by directly touching a specified region on the display surface with a plastic pen or finger, has widely been employed. Therefore, it is important that, in addition to high image quality and anti-reflectiveness, the surface of the display has characteristics such as endurance, e.g.,acrassion resistance, as well as grim resistance.

As a method of providing an antireflective capability, conventionally, it has been common to make the incidence plane for light rough to scatter or diffuse light. The rough surface is formed by direct roughening of the substrate surface by means of sand blasting, embossing, etc., or by coating a coating solution containing a filler on the substrate surface followed by drying to form a rough layer.

In particular, a method for forming a rough layer containing a filler on the substrate surface is now used widely because it is easy to control unevenness on the rough surface and permit easy production. Specifically, for example, JP-A No.6-18706 has proposed a roughened layer which comprises a UV-cured resin and resinous beads in order to apply the same to a less thermostable and highly transparent plastic film.

In the method of using a roughened layer containing a filler, however, there has been a problem in that the unevenness formed with the filler is negated by the effect of a binder making it difficult to achieve the antireflection capability as designed since the filler forming unevenness is immobilized on the substrate with a binder. When the binder is diluted or the amount of the binder to be used is reduced in order to improve the effect of unevenness of the filler, the strength of the film may be reduced resulting in a problem with durability.

In addition, as another known method for providing an antireflection capability, a highly refractive material is laminated in alternation with a low refractive material to form a multi-layered antireflection layer. The formation of the multi-layer structure may specifically carried out by a vapor phase method such as alternate vapor deposition of a low refractive material, e.g. $SiO_2$, and a highly refractive material, e.g. $TiO_2$, or $ZrO_2$, to form film, or by a sol-gel method utilizing hydrolysis of a metal alkoxide and condensation polymerization.

In these methods for forming a multi-layered antireflection layer, a gas phase method such as vapor deposition requires an expensive processing apparatus and is not appropriate for production of layers with a large area. In the case of the sol-gel method, there are problems in that the repetitive coating and burning raises the cost of production and the produced antireflection layer exhibits a violet or green tint making spots stand out.

In addition, another method for providing an antireflection capability has been proposed in N. J. Nattan, M. Brust et al., "Chemical Materials", 2000, (Vol) 12, (R) 2869, wherein negatively charged colloid gold particles are adsorbed on the surface of a silicone oxide substrate and immobilized with aminopropanethiol as a linker to form a crosslinking structure, which operation is repeated several times to adsorb gold particles adsorb on the substrate surface to form a multi-layer. In such a method, it is possible to produce an antireflection member having a roughened layer in which gold particles are adsorbed on the substrate. This technique, however, requires a complicated process and it is difficult to practically apply this technique to formation of particle-adsorbed layers.

As illustrated above by examples of members having an antireflection capability, it has been difficult to form a highly durable functional surface layer having varried functionality. Particularly, when a coating method is used in order to form a functional surface layer, it has been difficult to induce the function as initially designed because the function of the functional particles is blocked by a binder.

Presently, a thin layer film in which metal particles have been dispersed is now actively being used in a variety of fields. In one known method, a thin layer film is produced by "coating particles on the surface of a substrate, followed by coating a polymer thereon" (for example, ANDREW J. KELLOCK, "Journal of Colloid and Interface Science", 1993, (Vol) 156, (pp) 240–249). This method, however, is complicated since it requires execution of 3 steps, i.e., 1. production of particles; 2. coating of the particles; and 3. coating of a polymer. In addition, there is a problem in this method in that the ratio of the particles to be contained in the film is limited to several % by mass and it is difficult to exhibit the particulate characteristics. Moreover, there is a problem in that adhesion of the particles is poor since the particles are immobilized only by being coated on a substrate, and as a result, the durability of the metal particle-dispersed thin layer film is poor.

SUMMARY OF THE INVENTION

An object of the present invention is to solve afforementioned problems and to specifically attain the following. A first object of the present invention is to provide a method of graft polymerization by which it is possible to form a graft structure in which all polymer chains are chemically bonded directly to a polymerization initiating layer to prevent dissolution of an initiator contained in the polymerization initiating layer into a monomer solution.

The present inventors carried out earnest study found that the above-described first object could be attained in the following manner, thereby achieving the invention.

According to a first aspect, the invention provides a method of graft polymerization comprigring the steps of: forming a polymerization initiating layer in which a polymer having, on a side chain thereof, a crosslinking group and a functional group having polymerization initiating capability is immobilized on a support by a crosslinking reaction; and contacting a compound having a polymerizable functional group with the polymerization initiating layer, and then bonding the compound to the polymerization initiating layer by supplying energy thereto.

In the above-mentioned step of forming the polymerization initiating layer, the immobilization of the the polymer having, on a side chain thereof, the crosslinking group and the functional group having polymerization initiating capability by a crosslinking reaction is preferably carried out by a crosslinking reaction using a crosslinking agent. The crosslinking reaction using a crosslinking agent is preferably carried out under the condition of a temperature from 50° C. to 300° C.

The exact mechanism resulting in the effects of the first aspect of the invention is not completely clear but is presumed to be as follows. That is, it is presumed that the polymerization initiating layer to which the polymer having the crosslinking group and the functional group having polymerization initiating capability has been immobilized by the crosslinking reaction, in contact with a solution containing the compound having the polymerizable fuctional group used in graft polymerization, can prevent dissolution of an initiator component contained in the initiating layer into the solution due to its strong crosslinking structure. As a result, only the graft structure (graft polymer) in which all of the terminals of the polymer chains are chemically bonded directly to the polymerization initiating layer is generated in a particular region.

A second object of the invention is to provide a hydrophilic member having high hydrophilicity and superior hydrophilic durability by preventing dissolution of the initiator component contained in the initiating layer into a monomer solution and by making all of the hydrophilic compounds chemically bond directly to the polymerization initiating layer.

The present inventors carried out earnest study and found that the above-described second object could be attained in the following manner, thereby achieving the invention.

According tos a second aspect, the invention provides a hydrophilic member which comprises a polymerization initiating layer in hydrophilic member comprising: a support; a polymerization initiating layer formed on the support by immobilizing a polymer having, on a side chain thereof, a crosslinking group and a functional group having polymerization initiating capability, by a crosslinking reaction; and a hydrophilic layer formed by bonding a hydrophilic compound having a polymerizable group, directly to the polymerization initiating layer.

The exact mechanism resulting in the effects of the second aspect of the invention is not completely clear but is presumed to be as follows. The polymerization initiating layer in the hydrophilic member of the invention contains the polymer having the crosslinking group and the functional group having polymerization initiating capability and is immobilized by a crosslinking reaction with the crosslinking group, which provides excellent and strong film characteristics. Therefore, it is suggested that the initiator component contained in the polymerization initiating layer can be prevented from dissolving in a hydrophilic monomer solution or in a hydrophilic polymer-containing layer when contacted with the monomer solution or the polymer-containing layer. Additionally, generation of a homopolymer as a by-product can be inhibited. Therefore, in the hydrophilic member of the invention it is presumed that all of the chains in the hydrophilic compound formed on the surface of the polymerization initiating layer can be chemically bonded directly to the polymerization initiating layer at their terminals in a particular region to generate a graft structure (graft polymer), which provides high hydrophilicity and improved durability.

A third object of the invention is to provide a positive or negative printing plate precursor which has an improved printing scumming property and an excellent press life and can form a large number of spotless images of high quality even under severe printing condition.

The present inventors have carried out study to attain the above-mentioned third object and found that the problem can be solved by forming an image-forming layer on a support provided with a hydrophilic surface having high hydrophilicity and excellent durability, thereby achieving the invention.

According to a third aspect, the invention provides a printing plate precursor comprising: a substrate including a support and a hydrophilic surface; and an image forming layer provided on the substrate, wherein the hydrophilic surface is formed by directly bonding a hydrophilic compound having a polymerizable group to a polymerization initiating layer formed on the support by immobilizing a polymer having, on a side chain thereof, a crosslinking group and a functional group having polymerization initiating capability, by a crosslinking reaction.

The printing plate precursor of the invention can be applied to a variety of printing plate precursors, and in particular it is preferably a positive or negative planographic printing plate precursor.

The exact mechanism resulting in the effects of the second aspect of the invention is not completely clear but is presumed to be as follows.

The hydrophilic surface of the support in the printing plate precursor of the invention contains the polymer containing the crosslinking group and the functional group having polymerization initiating capability and immobilized by a crosslinking reaction with the crosslinking group, and the hydrophilic surface has a hydrophilic graft polymer prepared by making the hydrophilic compound having the polymerizing group bond directly to a polymerization initiating layer whose film characteristics are in a very good state. The polymerization initiating layer used in formation of such a hydrophilic surface has excellent film characteristics, and therefore, when contacted with a solution in which the hydrophilic compound is dissolved, it is possible to prevent dissolution in a solution of an initiator composition contained in the polymerization initiating layer and further to inhibit the generation of a homopolymer as a by-product. Therefore, in the hydrophilic surface of the support in the printing plate precursor of the invention, it is presumed that all of the chains in the hydrophilic compound formed on the surface of the polymerization initiating layer can be chemically bonded directly to the polymerization initiating layer at their terminals in a particular region to generate a graft structure (graft polymer), which provides high hydrophilicity and improved durability.

As a result, it is presumed that, in the printing plate precursor of the invention, when the image-forming layer in a non-image area is rapidly removed with an alkaline developer after exposure, excellent hydrophilicity is realized on the hydrophilic surface excellent in hydrophilicity with high mobility in the non-image area to accelerate supply and elimination of dampening water supplied during printing and effectively inhibit scumming in the non-image area due to the excellent hydrophilicity. In addition, it is also presumed that since generation of a homopolymer as a by-product is inhibited around the hydrophilic surface, insufficient adhesion between the recording layer and the support in the image area sue to dampening water can be prevented so as to enhance a press life.

Moreover, a fourth object of the invention is to provide a pattern forming material and a pattern forming method which can be applied to a printing plate precursor, such as a planographic printing plate precursor, requiring no treatment for development, by which patterning is possible in a convenient operation, and by which a film and stable pattern can be formed.

A fifth object of the invention is to provide a positive or negative printing plate precursor which requires no treatment for development after writing of an image, wherein dissolution of an initiator component contained in a polymerization initiating layer into a monomer solution is prevented, a firm and stable image recording layer can be formed, and a highly sensitive image can be formed by heat, acid or radiation.

In addition, a sixth object of the invention is to provide a positive or negative printing plate precursor which can be made directly by scanning of an infrared laser based on digital signals, being excellent in sensitivity and reduced scumming, and particularly improved in press life.

The present inventors have carried out study to attain the above-mentioned fourth to sixth objects and found that the objects can be achieved in the following manner, thereby achieving the invention.

According to a fourth aspect, the invention provides a pattern forming material comprising: a support; a polymerization initiating layer formed on the support by immobilizing a polymer having, on a side chain thereof, a crosslinking group and a functional group having polymerization initiating capability, by a crosslinking reaction; and a pattern forming layer formed by contacting a polymerizable compound having a functional group whose hydrophilicity/hydrophobicity changes due to heat, acid, or radiation, with the polymerization initiating layer, and supplying energy thereto, so as to generate a graft polymer on a surface of the polymerization initiating layer by graft polymerization.

In the pattern forming material of the invention, the immobilization of the polymerization initiating layer by a crosslinking reaction is preferably carried out with a crosslinking agent. Such a crosslinking reaction using a crosslinking agent is preferably carried out under the condition of a temperature form 50 to 300° C.

According to a fifth aspect, the invention provides a pattern forming method comprising the steps of: providing a polymerization initiating layer on a support by immobilizing a polymer having, on a side chain thereof, a crosslinking group and a functional group having polymerization initiating capability, by a crosslinking reaction; generating a graft polymer on a surface of the polymerization initiating layer by graft polymerization by contacting a polymerizable compound having a functional group whose hydrophilicity/hydrophobicity changes due to heat, acid or radiation, with the polymerization initiating layer, and supplying energy thereto; and imagewise supplying heat, acid or radiation to the graft polymer to form a hydrophilic/hydrophobic pattern.

In the above-mentioned step of providing the polymerization initiating layer, the immobilization by crosslinking reaction is preferably carried out with a crosslinking agent. Such a crosslinking reaction using a crosslinking agent is preferably carried out under the condition of a temperature form 50 to 300° C.

Moreover, the pattern forming material and the patterning method of the invention are suitably applied to a planographic printing plate precursor. Such a planographic printing plate precursor comprises a polymerization initiating layer formed on the support by immobilizing a polymer having, on a side chain thereof, a crosslinking group and a functional group having polymerization initiating capability, by a crosslinking reaction; and a polymer compound layer containing a polymer compound having a functional group whose hydrophilicity/hydrophobicity changes due to heat, acid or radiation, and chemically bonding directly to the polymerization initiating layer.

In the above-mentioned planographic printing plate precursor, the immobilization of the polymerization initiating layer by a crosslinking reaction is preferably carried out with a crosslinking agent. Such a crosslinking reaction using a crosslinking agent is preferably carried out under the condition of a temperature from 50 to 300° C.

The exact mechanism resulting in the effects of the fourth and fifth aspects of the invention is not completely clear but is presumed to be as follows.

That is, the polymerization initiating layer in the fourth and fifth aspects of the invention is prepared by immobilizing the polymer containing the crosslinking group and the functional group having polymerization initiating capability by a crosslinking reaction using the crosslinking group, and its film characteristics are in a very good state. Therefore, in the graft polymerization, by contacting a solution of a monomer having the functional group (hereinafter sometimes referred to as "polarity changing group") whose hydrophilicity/hydrophobicity changes due to heat, acid or radiation with the polymerization initiating layer, it is possible to prevent dissolution of an initiator component contained in the polymerization initiating layer into the monomer solution. Therefore, it is possible to suppress generation of a homopolymer as a by-product which is not bonded directly to the surface of polymerization initiating layer, to yield only the graft polymer bonded directly to the surface of the polymerization initiating layer. The pattern forming layer comprising the graft polymer, accordingly, does not peel off and can be obtained as a highly durable layer.

As mentioned above, it is presumed that in the planographic printing plate precursor to which the pattern forming material and the pattern forming method of the invention are applied, since a polymer compound (graft polymer) having the polarity changing group is chemically bonded to the polymerization initiating layer, water is held between the plural chains of the polymer compound having the polarity changing group in the non-image area. As a result, spotless hydrophilicity is generated during printing even if the planographic printing plate precursor has thin layers. Thus, in such a planographic printing plate precursor, the image recording layer can be made into a thinner layer to provide a highly sensitive product, since it can efficiently generate hydrophilicity. In addition since the polymer compound is chemically bonded directly to the polymerization initiating layer, such a planographic printing plate precursor, has an advantage in that it exhibits excellent press life even if it has thin layers.

A seventh object of the invention is to provide a particle-adsorbed material in which functional particles are firmly adsorbed on the surface thereof as a single layer or in a laminated state to form a highly durable particle-adsorbed layer and in which the effect of the adsorbed functional particles is sustained.

An eighth object of the invention is to provide a method for producing a particle-adsorbed material which has the above-mentioned characteristics and by which a particle-adsorbed layer of a multi-layer structure can readily be formed.

The present inventors have carried out study to attain the above-mentioned seventh and eighth objects, paying attention to the characteristics of substrates having a graft polymer on the surface. As a result, they found that, when a polar group is introduced into a graft polymer, it exhibits a strong adsorptiveness with respect to particles capable of mutually interacting with the polar group and can arrange and adsorb high density particles having particular physical properties. They additionally found that by utilizing these properties it is possible to obtain a particle-adsorbed layer in which excellent function of the particles can be used, thereby achhieving the invention.

According to a sixth aspect, the invention provides a method of producing a particle-adsorbed material, the method comprising the steps of:

providing a polymerization initiating layer on a surface of a support by immobilizing a polymer having, on a side chain thereof, a crosslinking group and a functional group having polymerization initiating capability, by a crosslinking reaction;

contacting a compound having a polymerizable functional group and a polar group with the polymerization initiating layer, and irradiating radiation thereto, so as to bond the compound to the surface of the polymerization initiating layer by graft polymerization; and adsorbing particles which are able to mutually interact with the polar group.

In the step of providing the polymerization initiating layer, the immobilization by a crosslinking reaction is preferably carried out with a crosslinking agent. In this step, the reaction is preferably carried out at a temperature from 50 to 300° C. As for the polar group, an ionic group is preferred.

The particle-adsorbed material produced by the relating to the sixth aspect of the invention is characterized in that the material is produced by providing the polymerization initiating layer on a surface of the support by immobilizing the polymer, having on a side chain thereof, the crosslinking group and the functional group having polymerization initiating capability by a crosslinking reaction; then contacting the compound having the polymerizable functional group and the polar group with the polymerization initiating layer, followed by irradiation of radiation, to make the compound bond to the surface of the polymerization initiating layer by graft polymerization; and then adsorbing particles which are able to mutually interact with the polar group.

The exact mechanism resulting in the method of producing the particle-adsorbed material of the invention is not completely clear but is presumed to be as follows. In the invention, the polar group is introduced onto the substrate, and a layer whose surface exhibits a physical property capable of forming some interaction with the polar group, on which optional functional particles such as metal oxide are packed evenly in high density is formed. As a result, a surface layer with the particles can be formed without using a binder, which layer, i.e., particle-adsorbed layer, directly reflects the shape or function of the particles. Thus, for example, a roughened surface layer having a homogeneous but uneven shape or a functional surface layer having an electrically conductive layer with conductive particles can be formed to exhibit the desired excellent function. Additionally, since the polar group provided on the surface is strongly adsorbed by the particles capable of adsorbing it based on the interaction such as electrostatic force, an abrassion resistance strengthened to yield highly durable particle-adsorbed layer.

According to the invention, since the polymerization initiating layer to which the polymer having, on a side chain thereof, the crosslinking group and the functional group having polymerization initiating capability has been immobilized by a crosslinking reaction has been provided, when the layer is contacted with a solution containing the polymerizable functional group used in the graft polymerization, dissolution of an initiator component (component having a polymerization initiating capability) contained in the polymerization initiating layer into a monomer solution can be prevented. As a result, generation of a homopolymer as a by-product which is not bonded directly to the substrate surface is suppressed, and peeling-off of the polymer itself due to abrasion can be avoided after adhesion of the particles to possibly further enhance durability of the formed particle-adsorbed layer.

The existence of the particle-adsorbed layer of such a structure can be confirmed externally by observation of the surface using an AFM (atomic force microscope) or by observation of the cross-section using a scanning electron microscope along with the fine uneven shape of the surface or the formed laminated state of particles. Moreover, adhesion (durability) of the particle-adsorbed layer can be confirmed by means of an in-line arrangement taping method (JIS5400) or rubbing experiment. The existence of the functional layer comprising particles can also be confirmed by measuring the physical properties exhibited by the functional particles.

A nineth object of the invention is to provide a metal particle-dispersed thin layer film superior in adhesion and durability, in which metal particles are dispersed at high density.

A tenth object of the invention is to provide a method for producing a metal particle-dispersed thin layer film having the above-mentioned characteristics, by which a metal particle-dispersed thin layer film can be produced at high productivity by a simple process.

The present inventors have carried out study amed at achiving the above-mentioned nineth and tenth objects, paying attention to the strong ion adhesion of a graft polymer. As a result, they found that it is possible to produce a metal particle-dispersed thin layer film by a simple process to reduce a metal salt contained in a graft polymer, whereby the resulting film is superb in adhesion and durability and metal particles are dispersed therein in high density, thereby achiving the invention.

Accordign to a seventh aspect, the invention provides a method of producing a metal particle-dispersed thin layer film, the method comprising the steps of: providing a polymerization initiating layer on the surface of a support by immobilizing a polymer having, on a side chain thereof, a crosslinking group and a functional group having polymerization initiating capability, by a crosslinking reaction; contacting a polymerizable compound having a polar group with the polymerization initiating layer, and irradiating radiation thereto, so as to make the compound graft-polymerize to the surface of the polymerization initiating layer to provide a graft polymer layer, and adding a metal salt to the graft polymer layer; and reducing the metal salt.

In the step of providing the polymerization initiating layer, the immobilization by a crosslinking reaction is preferably carried out with a crosslinking agent. In this step, the reaction is preferably carried out at a temperature from 50 to 300° C.

The metal particle-dispersed thin layer film produced by the method relating to the seventh aspect of the invention is characterized in that the film is produced by providing the polymerization initiating layer on the surface of the support by immobilizing the polymer having, on a side chain thereof, the crosslinking group and the functional group having polymerization initiating capability by a crosslinking reaction; then forming the graft polymer layer containing the metal salt on the surface of the polymerization initiating layer; and reducing the metal salt.

In the method for producing a metal particle-dispersed thin layer film of the invention, as the polymerizable compound having a polar group in which the metal salt may be added, any type of compound may be used as far as it can maintain a metal salt therein when it is converted into a graft polymer by graft polymerization. Specifically, polymerizable compounds having a metal salt structure, polymerizable compounds capable of adsorbing a metal ion and having an acidic group, polymerizable compounds containing a metal salt and a highly affinitive functional group, and polymerizable compounds having a hydrophilic group are preferable. In this method, when a polymerizable compound having a metal salt structure is used for producing the graft polymer layer, the step for producing the graft polymer layer may be carried out in one step combined with the step for adding the metal salt.

Moreover, in the method for producing a metal particle-dispersed thin layer film of the invention, the "graft polymer layer containing a metal salt" may be prepared by any one of the following processes: (1) graft polymerizing a polymerizable compound containing a metal salt structure on the polymerization initiating layer; (2) generating a graft polymer chain having an acidic group on the polymerization initiating layer, and making a metal ion adsorb on the acidic group; (3) generating on the polymerization initiating layer a graft polymer chain which has a high affinity to a metal salt, e.g., polyvinylpyrrolidone, followed by immersion in a solution in which a metal salt is dispersed or dissolved, to immerse the metal salt in the graft polymer layer; and (4) generating a hydrophilic graft polymer chain on the polymerization initiating layer, followed by immersion in a solution in which a metal salt is dispersed or dissolved, to immerse the metal salt in the graft polymer layer. In the embodiment of the item (4), the desired metal salt may be incorporated in the graft polymer layer even if the graft polymer chain has a positive charge.

Thus, the metal particle-dispersed thin layer film of the invention can be produced by a simple process, that is, reduction of the metal salt contained in the graft polymer layer.

In the method for producing a metal particle-dispersed thin layer film of the invention, the exact mechanism of generation of the high adhesion of the metal particle-dispersed film has not yet been clarified. Since the graft polymer layer is disposed on the surface of the polymerization initiating layer prepared by immobilizing the polymer having, on a side chain thereof, the crosslinking group and the functional group having polymerization initiating capability by a crosslinking reaction, when the layer is contacted with a solution containing the compound (e.g., monomer) used in generation of the graft polymer (graft polymerization), dissolution of an initiator component (component having a polymerization initiating capability) contained in the initiating layer into the solution can be prevented. As a result, generation of a homopolymer as a by-product which is not bonded directly to the surface of the polymerization initiating layer is suppressed, and peeling-off of the polymer itself due to abrasion can be avoided, after generation of the graft polymer layer in which the reduced metal particles are dispersed, to possibly further enhance adhesion of the thin layer metal particle-dispersed film.

Moreover, adhesion (durability) of the metal particle-ispersed thin layer film can be confirmed by means of an in-line arrangement taping method (JIS5400) or rubbing experiment.

DETAILED DESCRIPTION OF THE INVENTION

1. Method of Graft Polymerization

The method of graft polymerization of the present invention will be described in detail below.

The method of graft polymerization of the invention comprises a step forming a polymerization initiating layer in which a polymer having, on a side chain thereof, a crosslinking group and a functional group having polymerization initiating capability is immobilized on a support by a crosslinking reaction (hereinafter referred to as "a step of forming a polymerization initiating layer"), and a step of contacting a compound having a polymerizable functional group with the polymerization initiating layer, and then bonding the compound to the polymerization initiating layer by supplying energy thereto (hereinafter referred to as "a step of graft formation"). Moreover, the immobilization of the polymer having, on the side chain thereof, a crosslinking group and a functional group having polymerization initiating capability by crosslinking reaction is preferably carried out by the crosslinking reaction using a crosslinking agent.

1-1. Step of Forming a Polymerization Initiating Layer

First, the polymer used in this step, which contains on the side chain thereof crosslinking group and a functional group having polymerization initiating capability, will be explained as follows (hereinafter properly referred to as "specific polymerization initiating polymer").

This specific polymerization initiating polymer is preferably a copolymer comprising a copolymerizing component having a functional group having polymerization initiating capability (hereinafter properly referred to as "polymerization initiating group") and a copolymerizing component having a crosslinking group.

The polymerization initiating layer formed in the invention, as mentioned above, comprises a specific polymerization initiating polymer and is characterized in that in the polymerization initiating polymer the polymerization initiating groups are bonded to polymer chains, which are immobilized by crosslinking reaction. In the invention, since a graft polymer is generated on the surface of the polymerization initiating layer, when contacted with a solution of a compound having a polymerizing group in the step of graft formation as mentioned below, it is possible to prevent dissolution of the initiator component (component capable of initiating polymerization) contained in the polymerization initiating layer into the solution. In addition, since it is possible to use not only crosslinking reaction with a usual radical but also condensation or addition reaction between polar groups in formation of the polymerization initiating layer, a stronger crosslinking structure can be obtained. Thus, dissolution of the initiator component contained in the polymerization initiating layer can be prevented more effectively, the generation of homopolymer as by-product which is not bonded directly to the surface of polymerization initiating layer is suppressed, and as a result only graft polymer directly bonding to the surface of polymerization initiating layer is generated.

The respective components constituting the polymer of the specific polymerization initiating layer will be described in detail below.

1-1-1. Copolymerization Component having a Functioned Group having Polymerization Initiating Capability As for the copolymerization component which has polymerization initiating group and constitutes the specific polymerization initiating polymer, those comprising a polymerizing group allowing radical, anionic or cationic polymerization in which the following structure having polymerization initiating capability is pendent thereto are preferred. That is, the copolymerization component has the structure in which a polymerizable polymerizing group and a functioned group having polymerization initiating capability coexist within the molecule.

The structure having the polymerization initiating capability includes: (a) aromatic ketones, (b) onium salt compounds, (c) organic peroxides, (d) thio compounds, (e) hexaaryl biimidazole compounds, (f) ketoxime ester compounds, (g) borate compounds, (h) azinium compounds, (i) active ester compounds, (j) compounds containing a carbon-halogen linkage, and (k) pyridinium compounds. The followings indicate specific examples of the above items (a) to (k), which are not intended to limit the invention.

(a) Aromatic Ketones

As for the preferred aromatic ketones (a) which have the structure having polymerization initiating capability in the invention, compounds having the skeletal structure of benzophenone or of thioxanthone are included, which have been described in "RADIATION CURING IN POLYMER SCIENCE AND TECHNOLOGY", J. P. Fouassier, J. F. Rabek (1993), p.77–117. For example, the following compounds are exemplified.

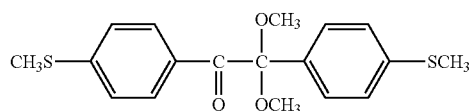

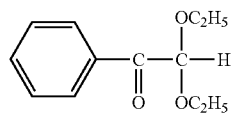

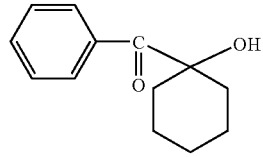

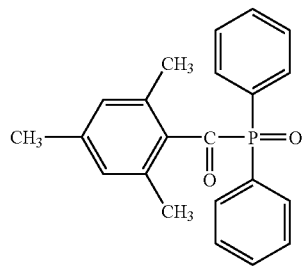

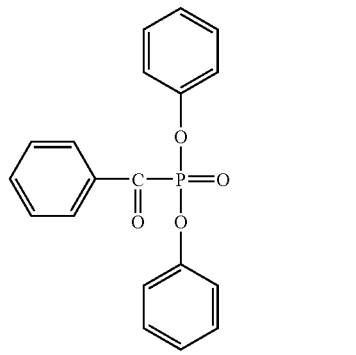

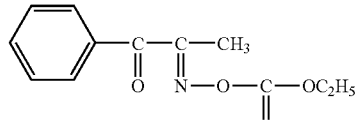

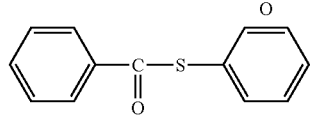

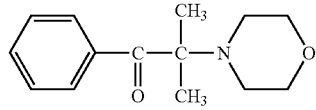

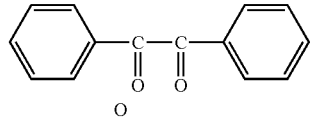

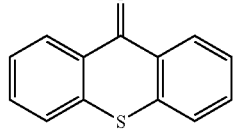

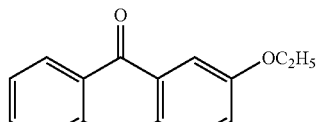

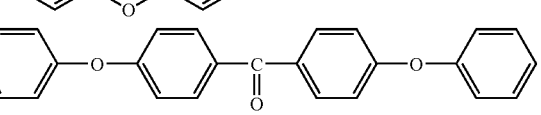

Examples of the particularly preferred aromatic ketones (a) are illustrated as follows.

α-Thiobenzophenone compounds as described in JP-B No.47-6416, and benzoin ether compunds as described in JP-B No.47-3981, for example, the following compound, are included.

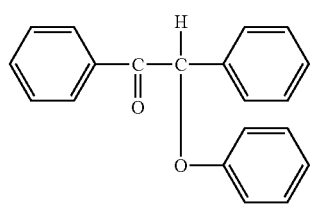

α-Substituted benzoin compounds, for example, the following compound, as described in JP-B No.47-22326, is included.

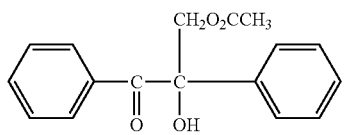

Benzoin derivatives as described in JP-B No.47-23664, aroylphosphonic acid esters as described in JP-A No.57-30704, dialkoxybenzophenones as described in JP-B No.60-26483, for example, the following compound, is exemplified.

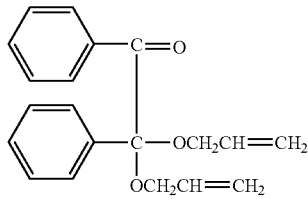

Benzoin ethers as described in JP-B No.60-26403 and JP-A No.62-81345, for example, the following compound, is exemplified.

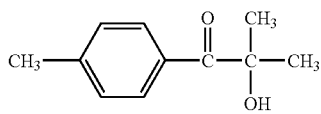

α-Aminobenzophenones, for example, the following compounds as described in JP-B No.1-34242, U.S. Pat. No. 4,318,791, and EP-B No.0,283,561 A1, are included.

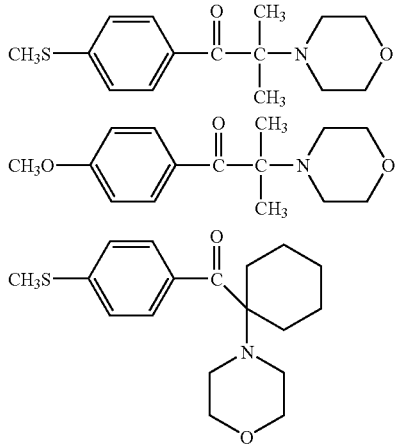

p-Di(dimethylaminobenzoyl)benzene as shown in the following formula, as described in JP-A No.2-211452, is exemplified.

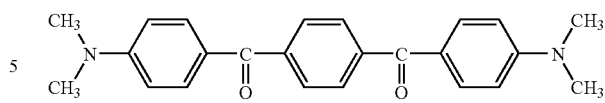

Thio-substituted aromatic ketones as described in JP-A No.61-194062, for example, the following compound, is exemplified.

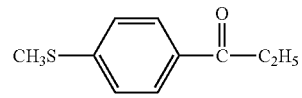

Acylphosphine sulfides as described in JP-B No.2-9597, for example, the following compounds are exemplified.

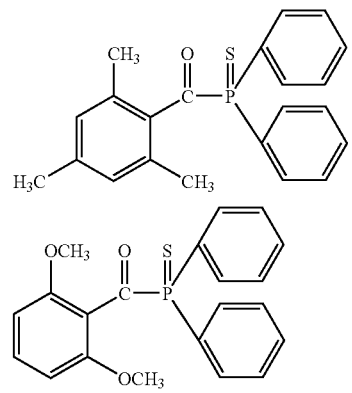

Acylphosphines as described in JP-B No.2-9596, for example, the following compounds are exemplified.

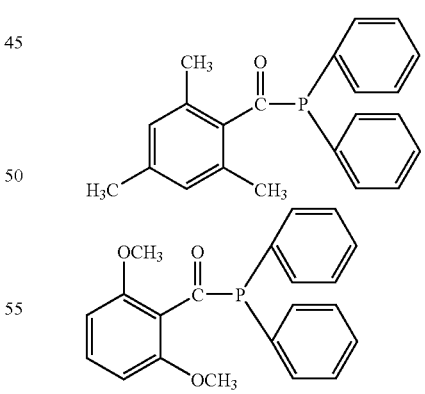

In addition, thioxanthones as described in JP-B No.63-61950 and coumalins as described in JP-B No.59-42864 are included.

(b) Oniumu Salt Compounds

As for the onium salt compounds (b) which are preferred as the structure having polymerization initiating capability in the invention, compounds as shown by the following general formulae (1) to (3) are included.

  General formula (1)

  General formula (2)

General formula (3)

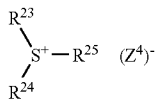

In the general formula (1), $Ar^1$ and $Ar^2$ each independently represents optionally substituted an aryl group of up to 20 carbon atoms. When the aryl group has a substituent or substituents, the preferred substituent includes halogen atoms, a nitro group, alkyl groups of up to 12 carbon atoms, alkoxy groups of up to 12 carbon atoms, or aryloxy groups of up to 12 carbon atoms. $(Z^2)^-$ represents a counter ion selected from the group consisting of halogen ions, perchlorate ions, carboxylate ions, tetrafluoroborate ions, hexafluorophosphate ions, and sulfonate ions, more preferably, perchlorate ions, hexafluorophosphate ions, and arylsulfonate ions.

In the general formula (2), $Ar^3$ represents an optionally substituted aryl group of up to 20 carbon atoms. The preferred substituent includes halogen atoms, a nitro group, alkyl groups of up to 12 carbon atoms, alkoxy groups of up to 12 carbon atoms, aryloxy groups of up to 12 carbon atoms, alkylamino groups of up to 12 carbon atoms, dialkylamino groups of up to 12 carbon atoms, arylamino groups of up to 12 carbon atoms, and diarylamino groups of up to 12 carbon atoms. $(Z^3)^-$ represents the same counter ion as $(Z^2)^-$.

In the general formula (3), $R^{23}$, $R^{24}$ and $R^{25}$ may be the same or different and each represents an optionally substituted hydrocarbon group of up to 20 carbon atoms. The preferred substituent includes halogen atoms, a nitro group, alkyl groups of up to 12 carbon atoms, alkoxy groups of up to 12 carbon atoms, or aryloxy groups of up to 12 carbon atoms. $(Z^4)^-$ represents the same counter ion as $(Z^2)^-$.

Specific example of the onium salt compound (b) preferably used in the invention includes those described in JP-A No.2001-133969, paragraph number [0030]-[10033]; JP-A No.2001-305734, paragraph number [0048]-[0052]; and JP-A No.2001-343742, paragraph number [0015]-[0046].

(c) Organic Peroxide Compounds

As for the organic peroxide compounds (c) which are preferred as the structure having polymerization initiating capability in the invention, almost all the organic compounds having one or more of oxygen-oxygen linkages within the molecule are included. Such compounds are exemplified by methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexanone, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl perioxide, bis(tert-butylperoxyisopropyl)benzene, 2,5-dimethyl-2,5-di(tert-butylperoxy)hexane, 2,5-hexanoyl peroxide, succinic peracid, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxycarbonate, dimethoxy isopropyl peroxycarbonate, di(3-methyl-3-methyoxybutyl)peroxydicarbonate, tert-butyl peroxyacetate, tert-butyl peroxy pivalate, tert-butyl peroxyneodecanoate, tert-butyl peroxyoctanoate, tert-butyl peroxy-3,5,5-trimethylhexanoate, tert-butyl peroxylaurate, tert-carbonate, 3,3',4,4'-tetra-(t-butyl peroxycarbonyl)benzophenone, 3,3',4,4'-tetra-(t-amyl peroxycarbonyl)benzophenone, 3,3',4,4'-tetra-(t-hexyl peroxycarbonyl)benzophenone, 3,3',4,4'-tetra-(t-octyl peroxycarbonyl)benzophenone, 3,3',4,4'-tetra-(cumyl peroxycarbonyl)benzophenone, 3,3',4,4'-tetra-(p-isopropylcumyl peroxycarbonyl)benzophenone, carbonyl di(t-butylperoxy dihydrogen diphthalate), and carbonyl di(t-hexylperoxy dihydrogen diphthalate).

Among these compounds, peroxy ester types of compounds such as 3,3',4,4'-tetra-(t-butyl peroxycarbonyl)benzophenone, 3,3',4,4'-tetra-(t-amyl peroxycarbonyl)benzophenone, 3,3',4,4'-tetra-(t-hexyl peroxycarbonyl)benzophenone, 3,3',4,4'-tetra-(t-octyl peroxycarbonyl)benzophenone, 3,3',4,4'-tetra-(cumyl peroxycarbonyl)benzophenone, 3,3',4,4'-tetra-(p-isopropylcumyl peroxycarbonyl)benzophenone, and di-t-butyl diperoxy isophthalate are preferably used.

(d) Thio Compounds

As for the thio compounds (d) which are preferred as the structure having polymerization initiating capability in the invention, compounds as shown by the following general formula (4) are included.

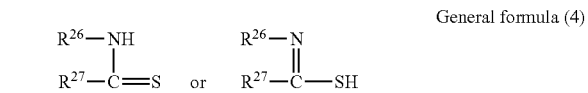  General formula (4)

wherein in the general formula (4), $R^{26}$ represents an alkyl group, an aryl group or a substituted aryl group; and $R^{27}$ represents a hydrogen atom or an alkyl group. Alternatively, $R^{26}$ and $R^{27}$ may bond with each other and represents a non-metallic atomic group necessary for forming a 5-to 7-membered ring which may contain a heteroatom selected from oxygen, sulfur and nitrogen atoms.

The alkyl group in the general formula (4) includes preferably those of 1 to 4 carbon atoms. The aryl group includes preferably those of 6 to 10 carbon atoms, such as phenyl or naphthyl. The substituted aryl group includes the above-mentioned aryl group substituted by halogen atom such as chlorine atom, alkyl group such as methyl, or alkoxy group such as methoxy or ethoxy. $R^{27}$ is preferably an alkyl group of 1 to 4 carbon atoms. Specific examples of the thio compounds of the general formula (4) include the following compounds shown in table 1.

TABLE 1

| No. | $R^{26}$ | $R^{27}$ |
|---|---|---|
| 1 | —H | —H |
| 2 | —H | —$CH_3$ |
| 3 | —$CH_3$ | —H |
| 4 | —$CH_3$ | —$CH_3$ |
| 5 | —$C_6H_5$ | —$C_2H_5$ |
| 6 | —$C_6H_5$ | —$C_4H_9$ |
| 7 | —$C_6H_4Cl$ | —$CH_3$ |

TABLE 1-continued

| No. | R²⁶ | R²⁷ |
|---|---|---|
| 8 | —C₆H₄Cl | —C₄H₉ |
| 9 | —C₆H₄—CH₃ | —C₄H₉ |
| 10 | —C₆H₄—OCH₃ | —CH₃ |
| 11 | —C₆H₄—OCH₃ | —C₂H₅ |
| 12 | —C₆H₄—OC₂H₅ | OH3 |
| 13 | —C₆H₄—OC₂H₅ | —C₂H₅ |
| 14 | —C₆H₄—OCH₃ | —C₄H₉ |
| 15 | —(CH₂)₂— | |
| 16 | —(CH₂)₂—S— | |
| 17 | —CH(CH₃)—CH—S— | |
| 18 | —CH₂—CH(CH₃)—S— | |
| 19 | —C(CH₃)₂—CH₂—S— | |
| 20 | —CH₂—O(CH₃)₂—S— | |
| 21 | —(CH₂)₂—O— | |
| 22 | —CH(CH₃)—CH₂—O— | |
| 23 | —C(CH₃)₂—CH₂—O— | |
| 24 | —CH═CH—N(CH₃)— | |
| 25 | —(CH₂)₃—S— | |
| 26 | —(CH₂)₂—CH(CH₃)—S— | |
| 27 | —(CH₂)₃—O— | |
| 28 | —(CH₂)₅— | |
| 29 | —C₆H₄—O— | |
| 30 | —N═C(SCH₃)—S— | |
| 31 | —C₆H₄—NH— | |
| 32 | 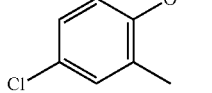 | |

(e) Hexaarylbiimidazole Compounds

As for the hexaaryl biimidazole compounds (e) which are preferred as the structure having polymerization initiating capability in the invention, lophine dimers as described in JP-B Nos. 45-37377 and 44-86516 are included. Such dimers are exemplified by 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5, 5'-tetraphenylbiimidazole, 2,2'-bis(o-chlorophenyl)-4,4',5, 5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and the like.

(f) Ketoxime Ester Compounds

The ketoxime ester compounds (f) which are preferred as the structure having polymerization initiating capability in the invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyminobutan-2-one, 2-ethoxycarbonyloxyimino-1-phenylpropan-1-one, and the like.

(g) Borate Compounds

As for the borate compounds (g) which are preferred as the structure having polymerization initiating capability in the invention, compounds as shown by the following general formula (5) are included.

General formula (5)

$$R^{28}-\underset{\underset{R^{30}}{|}}{\overset{\overset{R^{29}}{|}}{B^-}}-R^{31} \quad (Z^5)^+$$

wherein in the general formula (5), $R^{28}$, $R^{29}$, $R^{30}$ and $R^{31}$ may be the same or different and each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group; two or more of $R^{28}$, $R^{29}$, $R^{30}$ and $R^{31}$ may bond with each other to form a cyclic structure; however, at least one of $R^{28}$, $R^{29}$, $R^{30}$ and $R^{31}$ is a substituted or unsubstituted alkyl group. $(Z^5)^+$ represents an alkali metal cation or a quaternary ammonium cation.

As the alkyl group of $R^{28}$ to $R^{31}$, straight chain, branched chain or cyclic alkyl groups of 1 to 18 carbon atoms are preferably included. Specific examples include methyl, ethyl, propyl, isopropyl, butyl, pentyl, hexyl, octyl, stearyl, cyclobutyl, cyclopentyl, cyclohexyl, and the like. The substituted alkyl group, as mentioned above, includes those substituted by halogen atom (e.g., —Cl, —Br), cyano, nitro, aryl group (preferably, phenyl), hydroxy, —COOR³² (wherein R³² is a hydrogen atom, an alkyl group of 1 to 14 carbon atoms, or aryl group), —OCOR³³ or —OR³⁴ (wherein R³³ and R³⁴ each represents an alkyl group of 1 to 14 carbon atoms, or an aryl group), and those having a group or groups of the following formula as substituent.

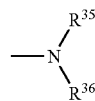

wherein $R^{35}$ and $R^{36}$ each independently represents a hydrogen atom, an alkyl group of 1 to 14 carbon atoms, or an aryl group.

The aryl group of $R^{28}$ to $R^{31}$ includes mono- to tri-cyclic aryl groups such as phenyl and naphthyl. The substituted aryl group includes the aryl groups substituted by a substituent or substituents as mentioned in the substituted alkyl group, or by an alkyl group or groups of 1 to 14 carbon atoms. The alkenyl group of $R^{28}$ to $R^{31}$ includes a straight chain, a branched chain or cyclic alkenyl groups of 2 to 18 carbon atoms. The substituent in the substituted alkenyl group includes those as mentioned as substituents in the substituted alkyl groups. The alkynyl group of $R^{28}$ to $R^{31}$ includes a straight chain or a branched chain alkynyl groups of 2 to 28 carbon atoms, and the substituent in the substituted alkynyl group includes those as mentioned as substituents in the substituted alkyl groups. The heterocyclic group of $R^{28}$ to $R^{31}$ includes 5-membered or larger, preferably 5- to 7-membered heterocyclic groups containing at least one of N, S and O, which heterocyclic groups may contain a condensed ring or rings. These heterocyclic groups may contain a substituent or substituents exemplified as the substituents in the substituted aryl groups. Specific examples of the compounds of the general formula (5) include those as described in U.S. Pat. Nos. 3,567,453 and 4,343,891, and European Patent Nos.109,772 and 109,773, and those as described below.

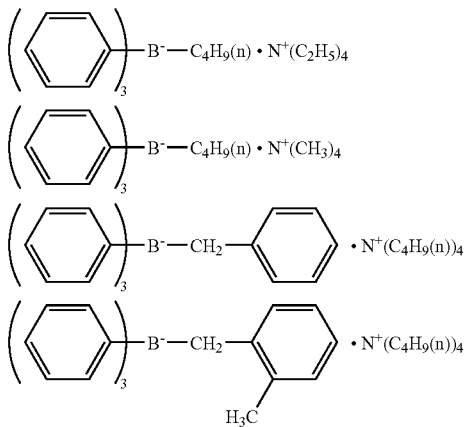

(h) Azinium Compounds

As for the azinium salt compounds (h) which are preferred as the structure having polymerization initiating capability in the invention, compounds containing an N—O linkage as described in JP-A Nos. 63-138345, 63-142345, 63-142346 and 63-143537 and JP-B No.46-42363 are included.

(i) Active Ester Compounds

As for the active ester compounds (i) which are preferred as the structure having polymerization initiating capability in the invention, imidosulfonate compounds as described in JP-B No.62-6223 and active sulfonates as described in JP-B No.63-14340 and JP-A No.59-174831 are included.

(j) Compounds Containing a Carbon-Halogen Linkage

As for the compounds containing a carbon-halogen linkage (j) which are preferred as the structure having polymerization initiating capability in the invention includes: compounds as shown by the following general formulae (6) to (9), carbonylmethylene heterocyclic compounds having a trihalogenomethyl group represented by the general formula (10), 4-Halogeno-5-(halogenomethyl-phenyl)-oxazole derivatives represented by the general formula (11), and 2-(Halogenomethyl-phenyl)-4-halogeno-oxazole derivatives represented by the general formula (12).

General formula (6):

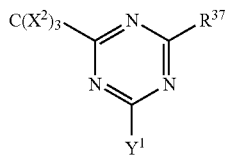

wherein in the general formula (6), $X^2$ represents a halogen atom; $Y^1$ represents —$C(X^2)_3$, —$NH_2$, —$NHR^{38}$, —$NR^{38}$, or —$OR^{38}$; $R^{38}$ represents an alkyl group, a substituted alkyl group, an aryl group, or a substituted aryl group; $R^{37}$ represents —$C(X^2)_3$, an alkyl group, a substituted alkyl group, an aryl group, substituted aryl group, or substituted alkenyl group.

General formula (7):

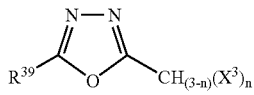

wherein in the general formula (7), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro gtoup, or a cyano group; $X^3$ represents a halogen atom; and n indicates an integer of 1 to 3.

$$R^{40}—Z^6-CH_{(2-m)}(X^3)_m R^{41} \quad \text{General formula (8)}$$

wherein in the general formula (8), $R^{40}$ represents an aryl group or a substituted aryl group; $R^{41}$ represents a group as mentioned below or halogen; and $Z^6$ represents —C(=O)—, —C(=S)— or —$SO_2$—. $X^3$ represents a halogen atom; and m represents 1 or 2.

wherein $R^{42}$ and $R^{43}$ each represents an alkyl group, a substituted alkyl group, an alkenyl group, a substituted alkenyl group, an aryl group, or a substituted aryl group; and $R^{44}$ has the same meanings as $R^{38}$ in the formula (6).

General formula (9):

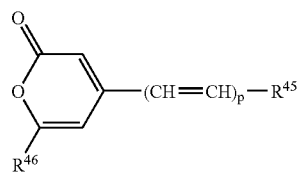

wherein in the general formula (9), $R^{45}$ represents an optionally substituted aryl group or a heterocyclic group; $R^{46}$ represents a trihaloalkyl group of 1 to 3 carbon atoms or a trihaloalkenyl group; and p represents 1, 2 or 3.

General formula (10):

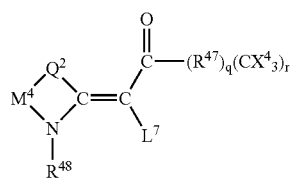

wherein in the general formula (10), $L^7$ represents a hydrogen atom or a substituent of the formula: CO—$(R^{47})_q(C(X^4)_3)_r$; $Q^2$ represents a sulfur, selenium or oxygen atom, a dialkylmethylene group, an alken-1,2-ylene group, a 1,2-phenylene group or a N—R group; $M^4$ represents a substituted or an unsubstituted alkylene or an alkenylene group, or a 1,2-arylene group; $R^{48}$ represents an alkyl group, an aralkyl group or an alkoxyalkyl group; $R^{47}$ represents a carbocyclic or a heterocyclic divalent aromatic group; $X^4$ represents a chlorine, bromine or iodine atom; and q=0 and r=1, or q=1 and r=1 or 2.

General formula (11):

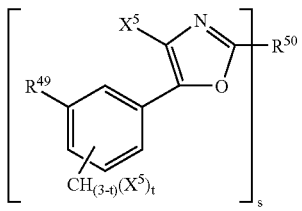

wherein in the general formula (11), $X^5$ represents a halogen atom; t indicates an integer of 1 to 3; s indicates an integer of 1 to 4; $R^{49}$ represents a hydrogen atom or a $CH_{3-t}X^5_t$ group; and $R^{50}$ represents an optionally substituted s-valent unsaturated organic group.

General formula (12):

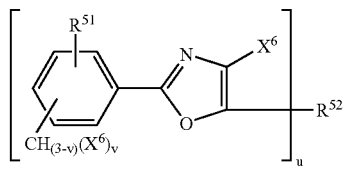

wherein in the general formula (12), $X^6$ represents a halogen atom; v indicates an integer of 1 to 3; u indicates an integer of 1 to 4; $R^{51}$ represents a hydrogen atom oran $CH_{3-v}X^6_v$ group; and $R^{52}$ represents an optionally substituted u-valent unsaturated organic group.

Specific examples of the compounds containing a carbon-halogen linkage include, for example, compounds as described in Wakabayashi, et al., Bull. Chem. Soc. Japan, 42, 2924 (1969), for example, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, 2-(α,α,β-trichloroethyl)-4,6-bis(trichloromethyl)-S-triazine, and the like. In addition, compounds as described in British Patent No. 1,388,492, for example, 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine, 2-(p-methoxystyryl)-4-amino-6-trichloromethyl-S-triazine, and the like; compounds as described in JP-A No.53-133428, for example, 2-(4-methoxy-naphth-1-yl)-4,6-bis-trichloromethyl-S-triazine, 2-(4-ethoxy-naphth-1-yl)-4,6-bis(trichloromethyl)-S-triazine, 2-[4-(2-ethoxyethyl)-naphth-1-yl]-4,6-bis(trichloromethyl)-S-triazine, 2-(4,7-dimethoxy-naphth-1-yl)-4,6-bis-trichloromethyl-S-triazine, 2-(acenaphth-5-yl)-4,6-bis-trichloromethyl-S-triazine, and the like; and compounds as described in German Patent No.3337024, for example, compounds as described below, are included.

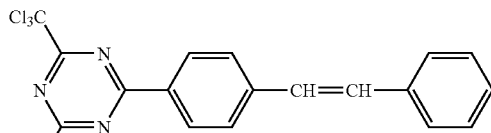

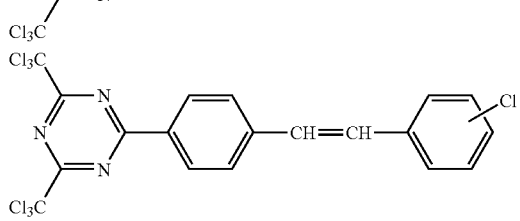

In addition, compounds as described in F. C. Schaefer, et al., J. Org. Chem., 29, 1527 (1964), for example, 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine, 2-methoxy-4-methyl-6-trichloromethyl-S-triazine, and the like, are included. In addition, the following compounds as described in JP-A No.62-58241 are exemplified.

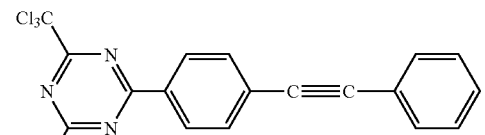

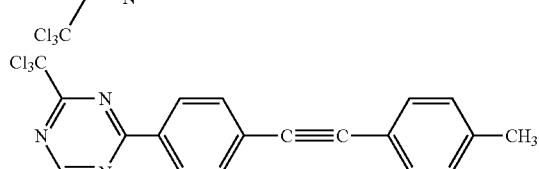

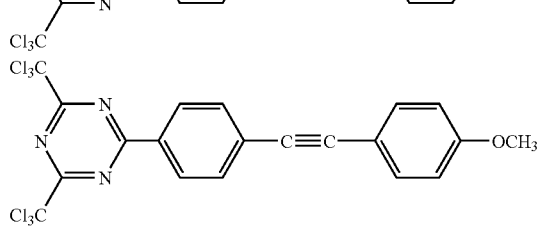

In addition, the following compounds as described in JP-A No.5-281728 are exemplified.

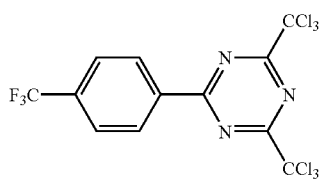

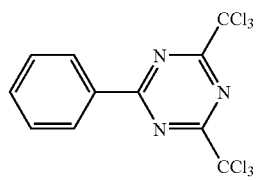

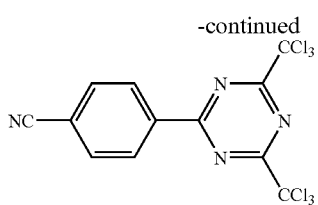

Moreover, a group of compounds which can readily be synthesized by a person skilled in the art according to the synthetic process as described in M. P. Hutt, E. F. Elslager and L. M. Herbel, Journal of Heterocyclic Chemistry, vol.7 (No.3), p.511 (1970), for example, the following compounds are exemplified.

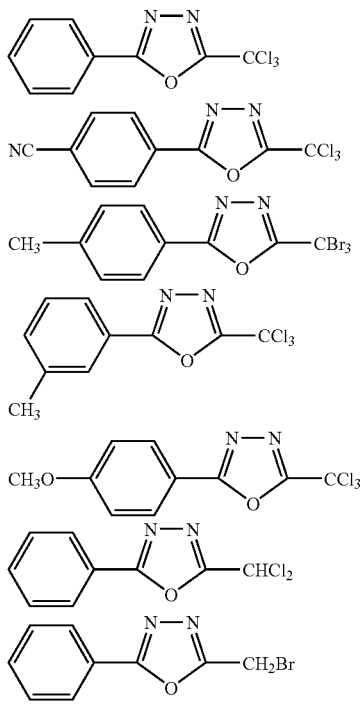

(k) Pyridinium Compounds

As for the pyridinium compounds (k) which are preferred as the structure having polymerization initiating capability in the invention, compounds as shown by the following general formula (13) are included.

General formula (13):

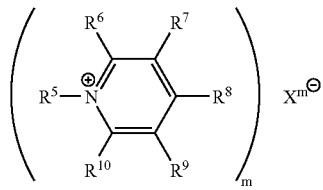

wherein in the general formula (13), preferably, $R^5$ represents a hydrogen atom, an alkyl group, a substituted alkyl group, an aryl group, a substituted aryl group, an alkenyl group, a substituted alkenyl group, an alkynyl group, or a substituted alkynyl group; $R^6$, $R^7$, $R^8$, $R^9$ and $R^{10}$ may be the same or different and each represents a hydrogen atom, a halogen atom or a mono-valent organic residue, and at least one of them has a group of the structure represented by the following general formula (14). Alternatively, $R^5$ and $R^6$, $R^5$ and $R^{10}$, $R^6$ and $R^7$, $R^7$ and $R^8$, $R^8$ and $R^9$, and $R^9$ and $R^{10}$ may bond with each other to form a ring. X represent a counter anion. m indicates an integer of 1 to 4)

General formula (14):

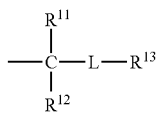

wherein in the general formula (14), $R^{12}$ and $R^{13}$ each independently represents a hydrogen atom, a halogen atom, an alkyl group, a substituted alkyl group, an aryl group, a substituted aryl group, an alkenyl group, a substituted alkenyl group, an alkynyl group, or a substituted alkynyl group; and $R^{11}$ represents a hydrogen atom, an alkyl group, a substituted alkyl group, an aryl group, a substituted aryl group, an alkenyl group, a substituted alkenyl group, an alkynyl group, a substituted alkynyl group, a hydroxyl group, a substituted oxy group, a mercapto group, a substituted thio group, an amino or substituted amino group. Alternatively, $R^{12}$ and $R^{13}$, $R^{11}$ and $R^{12}$, and $R^{11}$ and $R^{13}$ may bond with each other to form a ring. L represents a divalent linkage group containing a hetero atom)

In the general formula (13), as $R^5$, $R^6$, $R^7$, $R^8$ and $R^9$, any one of a hydrogen atom, a halogen atom, an alkyl group, a substituted alkyl group, an aryl group, a substituted aryl group, an alkenyl group, a substituted alkenyl group, an alkynyl group, a substituted an alkynyl group, a hydroxyl group, a substituted oxy group, a mercapto group, a substituted thio group, a amino group, a substituted amino group, a substituted carbonyl group, a sulfo group, a sufonato group, a substituted sulfinyl group, a substituted sulfonyl group, a phosphono group, a substituted phosphono group, a phosphonato group, a cyano group, a nitro group, and a silyl group, may preferably be used independently. Alternatively, $R^5$ and $R^6$, $R^5$ and $R^{10}$, $R^6$ and $R^7$, $R^7$ and $R^8$, $R^8$ and $R^9$, and $R^9$ and $R^{10}$ may bond with each other to form a ring.

Next, the preferred examples of $R^5$ in the general formula (13) will be explained in detail. The followings show the preferred examples of alkyl group, substituted alkyl group, aryl group, substituted aryl group, alkenyl group, substituted alkenyl group, alkynyl group, or substituted alkynyl group.

The alkyl group includes straight chain, branched chain or cyclic alkyl groups of 1 to 20 carbon atoms, specifically, for example, methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, 2-norbornyl, and the like. Among these groups, straight chain alkyl groups of 1 to 12 carbon atoms, branched chain alkyl groups of 3 to 12 carbon atoms, and cyclic alkyl groups of 5 to 10 carbon atoms are preferred.

The substituted alkyl is construted by bonding a substituent or substituents to an alkylene group, and as the substituent a mono-valent non-metal atomic group except hydrogen is used, including preferably, halogen atom (—F, —Br, —Cl, —I), hydroxyl, alkoxy group, aryloxy group, mercapto, alkylthio group, arylthio group, alkyldithio group, aryldithio group, amino, N-alkylamino group, N,N-dialkylamino group, N-arylamino group, N,N-diarylamino group, N-alkyl-N-arylamino group, acyloxy group, carbamoyloxy, N-alkylcarbamoyloxy group, N-arylcarbamoyloxy group, N,N-dialkylcarbamoyloxy group, N,N-diarylcarbamoyloxy group, N-alkyl-N-arylcarbomoyloxy group, alkylsulfoxy group, arylsulfoxy group, acylthio group, acylamino group, N-alkylacylamino group, N-arylacylamino group, ureido, N'-alkylureido, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl, acyl group, carboxyl and its conjugate base (hereinafter referred to as carboxylate), alkoxycarbonyl group, aryloxycarbonyl group, carbamoyl, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo (—SO$_3$H) and its conjugate base (hereinafter referred to as sulfonato), alkoxysulfonyl group, aryloxysulfonyl group, sulfinamoyl, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl, N-alkylsulfamoyl group, N,N-dialkylsulfamoyl group, N-arylsulfamoyl group, N,N-diarylsulfamoyl group, N-alkyl-N-arylsulfamoyl group, N-acylsulfamoyl group and its conjugate base, N-alkylsulfonylsulfamoyl (—SO$_2$NHSO$_2$(alkyl)) and its conjugate base, N-allylsulfonylsulfamoyl (—SO$_2$NHSO$_2$(allyl)) and its conjugate base, N-alkylsulfonylcarbamoyl group (—CONHSO$_2$(alkyl)) and its conjugate base, N-allylsulfonylcarbamoyl (—CONHSO$_2$(allyl)) and its conjugate base, alkoxysilyl group (—Si(O-alkyl)$_3$), allyloxysilyl group (—Si(O-allyl)$_3$), hydroxysilyl (—Si(OH)$_3$) and its conjugate base, phosphono (—PO$_3$H$_2$) and its conjugate base (hereinafter referred to as phosphonato), dialkylphosphono group (—PO$_3$(alkyl)$_2$), diarylphosphono group (—PO$_3$(aryl)$_2$), alkylarylphosphono group (—PO$_3$(alkyl)(aryl), monoalkylphosphono group (—PO$_3$H(alkyl)) and its conjugate base (hereinafter referred to as alkylphosphonato group), monoarylphosphono group (—PO$_3$H(aryl)) and its conjugate base (hereinafter referred to as arylphosphonato group), phosphonooxy (—OPO$_3$H$_2$) and its conjugate base (hereinafter referred to as phosphonatooxy), dialkylphosphonooxy group (—OPO$_3$(alkyl)$_2$), diarylphosphonooxy (—OPO$_3$(aryl)$_2$), alkylarylphosphonooxy group (—OPO$_3$(alkyl)(aryl)), monoalkylphosphonooxy (—OPO$_3$H(alkyl)) and its conjugate base (hereinafter referred to as alkylphosphonatooxy group), monoarylphosphonooxy group (—OPO$_3$H(aryl)) and its conjugate base (hereinafter referred to as arylphosphonatooxy group), cyano, nitro, aryl group, alkenyl group, and alkynyl group.

Specific examples of the alkyl groups in these substituents include the alkyl groups as mentioned above. Specific examples of the aryl groups include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl, phosphonatophenyl, and the like. The alkenyl group includes, for example, vinyl, 1-propenyl, 1-butenyl, cinnamyl, 2-chloro-1-ethenyl, and the like. The alkynyl group includes, for example, ethynyl, 1-propynyl, 1-butynyl, trimethylsilylethynyl, phenylethynyl, and the like.

As for the acyl group (R$^4$CO—), those in which R$^4$ is a hydrogen atom, or alkyl group, aryl group, alkenyl group or alkynyl group as mentioned above are exemplified.

On the other hand, as the alkylene group in the substituted alkyl group, those derived from the alkyl groups of 1 to 20 carbon atoms from which any one of hydrogen atoms is removed to give divalent organic residues, are included. Such alkylene group includes, preferably, straight chain alkylene groups of 1 to 12 carbon atoms, branched chain alkylene groups of 3 to 12 carbon atoms, and cyclic alkylene groups of 5 to 10 carbon atoms.

The preferred substituted alkyl groups are specifically exemplified by chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

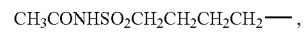

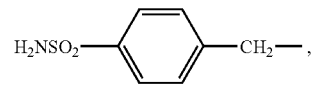

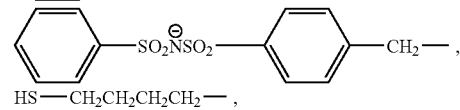

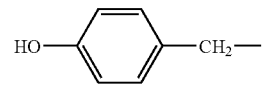

phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonooxypropyl, phosphonatooxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl, 3-butynyl, and the like.

The aryl groups are exemplified by rings or condensed rings formed by 1 to 3 benzene rings or by a benzene ring and a 5-membered unsaturated ring, specifically including phenyl, naphthyl, anthryl, phenanthryl, indenyl, acenaphthenyl, fluorenyl, and the like, with phenyl and naphthyl being preferred.

The substituted aryl group means those in which a substitutent or substituents are bonded to aryl groups, wherein as the substituent a mono-valent non-metal atomic group attached to the carbon atom of the aryl ring except hydrogen is used. The preferred substituent is exemplified by the alkyl groups or substituted alkyl groups as mentioned above and the same substituents as those in the substituted alkyl groups as mentioned above.

Preferred specific examples of these substituted aryl groups include biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allyl, 1-propenylmethyl, 2-butenyl, 2-methylallylphenyl, 2-methylpropenylphenyl, 2-propynylphenyl, 2-butynylphenyl, 3-butynylphenyl, and the like.

The alkenyl group includes those as mentioned above. The substituted alkenyl groups means those in which a hydrogen atom on the alkenyl group is replaced by a substituent. As such a substituent the substituent in the substituted alkyl group may be used, and as the alkenyl groups those as mentioned above may be used. The preferred substituted alkenyl groups are exemplified by the following groups.

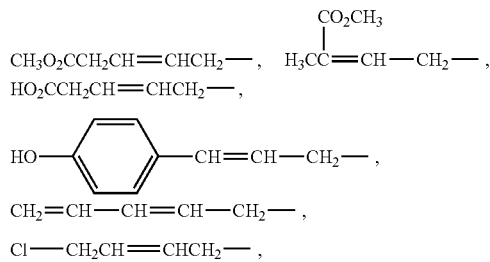

-continued

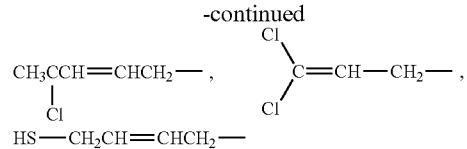

The alkynyl group includes those as mentioned above. The substituted alkynyl group means that in which a hydrogen atom on the alkynyl group is replaced by a substituent. As such a substituent the substituent in the substituted alkyl group may be used, and as the alkynyl groups those as mentioned above may be used.

Next, preferred examples of $R^6$, $R^7$, $R^8$, $R^9$ and $R^{10}$ in the general formula (13) will be explained in detail except the structure represented by the general formula (14). As the halogen atom, fluorine, chlorine, bromine and iodine atoms are preferred. The preferred alkyl, substituted alkyl, aryl, substituted aryl, alkenyl, and substituted alkenyl groups are exemplified by those as exemplified in $R^5$.

As for the substituted oxy group ($R^{14}O$—), those in which $R^{14}$ is a mono-valent non-metal atomic group other than hydrogen atom may be used. The preferred substituted oxy group includes alkoxy group, aryloxy group, acyloxy group, carbamoyloxy, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, phosphonooxy, and phosphonatooxy. The alkyl and aryl groups in these groups are exemplified by those as mentioned above as alkyl, substituted alkyl, aryl and substituted aryl groups. As for the acyl group ($R^{15}CO$—) in the acyloxy group, those in which $R^{15}$ is the alkyl, substituted alkyl, aryl and substituted aryl groups as mentioned above may be used. Among these substituents, the alkoxy group, aryloxy group, acyloxy group and arylsulfoxy group are particularly preferred.

Specific examples of the preferred substituted oxy groups include methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonooxy, phosphonatooxy, and the like.

As for the substituted thio group ($R^{16}S$—), those in which $R^{16}$ is a mono-valent non-metal atomic group other than hydrogen atom may be used. The preferred substituted thio group includes alkylthio group, arylthio group, alkyldithio group, aryldithio group, and acylthio group. The alkyl and aryl groups in these groups are exemplified by those as mentioned above as alkyl, substituted alkyl, aryl and substituted aryl groups. $R^{15}$ of the acyl group ($R^{15}CO$—) in the acylthio group is as mentioned above. Among them, the alkylthio and arylthio groups are particularly preferred. The preferred substituted thio groups are specifically exemplified by methylthio, ethylthio, phenylthio, ethoxyethylthio, carboxyethylthio, methoxycarbonylthio, and the like.

As for the substituted amino group ($R^{17}NH$—, $(R^{18})(R^{19})N$—), those in which $R^{17}$, $R^{18}$ and $R^{19}$ are mono-valent non-metal atomic groups other than hydrogen atom may be used. The preferred substituted amino groups are exemplified by N-alkylamino grup, N,N-dialkylamino group, N-arylamino group, N,N-diarylamino group, N-alkyl-N-arylamino group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-arlkylureido group, N'-aryl-N-arylureido group, N',N'-diaryl-N-alkylureido group, N',N'-diaryl-N-arylureido group, N'-alkyl-N'-aryl-N-alkyluriedo group, N'-alkyl-N'-aryl-N-arylureido group, alkoxycarbonylamino group, aryloxycarbonylamino group, N-alkyl-N-alkoxycarbonylamino group, N-alkylamino-N-aryloxycarbonylamino group, N-aryl-N-alkoxycarbonylamino group, and N-aryl-N-aryloxycarbonylamino group. In these groups, the alkyl groups and the aryl groups are exemplified by the above-mentioned alkyl groups, substituted alkyl groups, as well as aryl groups and substituted aryl groups as mentioned above. $R^{15}$ of the acyl groups ($R^{15}CO—$) in the acylamino, N-alkylacrylamino, and N-arylacylamino groups is the same as mentioned above.

Among them, particularly preferred are N-alkylamino group, N,N-dialkylamino group, N-arylamino group, and acylamino group, specifically including methylamino, ethylamino, diethylamino, morpholino, piperidino, peperazino, pyrrolidino, phenylamino, benzoylamino, acetylamino, and the like.

As for the substituted carbonyl group ($R^{20}—CO—$), those in which $R^{20}$ is a mono-valent non-metal atomic group can be used. Example of the preferred substituted carbonyl group includes formyl, acyl groups, carboxyl, alkoxycarbonyl groups, aryloxycarbnyl groups, carbamoyl, N-alkylcarbamoyl groups, N,N-dialkylcarbamoyl groups, N-arylcarbamoyl groups, N,N-diarylcarbamoyl groups, and N-alkyl-N-arylcarbamoyl groups. In these groups, the alkyl groups and the aryl groups are exemplified by the above-mentioned alkyl groups, substituted alkyl groups, as well as aryl groups and substituted aryl groups as mentioned above.

Among them, particularly preferred substituents are formyl, acyl group, alkoxycarbonyl group, aryloxycarbonyl group, carbamoyl, N-alkylcarbamoyl group, N',N-dialkylcarbamoyl group, and N-arylcarbamoyl group. Even more preferred are formyl, acyl group, carboxyl, alkoxycarbonyl group, and aryloxycarbonyl group. Specific example of the preferred substituted sulfinyl group includes formyl, acetyl, benzoyl, carboxyl, methoxycarbonyl, allyloxycarbonyl, N-methylcarbamoyl, N-phenylcarbamoyl, N,N-diethylcarbamoyl, morpholinocarbonyl, and the like.

As for the substituted sulfinyl group ($R^{21}—SO—$), those in which $R^{21}$ is a mono-valent non-metal atomic group can be used. Example of the preferred substituted sulfinyl group includes alkylsulfinyl groups, arylsulfinyl groups, sulfinamoyl, N-alkylsulfinamoyl groups, N,N-dialkylsulfinamoyl groups, N-arylsulfinamoyl groups, N,N-diarylsulfinamoyl groups, and N-alkyl-N-arylsulminamoyl groups. In these groups, the alkyl group and the aryl group are exemplified by the above-mentioned alkyl group, substituted alkyl group, as well as aryl group and substituted aryl group. Among them, particularly preferred groups are specifically exemplified by hexylsulfinyl, benzylsulfinyl, tolylsulfinyl, and the like.

As for the substituted sulfonyl group ($R^{25}—SO_2—$), those in which $R^{25}$ is a mono-valent non-metal atomic group can be used. Example of the preferred substituted sulfonyl group includes alkylsulfonyl groups and arylsulfonyl groups. In these groups, the alkyl group and the aryl group are exemplified by the above-mentioned alkyl group, substituted alkyl group, as well as aryl group and substituted aryl group. Specific example of the substituted sulfonyl group includes butylsulfonyl, chlorophenylsulfonyl, and the like.

Sulfonato ($SO_3^-$), as mentioned above, means a conjugate base anion of sulfo ($—SO_3H$). Usually, it is preferably used together with a counter cation. Such a counter cation includes those known publicly, that is, a variety of oniums (ammonium, sulfonium, phosphonium, iodonium, azinium, etc.) as well as metal ions ($Na^+$, $K^+$, $Ca^{2+}$, $Zn^{2+}$, etc.).

The substituted phosphono group means phosphono of which one or two of hydroxyl groups is replaced by another organic oxo group, preferably including the above-mentioned dialkylphosphono group, diarylsulfono group, alkylarylphosphono group, monoalkylphosphono group, and monoarylphosphono group. Among them, dialkylphosphono group and diarylphosphono group are particularly preferred. Such a specific example includes diethylphosphono, dibutylphosphono, diphenylphosphono, and the like.

The phosphonato ($—PO_3^{2-}$, $—PO_3H^-$), as mentioned above, means a conjugate base anion derived from the acid primary dissociation or acid secondary dissociation of phosphono ($—PO_3H_2$). In general this is preferably used together with a counter cation. Such a counter cation includes those known publicly, that is, a variety of oniums (ammonium, sulfonium, phosphonium, iodonium, azinium, etc.) as well as metal ions ($Na^+$, $K^+$, $Ca^{2+}$, $Zn^{2+}$, etc.).

The substituted phosphonato group means a conjugate base anion in which one of the hydroxyl groups in the substituted phosphono group is replaced by an organic oxo group, specifically including the conjugate base of the above-mentioned mono-alkylphosphono group ($—PO_3H$(alkyl)) or mono-arylphosphono group ($—PO_3H$(aryl)). In general this is preferably used together with a counter cation. Such a counter cation includes those known publicly, that is, a variety of oniums (ammonium, sulfonium, phosphonium, iodonium, azinium, etc.) as well as metal ions ($Na^+$, $K^+$, $Ca^{2+}$, $Zn^{2+}$, etc.).

As for the silyl group (($R^{23}$)($R^{24}$)($R^{25}$)Si—)), those in which $R^{23}$, $R^{24}$ and $R^{25}$ are mono-valent non-metal atomic groups can be used, preferably including the above-mentioned alkyl group, substituted alkyl group, aryl group, and substituted aryl group. The preferred silyl group is exemplified by trimethylsilyl, tributylsilyl, t-butyldimethylsilyl, dimethylphenylsilyl, and the like.

Among the examples of $R^6$, $R^7$, $R^8$, $R^9$ and $R^{10}$ as mentioned above, more preferred one is exemplified by hydrogen atom, halogen atom (—F, —Cl, —Br, —I), alkyl group, substituted alkyl group, aryl group, substituted aryl group, substituted oxy group, substituted thio group, substituted amino group, substituted carbonyl group, sulfo, sulfonato, and cyano, and even more preferred one includes hydrogen atom, halogen atom, alkyl group, substituted group, aryl group, and substituted carbonyl group.

The followings show examples of the rings formed by each other's linkage of $R^5$ and $R^6$, $R^5$ and $R^{10}$, $R^6$ and $R^7$, $R^7$ and $R^8$, $R^8$ and $R^9$, or $R^9$ and $R^{10}$. Such examples include saturated or unsaturated aliphatic ring formed by each other's linkage of $R^5$ and $R^6$, $R^5$ and $R^{10}$, $R^6$ and $R^7$, $R^7$ and $R^8$, $R^8$ and $R^9$, or $R^9$ and $R^{10}$. Preferably, they may be taken together with the carbon atom to which they are bonded to form a 5-, 6-, 7- or 8-membered aliphatic ring. Even more preferred are 5- and 6-membered aliphatic rings. These rings may have a sutstituent or substituents on the carbon atom or atoms constituting them (the substituents are exemplified by those in the substituted alkyl groups exemplified by $R^8$ and $R^{11}$). A part of the ring-constituting carbons may be substituted by a hetero atom or atoms (oxygen atom, sulfur atom, nitrogen atom, etc.). Additionally, a part of the aliphatic ring may form a part of the aromatic ring. Specific examples of the preferred rings include cyclopentane, cyclohexane, cycloheptane, cyclooctane, cyclo-1,3-dioxapentane, cyclopentene, cyclohexene, cycloheptene, cyclooctene, cyclo-1,3-dioxapentene, cyclo-1,3-dioxahexene, cyclohexadiene, benzocyclohexene, benzocyclohexadiene, tetrahydropyranone, and the like.

Examples of the aromatic rings formed by each other's linkage of $R^6$ and $R^7$, $R^7$ and $R^8$, $R^8$ and $R^9$, or $R^9$ and $R^{10}$ include those which are formed together with a pyridine ring containing the carbon atom involved in the linkage, exemplified by quinoline, isoquinoline, acridine, phenanthridine, benzquinoline, and benzisoquinoline, with quinoline ring being preferred. These may have a substituent or substituents on the constituting carbon atom or atoms (the substituents are exemplified by those in the substituted alkyl groups as mentioned above).

The followings indicate examples of the preferred groups of $R^{12}$ and $R^{13}$ in the general formula (14) in detail. As the halogen atom, fluorine, chlorine, bromine and iodine are preferred. As for the examples of the preferred alkyl group, substituted alkyl group, aryl group, substituted aryl group, alkenyl group, substituted alkenyl group, alkynyl group, or substituted alkynyl group, those mentioned in $R^5$ are exemplified. Particularly preferred ones of $R^{12}$ and $R^{13}$ are hydrogen atom and alkyl group.

The followings indicate examples of the preferred groups of $R^{11}$ in the general formula (14) in details. As for the examples of the preferred alkyl group, substituted alkyl group, aryl group, substituted aryl group, alkenyl group, substituted alkenyl group, alkynyl group, substituted alkynyl group, hydroxyl group, substituted oxy group, mercapto, substituted thio group, amino, and substituted amino group, those mentioned in $R^5$, $R^6$, $R^7$, $R^8$, $R^9$ and $R^{10}$ are exemplified. Particularly preferred ones of $R^{11}$ are alkyl group, substituted alkyl group, aryl group, substituted aryl group, and alkenyl group.

$R^{12}$ and $R^{13}$, $R^{11}$ and $R^{12}$, or $R^{11}$ and $R^{13}$ may bond with each other to form a saturated or unsaturated aliphatic ring. Preferably, they taken with the carbon atom to which they are bonded may form a 5-, 6-, 7- or 8-membered aliphatic ring. Even more preferably, 5- and 6-membered aliphatic rings are included. These may have a substituent or substituents on the constituting carbon atom or atoms (the substituents are exemplified by those in the substituted alkyl groups as mentioned above). A part of the ring-constituting carbons may be substituted by a hetero atom or atoms (oxygen atom, sulfur atom, nitrogen atom, etc.). Additionally, a part of the aliphatic ring may form a part of the aromatic ring. Specific examples of the preferred rings include cyclopentane, cyclohexane, cycloheptane, cyclooctane, cyclo-1,3-dioxapentane, cyclopentene, cyclohexene, cycloheptene, cyclooctene, cyclo-1,3-dioxapentene, cyclo-1,3-dioxahexene, cyclohexadiene, benzocyclohexene, benzocyclohexadiene, perhydropyran, and the like.

The followings will explain L in the general formula (14). L represents a divalent connecting group containing a hetero atom or atoms, specifically those having the following partial structure. Here, the phrase "having the following partial structure" means that the symbol L as a connecting group or terminal group has at least one of the partial structure and it may have a plural number of the partial structure. Therefore, L may be the partial structure per se, or a group in which plural of the groups are connected, or a group in which the partial structure is connected to another hydrocarbon group.

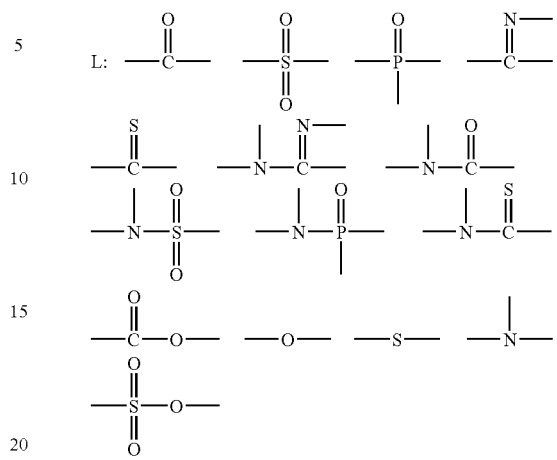

Specific examples of the particularly preferred L include the following structure.

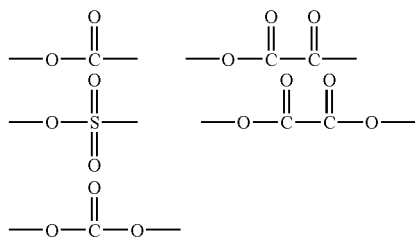

The followings will explain examples of the preferred counter anion $X^{m-}$ in the general formula (13) in detail. The preferred example of $X^{m-}$ includes halide ion ($F^-$, $Cl^-$, $Br^-$, $I^-$), sulfonate ion, organic boron anion, perchlorate ion ($ClO_4^-$), as well as an anion represented by the general formula (a) or (b).

$$MX_r \qquad (a)$$

$$MX_{r-1}(OH) \qquad (b)$$

(In the general formulae (a) and (b), M represents a boron atom, phosphorus atom, arsenic atom, or antimony atom; X represents a halogen atom; and r indicates an integer of 4 to 6)

The preferred example of the sulfonate ion includes methanesulfonate ion, benzenesulfonate ion, p-toluenesulfonate ion (TsO$^-$), p-styrenesulfonate ion, β-naphthoquinone-4-sulfonate ion, anthraquinone-1,5-disulfonate ion, anthraquinone-1,8-disulfonate ion, anthraquinone-1-sulfonate ion, anthraquinone-2-sulfonate ion, quinoline-8-sulfonate ion, hydroquinonesulfonate ion, 1,5-naphthalenedisulfonate ion, 1-naphthalenesulfonate ion, 2-naphthalenesulfonate ion, 2-amino-1-naphthalenesulfonate ion, 2-naphthol-6-sulfonate ion, dibutylnaphthalenesulfonate ion, naphthalene-1,3,6-trisulfonate ion, m-benzenesulfonate ion, p-phenolsulfonate ion, deodecybenzenesulfonate ion, 2-hydroxy-4-methoxybenzophenone-5-sulfonate ion, 4-acetylbenzenesulfonate ion, 4-nitrotoluene-2-sulfonate ion, o-benzaldehydesulfonate ion, diphenylamine-4-sulfonate ion, benzaldehyde-2,4-disulfonate ion, mesitylenesulfonate ion, trifluoromethanesulfonate ion, chlorosulfonate ion, fluorosulfonate ion, 9,10-dimethoxyanthracene-2-sulfonate ion, and the like.

The followings indicate prefered specific examples of the compounds represented by the general formula (13), which are not intended to limit the invention.

(type A)

[Structure: pyridinium cation with $R^5$ on N, $R^6$, $R^7$, $R^9$, $R^{10}$ on ring, –CH$_2$–O–C(=O)–$R^{13}$ substituent, and $X^{\ominus}$ counterion]

| | $R^5$ | $R^6$ | $R^7$ | $R^9$ | $R^{10}$ | $R^{13}$ | X |
|---|---|---|---|---|---|---|---|
| II-1 | PhCH$_2$— | H | H | H | H | Ph— | PF$_6$ |
| II-2 | H— | H | H | H | H | Ph— | Cl |
| II-3 | CH$_3$— | H | H | H | H | Ph— | TsO* |
| II-4 | C$_7$H$_{15}$— | H | H | H | H | Ph— | TsO* |
| II-5 | 4-NO$_2$-C$_6$H$_4$— | H | H | H | H | Ph— | BF$_4$ |
| II-6 | CH$_3$—CH=CH— | H | H | H | H | 4-CH$_3$O-C$_6$H$_4$— | BF$_4$ |
| II-7 | CH$_3$—CH≡CH— | H | H | H | H | 4-CH$_3$O-C$_6$H$_4$— | PF$_6$ |
| II-8 | C$_7$H$_{15}$— | H | H | H | H | 4-CF$_3$-C$_6$H$_4$— | BF$_4$ |
| II-9 | C$_8$H$_{17}$— | H | H | H | H | 4-(CH$_3$)$_2$N-C$_6$H$_4$— | TsO* |
| II-10 | PhCH$_2$— | H | H | H | H | PhS—CH$_2$— | PF$_6$ |
| II-11 | PhCH$_2$— | H | H | H | H | PhO—CH$_2$— | PF$_6$ |
| II-12 | PhCH$_2$— | H | H | H | H | Ph-O-CH(CH$_3$)— | BF$_4$ |
| II-13 | 4-CF$_3$-C$_6$H$_4$-CH$_2$— | H | H | H | H | PhS—CH$_2$— | BF$_4$ |
| II-14 | 4-CF$_3$-C$_6$H$_4$-CH$_2$— | H | CH$_3$ | CH$_3$ | H | PhS—CH$_2$— | BF$_4$ |

-continued

| | R⁵ | | | | | R¹³ | X |
|---|---|---|---|---|---|---|---|
| II-15 | benzyl (PhCH₂–) | Cl | H | H | H | 2-methylphenoxymethyl (o-CH₃-C₆H₄-O-CH₂-) | SbF₆ |
| II-16 | C₇H₁₅— | H | H | H | H | (t)Bu—O— | TsO* |
| II-17 | C₇H₁₅— | H | H | H | H | (t)Bu— | TsO* |
| II-18 | benzyl (PhCH₂–) | H | H | H | H | 4-(t)Bu-C₆H₄— | BF₄ |
| II-19 | C₇H₁₅— | H | H | H | H | H₃C–N(H)–CH₃ (dimethylamino) | TsO* |

(type B)

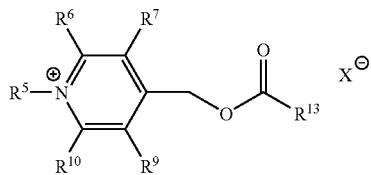

| | R⁵ | R⁶ | R⁷ | R⁸ | R¹⁰ | R¹³ | X |
|---|---|---|---|---|---|---|---|
| II-20 | C₇H₁₅— | H | H | H | H | Ph— | TsO* |
| II-21 | C₇H₁₅— | H | H | H | H | (t)Bu— | PF₆ |
| II-22 | benzyl (PhCH₂–) | H | H | H | H | Ph— | BF₄ |
| II-23 | benzyl (PhCH₂–) | H | H | H | H | PhS-CH₂— | PF₆ |
| II-24 | CH₃ | H | H | H | H | Ph— | TSO* |
| II-25 | C₇H₁₅— | CH₃ | H | H | CH₃ | Ph— | PF₆ |
| II-26 | C₇H₁₅— | Cl | H | H | H | Ph— | BF₄ |

(type C)

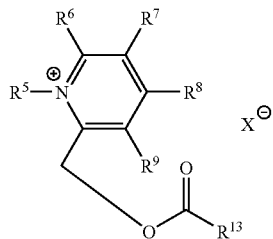

| | R⁵ | R⁶ | R⁷ | R⁸ | R⁹ | R¹³ | X |
|---|---|---|---|---|---|---|---|
| II-27 | 4-(t)Bu-C₆H₄-CH₂— | H | H | H | H | PhS-CH₂— | PF₆ |
| II-28 | 4-(t)Bu-C₆H₄-CH₂— | Cl | H | H | (t)Bu | PhS-CH₂— | Br |

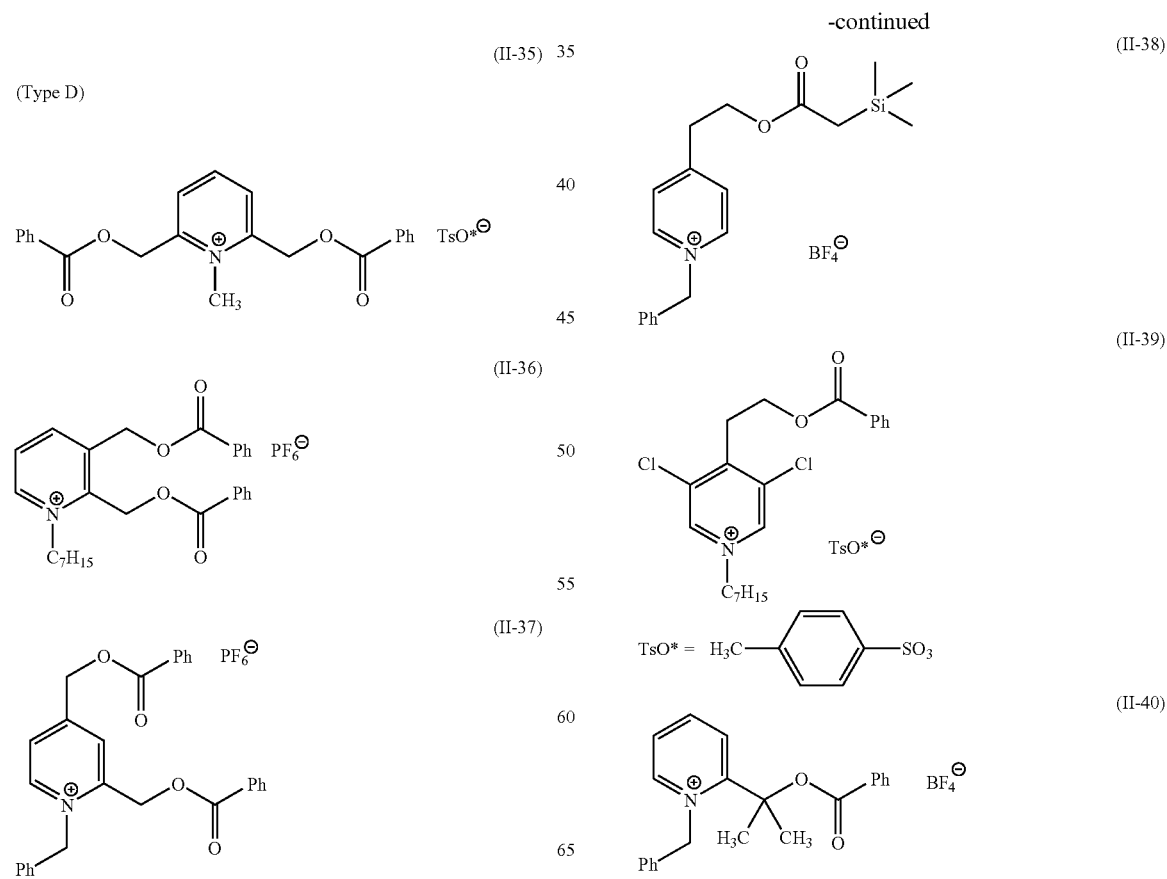

(type E)

Structure: pyridinium with R5 on N+, R6, R7, R8, R9, R10 on ring positions, X⁻ counterion.

| | R⁵ | R⁶ | R⁷ | R⁸ |
|---|---|---|---|---|
| II-45 | PhCH₂— | H | H | —CH₂—O—C(=O)—C(=O)—Ph |
| II-46 | PhCH₂— | Cl | H | —CH₂—O—C(=O)—C(=O)—Ph |
| II-47 | PhCH₂— | H | CH₃ | —CH₂—O—C(=O)—C(=O)—Ph |
| II-48 | C₇H₁₅— | H | H | —CH₂—O—C(=O)—C(=O)—CH₃ |
| II-49 | C₇H₁₅— | H | H | —CH₂—O—C(=O)—C(=O)—Ph |
| II-50 | CH₃ | H | H | —CH₂—O—C(=O)—C(=O)—C₇H₁₅ |
| II-51 | C₇H₁₅— | H | H | H |
| II-52 | PhCH₂— | CH₃ | H | H |
| II-53 | PhCH₂— | H | H | H |

-continued

| | | R⁹ | R¹⁰ | X |
|---|---|---|---|---|
| II-54 | 4-CF₃-C₆H₄-CH₂— | H | H | —O—C(=O)—C(=O)—Ph |
| II-55 | 4-CF₃-C₆H₄-CH₂— | H | H | H |
| II-56 | Ph-CH₂— | H | H | —CH₂—O—C(=O)—C(=O)—C₆H₄-4-OCH₃ |
| II-57 | Ph-CH₂— | H | H | —CH₂—O—C(=O)—C(=O)—C₆H₄-4-CF₃ |

| | R⁹ | R¹⁰ | X |
|---|---|---|---|
| II-45 | H | H | PF₆ |
| II-46 | H | H | TsO* |
| II-47 | H | H | BF₄ |
| II-48 | H | H | PF₆ |
| II-49 | H | H | PF₆ |
| II-50 | H | H | TsO* |
| II-51 | —CH₂—O—C(=O)—C(=O)—Ph | H | PF₆ |
| II-52 | —CH₂—O—C(=O)—C(=O)—Ph | H | PF₆ |
| II-53 | H | —CH₂—O—C(=O)—C(=O)—Ph | PF₆ |
| II-54 | H | H | BF₄ |
| II-55 | H | —CH₂—O—C(=O)—C(=O)—Ph | PF₆ |
| II-56 | H | H | PF₆ |
| II-57 | H | H | BF₄ |

TsO* = H₃C—C₆H₄—SO₃

(type F)

$$R^5-\overset{\oplus}{N}\text{(pyridinium)}-CH_2-S(=O)_2-O-R^{13} \quad X^{\ominus}$$

| | R⁵ | R¹³ | X |
|---|---|---|---|
| II-58 | 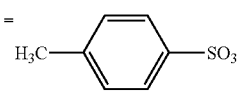 Ph-CH₂— | Ph— | PF₆ |

-continued
| | | | |
|---|---|---|---|
| II-59 |  | | TsO* |
| II-60 | C₇H₁₅— | Ph— | PF₆ |
| II-61 | C₇H₁₅— | C₅H₁₁— | PF₆ |
| II-62 | 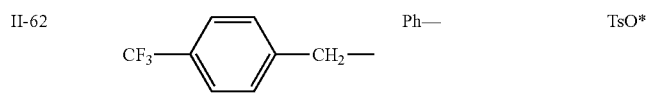 | Ph— | TsO* |
TsO* = 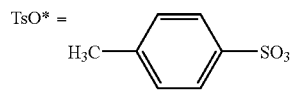
(type G)
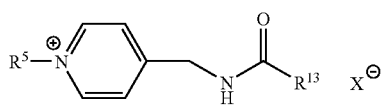
| | R⁵ | R¹³ | R | X |
|---|---|---|---|---|
| II-63 | 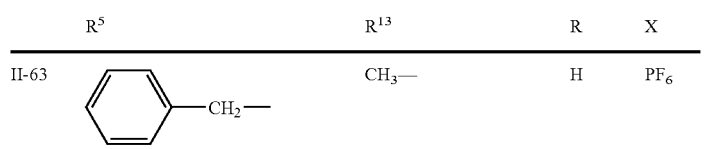 | CH₃— | H | PF₆ |
| II-64 | 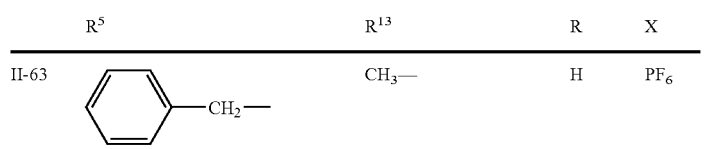 | Ph— | H | PF₆ |
| II-65 | H | Ph— | CH₃ | TsO* |
| II-66 | C₇H₁₅— | CH₃— | H | BF₄ |
| II-67 | C₇H₁₅— | Pr— | H | PF₆ |
TsO* = 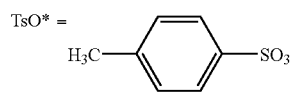
(type H)
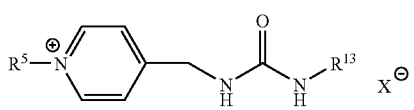
| | R⁵ | R¹³ | R | X |
|---|---|---|---|---|
| II-68 | 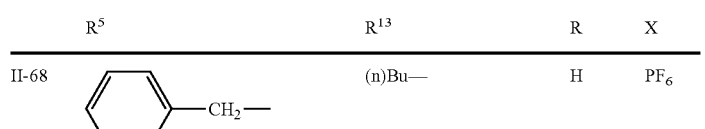 | (n)Bu— | H | PF₆ |
| II-69 | 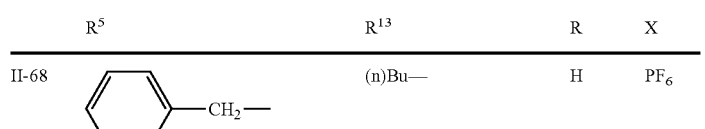 | Ph— | CH₃ | PF₆ |
| II-70 | C₇H₁₅— | Ph— | H | TsO* |
| II-71 | C₇H₁₅— |  | H | PF₆ |

| | | | | |
|---|---|---|---|---|
| | | -continued | | |
| II-72 | CH₃— | CH₃— | CH₃ | BF₄ |

TsO* =

H₃C—⟨benzene⟩—SO₃

In the structure having polymerization initiating capability, it is preferred that the aromatic ketones or triazines having the structure as mentioned below are pendent on a polymerizing group. As for the preferred aromatic ketones, a commercially available product such as Irgacure 184 can be used.

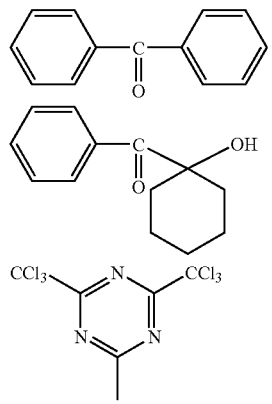

In the structure having a polymerization initiating capability, only one may be pendent on the polymerizing group, or two or more of such structure may be pendent on the polymerizing group.

The polymerizing group on which the structure having a polymerization initiating capability is pendent includes those allowing radical, anionic or cationic polymerization such as acryl, methacryl, acrylamido, methacrylamido, or vinyl. Among them, particularly preferred one is acryl or methacryl because it is an easily synthesizable group.

In the invention, as a specific example of copolymer component having a functional group capable of initiating polymerization, monomers having the following structure are exemplified.

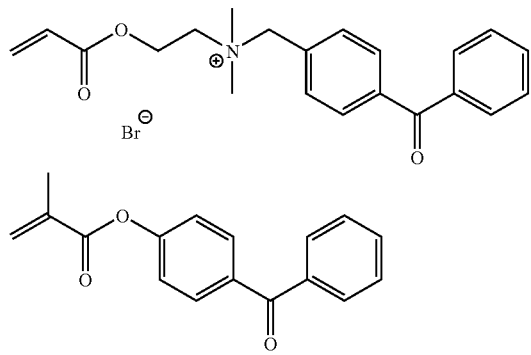

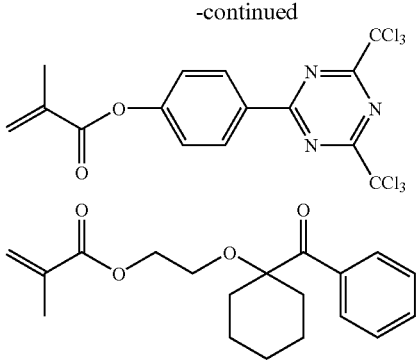

1-1-2. Copolymer Components having Crosslinking Groups

In the invention, it is preferred that a copolymer component having a crosslinking group, which constitutes a specific polymerization initiating polymer, comprises a polymerizing group allowing radical, anionic or cationic polymerization, on which the so far known crosslinking group (a functional group having the structure used in crosslinking reactions) is pendent as described in Shinji Yamashita (Editor), "Handbook of Crosslinking Agents". That is, this copolymer component has a crosslinking group together with a polymerizable polymerizing group within the molecule.

Among the so far known crosslinking groups, it is preferable to use those in which a carboxylic acid group (—COOH), hydroxyl group (—OH), amino (—NH₂) or isocyanate (—NCO) is pendent on the polymerizing group.

In such a crosslinking group, only one group may be pendent on the polymerizing group, or two or more groups may be pendent on the polymerizing group.

As for the polymerizing groups on which a crosslinking group is pendent, those allowing radical, anionic or cationic polymerization such as acryl, methacryl, acrylamido, methacrylamido, or vinyl are included. Among them, particularly preferred one is acryl or methacryl because it is an easily synthesizable group.

In the invention, as specific examples of copolymer component having a crosslinking group, monomers having the following structure are exemplified.

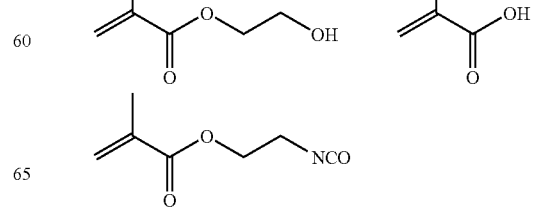

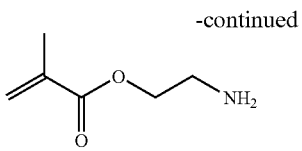

1-1-3. Other Copolymer Components

The specific polymerization initiating polymer of the invention may be used together with a third copolymer component as shown below in order to adjust a coating property, hydrophilicity/hydrophobicity, solubility in a solvent, and polymerization initiating capability.

As for the third copolymer component, any compound allowing radical, anionic or cationic polymerization can be used. Considering the polymerizing property, it is preferred to use an acryl or methacryl monomer on which an alkyl group of 1 to 20 carbon atoms is pendent. In this situation, an alkyl group having a tertiary hydrogen is preferable in order to generate more active spieces by UV light irradiation. Moreover, although the alkyl group may be substituted by any kind of substituent, it is appropriate to use those substituted by a substituent having the structure of a quaternary ammonium salt in view of enhancing the solvent resistance of the polymerization initiating layer.

In the specific polymerization initiating polymer of the invention, the mole percentage for copolymerization of the copolymer component (A) having a polymerization initiating group is preferably in 1–40 mole % and that of the copolymer component (B) having a crosslinking group is preferably in 20–70 mole %. In view of the graft polymerization and the film characteristic of polymerization initiating layer after crosslinking reaction, the mole percentage is preferably 5–30 mole % for (A) and 30–60 mole % for (B).

The weight-average molecular weight of the specific polymerization initiating polymer of the invention is preferably from 10,000 to 10,000,000, more preferably from 10,000 to 5,000,000, and even more preferably from 100,000 to 1,000,000. When the weight-average molecular weight of the specific polymerization initiating polymer of the invention is lower than 10,000, the polymerization initiating layer sometimes becomes readily soluble in a monomer solution.

The specific polymerization initiating polymer of the invention can be synthesized by copolymerizing the above-mentioned copolymer components. Though the copolymer can be synthesized in any way of polymerization, it is preferred to utilize a radical polymerization reaction in view of the convenience of the reaction. As the radial generating agent to cause a radical polymerization, a compound which generate radicals due to heat is preferable.

Though the specific polymerization initiating polymer of the invention can be explained as mentioned above, the synthesis of the initiating polymer is not limited to that by copolymerization. For example, a polymer containing a polymerization initiating group on the side chain is first synthesized and thereafter a proper amount of crosslinking group is introduced therein to give the specific polymerization initiating polymer of the invention. Alternatively, one monomer unit which contains a polymerization initiating group together with a crosslinking group is polymerized to give the specific polymerization initiating polymer of the invention.

In this situation, considering easy availability of the monomer, it is appropriate to employ an embodiment in that the specific polymerization initiating polymer of the invention is produced by conducting copolymerization using a polymerization initiating group and a crosslinking group respectively contained in different monomer units.

1-1-4. Polymerization Initiating Layer Formed by Immobilization of the Specific Polymerization Initiating Polymer by a Crosslinking Reaction In the step of forming a polymerization initiating layer, as methods for immobilizing the specific polymerization initiating polymer by a crosslinking reaction, there are a method for utilizing a self-condensation reaction of the specific polymerization initiating polymer and a method of using a crosslinking agent in combination, and it is preferred to use a crosslinking agent. As for a method for utilizing a self-condensation reaction of the specific polymerization initiating polymer, for example, when the crosslinking group is —NCO, the self-condensation reaction proceeds with heating; this characteristic is utilized in this reaction. The crosslinking structure is formed with proceeding of the self-condensation reaction.

As for the crosslinking agent used in the method of using a crosslinking agent in combination, the so far known agents as described in Shinji Yamashita (Editor), "Handbook of Crosslinking Agents" can be used.

The preferred combination of the crosslinking group contained in the specific polymerization initiating polymer and the crosslinking agent are as follows: (crosslinking group, crosslinking agent)=(—COOH, polyvalent amine), (—COOH, polyvalent aziridine), (—COOH, polyvalent isocyante), (—COOH, polyvalent epoxy), (—NH$_2$, polyvalent isocyante), (—NH$_2$, aldehydes), (—NCO, polyvalent amine), (—NCO, polyvalent isocyanate), (—NCO, polyvalent alcohol), (—NCO, polyvalent epoxy), (—OH, polyvalent alcohol), (—OH, polyvalent halogenated compound), (—OH, polyvalent amine), and (—OH, acid anhydride). In particular, (functional group, crosslinking agent)=(—OH, polyvalent isocyanate) is a more preferred combination in view of the urethane linkage being generated after crosslinking and highly strong crosslink being formed.

Specific examples of the crosslinking agents used in the invention include those having the following structure.

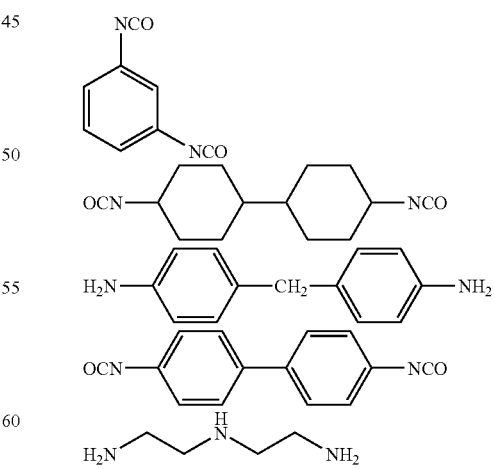

Such a crosslinking agent is added to a coating solution containing the specific polymerization initiating polymer at the time of coating of the polymerization initiating layer. Thereafter, the coated film can form the firm crosslink structure with proceeding of the crosslinking reaction by heat during drying under heating. In particular, the crosslinking reaction proceeds with the dehydration reaction as shown in ex 1 and the addition reaction as shown in ex 2 to form the crosslink structure. The reaction may preferably be carried out under the condition of a temperature from 50 to 300° C., more preferably from 80 to 200° C.

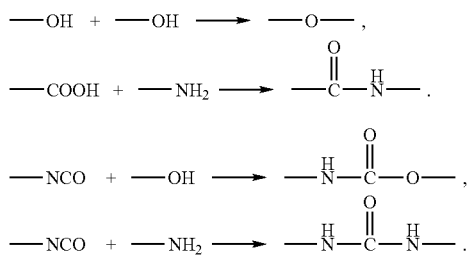

The amount of the crosslinking agent to be added to the coating solution, though it is altered depending on the amount of the crosslinking group contained in the specific polymerization initiating polymer, is usually prefered in the range of 0.01–50 equivalent for the mole number of the crosslinking group, more preferably in 0.01–10 equivalent, and even more preferably in 0.5–3 equivalent, in view of the insolubility of the polymerization initiating layer. When the amount of the crosslinking agent is over the upper limit, the unreacted crosslinking component remaining unchanged in the polymerization initiating layer tends to dissolve in the monomer solution.

1-1-5. Support

There is no limitation in the support used in the invention as far as it is a dimensionally stable plate satisfying necessary flexibility, strength, durability, and so on. Such a support is exemplified by paper, paper laminated with plastic (e.g., polyethylene terephthalate, polyethylene naphthalate, polyethylene, polypropylene, polystyrene, etc.), metal plate (e.g., aluminum, zinc, copper, etc.), plastic film (e.g., cellulose diacetate, cellulose triacetate, cellulose propionate, cellulose butyrate, cellulose acetate butyrate, cellulose nitrate, polyethylene terephthalate, polyethylene naphthalate, polyethylene, polystyrene, polypropylene, polycarbonate, polyvinylacetal, polyamide, etc.), and paper or plastic film laminated or vapor-deposited with the metal as mentioned above. As for the support used in the invention, polyester film, polyamide or aluminum plates are preferred. In addition, an aluminum laminated or vapor-deposited plastic film is preferred, too. The particularly preferred aluminum plate is a pure aluminum plate or an alloy plate consisting of aluminum as a major component and a small amount of other elements. Such elements include silicon, iron, manganese, copper, magnesium, chromium, zinc, bismuth, nickel, titanium, and so on. The content of the other elements in the alloy is preferably 10% by weight or less. Particularly preferred aluminum in the invention is pure aluminum, but since it is difficult to produce perfectly pure aluminum due to limitation of the refinement technique, the aluminum may contain a trace of other elements.

Since the constitution of the aluminum plate adaptable to the invention cannot be specified, any of aluminum plates made from publicly known raw materials can be suitably utilized. The thickness of the aluminum plates used in the invention is in approximately 0.1 mm–0.6 mm, preferably in 0.15 mm–0.4 mm, more preferably in 0.2 mm–0.3 mm.

1-1-6. Film Formation of the Polymerization Initiating Layer

In this step, the specific polymerization initiating polymer is dissolved in a proper solvent to give a coating solution, which is placed on a support, for example by coating, and the solvent is then removed to form film with proceeding of a crosslinking reaction.

(Solvent)

As for the solvent used in coating of the polymerization initiating layer, there is no particular limitation as far as the specific polymerization initiating polymer is soluble therein. In view of easy drying and workability, it is appropriate to choose a solvent of which the boiling point is not so high, specifically those having approximately 40–150° C.

Specifically, acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, and the like, are included.

These solvents may be used alone or as a mixture. The content of the solid component in the coating solution is preferably 2–50% by weight.

The polymerization initiating layer may be preferably formed with 0.1–20 g/m² of the coating amount (weight after drying), more preferably 1–15 g/m², in view of the polymerization initiating capability and the film characteristics.

1-2. Step of Graft Formation

In this step, the polymerization initiating layer is brought into contact with a compound having a polymerizable functional group under irradiation with radiation ray to make the compound bond to the polymerization initiating layer. As a result, the graft structure is formed on the polymerization initiating layer which has been formed in the preceding step for formation of the polymerization initiating layer.

1-2-1. Graft Polymerization

The graft formation step of the invention is generally carried out in a way of the so-called surface graft polymerization. The graft polymerization means a method for synthesizing a graft polymer by giving an active species onto the chain of a polymer compound and bonding and pdymerizing thereto another monomer for initiating polymerization. Particularly, the formation of the solid surface with a polymer compound giving an active species is called surface graft polymerization. The graft polymerization of the invention also provides the graft polymer prepared by bonding a desired polymer to an active species on the chain of a polymer compound. In the invention, a polymer compound to which an active species is given is the specific polymerization initiating polymer. As a way for giving an active species to the polymer compound, a radiation ray such as UV light is irradiated to give energy to the polymer generating the active species.

As for the method of surface graft polymerization by which the invention is achieved, any of the publicly known methods as described in literature can be applied. For example, a method of photo-graft polymerization and a method of graft polymerization by plasma irradiation have been described in Shin Kobunshi Jikken-gaku (New Polymer Experimentation) 10, Society of Polymer Science, Japan, 1994, p.135, Kyoritsu Shuppan Co., Ltd. In Handbook of Adsorption Technology, NTS Co., Ltd., Edited by Takeuchi, published on February 1999, p.203 and p.695, a method of graft polymerization by irradiation of radiation such as γ-ray or electron ray has been described. As for a specific method of photograft polymerization, those as described in JP-A Nos. 63-92658, 10-296895, 11-119413, and 2000-80189 can be used. As for the methods of graft polymerization by plasma irradiation or by irradiation of radiation, those as described in the above-mentioned documents and in Y. Ikeda et al., Macromolecules vol. 19, page 1804 (1986) can be applied.

Specifically, the surface of the polymerization initiating layer is treated with UV light, plasma, or electron ray to generate radical, and the activated surface is then allowed to react with a compound having a polymerizable functional group and containing a desired functionally active functional group to give the graft structure (graft polymer) in which the compound is directly bonded to the polymerization initiating layer. Among these methods, it is preferred to apply exposure of UV light in view of easiness of the exposure.

The compound having a polymerizable functional group useful in formation of the graft structure has at least one polymerizable double bond and if required preferably has a desired functionally active functional group. As for the compound having a polymerizable functional group, any of polymer, oligomer and monomer can be used as far as they have a double bond in the molecule.

In the invention, for example, in order to give hydrophilicity to the formed graft structure, a hydrophilic compound having a double bond and a hydrophilic group may be used. In this situation, the following hydrophilic monomer or hydrophilic macromer as well as hydrophilic polymer are exemplified as preferably used hydrophilic compounds.

Specifically, the hydrophilic monomer used in the invention includes those which have a polymerizable double bond together with a positive charge such as ammonium or phosphonium, or a negative charge or an acidic group capable of dissociating into a negative charge such as a sulfonic acid group, a carboxyl group, a phosphoric acid group and a phosphonic acid group. In addition, for example, a hydrophilic monomer having a non-ionic group such as hydroxyl, amide, sulfonamide, alkoxy, or cyano, may also be used.

Particularly useful hydrophilic monomers used in the invention are specifically exemplified by the following monomers. For example, (meth)acrylic acid or alkali metal salts or amine salts thereof, itaconic acid or alkali metal salts or amine salts thereof, allylamine or hydrohalic acid salts thereof, 3-vinylpropionic acid or alkali metal salts or amine salts thereof, vinylsulfonic acid or alkali metal salts or amine salts thereof, styrenesulfonic acid or alkali metal salts or amine salts thereof, 2-sulfoethylene (meth)acrylate, 3-sulfopropylene (meth)acrylate or alkali metal salts or amine salts thereof, 2-acrylamido-2-methylpropanesulfonic acid or alkali metal salts or amine salts thereof, acid phosphooxypolyoxyethylene glycol mono(meth)acrylate or salts thereof, 2-dimethylaminoethyl (meth)acrylate or hydrohalic acid salts thereof, 3-trimethylammonium propyl(meth)acrylate, 3-trimethylammonium propyl(meth)acrylate, N, N, N-trimethyl-N-(2-hydroxy-3-methacryloyloxypropyl)ammonium chloride, and the like may be used. In addition, 2-hydroxyethyl (meth)acrylate, (meth)acrylamide, N-monomethylol (meth)acrylamide, N-dimethylol (meth) acrylamide, N-vinylpyrrolidone, N-vinylacetamide, and polyoxyethylene glycol mono(meth)acrylate are also useful.

In the invention, specific examples of particularly useful hydrophilic macromers include macromers derived from carboxyl-containing monomers such as acrylic acid or methacrylic acid; sulfonic acid macromers derived from monomer of 2-acrylamido-2-methylpropanesulfonic acid, styrenesulfonic acid and salts thereof; amide-type macromers such as acrylamide or methacrylamide; amide-type macromers derived from N-vinylcarboxylic acid amide monomers such as N-vinylacetamide or N-vinylformamide; macromers derived from hydroxyl-containing monomers such as hydroxyethyl methacrylate, hydroxyethyl acrylate or glycerol monomethacrylate; and macromers derived from alkoxy- or ethylene oxide-containing monomers such as methoxyethyl acrylate, methoxypolyethylene glycol acrylate or polyethylene glycol acrylate. In addition, monomers having a polyethylene glycol chain or polypropylene glycol chain may also be used as macromers of the invention.

The effective molecular weight of these macromers, in view of the reactivity of the polymerizing group, is preferably in the range of 400 to 100,000, more preferably in the range of 1,000 to 50,000, particularly in the range of 1,500 to 20,000.

In the invention, for example, in order to make the graft structure showing hydrophobicity, a hydrophobic compound having a double bond and a hydrophobic group may be used. In this situation, the properly used hydrophobic compound includes hydrophilic monomers, hydrophilic macromers and hydrophilic polymers as mentioned below.

More particularly, the hydrophobic monomers used in the invention among a variety of monomers are exemplified by those having a polymerizable double bond together with a hydrophobic functional group as mentioned below.

The hydrophobic functional group includes an alkyl group, a substituted alkyl group, alkyl sulfonates, disulfones, and sulfonimides as described in JP-A No. 10-282672; alkoxyalkyl esters as described in EP 0,652,483 and WO92/9934; t-butyl esters as described in H. Ito et al., Macromolecules, vol.21, p.1477; and carboxylates protected by an acid-decomposing group such as silyl esters or vinyl esters as described in documents. The invention, however, is not limited to these functional groups.

In addition, as the hydrophobic functional group, alkoxyalkyl ester groups represented by the following general formula (I) may also be used.

General formula (I):

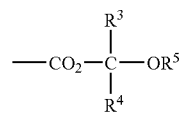

wherein in the general formula (I), $R^3$ represents a hydrogen atom; $R^4$ represents a hydrogen atom or an alkyl group of up to 18 carbon atoms; and $R^5$ represents an alkyl group of up to 18 carbon atoms. Alternatively, two of $R^3$, $R^4$ and $R^5$ may bond with each other to form a ring. Particularly, it is preferable that $R^4$ and $R^5$ are bonded to each other to form a 5- or 6-membered ring.

The hydrophobic functional group represented by the general formula (I) is specifically exemplified by the following formulae (I-1) to (I-4).

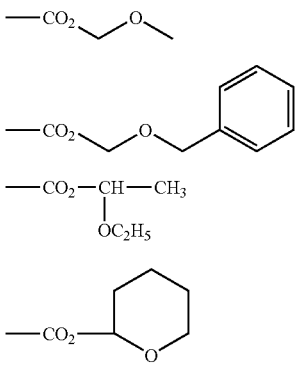

(I-1)
(I-2)
(I-3)
(I-4)

In the invention, it is possible to form the desired graft polymer (graft structure) by providing a variety of functionally active functional groups for monomer or macromer working as a graft chain as mentioned above.

According to the graft polymerization method of the invention, it is possible to form the graft structure in which all of the polymer chain terminals are bonded to a support regardless of the characteristics required for the graft polymer. The support which has the graft polymerization layer formed by the graft polymerization method of the invention is suitable as a solid carrier (support) such as an image-forming material, pattern forming material, or planographic printing plate precursor. Other uses include solid carriers (supports) such as electrical wiring substrate, gas barrier film, conductive film, electromagnetic wave protective film, or cloud protective film.

The graft polymerization method of the invention is suitably applicable to a hydrophilic member, printing plate precursor, pattern forming material, pattern forming method, method of producing a particle-adsorbed material, particle-adsorbed material, method of producing a metal particle-dispersed thin layer film, and metal particle-dispersed thin layer film. The followings will explain such embodiments in details.

2. Hydrophilic Member

The hydrophilic member in the second aspect of the invention comprises a polymerization initiating layer in which a polymer having, on a side chain thereof, a crosslinking group and a functional group having polymerization initiating capability is immobilized on a substrate by a crosslinking reaction, and a hydrophilic layer in which a hydrophilic compound having a polymerizable group is bonded directly to the polymerization initiating layer.

2-1. Polymerization Initiating Layer in which a Polymer having a Crosslinking Group and a Functional Group having Polymerization Initiating Capability is Immobilized on a Substrate by a Crosslinking Reaction As for the polymerization initiating layer relating to the hydrophilic member of the invention, the same polymerization initiating layer as that formed in the step of forming the polymerization initiating layer by the graft polymerization method can be applied.

In this connection, in the specific polymerization initiating polymer adaptable to this aspect, the mole percentages for copolymerization of the copolymer component (A) having a polymerization initiating group and of the copolymer component (B) having a crosslinking group are: preferably 5 mole % or more for (A) and 10 mole % or more for (B); more preferably 5–50 mole % for (A) and 30–70 mole % for (B); and even more preferably 10–20 mole % for (A) and 30–40 mole % for (B), in view of the film characteristics of the polymerization initiating layer after the graft polymerization and crosslinking reaction.

2-2. Hydrophilic Layer in which a Hydrophilic Compound having a Polymerizable Group is Bonded Directly to the Polymerization Initiating Layer The followings will explain a method for producing a hydrophilic layer by the graft polymerization in the hydrophilic member of the invention.

The methods for making a hydrophilic layer by graft polymerization can roughly be classified into:

(1) A method which comprises placing an upper layer containing a hydrophilic polymer having a polymerizing group on the polymerization initiating layer, followed by irradiation of light to make the hydrophilic polymer bond to the polymerization initiating layer.

(2) A method which comprises immersing a substrate having the polymerization initiating layer into a solution of a hydrophilic compound having a polymerizing group, followed by irradiation of light to make the hydrophilic compound bond and polymerize to the polymerization initiating layer.

"(1) A method which comprises placing an upper layer containing a hydrophilic polymer having a polymerizing group on the polymerization initiating layer, followed by irradiation of light to make the hydrophilic polymer bond to the polymerization initiating layer"

In this method, an upper layer containing a hydrophilic polymer having a polymerizing group (hereinafter referred to as upper layer in some cases) is placed on the polymerization initiating layer (hereinafter sometimes referred to as lower layer) formed on a substrate, and then light is irradiated to generate an active species on the polymerization initiating layer, to which the hydrophilic polymer is bonded directly to form a hydrophilic layer.

(Hydrophilic Polymer having a Polymerizing Group)

The hydrophilic polymer having a polymerizing group contained in the upper layer means that containing a radical polymerizing group into which is introduced an ethylene-adding polymerizing unsaturated group such as vinyl, allyl or (meth)acryl in the molecule. This hydrophilic polymer containing a radical polymerizing group has to have a polymerizing group on the terminal of the major chain and/or side chain; thus, it is preferable that both have the polymerizing group. Hereinafter, the hydrophilic polymer having the polymerizing group (on the terminal of the major chain and/or side chain) is referred to as a hydrophilic polymer containing a radical polymerizing group.

Such a hydrophilic polymer containing a radical polymerizing group may be synthesized as follows.

The synthetic method includes (a) a method for copolymerizing a hydrophilic monomer with a monomer having an ethylene-adding polymerizing unsaturated group; (b) a method comprising copolymerizing a hydrophilic monomer with a monomer having a double bond precursor, followed by introduction of a double bond by treatment with a base; and (c) a method for reacting the functional group of a hydrophilic polymer with a monomer having an ethylene-adding polymerizing unsaturated group. Among these methods, in view of an aptitude for synthesis, a method for reacting the functional group of a hydrophilic polymer with a monomer having an ethylene-adding polymerizing unsaturated group is particularly preferred.

The hydrophilic monomer used in the synthesis of the hydrophilic polymer containing a radical polymerizing group includes those having a hydrophilic group such as carboxyl, sulfonic acid, phosphoric acid, amino or a salt thereof, hydroxyl, amide or ether, for example, (meth) acrylic acid or alkali metal salts or amine salts thereof, itaconic acid or alkali metal salts or amine salts thereof, 2-hydroxyethyl (meth)acrylate, (meth)acrylamide, N-monomethylol (meth)acrylamide, N-dimethylol (meth) acrylamide, allylamine or hydrohalic acid salts thereof, 3-vinylpropionic acid or alkali metal salts or amine salts thereof, vinylsulfonic acid or alkali metal salts or amine salts thereof, 2-sulfoethyl (meth)acrylate, polyoxyethylene glycol mono(meth), 2-acrylamido-2-methylpropanesulfonic acid, acid phospho-oxypolyoxyethylene glycol mono(meth)acrylate and the like.

The hydrophilic polymer containing a radical polymerizing group constituting the upper layer is a hydrophilic monopolymer or copolymer prepared from at least one selected from these hydrophilic monomers.

In synthesizing the hydrophilic polymer containing a radical polymerizing group by the method (a), as the monomer having an ethylene-adding polymerizing unsaturated group which copolymerizes with a hydrophilic monomer, for example, an allyl-containing monomer is included, specifically allyl (meth)acrylate or 2-allyloxyethyl (meth)acrylate.

In synthesizing the hydrophilic polymer containing a radical polymerizing group by the method (b), as the monomer having a double bond precursor which copolymerizes with a hydrophilic monomer, 2-(3-chloro-1-oxopropoxy) ethyl methacrylate is exemplified.

In synthesizing the hydrophilic polymer containing a radical polymerizing group by the method (c), as the monomer having an unsaturated group for addition-polymerization which is used in introduction of an unsaturated group by utilizing the reaction of a functional group such as the hydroxyl or epoxy group with the carboxylic or amino group or its salt in the hydrophilic polymer, (meth)acrylic acid, glycidyl (meth)acrylate, allyl glycidyl ether, 2-isocyanatoethyl (meth)acrylate, and the like are exemplified.

The hydrophilic polymer containing a radical polymerizing group contained in the upper layer may be a hydrophilic macromonomer. With respect to the method for producing macromonomers used in the invention, a variety of methods have been proposed, for example, in "Chemistry and Industry of Macromonomers", edited by Yuya Yamashita, Chapter 2 "Synthesis of Macromonomers" published by IPC Press, Sep. 20, 1989.

Particularly useful hydrophilic macromonomer used in the invention includes macromonomers derived from carboxyl-containing monomers such as acrylic acid or methacrylic acid; sulfonic acid macromonomers derived from monomer of 2-acrylamido-2-methylpropanesulfonic acid, vinylstyrenesulfonic acid and salts thereof; amide-type macromonomers derived from (meth)acrylamide, N-vinylacetamide, N-vinylformamide, or N-vinylcarboxylic acid amide monomer; macromonomers derived from hydroxyl-containing monomers such as hydroxyethyl methacrylate, hydroxyethyl acrylate or glycerol monomethacrylate; and macromonomers derived from alkoxy- or ethylene oxide-containing monomers such as methoxyethyl acrylate, methoxypolyethylene glycol acrylate or polyethylene glycol acrylate. In addition, monomers having a polyethylene glycol chain or polypropylene glycol chain may also be used as macromonomers of the invention.

The molecular weight of the particularly useful hydrophilic macromonomers is in the range of 250 to 100,000, particularly in 400 to 30,000.

In preparing the upper layer, a hydrophilic monomer may be added in addition to the hydrophilic polymer containing a radical polymerizing group. By addition of the hydrophilic monomer, the hydrophilic graft chain is further bonded to the polymerizing group on the side chain of the hydrophilic polymer containing a radical polymerizing group (graft chain) bonding to the polymerization initiating layer to form a graft chain having branched structure. Thus, the formation density and mobility of the highly mobile hydrophilic graft is greatly improved to generate much higher hydrophilicity.

The amount of the hydrophilic monomer to be added is preferably 0–60% by weight for the entire solid component on the upper layer. When it is over 60% by weight, coating is inadequate because it cannot be applied homogeneously due to poor coating property.

(Hydrophilic Monomer)

The hydrophilic monomer used together with a hydrophilic polymer containing a radical polymerizing group in formation of the upper layer includes those having a positive charge such as ammonium or phosphonium, or a negative charge or an acidic group capable of dissociating into a negative charge such as sulfonic acid, carboxyl, phosphoric acid or phosphonic acid group. In addition, for example, a hydrophilic monomer having a non-ionic group such as hydroxyl, amide, sulfonamide, alkoxy, or cyano, may also be used.

In the invention, the specific example of the particularly useful hydrophilic monomer used together with a hydrophilic polymer containing a radical polymerizing group includes the following monomers.

Examples of the hydrophilic monomer include (meth) acrylic acid and an alkali metal salt or an amine salt thereof, itaconic acid and an alkali metal salt or an amine salt thereof, allylamine and a hydrogen halide acid salt thereof, 3-vinylpropionic acid and an alkali metal salt or an amine salt thereof, vinylsulfonic acid and an alkali metal salt or an amine salt thereof, styrenesulfonic acid and an alkali metal salt or an amine salt thereof, 2-sulfoethylene (meth)acrylate, 3-sulfopropylene (meth)acrylate and an alkali metal salt or an amine salt thereof, 2-acrylamide-2-methylpropanesulfonic acid and an alkali metal salt or an amine salt thereof, acid phosphoxypolyoxyethylene glycol mono(meth)acrylate and a salt thereof, 2-dimethylaminoethyl (meth)acrylate and a hydrogen halide acid salt thereof, 3-trimethylammoniumpropyl (meth)acrylate, 3-trimethylammoniumpropyl (meth) acrylamide and N,N,N-trimethyl-N-(2-hydroxy-3-methacryloyloxypropyl)ammonium chloride.

(Solvent used as the Upper Layer Component)

There is no particular limitation in a coating solvent used in the composition for forming an upper layer in the invention, as far as the hydrophilic polymer containing a radical polymerizing group or hydrophilic monomer as major component in the upper layer is soluble therein. Particularly, aqueous solvents such as water or water-soluble solvents are preferred, and it is preferable to add a surface active agent to the solvent or mixture thereof.

The water-soluble solvent means solvents which are miscible with water in an optional ratio, including, for example, alcoholic solvents such as methanol, ethanol, propanol, ethylene glycol or glycerin, acids such as acetic acid, ketone-type solvents such as acetone, and amide-type solvents such as formamide.

The surface active agent to be added to the solvent in case of necessity, which is soluble in the solvent, includes, for example, anionic surfactants such as sodium n-dodecylbenzenesulfonate, cationic surfactants such as n-dodecyltrimethylammonium chloride, and non-ionic surfactants such as polyoxyethylene nonylphenol ether (commercially available, e.g., as Emulgen 910, Kao Corp.), polyoxyethylene sorbitan monolaurate (commercially available, e.g., as "Tween 20" (trade name)), and polyoxyethylene lauryl ether.

The coating amount of the upper layer is preferably in 0.1–10 g/m$^2$ converting into the solid component, particularly in 1–5 g/m$^2$. When the coating amount is less than 0.1 g/m$^2$, the prepared hydrophilic member affords no sufficient surface hydrophilicity, and when it is over 10 g/cm$^2$, no homogeneous coating film is formed. Either cases are not preferred, accordingly.

"(2) A method which comprises immersing a substrate having the polymerization initiating layer into a solution of a hydrophilic compound having a polymerizing group, followed by irradiation of light to make the hydrophilic compound bond and polymerize to the polymerization initiating layer"

In this method, a substrate having the polymerization initiating layer is immersed into a solution of a hydrophilic compound having a polymerizing group, and then light is irradiated to generate an active species on the polymerization initiating layer, to which the hydrophilic compound is directly bonded and polymerized to form a hydrophilic layer.

As for the hydrophilic compound used in this method, the hydrophilic monomer having a polymerizing group (including hydrophilic macromer) used in the method (1) can be used in addition to the hydrophilic polymer having a polymerizing group as described below. When a hydrophilic polymer having a polymerizing group is used as a hydrophilic compound, it is not always necessary to make polymerization reaction during the bonding to the polymerization initiating layer.

(Hydrophilic Monomer having a Polymerizing Group)

The hydrophilic monomer having a polymerizing group used in this method (hereinafter referred to as polymerizing hydrophilic monomer) is a monomer which contains an ethylene-adding polymerizing unsaturated group such as vinyl, allyl or (meth)acryl group introduced in the molecule and has a hydrophilic functional group.

The hydrophilic functional group possessed by the polymerizing hydrophilic monomer includes a carboxylic acid group, sulfonic acid group, sulfinic acid group, phosphonic acid group, amino and its salts, amide group, hydroxyl group, ether group, polyoxyethylene group, and the like.

In the hydrophilic member of the invention, particularly useful polymerizing hydrophilic monomer having a hydrophilic functional group is specifically exemplified by the following monomers. Examples of the monomer include (meth)acrylic acid and an alkali metal salt or an amine salt thereof, itaconic acid and an alkali metal salt or an amine salt thereof, allylamine and a hydrogen halide acid salt thereof, 3-vinylpropionic acid and an alkali metal salt or an amine salt thereof, vinylsulfonic acid and an alkali metal salt or an amine salt thereof, styrenesulfonic acid and an alkali metal salt or an amine salt thereof, 2-sulfoethylene (meth)acrylate, 3-sulfopropylene (meth)acrylate and an alkali metal salt or an amine salt thereof, 2-acrylamide-2-methylpropanesulfonic acid and an alkali metal salt or an amine salt thereof, acid phosphoxypolyoxyethylene glycol mono(meth)acrylate and a salt thereof, 2-dimethylaminoethyl (meth)acrylate and a hydrogen halide acid salt thereof, 3-trimethylammoniumpropyl (meth)acrylate, 3-trimethylammoniumpropyl (meth)acrylamide and N,N,N-trimethyl-N-(2-hydroxy-3-methacryloyloxypropyl)ammonium chloride.

(Solvent used for a Solution of a Hydrophilic Compound having a Polymerizing Group)

There is no particular limitation in a coating solvent used in the polymerizing hydrophilic monomer solution, as far as the hydrophilic compound containing a polymerizing hydrophilic monomer is soluble therein. Particularly, aqueous solvents such as water or water-soluble solvents are preferred, and it is also preferred to add a surface active agent to the solvent or mixture thereof.

The water-soluble solvent means solvents which are miscible with water in an optional ratio, including, for example, alcoholic solvents such as methanol, ethanol, propanol, ethylene glycol or glycerin, acids such as acetic acid, ketone-type solvents such as acetone, and amide-type solvents such as formamide.

The hydrophilic layer formed as mentioned above has excellent hydrophilicity with durability of the hydrophilicity since the constituting hydrophilic compound is directly bonded to the polymerization initiating layer as a graft chain.

The "excellent hydrophilicity" in the hydrophilic member of the invention means a state of the water leakage converted into the contact angle with water being 20° or less. Measurement of the contact angle may be carried out according to a publicly known method, for example, a method of measuring a contact angle (water drops in the air) using a commercially available apparatus CA-Z (Kyowa Interface Science Co., Ltd. In this method, when the value converted into the contact angle is 20° or less, it can be judged that preferred hydrophilicity of the invention is attained.

2-3. Support

The supports used as hydrophilic members of the invention may be chosen according to the use of the hydrophilic members.

More specifically, when the hydrophilic member is expected to have a cloud preventive effect, a clear substrate may be chosen, for example, materials such as glass or plastic is preferably utilized. The utility for which the members having a cloud preventive effect is applicable includes: mirrors such as room mirror or side mirror for cars, bathroom mirror, washroom mirror, dentist mirror, or road mirror; lens such as spectacle lens, optical lens, camera lens, endoscope lens, lighting lens, lens for semiconductors, or lens for copying machines; prisms; window glass for buildings or lookout towers; window glass of transport vehicles or vessels such as cars, railroad vehicles, airplanes, shipping, submarines, snow vehicles, cabins of cableways, cabins in amusement parks, or spaceships; windshields glass of transport vehicles or vessels such as cars, railroad vehicles, airplanes, shipping, submarines, snow vehicles, snowmobiles, motorcycles, cabins of cableways, cabins in amusement parks, or spaceships; glass for protective goggles, gaggles for sports, protective mask shields, mask shields for sports, helmet shields, or showcases for chilled foods; and cover glass of measuring instruments, and film stuck on the above-mentioned articles.

When the hydrophilic members of the invention are expected to have a surface-cleaning effect, as such materials, for example, metal, ceramics, glass, plastics, wood, stone, cement, concrete, fiber, dishtowels, a combination of them, and laminates of them, can be utilized suitably for the supports. The utility for which the members having a surface-cleaning effect is applicable includes: building materials, the exterior of buildings, the interior of buildings, window frames, window glass, structure members, the finish or painting of vehicles, the finish of machinery instruments or articles, dust-proof cover and paint, the finish and paint on traffic signals, various display instruments, poster columns, road soundproof walls, railroad soundproof walls, bridges, and guardrails, the interior and paint in tunnels, insulators, solar cell covers, heat-collecting covers for solar radiation hot water supply, vinyl house, lighting covers for vehicles, house facilities, toilet pans, bathes, washbasins, lighting instruments, lighting covers, kitchen utensils, tableware, dishwashers, dish driers, sinks, cooker ovens, cooker hoods, ventilating fans, and film stuck on the above-mentioned articles, are included.

Additionally, when the hydrophilic members of the invention are expected to have an anti-static effect, as such materials, for example, metal, ceramics, glass, plastics, wood, stone, cement, concrete, fiber, dishtowels, a combination of them, and laminates of them can be utilized suitably. The utility for which the members having an anti-static effect is applicable includes: Braun tubes, magnetic recording media, optical recording media, magneto-optical recording media, audio tapes, video tapes, analogue-type records, housing or parts or exteriors or paint of household electrical products, housing or parts or exteriors or paint of OA instruments and products, building materials, the exterior of buildings, the interior of buildings, window frames, window glass, structure members, the finish or painting of vehicles, the finish of machinery instruments or articles, dust-proof cover and paint, and film stuck on the above-mentioned articles.

In the hydrophilic members of the invention, the substrates having the surface comprising polymer resin are preferably used, including resin per se, the substrates of which the surface is coated with resin, and composite materials of which the surface is made of a resin layer.

The resin per se is exemplified by film substrates such as scattering preventive film, design film, or anticorrosive film; and resin substrates such as signboards or sound-proof walls on high ways.

The substrates of which the surface is coated with resin are exemplified by painting plates such as car bodies or painted building materials, laminate plates for which a resin film is stuck on the surface, primer-treated substrates, and hard coat-treated substrates.

The composite materials of which the surface is made of a resin layer are exemplified by resin seal materials provided with an adhesive layer on the backside and reflecting mirrors.

As mentioned above, using a hydrophilic member of the invention, it is possible to form a hydrophilic member having the excellent hydrophilic surface on the surface of an optional substrate in a relatively simple treatment way. Moreover, since the hydrophilicity is superior in durability, they can be used advantageously in a variety of objects as mentioned above.

3. Printing Plate Precursor

The printing plate precursor in the third aspect of the invention are those in which an image-forming layer is provided on a substrate comprising a support and a hydrophilic surface, and characterized in that:

The hydrophilic surface is formed by making a hydrophilic compound having a polymerizing group bonding directly to a polymerization initiating layer immobilized on the substrate by the crosslinking reaction of a polymer which has on the side chain thereof a crosslinking group and a functional group having a polymerization initiating capability.

The printing plate precursor of the invention can be applied as a variety of printing plate precursor, and in a particularly preferred aspect they are applied to planographic printing plate precursor. In the following explanation, the planographic printing plate precursor will be explained as an example of a particularly preferred aspect among the printing plate precursor.

The followings will explain in details a support constituting a planographic printing plate precursor and positive and negative image-forming layers.

3-1. Substrates Comprising Supports and Hydrophilic Surfaces

[Hydrophilic Surface]

The hydrophilic surface on a substrates used in the invention is formed by making a hydrophilic compound having a polymerizing group bonding directly to a polymerization initiating layer immobilized on the support by the crosslinking reaction of a polymer which has on the side chain thereof a functional group having a polymerization initiating capability and a crosslinking group.

[Polymerization Initiating Layer]

As for the polymerization initiating layer of the printing plate precursor in the invention, the same polymerization initiating layer as that formed by the process of formation of the polymerization initiating layer in the graft polymerization can be applied.

In this connection, in the specific polymerization initiating polymer adaptable to this aspect, the mole percentages for copolymerization of the copolymer component (A) having a polymerization initiating group and of the copolymer component (B) having a crosslinking group are: preferably 5 mole % or more for (A) and 10 mole % or more for (B); more preferably 5–50 mole % for (A) and 30–70 mole % for (B); and even more preferably 10–20 mole % for (A) and 30–40 mole % for (B), in view of the film characteristics of the polymerization initiating layer after the graft polymerization and crosslinking reaction.

[Supports]

In the invention, there is no limitation in the support on which the polymerization initiating layer is placed, as far as it is a dimensionally stable plate satisfying necessary flexibility, strength, durability, and so on. Such a support is exemplified by paper, paper laminated with plastic (e.g., polyethylene terephthalate, polyethylene naphthalate, polyethylene, polypropylene, polystyrene, etc.), metal plate (e.g., aluminum, zinc, copper, etc.), plastic film (e.g., cellulose diacetate, cellulose triacetate, cellulose propionate, cellulose butyrate, cellulose acetate butyrate, cellulose nitrate, polyethylene terephthalate, polyethylene naphthalate, polyethylene, polystyrene, polypropylene, polycarbonate, polyvinylacetal, etc.), and paper or plastic film laminated or vapor-deposited with the metal as mentioned above.

As for the support used in the invention, polyester film or aluminum plates are preferred. In addition, an aluminum laminated or vapor-deposited plastic film is preferred, too. The particularly preferred aluminum plate is a pure aluminum plate or an alloy plate consisting of aluminum as a major component and a small amount of other elements. Such elements include silicon, iron, manganese, copper, magnesium, chromium, zinc, bismuth, nickel, titanium, and so on. The content of the other elements in the alloy is preferably 10% by weight or less. Particularly preferred aluminum in the invention is pure aluminum, but since it is difficult to produce perfectly pure aluminum due to limitation of the refinement technique, the aluminum may contain a trace of other elements.

Since the constitution of the aluminum plate adaptable to the invention cannot be specified, any of aluminum plates made from publicly known raw materials can be utilized. The thickness of the aluminum plates used in the invention is in approximately 0.1–0.6 mm, preferably in 0.15–0.4 mm, more preferably in 0.2–0.3 mm.

(Properties of the Support Surface)

As the support on which a hydrophilic surface is formed, in view of improvement of the hydrophilicity of the hydrophilic surface or the adhesion with the image-forming layer provided thereon, those of which the surface to be hydrophilic is made rough are preferably used. The followings will explain the preferred properties of the substrate surface (solid surface) used in the invention.

The preferably roughened surface state of the substrate used in the invention is as follows: the median average roughness (Ra) of secondary roughness parameter is 0.1–1 µm; the maximum height (Ry) is 1–10 µm; an average roughness at 10 points (Rz) is 1–10 µm; an average space of concavo-convex (Sm) is 5–8 µm; an average space between the local peaks (S) is 5–80 µm; the maximum height (Rt) is 1–10 µm; the height of the peaks in the center line (Rp) is 1–10 µm; and the depth of the bottom in the center line (Rv) is 1–10 µm. It is appropriate to satisfy one or more of, and preferably all of these conditions.

The secondary roughness parameter is based on the following definition.

The median average roughness (Ra): the value obtained by drawing out the part L of the measured length from a roughness curve in the direction of the center line, followed by subjecting the absolute value of deviation between the removed center line and the roughness curve to the arithmetic means.

The maximum height (Ry): the value obtained by drawing out the standard length from the roughness curve in the direction of the average line, and measuring the space between the peak line and the bottom line of the drawn-out portion in the direction of the longitudinal magnification of the roughness curve.

Average roughness at 10 points (Rz): the value obtained by drawing out the standard length from the roughness curve in the direction of the average value, and measuring the drawn-out portion from the average line in the direction of the longitudinal magnification, wherein the sum of the average absolute value of the heights (YP) from the highest peak to the fifth peak and that of the heights (Yv) from the lowest bottom to the 5th bottom is represented by micrometer (µm).

Average space of concavo-convex (Sm); the value obtained by drawing out the standard length from the roughness curve in the direction of the average value, then obtaining the sum of the average lines corresponding to a peak and an adjacent bottom in the drawn-out portion, and representing the arithmetic means of a large number of concavo-convex spaces by micrometer (µm).

Average space between the local peaks (S): the value obtained by drawing out the standard length from the roughness curve in the direction of the average value, then obtaining the length of the average lines corresponding to a local peak-to-peak space in the drawn-out portion, and representing the arithmetic means of a large number of local peak-to-peak spaces by micrometer (µm).

Maximum height (Rt): the value of the space between two straight lines obtained by drawing out the standard length from the roughness curve and put the drawn-out portion between two straight lines parallel to the center line.

Height of the peaks in the center line (Rp): the value obtained by drawing out the part L of the measured length from the roughness curve in the direction of the center line, and measuring the space between the center line of the drawn-out portion and the straight line parallel to the center line and passing through the highest peak.

Depth of the bottom in the center line (Rv): the value obtained by drawing out the part L of the measured length from the roughness curve in the direction of the center line, and measuring the space between the center line of the drawn-out portion and the straight line parallel to the center line and passing through the lowest bottom.

The amount of the polymerization initiating layer to be coated is preferably 0.1–20 $g/m^2$ by weight after drying, more preferably 1–15 $g/m^2$. Less than 0.1 $g/m^2$ of the coating amount possibly makes the polymerization initiating capability insufficient and results in insufficient graft polymerization, which gives no desired firm graft structure. On the other hand, more than 20 $g/m^2$ of the coating amount tends to decrease the film characteristic and easily cause peeling-off. Either cases are not preferred.

[Formation of the Hydrophilic Surface]

In the planographic printing plate precursor of the invention, the hydrophilic surface may be formed by making a hydrophilic compound having a polymerizing group bonding directly to the polymerization initiating layer.

The hydrophilic surface may be formed in the same manner as mentioned in details in the explanation of the hydrophilic members as the second aspect of the invention.

Thus formed hydrophilic surface, since the hydrophilic compound constituting it is directly bonded as a graft chain to the polymerization initiating layer, shows excellent hydrophilicity with better hydrophilic durability.

The thickness of the layer forming the hydrophilic surface (graft polymer layer) may be chosen according to the purpose, and in general it is preferably in the range of 0.001 µm to 10 µm, more preferably 0.01 µm to 5 µm, and most preferably 0.1 µm to 2 µm. Excessively thin layer has a tendency to make flaw resistance decrease, and to the contrary an excessively thick layer has a tendency to make ink sweeping-off worse.

When the hydrophilicity of the hydrophilic surface is high, the graft polymer forming a hydrophilic surface is not necessary to completely cover the support surface. When a graft polymer is applied on the surface of a publicly known hydrophilic support by graft polymerization to enhance hydrophilicity, the application of 0.1% or more of the graft polymer for the entire surface of the support produces a significant effect on improvement of the hydrophilicity. More particularly, the graft polymer is preferably applied at the rate of 1% or more for the entire surface and more preferably at 10% or more.

3-2. Image-Forming Layer

The planographic printing plate precursor of the invention comprises providing an image-forming layer as mentioned below on the hydrophilic surface of a substrate. In the image-forming layer (photosensitive layer or heat-sensitive layer) of the planographic printing plate precursor of the invention, a variety of known components of image-forming materials can be chosen properly and used. The image-forming layer can be classified into two types, that is, a positive type of which the solubility in an alkali aqueous solution is increased by exposure and a negative type of which the solubility in an alkali aqueous solution is decreased conversely.

The followings will explain the respective components used in the positive image-forming layer and the negative image-forming layer.

3-2-1. Positive Image-Forming Layer

The positive image-forming layer contains the following positive working sensitive components.

As the positive working sensitive components in the invention, the following so far known components [(a) to (d)] can preferably be used.

(a) A so far used conventional positive working photosensitive composition comprising naphthoquinone diazide and novolac resin.

(b) A laser sensitive positive composition comprising a polymer compound insoluble in water but soluble in an alkaline aqueous solution and a light-to-heat conversion agent, of which the solubility in an alkaline aqueous solution is increased by light or heat.

(c) A laser sensitive positive composition comprising a thermally decomposed sulfonic acid ester polymer or a acid-decomposed carboxylic acid ester polymer and an infrared absorbent.

(d) A chemically amplified positive working photosensitive composition comprising a combination of an alkali-soluble compound protected by an acid-decomposing group and an acid-generating agent.

The followings will explain the compounds used in the positive working sensitive compositions as shown in the above items (a) to (d).

[Naphthoquinone Diazides]

In the positive working sensitive composition (a), quinone diazide compounds suitable as the naphthoquinone diazides are exemplified by o-quinone diazide compounds. The o-quinone diazide compounds used in the invention have at least one o-quinone diazide group and show increased alkali solubility by thermal decomposition. A variety of compounds having such structure can be used. That is, the o-quinone diazides lose the dissolution inhibitory capability as alkali soluble compounds by thermal decompositon and they themselves are transformed into alkali soluble substances. Thus, both effects assist dissolution of the sensitive materials. As for the o-quinone diazide compounds used in the invention, for example, those as described in J. Korser, "Light Sensitive Systems" (John Wiley & Sons. Inc.), p.339–352, are included, in which the sulfonic acid esters or sulfonamides of o-quinone diazides allowed to react with various aromatic polyhydroxy compounds or aromatic amino compounds are particularly preferred. In addition, an ester of pyrogallol-acetone resin with benzoquinone-(1,2)-diazidosulfonic acid chloride or naphthoquinone-(1,2)-diazido-5-sulfonic acid chloride as described in JP-B No. 43-28403; and an ester of phenol-formaldehyde resin with benzoquinone-(1,2)-diazidosulfonic acid chloride or naphthoquinone-(1,2)-diazido-5-sulfonic acid chloride as described in U.S. Pat. Nos. 3,046,120 and 3,188,210.

In addition, esters of phenol-formaldehyde resin or cresol-formaldehyde resin with naphthoquinone-(1,2)-diazido-4-sulfonic acid chloride, and esters of pyrogallol-acetone resin with naphthoquinone-(1,2)-diazido-4-sulfonic acid chloride are also used preferably. Other useful o-quinone diazide compounds have been reported in a large number of documents relating to patent. For example, the documents include JP-A Nos. 47-5303, 48-63802, 48-63803, 48-96575, 49-38701, and 48-13354, JP-B No. 41-11222, 45-9610, and 49-17481, U.S. Pat. Nos. 2,797,213, 3,454,400, 3,544,323, 3,573,917, 3,674,495, and 3,785,825, British Patent Nos. 1,227,602, 1,251,345, 1,267,005, 1,329,888, and 1,330,932, and German Patent No. 854,890.

In the invention, the content of the o-quinone diazide compounds for the entire solid component of the image-forming layer is 1–50% by weight, preferably 5–30% by weight, and more preferably 10–30% by weight. These compounds may be used alone or as a mixture of several compounds.

"A Polymer Compound Insoluble in Water but Soluble in an Alkaline Aqueous Solution (including Novolac Resin)

The major component for forming an image-forming layer of the planographic printing plate precursor, of the invention i.e., a polymer compound insoluble in water but soluble in an alkaline aqueous solution (hereinafter referred to as an alkali-soluble polymer compound), indicates those having an acid group as structure as mentioned below on the principal chain or side chain.

Phenolic hydroxyl group (—Ar—OH), carboxylic acid group (—$CO_2H$), sulfonic acid group (—$SO_3H$), phosphoric acid group (—$OPO_3H$), sulfonamide group (—$SO_2NH$—R), and substituted sulfonamide-type acid group (active imide group)(—$SO_2NHCOR$, —$SO_2NHSO_2R$, —$CONHSO_2R$). Wherein, Ar represents an optionally substituted divalent aryl group, and R represents an optionally substituted hydrocarbon group. Particularly preferred acid group includes (a-1) phenolic hydroxyl group, (a-2) sulfonamide group, and (a-3) active imide group. Particularly, an alkali soluble polymer compound having a phenolic hydroxyl group (a-1) is used most preferably.

(a-1) The alkali soluble polymer compound having a phenolic hydroxyl group includes, for example, novolac resins such as a condensation polymer of phenol and formaldehyde (hereinafter referred to as "phenol-formaldehyde resin"), a condensation polymer of m-cresol and formaldehyde (hereinafter referred to as "m-creaol-formaldehyde resin"), a condensation polymer of p-cresol and formaldehyde, a condensation polymer of m-/p-mixed cresol and formaldehyde, and a condensation polymer of phenol, cresol (any of m-. p-, or m-/p-mixture) and formaldehyde; and a condensation polymer of pyrogallol and acetone. In addition, copolymers prepared by copolymerizing a monomer having a phenol group on the side chain may also be used. The monomer having a phenol group used in the copolymerization includes acrylamides, methacrylamides, acrylic acid esters, methacrylic acid esters or hydroxystyrenes having a phenol group. Specifically, N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, 2-(4-hydroxyphenyl)ethyl methacrylate, 2-(N'-(4-hydroxyphenyl)ureido)ethyl acrylate, 2-(N'-(4-hydroxyphenyl)ureido)ethyl methacrylate, and the like, can be used preferably.

These compounds may be used alone or in a combination of two or more species. When the compounds are used in combination, a condensation polymer of formaldehyde and a phenol having an alkyl group of 3 to 8 carbons as a substituent, such as a condensation polymer of t-butylphenol and formaldehyde or a condensation polymer of octylphenol and formaldehyde, as described in U.S. Pat. No. 4,123,279, may be used together.

Further, as described in U.S. Pat. No. 4,123,279, a condensation polymer of formaldehyde and a phenol having an alkyl group of 3 to 8 carbons as a substituent such as t-butylphenol-formaldehyde resin or octylphenol-formaldehyde resin may be used in combination. Such a resin containing a phenolic hydroxyl group may be used alone or in combination of two or more species.

(a-2) In the case of an alkali-soluble polymer compound having a sulfonamide group, the sulfonamide-containing monomer (a-2), which is a major monomer constituting the polymer compound, includes monomers comprising a low molecular compound containing one or more of sulfonamide groups of which the nitrogen atom is bonded by at least one hydrogen atom and one or more of polymerizable unsaturated linkages in one mdecule. Among them, low molecular compounds which have an acryloyl, allyl or vinyloxy group and a substituted or mono-substituted aminosulfonyl or substituted sulfonylimino group are preferred. Specifically, m-aminosulfonylphenyl methacrylate, N-(p-aminosulfonylphenyl)methacrylamide, N-(aminosulfonylphenyl)acrylamide, and the like may preferably be used.

(a-3) The alkali-soluble polymer compound having an active imide group is a major monomer constituting the polymer compound, which has an active imide group in the molecule.

As for such a polymer compound, specifically, N-(p-toluenesulfonyl)methacrylamide and N-(p-toluenesulfonyl) acrylamide may preferably be used.

In the invention, the weight-average molecular weight of the alkali-soluble polymer compounds is preferably in $5.0 \times 10^2 - 2.0 \times 10^5$, and the number average molecular weight is in $2.0 \times 10^2 - 1.0 \times 10^5$, to give a preferable image-forming property.

The content of the alkali-soluble polymer compounds in the entire solid component of the image-forming layer is about 10–90% by weight, preferably 20–85% by weight, and more preferably 30–80% by weight, in view of sensitivity and durability.

[Light-to-Heat Conversion Agent (Infrared Absorbent)]

When the planographic printing plate precursor of the invention is permitted to record an image by IR laser, it is appropriate to add a light-to-heat conversion agent (infrared absorbent) to any part of the planographic printing plate precursor in order to convert the light energy into thermal energy. The part to which the light-to-heat conversion agent is added is, for example, a hydrophilic surface or image-forming layer, or another layer provided between the hydrophilic surface and the image-forming layer.

In the planographic printing plate precursor of the invention, the light-to-heat conversion agent which may be added includes all of those which can absorb light such as ultraviolet, visible light, infrared or white light to convert into heat, for example, carbon black, carbon graphite, pigment, phthalocyanine pigment, iron powder, graphite powder, iron oxide powder, lead oxide, silver oxide, chromium oxide, iron sulfide, chromium sulfide, and the like. Particularly preferred is a dye, pigment or metal which effectively absorbs infrared ray at a wavelength of from 760 nm to 1200 nm.

As the dye, a commercially available one or a publicly known one described in documents (e.g., "Dye Handbook", edited by Society of Synthetic Organic Chemistry, Japan, 1970) can be utilized. Specifically, azo dye, metal complex azo dye, pyrazolone azo dye, anthraquinone dye, phthalocyanine dye, carbonium dye, quinone imine dye, methine dye, cyanine dye, metal thiolate complex, and the like, are included. The preferred dye includes, for example, cyanine dyes as described in JP-A Nos. 58-125246, 59-84356, 59-202829 and 60-78787; methine dyes as described in JP-A Nos. 58-173696, 58-181690, and 58-194595; naphthoquinone dyes as described in JP-A Nos. 58-112793, 58-224793, 59-48187, 59-73996, 60-52940, and 60-63744; squarylium pigments as described in JP-A No. 58-112792; and cyanine dyes as described in British Patent No. 434,875, are included.

In addition, a near-infrared absorption sensitizer as described in U.S. Pat. No. 5,156,938; a substituted arylbenzo (thio) pyrylium salt as described in U.S. Pat. No. 3,881,924; trimethine thiapyrylium salt as described in JP-A No. 57-142645 (U.S. Pat. No. 4,327,169); pyrylium compounds as described in JP-A Nos. 58-181051, 58-220143, 59-41363, 59-84248, 59-84249, 59-146063, and 59-146061; a cyanine pigment as described in JP-A No. 59-216146; pentamethine thiopyrylium salts as described in U.S. Pat. No. 4,283,475; and a pyrylium compound as described in JP-B Nos. 5-13514 and 5-19702, can be used preferably. As other examples of the preferred dyes, near-infrared absorption dyes described as formulae (I) and (II) in U.S. Pat. No. 4,756,993 can be exemplified. Among these dyes, particularly preferred are cyanine pigments, squarylium pigments, pyrylium salts, and nickel thiolate complexes.

As for the pigments used in the invention, commercially available pigments and those as described in Color Index (C. I.) Handbook, "Current Pigment Handbook" (edited by Japan Association of Pigment Technology, 1977), "Current Technology for Application of Pigments" (CMC PRESS, 1986), and "Technology of Printing Ink" (CMC PRESS, 1984) can be utilized. The type of pigments include black pigment, yellow pigment, orange pigment, brown pigment, red pigment, violet pigment, blue pigment, green pigment, fluorescent pigment, metal powder pigment, others, and polymer-bonding pigment. Specifically, insoluble azo pigment, azo lake pigment, condensed azo pigment, chelate azo pigment, phthalocyanine pigment, anthraquinone pigment, perylene and perynone pigment, thioindigo pigment, quinacridone pigment, dioxazine pigment, isoindolinone pigment, quinophthalone pigment, dye lake pigment, azine pigment, nitroso pigment, nitro pigment, natural pigment, fluorescent pigment, inorganic pigment, carbon black, and the like can be used. Among these pigments, particularly preferred is carbon black.

These dyes or pigments may be used at the rate of 0.01–50% by weight, preferably 0.1–10% by weight, for the entire solid component of the layer containing a light-to-heat conversion agent, in view of sensitivity and film strength. Particularly, preferably the dye may be used at the rate of 0.5–10% by weight and the pigment at the rate of 3.1–10% by weight.

"Thermally Decomposing Sulfonic Acid Ester Polymer or Acid Decomposing Carboxylic Acid Ester Polymer"

As the thermally decomposing sulfonic acid ester polymer or acid decomposing carboxylic acid ester polymer used in the invention, those described in JP-A No. 10-282672, EP652,483, and JP-A No. 6-502260 can be used. Specifically, such a polymer includes, for example, secondary sulfonic acid ester polymers such as cyclohexyl polystyrenesulfonate, isopropyl polystyrenesulfonate and 1-methoxy-2-poropyl polystyrenesulfonate, and acrylic acid esters protected by an acid decomposing group such as t-butyl polymethacrylate and tetrahydropyranyl polymethacrylate.

"Alkali Soluble Compounds Protected by an Acid Decomposing Group"

In the invention, the alkali soluble compound protected by an acid decomposing group means a compound which is decomposed by the action of acid to become soluble in alkali aqueous solution. The acid decomposing group includes well-known protective groups such as t-butyl ester, t-butyl carbamate, and alkoxyethyl ester.

"Acid-Generating Agents"

The acid-generating agents used in the invention are compounds which generate an acid under heating or lighting, generally including known compounds generating an acid by light and their mixtures used as photo-initiators in light cationic polymerization or light radical polymerization, photobleaching agents in pigments, photo-discoloring agents, and microresist. These compounds may optionally be chosen and used. Specifically, they include, for example, diazonium salts, onium salts, halides, and sulfonic acid esters.

For example, the following compounds are included: onium salts, for example, diazonium salts as described in S. I. Schlesinger, Photogr. Sci. Eng., 18, 387 (1974), T. S. Bal et al., Polymer, 21, 423 (1980); ammonium salts as described in U.S. Pat. Nos. 4,069,055 and 4,069,056, JP-A No. 3-140140; phosphonium salts as described in D. C. Necker et al., Macromolecules, 17, 2468 (1984), C. S. Wen et al., Teh, Proc. Conf. Rad. Curing ASIA, p.478, Tokyo, October (1988), U.S. Pat. Nos. 4,069,055 and 4,069,056; iodonium salts as described in J. V. Crivello et al., Macromolecules, 10(6), 1307 (1977), Chem. & Eng. News, November 28, p.31 (1988), EP No. 104,143, U.S. Pat. Nos. 5,041,358 and 4,491,628, JP-A Nos. 2-150848 and 2-296514; sulfonium salts as described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP No. 370,693, U.S. Pat. No. 3,902,114, EP Nos. 233,567, 297,443 and 297,442, U.S. Pat. Nos. 4,933,377, 4,491,628, 5,041, 358, 4,760,013, 4,734,444 and 2,833,827, German Pat. Nos. 2,904,626, 3,604,580 and 3,604,581; selenonium salts as described in J. V. Crivello et al., Macromolecules, 10(6), 1307 (1977), J. V. Crivello et al., J. Polymer Sci., Polymer Chem. Ed., 17, 1047 (1979); and arsonium salts as described in C. S. Wen et al., Teh, Proc. Conf. Rad. Curing ASIA, p.478, Tokyo, October (1988);

organic halides as described in U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339; organometallic/organic halides as described in K. Meier et al., J. Rad. Curing, 13(4), 26 (1986), T. P. Gill et al., Inorg. Chem., 19, 3007 (1980), D. Astruc, Acc. Chem. Res., 19(12), 377 (1986), JP-A No. 2-161445; light acid-generating agents having o-nitrobenzyl type protecting groups as described in S. Hayase et al., J. Polymer Sci., 25, 753 (1987), E. Reichman et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17) 1445 (1975), J. W. Walker et al., J. Am. Chem. Soc., 110, 7170 (1988), S. C. Busman et al., J. Imaging Technol., 11(4) (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130(6), F. M. Houlihan et al., Macromolecules, 21, 2001 (1988), EP Nos. 0,290,750, 046,083, 156,535, 271,851 and 0,388,343, U.S. Pat. Nos. 3,901,710 and 4,181,531, JP-A Nos. 60-198538 and 53-133022;

compounds generating sulfonic acid by photo-decomposition exemplified by iminosulfonates as described in TUNOOKA et al., Polymer Preprints Japan, 35(8), G. Berner et al., J. Rad. Curing, 13(4), W. J. Mijs et al., Coating Technol., 55(697), 45(1983), Akzo, H. Adachi et al., Polymer Preprints, Japan, 37(3), EP Nos. 0,199,672, 84,515, 199,672, 044,115, and 0,101,122, U.S. Pat. Nos. 4,618,554, 4,371,605 and 4,431,774, JP-A Nos. 64-18143, 2-245756 and 3-140109; and disulfone compounds as described in JP-A No. 61-166544.

In addition, compounds in which an acid-generating agent has been introduced on the main chain or side chain of the polymer, for example, as described in M. E. Woodhouse et al., J. Am. Chem. Soc., 104, 5586 (1982), S. P. Pappas et al., J. Imaging Sci., 30(5), 218 (1986), S. Kondo et al., Makromol. Chem. Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent No. 3,914,407, JP-A Nos. 63-26653, 55-164824, 62-69263, 63-14603, 63-163452, 62-153853, and 63-146029, can be used.

In addition, compounds which generate an acid under light, as described in V. N. R. Pillai, Synthesis, (1) 1 (1980), A. Abad et al., Tetrahedron Lett., (47) 4555 (1971), D. H. R. Barton et al., J. Chem. Soc., (C) 329 (1970), U.S. Pat. No. 3,779,778, and EP No. 126,712, can also be used.

In the invention, the amount of the acid-generating agent to be added is preferably at the rate of 0.001–40% by weight for the entire solid component of the image-forming layer, more preferably at 0.01–20% by weight, and even more preferably at 0.1–5% by weight.

In the preferred aspect, the positive image-forming layer in the planographic printing plate precursor of the invention comprises a substance which absorbs light to generate heat and a polymer compound insoluble in water but soluble in alkali, and its solubility in an alkaline aqueous solution is increased by exposure. This image-forming layer corresponds to the positive image-forming layer to which a laser-sensitive positive composition is adapted as mentioned in the item (b). The followings will further explain such a positive image-forming layer in details.

3-2-2. Positive Recording Layer of which the Solubility in an Alkaline Aqueous Solution is Increased by Exposure The positive recording layer of which the solubility in an alkaline aqueous solution is increased by exposure is characterized in that the recording layer comprises a substance which absorbs light to generate heat and a polymer compound insoluble in water but soluble in alkali, and its solubility in an alkaline aqueous solution is increased by exposure.

The followings will explain each component used in the positive recording layer.

[Substance which Absorbs Light to Generate Heat]

As for the substance which absorbs light to generate heat used in the invention (hereinafter referred to as light-to-heat conversion agent), there is no limitation in the range of absorbed wavelength, as far as it works to absorb light energy irradiation ray used for recording and generate heat. However, in view of the applicability to a readily available high power laser, an infrared absorbing dye or pigment having the absorption maximum at a wavelength of 760 nm to 1200 nm can be used preferably.

As for the dye used as light-to-heat conversion agent in the invention, a commercially available one or a publicly known one described in documents, for example, "Dye Handbook" (edited by Society of Synthetic Organic Chemistry, Japan, 1970) can be utilized. Specifically, azo dye, metal complex azo dye, pyrazolone azo dye, naphthoquinone dye, anthraquinone dye, phthalocyanine dye, carbonium dye, quinone imine dye, methine dye, cyanine dye, squarylium pigment, pyrylium salt, metal thiolate complex, oxonol dye, diimmonium dye, aminium dye, croconium dye, and the like, are included.

The preferred dye includes, for example, cyanine dyes as described in JP-A Nos. 58-125246, 59-84356, 59-202829 and 60-78787; methine dyes as described in JP-A Nos. 58-173696, 58-181690, and 58-194595; naphthoquinone dyes as described in JP-A Nos. 58-112793, 58-224793, 59-48187, 59-73996, 60-52940, and 60-63744; squarylium pigments as described in JP-A No. 58-112792; and cyanine dyes as described in British Patent No. 434,875, are included.

In addition, a near-infrared absorption sensitizer as described in U.S. Pat. No. 5,156,938; a substituted arylbenzo (thio) pyrylium salt as described in U.S. Pat. No. 3,881,924; trimethine thiapyrylium salt as described in JP-A No. 57-142645 (U.S. Pat. No. 4,327,169); pyrylium compounds as described in JP-A Nos. 58-181051, 58-220143, 59-41363, 59-84248, 59-84249, 59-146063, and 59-146061; a cyanine pigment as described in JP-A No. 59-216146; pentamethine thiopyrylium salts as described in U.S. Pat. No. 4,283,475; and a pyrylium compound as described in JP-B Nos. 5-13514 and 5-19702, can also be used preferably.

As other examples of the preferred dyes, near-infrared absorption dyes described as formulae (I) and (II) in U.S. Pat. No. 4,756,993.

Among these dyes, particularly preferred are cyanine pigments, phthalocyanine dyes, oxonol dyes, squarylium pigments, pyrylium salts, thiopyrylium dyes and nickel thiolate complexes. Moreover, dyes represented by the following general formulae (a) to (e) are preferred since they have a high light-to-heat conversion rate. Particularly, cyanine pigments represented by the following general formula (a), when used in the polymerizing components of the invention, are the best since they can afford a high polymerization activity and are stable and economical.

General formula (a)

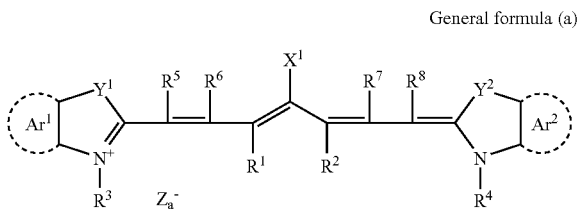

In the general formula (a), $X^1$ represents a hydrogen atom, halogen atom, $-NPh_2$, $X^2-L^1$ or the group as mentioned below. Wherein, $X^2$ represents an oxygen atom or sulfur atom; and $L^1$ represents a hydrocarbon group of 1 to 12 carbon atoms, heteroatom-containing aromatic ring, or heteroatom-containing hydrocarbon group of 1 to 12 carbon atoms. In this definition, the heteroatom means N, S, O, halogen atom, or Se.

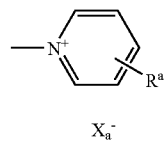

$R^1$ and $R^2$ each independently represents a hydrocarbon group of 1 to 12 carbon atoms. Considering the preservative stability of a coating solution of the recording layer, $R^1$ and $R^2$ both are preferably hydrocarbon groups of 2 or more carbon atoms. Moreover, it is particularly preferred that $R^1$ and $R^2$ are bonded to each other to form a 5- or 6-membered ring.

$Ar^1$ and $Ar^2$ are the same or different, each representing an optionally substituted aromatic hydrocarbon group. The preferred aromatic hydrocarbon group includes benzene rings and naphthalene rings. The preferred substitutent includes hydrocarbon groups of up to 12 carbon atoms, halogen atoms, and alkoxy groups of up to 12 carbon atoms. $Y^1$ and $Y^2$ are the same or different, each representing a sulfur atom or dialkylmethylene group of up to 12 carbon atoms. $R^3$ and $R^4$ are the same or different, each representing an optionally substituted hydrocarbon group of up to 20 carbon atoms. The preferred substitutent includes alkoxy groups of up to 12 carbon atoms, carboxyl and sulfo. $R^5$, $R^6$, $R^7$ and $R^8$ are the same or different, each representing a hydrocarbon group of up to 12 carbon atoms. In view of availability of the raw material, hydrogen atom is preferred. $Z_a^-$ indicates a counter anion. When any of $R^1$ to $R^8$ is substituted by sulfo, however, $Z_a^-$ is unnecessary. Considering the preservative stability of a coating solution of the recording layer, the preferred $Z_a^-$ is a halogen ion, perchlorate ion, tetrafluoroborate ion, hexafluorophosphate ion, and sulfonic acid ion, with perchlorate ion, hexafluorophosphate ion, and arylsulfonic acid ion being particularly preferred.

In the invention, specific examples of the preferably used cyanine pigments represented by the formula (a) are as mentioned below. In addition, those as described in JP-A No. 2001-133969, paragraph number [0017]-[0019]; JP-A No. 2002-40638, paragraph number [0012]-[0038]; and JP-A No. 2002-23360, paragraph number [0012]-[0023] are included.

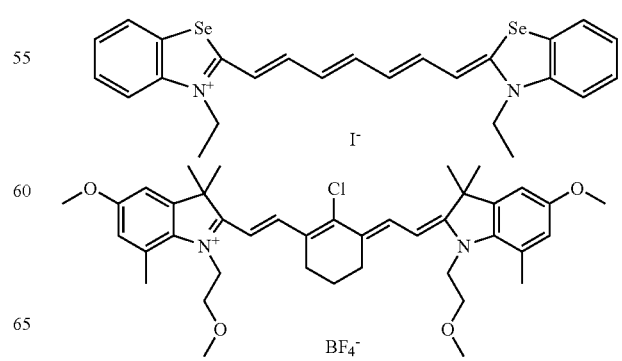

-continued
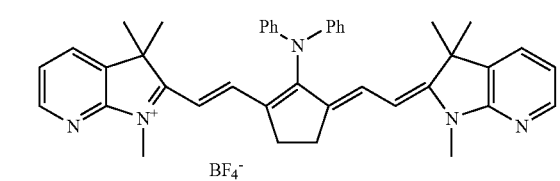
BF$_4^-$
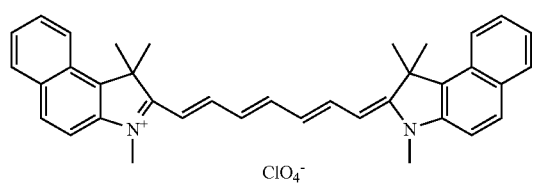
ClO$_4^-$
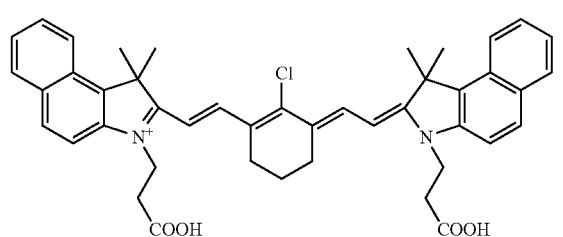
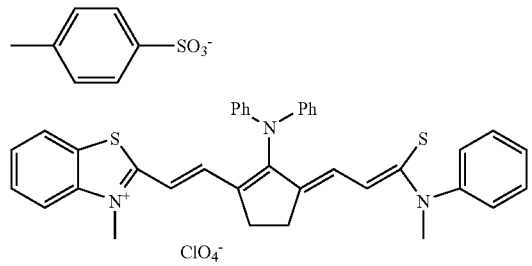
ClO$_4^-$
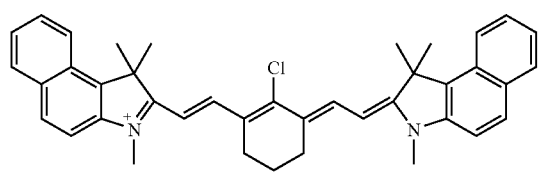
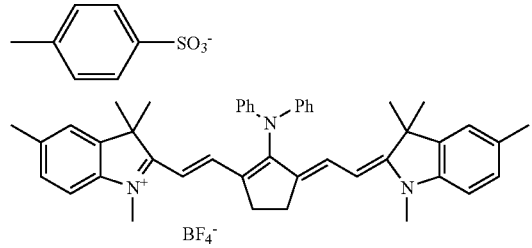
BF$_4^-$
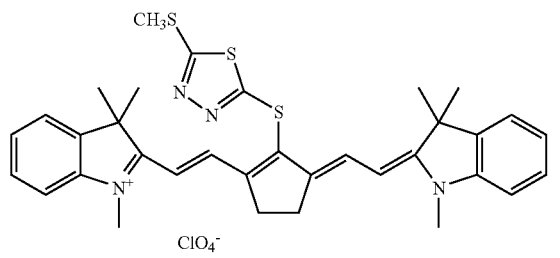
ClO$_4^-$
-continued
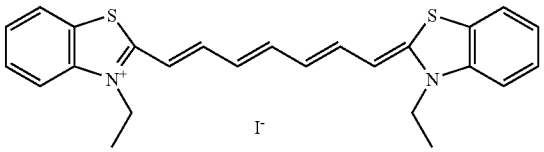
I$^-$
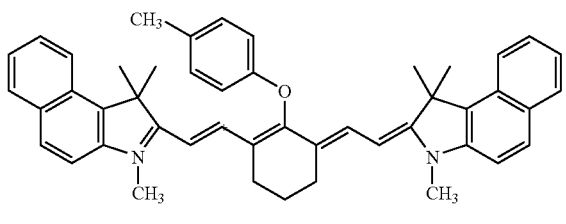
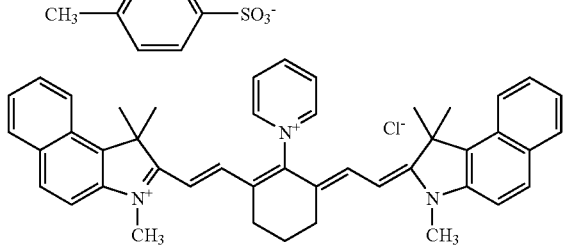
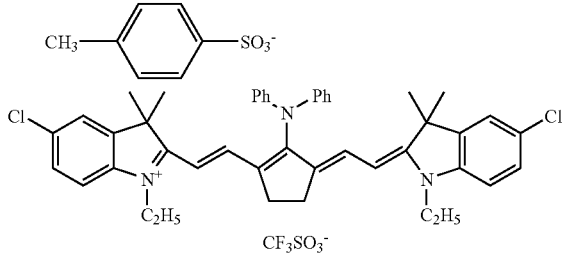
CF$_3$SO$_3^-$
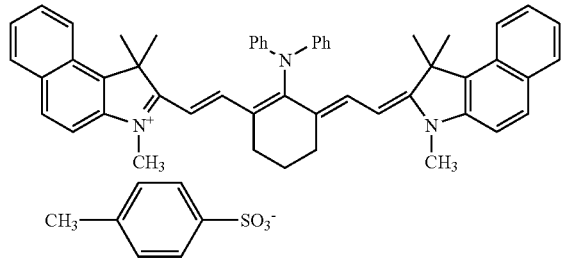
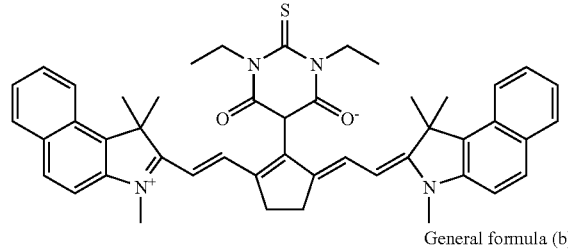
General formula (b)
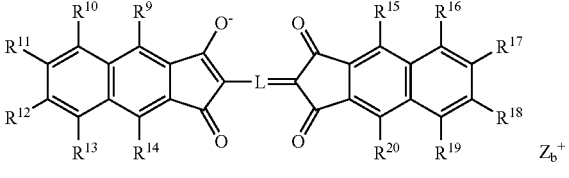
Z$_b^+$ In the general formula (b), L represents a methine chain of 7 or more conjugate carbon atoms, which may have a substituent or substituents and in which the substituents may bond with each other to form a ring structure. $Zb^+$ indicates a counter cation. The preferred counter cation includes ammonium, iodonium, sulfonium, phosphonium, pyridinium, alkali metal cation ($Na^+$, $K^+$, $Li^+$), and the like. $R^9$ to $R^{14}$ and $R^{15}$ to $R^{20}$ each independently represents a hydrogen atom or a substitutent selected from halogen atom, cyano, alkyl group, aryl group, alkenyl group, alkynyl group, carbonyl, thio, sulfonyl, sulfinyl, oxy or amino, or alternatively 2 or 3 of them may be combined to represent a substituent and bonded to each other to form a ring structure. In the general formula (b), in view of easiness of availability and effect, the compounds in which L represents a methine chain of 7 conjugate carbon atoms and all of $R^9$ to $R^{14}$ and $R^{15}$ to $R^{20}$ are hydrogen atoms are preferred.

Specific examples of the dyes of the formula (b) preferably used in the invention include the following compounds.

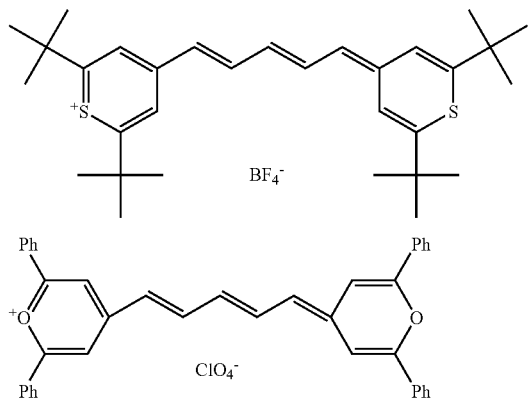

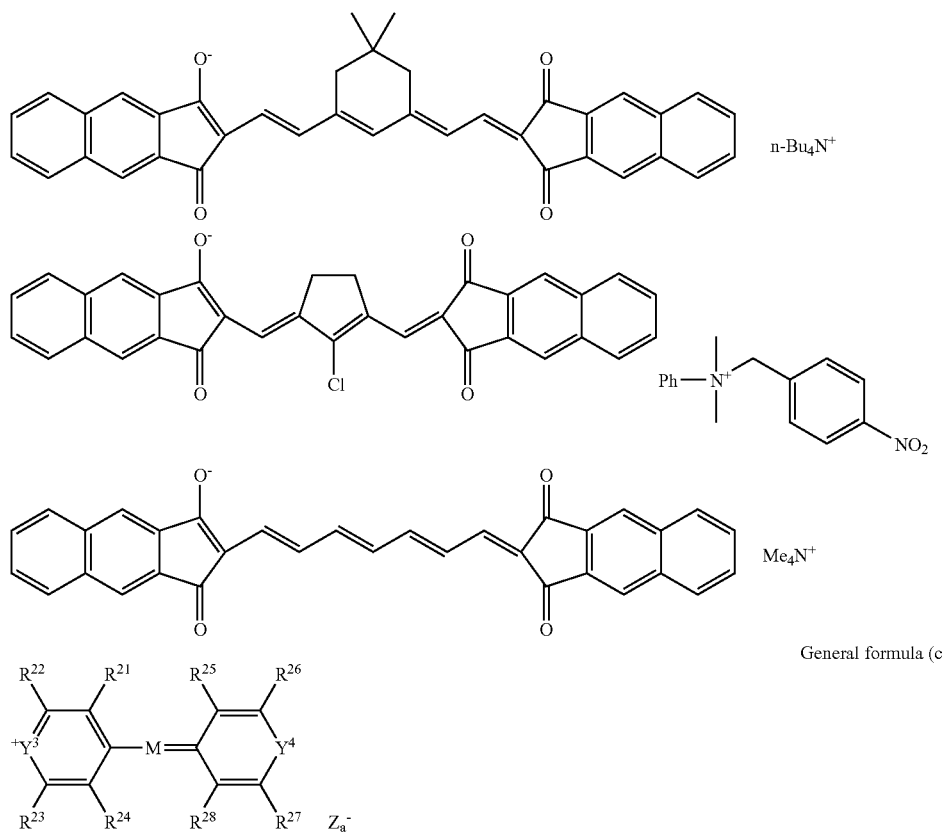

In the general formula (c), $Y^3$ and $Y^4$ each represents an oxygen atom, sulfur atom, selenium atom, or tellurium atom. M represents a methine chain of 5 or more conjugate carbon atoms. $R^{21}$ to $R^{24}$ and $R^{25}$ to $R^{28}$ are the same or different, each representing a hydrogen atom, halogen atom, cyano, alkyl group, aryl group, alkenyl group, alkynyl group, carbonyl, thio, sulfonyl, sulfinyl, oxy or amino. $Za^-$ represents a counter anion and has the same significance as $Za^-$ in the formula (a).

Specific examples of the dyes of the formula (c) preferably used in the invention include the following compounds.

-continued

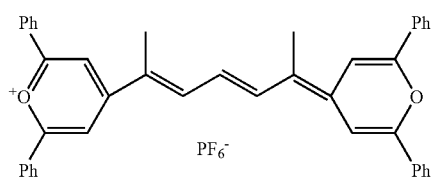

-continued

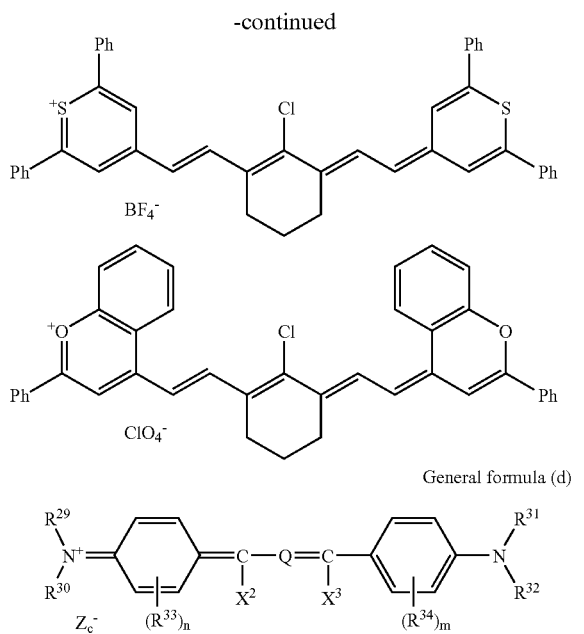

General formula (d)

-continued

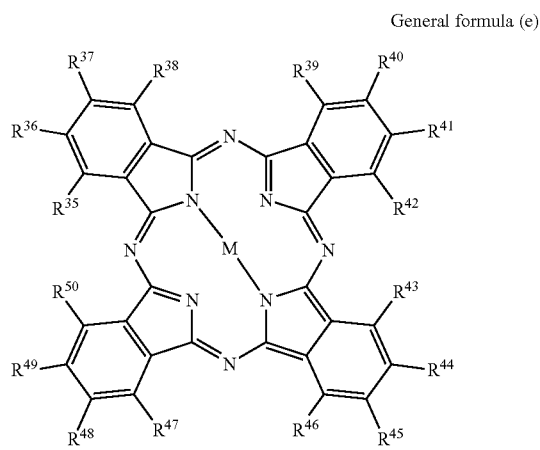

General formula (e)

In the general formula (e), $R^{35}$ to $R^{50}$ each independently represents a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group, or an onium salt structure, and in the case where a substituent can be introduced, these groups may have a substituent. M represents two hydrogen atoms or metal atoms, halometal, or oxymetal, in which the metal atom includes the atoms of the IA, IIA, IIIB and IVB groups in the periodic chart of the elements as well as the transition metals of the first, second and third period, and Lanthanide elements. Particularly, copper, magnesium, iron, zinc, cobalt, aluminum, titanium, and vanadium are preferred.

In the general formula (d), $R^{29}$ to $R^{31}$ each independently represents a hydrogen atom, alkyl group, or aryl group. $R^{33}$ and $R^{34}$ each independently represents an alkyl group, substituted oxy group, or halogen atom. n and m each indicates independently an integer of 0 to 4. $R^{29}$ and $R^{30}$ or $R^{31}$ and $R^{32}$ may bond with each other to form a ring. $R^{29}$ and/or $R^{30}$ may be taken with $R^{33}$, or $R^{31}$ and/or $R^{32}$ may be taken with $R^{34}$, to form a ring. Further, when there are plurality or more of $R^{33}$ or $R^{34}$, plurality of $R^{33}$ or two of $R^{34}$ may bond with each other to form a ring. $X^2$ and $X^3$ each independently represents a hydrogen atom, alkyl group, or aryl group, and at least one of $X^2$ and $X^3$ represents a hydrogen atom or alkyl group. Q is an optionally substituted trimethine or pentamethine, or taken with a divalent organic group may form a ring structure. Zc⁻ represents a counter anion and has the same significance as Za⁻ in the formula (a).

Specific examples of the dyes of the formula (d) preferably used in the invention include the following compounds.

Specific examples of the dyes of the formula (e) preferably used in the invention include the following compounds.

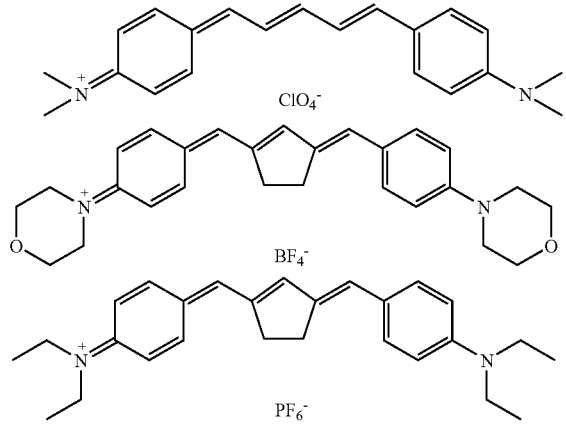

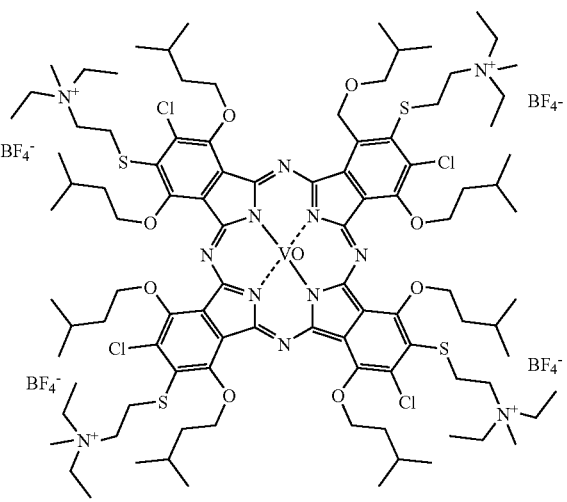

-continued

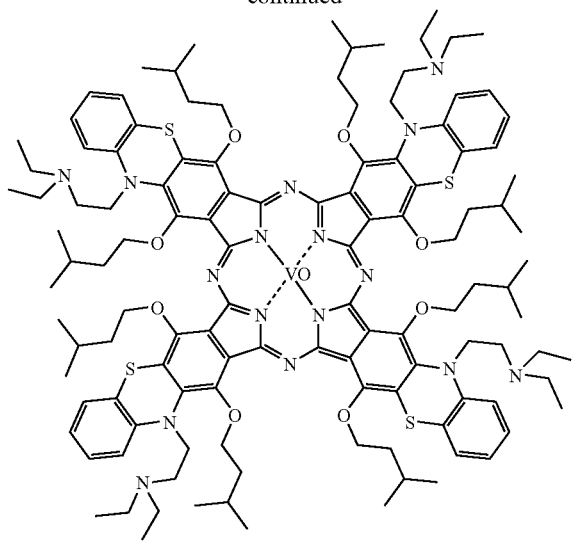

As for the pigments used as light-to-heat conversion agents in the invention, commercially available pigments and those as described in Color Index (C.I.) Handbook, "Current Pigment Handbook" (edited by Japan Association of Pigment Technology, 1977), "Current Technology for Application of Pigments" (CMC PRESS, 1986), and "Technology of Printing Ink" (CMC PRESS, 1984) can be utilized.

The type of pigments include black pigment, yellow pigment, orange pigment, brown pigment, red pigment, violet pigment, blue pigment, green pigment, fluorescent pigment, metal powder pigment, others, and polymer-bonding pigment. Specifically, insoluble azo pigment, azo lake pigment, condensed azo pigment, chelate azo pigment, phthalocyanine pigment, anthraquinone pigment, perylene and perynone pigment, thioindigo pigment, quinacridone pigment, dioxazine pigment, isoindolinone pigment, quinophthalone pigment, dye lake pigment, azine pigment, nitroso pigment, nitro pigment, natural pigment, fluorescent pigment, inorganic pigment, carbon black, and the like can be used. Among these pigments, particularly preferred is carbon black.

These pigments can be used with or without surface treatment. The surface treatment is considered to be achieved by coating of the surface with resin or wax, by adhesion of a surface active agent, or by bonding of a reactive material (for example, silane-coupling agent, epoxy compound, polyisocyanate) to the pigment surface. The above-mentioned methods for treatment have been described in "Properties and Application of Metal Soap" (Sachi Syobo), "Technology of Printing Ink" (CMC PRESS, 1984), and "Current Technology for Application of Pigments" (CMC PRESS, 1986).

The particle size of the pigments is preferably in the range of 0.1 μm–10 μm, more preferably in 0.05 μm–1 μm, particularly in 0.1 μm–1 μm.

Dispersion of the pigment can be achieved by a publicly known technique used in production of ink or toner. As for a dispersing machine, ultrasonic dispersing machine, sand mill, atriter, pearl mill, super mill, ball mill, impeller, disperser, KD mill, colloid mill, Dynatron, three-roll mill, pressure kneader, and the like are exemplified. Details are described in "Current Technology for Application of Pigments" (CMC PRESS, 1986).

The amount of the pigment or dye to be added is in 0.01–50% by weight, preferably 0.1–10% by weight, for the entire solid component constituting the positive recording layer. Particularly, the dye may preferably be used in 0.5–10% by weight, and the pigment may preferably be used in 0.1–10% by weight.

[Polymer Compounds Insoluble in Water but Soluble in Alkali]

The polymer compounds insoluble in water but soluble in alkali used in the positive image-recording layer (hereinafter sometimes referred to as alkali-soluble polymer) includes homopolymers which contain an acidic group on the main chain and/or side chain, and their copolymers and mixtures. Therefore, the recording layer relating to the invention has a characteristic to dissolve in an alkaline developing solution upon contact.

As the alkali-soluble polymer used in the positive image-recording layer, publicly so far known ones can be used with no limitation. Among them, the polymers which contain an acidic group on the main chain and/or side chain as mentioned in the following items (1) to (6) are preferred in view of solubility in an alkaline developing solution.

(1) Phenolic hydroxyl group (—Ar—OH)
(2) Sulfonamide group (—SO$_2$NH—R)
(3) Substituted sulfonamide-type acid group (hereinafter referred to as "active imide group")

[—SO$_2$NHCOR, —SO$_2$NHSO$_2$R, —CONHSO$_2$R]

(4) Carboxylic acid group (—CO$_2$H)
(5) Sulfonic acid group (—SO$_3$H)
(6) Phosphoric acid group (—OPO$_3$H$_2$)

In the items (1) to (6), Ar represents an optionally substituted divalent aryl connecting group; and R represents a hydrogen atom or an optionally substituted hydrocarbon group.

Among the alkaline water-soluble polymers which contain an acidic group selected from the items (1) to (6), those containing (1) a phenol group, (2) a sulfonamide group, and (3) an active imide group are preferred, and most preferred are those containing (1) a phenol group or (2) a sulfonamide group because they give sufficient solubility and film strength in an alkaline developing solution.

The followings are typical of the polymerization components for the alkaline water-soluble polymer compounds.

(1) The monomer for polymerization containing a phenolic hydroxyl group includes those which comprise a low molecular compound having respectively one or more of phenolic hydroxylic groups and polymerizable unsaturated linkages, for example, acrylamide, methacrylamide, acrylic acid esters, methacrylic acid esters or hydroxystyrene which have a phenolic hydroxyl group.

Specifically, N-(2-hydroxyphenyl) acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate, are exemplified. These monomers having a phenolic hydroxyl group may be used in combination of 2 or more species.

(2) The monomer for polymerization containing a sulfonamide group includes those which comprise a low molecular compound having in one molecule one or more of sulfonamide groups (—NH—SO$_2$—) in which the nitrogen atom is bonded by at least one hydrogen atom and one or more of polymerizable unsaturated linkages, for example, those having an acryloyl, allyl or vinyloxy group and a substituted or mono-substituted aminosulfonyl group or substituted sulfonylimino group. Such compounds are exemplified by those represented by the general formulae (I) to (V) described in JP-A No. 8-123029.

Specifically, m-aminosulfonylphenyl methacrylate, N-(p-aminosulfonylphenyl)methacrylamide, N-(p-aminosulfonylphenyl)acrylamide, and the like may preferably be used.

(3) As the monomer for polymerization containing an active imide group, those having an active imide group in the molecule as described in JP-A No. 11-84657 are preferred, for example, those comprising a low molecular compound having respectively one or more of active imide groups and polymerizable unsaturated linkages in one molecule.

Specifically, N-(p-toluenesulfonyl)methacrylamide and N-(p-toluenesulfonyl)acrylamide may preferably be used.

(4) The polymer having a carboxylic acid group soluble in an alkaline aqueous solution, for example, comprises as major component the minimum constitutional unit derived from a compound having respectively one or more of carboxylic acid groups and polymerizable unsaturated groups in the molecule.

(5) The alkali-soluble polymer having a sulfonic acid group, for example, comprises as major component the minimum constitutional unit derived from a compound having respectively one or more of sulfonic acid groups and polymerizable unsaturated groups in the molecule.

(6) The polymer having a phosphoric acid group soluble in an alkaline aqueous solution, for example, comprises as major component the minimum constitutional unit derived from a compound having respectively one or more of phosphoric acid groups and polymerizable unsaturated groups in the molecule.

The minimum constituting unit having an acidic group selected from the items (1) to (6), which constitutes an alkali-soluble polymer used in a positive image-recording layer, may be copolymerized alone or in combination of two or more of the minimum unites having the same acidic group or different acidic groups.

The copolymerization may be achieved in a so far known method, including graft copolymerization, block copolymerization, random copolymerization, and so on.

In the copolymer, the compound having an acidic group selected from the items (1) to (6) to be copolymerized may be contained at the rate of 10 mole % or more, more preferably 20 mole % or more.

The monomer component to be copolymerized with the compound having an acidic group selected from the items (1) to (6) is exemplified by compounds as described in the following items (m1) to (m12), though it is not limited to them.

(m1) Acrylic acid esters and methacrylic acid esters having an aliphatic hydroxyl group, such as 2-hydroxyethyl acrylate or 2-hydroxyethyl methacrylate.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, and glycydyl acrylate.

(m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycydyl methacrylate.

(m4) Acrylamides or methacrylamides such as acrylamide, methacrylamide, N-methylol acrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(m5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(m6) Vinyl esters such as vinyl acetate, vinyl chloroacetate, vinyl butyrate, and vinyl benzoate.

(m7) Styrenes such as styrene, a-methylstyrene, methylstyrene, and chloromethylstyrene.

(m8) Vinyl ketones such as methyl vinyl ketone, ethyl vinyl ketone, propyl vinyl ketone, and phenyl vinyl ketone.

(m9) Olefins such as ethylene, propylene, isobutylene, butadiene and isoprene.

(m10) N-Vinylpyrrolidone, acrylonitrile, methacrylonitrile, and the like.

(m11) Unsaturated imides such as maleimide, N-acryloylacrylamide, N-acetylmethacrylamide, N-propionylmethacrylamide, and N-(p-chlorobenzoyl)metacrylamide.

(m12) Unsaturated carboxylic acids such as acrylic acid, methacrylic acid, maleic anhydride, and itaconic acid.

As for the alkali-soluble polymer, those having a phenolic hydroxyl group are preferred because they are superior in forming an image by exposure to infrared laser, for example, novolac resin such as phenol-formaldehyde resin, m-cresol-formaldehyde resin, p-creasol-formaldehyde resin, m-/p-mixed cresol-formaldehyde resin, and phenol/cresol (any of m-, p-, or m-/p-mixture) mixed formaldehyde resin, and pyrogallol acetone resin.

As for the polymer soluble in an alkaline aqueous solution having a phenolic hydroxyl group, in addition to the above-mentioned compounds, condensation polymers of formaldehyde and a phenol having an alkyl group of 3 to 8 carbons as substituents as described in U.S. Pat. No. 4,123,279, such as t-butylphenol formaldehyde resin or octylphenol formaldehyde resin.

The copolymerization of the polymer soluble in an alkaline aqueous solution may be achieved in a so far known method, including graft copolymerization, block copolymerization, random copolymerization, and so on.

In the invention, when the alkali-soluble polymer is a monomer or copolymer from the polymerizing monomer having a phenolic hydroxyl group or a sulfonamide group or an active imide group, those of which the weight-average molecular weight is 2,000 or higher, and the mumber-average molecular weight is 500 or higher, are preferred. Particularly preferred are those of which the weight-average molecular weight is 5,000–300,000, the mumber-average molecular weight is 800–250,000, and the dgree of dispersion (the weight-average molecular weight/the mumber-average molecular weight) is 1.1–10.

In the invention, when the alkali-soluble polymer is a resin such as phenol formaldehyde resin or creasol aldehyde resin, those of which the weight-average molecular weight is 500–20,000, and the mumber-average molecular weight is 200–10,000 are preferred.

These alkali-soluble polymers may be used alone or in combination of 2 or more species, and they may be added to the entire solid component of the recording layer at the rate of 30–99% by weight, preferably 40–95% by weight, particularly 50–90% by weight, in view of durability and sensitivity of the recording layer.

[Other Components]

In forming the positive recording layer used in the invention, it is possible to add a variety of additives if necessary. For example, onium salts, o-quinone diazide compounds, aromatic sulfone compounds or aromatic sulfonic acid ester compounds are thermally decomposed, but they in a native state essentially decrease the solubility of the polymers soluble in an alkaline aqueous solution. The combined use of such compounds, accordingly, is preferable in enhancing the block of dissolution of the image area into a developing solution. The onium salts are exemplified by diazonium salts, ammonium salts, phosphonium salts, iodonium salts, sulfonium salts, selenium salts, and arsonium salts.

The preferred onium salt used in the invention includes, for example, diazonium salts as described in S. I. Schlesinger, Photogr. Sci. Eng., 18, 387 (1974), T. S. Bal et al., Polymer, 21, 423 (1980), JP-A No. 5-158230; ammonium salts as described in U.S. Pat. Nos. 4,069,055, 4,069,056, JP-A No. 3-140140; phosphonium salts as described in D. C. Necker et al., Macromolecules, 17, 2468 (1984), C. S. Wen et al., Teh, Proc. Conf. Rad. Curing ASIA, p.478, Tokyo, October (1988), U.S. Pat. Nos. 4,069,055 and 4,069,056; iodonium salts as described in J. V. Crivello et al., Macromolecules, 10(6), 1307 (1977), Chem. & Eng. News, November 28, p.31 (1988), EP No. 104,143, U.S. Pat. Nos. 5,041,358 and 4,491,628, JP-A Nos. 2-150848 and 2-296514; sulfonium salts as described in J. V. Crivello et al., Polymer J., 17,73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP Nos. 370,693, 233,567, 297,443 and 297,442, U.S. Pat. Nos. 4,933,377, 3,902,114, 4,491,628, 5,041,358, 4,760,013, 4,734,444 and 2,833,827, German Pat. Nos. 2,904,626, 3,604,580 and 3,604,581; selenonium salts as described in J. V. Crivello et al., Macromolecules, 10(6), 1307 (1977), J. V. Crivello et al., J. Polymer Sci., Polymer Chem. Ed., 17, 1047 (1979); and arsonium salts as described in C. S. Wen et al., Teh, Proc. Conf. Rad. Curing ASIA, p.478, Tokyo, October (1988).

Among these onium salts, the diazonium salts are particuarly preferred. Particularly preferred diazonium salts are as described in JP-A No. 5-158230.

The counter ion to the onium salt includes tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Among them, hexafluorophosphoric acid, triisopropylnaphthalenesulfonic acid, and alkyl aromatic sulfonic acids such as 2,5-dimethylbenzenesulfonic acid are particularly preferred.

The preferred quinone diazides are exemplified by o-quinone diazide compounds. The o-quinone diazide compounds used in the invention have at least one o-quinone diazide group and show increased alkali solubility by thermal decomposition. A variety of compounds having such structure can be used. That is, the o-quinone diazides lose the dissolution inhibitory capability as binders by thermal decompositon and they themselves are transformed into alkali soluble substances. Thus, both effects assist dissolution of the sensitive materials. As for the o-quinone diazide compounds used in the invention, for example, those as described in J. Courser, "Light Sensitive Systems" (John Wiley & Sons. Inc.), p.339–352, are included, in which the sulfonic acid esters or sulfonamides of o-quinone diazides allowed to react with various aromatic polyhydroxy compounds or aromatic amino compounds are particularly preferred. In addition, an ester of pyrogallol-acetone resin with benzoquinone-(1,2)-diazidosulfonic acid chloride or naphthoquinone-(1,2)-diazido-5-sulfonic acid chloride as described in JP-B No. 43-28403; and an ester of phenol-formaldehyde resin with benzoquinone-(1,2)-diazidosulfonic acid chloride or naphthoquinone-(1,2)-diazido-5-sulfonic acid chloride as described in U.S. Pat. Nos. 3,046,120 and 3,188,210, are preferably used.

In addition, esters of phenol-formaldehyde resin or cresol-formaldehyde resin with naphthoquinone-(1,2)-diazido-4-sulfonic acid chloride, and esters of pyrogallol-acetone resin with naphthoquinone-(1,2)-diazido-4-sulfonic acid chloride are also used preferably. Other useful o-quinone diazide compounds have been reported in a large number of documents relating to patent. For example, the documents include JP-A Nos. 47-5303, 48-63802, 48-63803, 48-96575, 49-38701, and 48-13354, JP-B No. 41-11222, 45-9610, and 49-17481, U.S. Pat. Nos. 2,797,213, 3,454,400, 3,544,323, 3,573,917, 3,674,495, and 3,785,825, British Patent Nos. 1,227,602, 1,251,345, 1,267,005, 1,329,888, and 1,330,932, and German Patent No. 854,890.

The amount of o-quinone diazide compound to be added is preferably in the range of 1–50% by weight for the entire solid component of the printing plate material, more preferably 5–30% by weight, particularly 10–30% by weight. The compound may be used alone or in combination of several species.

The amount of the additives other than o-quinone diazides to be added is preferably in 1–50% by weight, more preferably 5–30% by weight, and particularly 10–30% by weight. The additives and binder used in the invention is preferably added to the same layer.

In order to further improve the sensitivity, it is possible to use a cyclic acid anhydride, phenol, or organic acid together. As the cyclic acid anhydride, phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride, pyromellitic anhydride, and the like may be used as described in U.S. Pat. No. 4,115,128. The phenol includes bisphenol A, p-nitrophenol, p-ethoxyphenol, 2,4,4'-trihydroxybenzophenone, 2,3,4-trihydroxybenzophenone, 4-hydroxybenzophenone, 4,4', 4"-trihydroxytriphenylmethane, 4,4',3",4"-tetrahydroxy-3,5,3',5'-tetramethyltriphenyl-methane, and the like. Further, the organic acid includes sulfonic acids, sulfinic acids, alkylsulfuric acid, phosphonic acids, phosphoric acid esters and carboxylic acids as described in JP-A Nos. 60-88942 and 2-96755, and specifically, p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid, and the like. The rate of the cyclic acid anhydride, phenol and organic acid contained in the printing plate material is preferably in 0.05–20% by weight, more preferably 0.1–15% by weight, and particularly 0.1–10% by weight.

In addition, in order to expand the stability of treatment in the development condition, it is appropriate to add in the coating solution of the recording layer a non-ionic surface active agent as described in JP-A Nos. 62-251740 and 3-208514, an amphoteric surface active agent as described in JP-A Nos. 59-121044 and 4-13149, a siloxane compound as described in EP950517, and/or a fluorine-containing monomer copolymer as described in JP-A No. 11-288093.

Specific examples of the non-ionic surface active agents include sorbitan tristearate, sorbitan monopalmitate, sorbitan trioleate, stearic acid monoglyceride, polyoxyethylene nonyl phenyl ether, and the like. Specific examples of the amphoteric surface active agents include alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine type (e.g., "Amorgen K" (trade name), Daiichi Kogyo Co.).

As the siloxane compound, a block copolymer of dimethylsiloxane and polyalkylene oxide is preferably used. Specifically, polyalkynene oxide denatured silicone, for example, the products of Chisso Corp., such as DBE-224, DBE-621, DBE-712, DBP-732 and DBP-534, and the products of German Tego Co., such as Tego Glide 100, are exemplified.

The rate of the non-ionic surfactant and the amphoteric surfactant contained in the printing plate material is preferably in 0.05–15% by weight, more preferably 0.1–5% by weight.

Into the image-recording layer, it is possible to add a printing-out agent to give a visible image immediately after heating by exposure and a dye or pigment as an image-coloring agent.

As for the printing-out agent, a combination of a compound releasing an acid by heating with exposure and a salt-forming organic dye is exemplified as a typical agent. Specifically, a combination of o-naphthoquinone diazido-4-sulfonic acid halide and a salt-forming organic dye as described in JP-A Nos. 50-36209 and 53-8128, and a combination of a trihalomethyl compound and a salt-forming organic dye as described in JP-A Nos. 53-36223, 54-74728, 60-3626, 61-143748, 61-151644 and 63-58440, are exemplified. Such a trihalomethyl compound includes oxazole compounds and triazine compounds, both of which are stable with a lapse of time and produce a clear pringing-out image.

As for the image-coloring agent, other dyes in addition to the salt-forming organic dyes can be used. As preferred dyes, oil-soluble dyes and basic dyes including the salt-forming organic dyes are exemplified. Specifically, oil yellow #101, oil yellow #103, oil pink #312, oil green BG, oil blue BOS, oil blue #603, oil black BY, oil black BS, oil black T-505 (the above-mentioned dyes are the products of Orient Chemical Ind., Co.), Victoria pure blue, crystal violet (CI42555), methyl violet (CI42535), ethyl violet, Rhodamine B (CI145170B), malachite green (CI42000), methylene blue (CI52015), and the like, are included. Particularly, the dyes described in JP-A No. 62-293247 are preferred. These dyes may be added to the entire solid component of a printing plate material at the rate of 0.01–10% by weight, preferably 0.1–3% by weight. Moreover, it is possible to add a plasticizer to the printing plate material of the invention in order to give flexibility to the coating film. For example, butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, are used.

3-2-3. Negative Image-Forming Layer

The negative image-forming layer contains a negative working sensitive composition as shown below.

As for the negative working sensitive composition in the invention, the following so far publicly known negative working sensitive compositions ((e) to (h)) can be used.

(e) Negative working sensitive composition comprising a polymer having a photo-crosslinking group and an azide compound.

(f) Negative working sensitive composition comprising a dizao compound.

(g) Photo or thermally polymerizing negative working sensitive composition comprising a photo or thermal polymerization initiator, an unsaturated addition-polymerization compound, and an alkali-soluble polymer compound.

(h) Negative working sensitive composition comprising an alkali-soluble polymer compound, an acid-generating agent, and an acid-crosslinking compound.

The followings will explain the compounds used in the negative working sensitive composition as shown in the items (e) to (h).

[Polymer having a Photo-Crosslinking Group]

As for the polymer having a photo-crosslinking group used in the negative working sensitive composition, those having affinity to an aqueous alkali developing solution are preferably used, for example, including polymer having a photo-crosslinking group such as —CH=CH—CO— on the main chain or side chain of the molecule as described in U.S. Pat. No. 5,064,747; copolymer having a cinnamic acid group and a carboxyl group as described in JP-B No. 54-15711; polyester resin having a phenylenediacrylic acid residue and a carboxyl group as described in JP-A No. 60-165646; polyester resin having a phenylenediacrylic acid residue and a phenolic hydroxyl group as described in JP-A No. 60-203630; polyester resin having a phenylenediacrylic acid residue and a sodium iminodisulfonyl group as described in JP-B No. 57-42858; and polymer having an azide group and a carboxyl group on the side chain as described in JP-A No. 59-208552. The content of the polymer having a photo-crosslinking group in the invention is approximately 5–100% by weight for the entire solid component in the image-forming layer, preferably 10–95% by weight, and more preferably 20–90% by weight.

[Azide Compounds]

As for the azide compound used in the negative working sensitive composition, 2,6-bis(4-azidobenzal)-4-methylcyclohexanone and 4,4'-diazidodiphenylsulfide are exemplified.

The content of the azide compound in the invention is approximately 5–95% by weight for the entire solid component in the image-forming layer, preferably 10–90% by weight, and more preferably 20–80% by weight.

[Diazo Compounds]

As for the diazo compound used in the negative working sensitive composition, dizao resin exemplified by the salt of the condensate of a diazodiarylamine and an active carbonyl compound, particularly that sensitive to light, insoluble in water but soluble in organic solvents is preferably used.

Particularly preferred diazo resin includes, for example, the organic acid or inorganic acid salts of the condensates of 4-diazodiphenylamine, 4-diazo-3-methyldiphenylamine, 4-diazo-4'-methyldiphenylamine, 4-diazo-3'-methyldiphenylamine, 4-diazo-4'-methoxydiphenylamine, 4-diazo-3-methyl-4'-ethoxydiphenylamine, or 4-diazo-3-methoxydiphenylamine, with formaldehyde, paraformaldehyde, acetaldehyde, benzaldehyde, or 4,4'-bis-methoxymethyldiphenyl ether.

The organic acid used in this stage includes, for example, methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenznensulfonic acid, 3-chlorobenzenesulfonic acid, 2-hydroxy-4-methoxybenzophenone-5-sulfonic acid, and the like. The inorganic acid includes hexafluorophosphoric acid, tetrafluoroboric acid, thiocyanic acid, and the like.

In addition, the following diazo resin can be used: resin in which the main chain is a polyester group as described in JP-A No. 54-30121; diazo resin prepared by reacting a polymer having a carboxylic acid anhydride residue with a diazo compound containing a hydroxyl group as described in JP-A No. 61-273538; and diazo resin derived from the reaction of a polyisocyanate compound with a diazo compound containing a hydroxyl group.

In the invention, the preferred content of the diazo resin is approximately 0–40% by weight for the entire solid component in the image-forming layer. If necessary, 2 or more species of the diazo resins may be used together.

[Photo or Thermal Polymerization Initiator]

As for the photo-polymerization initiator used in the negative working sensitive composition, a variety of publicly known photo-polymerization initiators can be suitably used alone or in combination of two or more species corresponding to the wavelength of the light source used in the image formation.

When a visible ray longer than 400 nm, Ar laser, the 2nd harmonic of a semiconductor laser, or SHG-YAG laser is used as a light source, a variety of photo-initiator systems have been proposed; for example, a certain photo-reductive dye as described in U.S. Pat. No. 2,850,445, for example, rose bengal, eosin, or erythrocin; a combined system comprising a dye and an initiator, for example, complex initiation system comprising a dye and an amine (JP-B No. 44-20189); a combined system of a hexaarylbiimidazole, a radical generator and a dye (JP-B No. 45-37377); a system comprising a hexaarylbiimidazole and a p-dialkylaminobenzylidene ketone (JP-B No. 47-2528, JP-A No. 54-155292), a system of a cyclic cis-α-dicarbonyl compound and a dye (JP-A NO. 48-84183); a system of a cyclic triazine and a merocyanine pigment (JP-A No. 54-151024); a system of a 3-ketocoumalin and an activator (JP-A Nos. 52-112681 and 58-15503); a system of biimidazole, a styrene derivative and a thiol (JP-A No. 59-140203); a system of an organic perioxide and a pigment (JP-A Nos. 59-1504, 59-140203, 59-189340, 62-174203, JP-B No. 62-1641, U.S. Pat. No. 4,766,055); a system of a dye and an active halogen compound (JP-A Nos. 63-258903, 2-63054, etc.); a system of a dye and a borate compound (JP-A Nos. 62-143044, 62-150242, 64-13140, 64-13141, 64-13142, 64-13143, 64-13144, 64-17048, 1-229003, 1-298348, 1-138204, etc.); a system of a pigment having a rhodanine ring and a radical-generating agent (JP-A Nos. 2-179643 and 2-244050); a system of a titanocene and 3-ketocoumalin pigment (JP-A No. 63-221110); a combined system of a titanocene and a xanthene pigment, or further an ethylenic unsaturated addition-polymerizable compound containing an amino or urethane group (JP-A Nos. 4-221958 and 4-219756); a system of a titanocene and a certain merocyanine pigment (JP-A No. 6-295061); and a system of a titanocene and a pigment having a benzopyran ring (JP-A No. 8-334897).

Particularly, when infrared laser is used as a light soucre for exposure, a combination of a light-to-heat conversion agent and a radical generator is used as a photo-polymerization initiator. In this combination, the heat generated by the light-to-heat conversion agent decomposes the radical-generating agent to give radical, which works as initiator. In this stage, the radical-generating agent may be decomposed not only by heat but also by light and works as photo or thermal polymerization initiator. The compound preferred as a radical-generating agent is an onium salt, specifically including iodonium salts, dizaonium salts, and sulfonium salts.

In this connection, as the light-to-heat conversion agent, the same agents as those used in the positive working sensitive composition may be used.

The amount of the photo or thermal polymerization initiator to be used is in the range of 0.05–100 parts by weight for 100 parts by weight of the unsaturated addition-polymerization compound as mentioned below, preferably 0.1–70 parts by weight, and more preferably 0.2–50 parts by weight.

[Unsaturated Addition-Polymerization Compound]

The unsaturated addition-polymerization compound used in the negative working sensitive composition can optionally be chosen from the compounds having at least one terminal ethylenic unsaturated linkage, preferably two or more linkages. For example, they have a chemical form of, for example, monomer or prepolymer, that is, dimer or trimer and oligomer, or their mixture as well as copolymer.

The monomer and copolymer are exemplified by esters of unsaturated carboxylic acids (e.g., acrylic acid, methacrylic acid, itaconic acid, crotonic acid, isocrotonic acid, maleic acid, etc.) and aliphatic polyalcoholic compounds and by amides of unsaturated carboxylic acids and aliphatic polyvalent amine compounds.

Specific examples of the ester monomers of aliphatic polyhydric alcohol compounds and unsaturated carboxylic acids include: as acrylic acid ester, ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, and the like.

As methacrylic acid ester, tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butanediol dimethacrylate, hexanediol dimethacrylate, pentaerythritol dimethacrylate, pentaerythritol trimethacrylate, pentaerytritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, and the like, are included.

As itaconic acid ester, ethylene glycol diitaconate, propylene glycol diitaconate, 1,3-butanediol diitaconate, 1.4-butanediol diitaconate, tetramethylene glycol diitaconate, pentaerythritol diitaconate, sorbitol tetraitaconate, and the like, are included.

As crotonic acid ester, ethylene glycol dicrotonate, tetramethylene glycol dicrotonate, pentaerythritol dicrotonate, sorbitol tetradicrotonate, and the like, are included.

As isocrotonic acid ester, ethylene glycol diisocrotonate, pentaerythritol diisocrotonate, sorbitol tetraisocrotonate, and the like, are included.

As maleic acid ester, ethylene glycol dimaleate, triethylene glycol dimaleate, pentaerythritol dimaleate, sorbitol tetramaleate, and the like, are included.

In addition, mixtures of the above-mentioned ester monomers are exemplified.

The amide monomers derived from aliphatic multi-valent amines and unsaturated carboxylic acids are specifically exemplified by methylene bis-acrylamide, methylene bis-methacrylamide, 1,6-hexamethylene bis-acrylamide, 1,6-hexamethylene bis-methacrylamide, diethylenetriamine tris-acrylamide, xylylene bis-acrylamide, xylylene bis-methacrylamide, and the like.

Other examples include vinylurethanes having 2 or more polymerizing vinyl groups in the molecules which are prepared by adding a vinylmonomer containing a hydroxyl group represented by the following general formula (f) to polyisocyanate compounds having 2 or more isocyanate groups in the molecules, as described in JP-B No.48-41708.

　　　　　　　　　　　　General formula (f)

(wherein $R^3$ and $R^4$ each represents H or $CH_3$)

In addition, urethane acrylates as described in JP-A No.51-37193 and JP-B No.2-32293; polyester acrylates as described in JP-A No.48-64183, JP-B Nos.49-43191 and 52-30490; and poly-functional acrylates or methacrylates such as epoxyacrylates prepared by reacting epoxy resin with (meth)acrylic acid, are included. Additionally, photocuring monomers and oligomers disclosed in Nippon Settyaku Kyokai-shi (Journal of Adhesion Society of Japan), vol.20, No.7, P.300–308 (1984) can also be used. The amount of these compounds to be used is 5–70% by weight for the entire component, preferably 10–50% by weight.

In the invention, the content of the unsaturated addition-polymerization compound is approximately 5–95% by weight for the entire solid component in the image-forming layer, preferably 5–80% by weight.

[Alkali-Soluble Polymer Compounds]

The alkali-soluble polymer compounds used in the negative working sensitive composition may be the same as those used in the positive working sensitive composition. In addition, the following polymers may be used.

Addition polymers having a carboxylic acid group on the side chain, for example, those as described in JP-A No.59-44615, JP-B Nos.54-34327, 58-12577 and 54-25957, JP-A Nos. 54-92723, 59-53836 and 59-71048, including methacrylic acid copolymer, acrylic acid copolymer, itaconic acid copolymer, crotonic acid copolymer, maleic acid copolymer, and partially esterified maleic acid copolymer, are exemplified.

Similarly, acidic cellulose derivatives having a carboxylic acid group on the side chain may also be used. In addition, the hydroxyl-containing addition polymers to which a cyclic acid anhydride is added are useful. Particularly, among them, [benzyl methacrylate/(meth)acrylic acid/if required other addition-polymerization vinyl monomer]copolymers and [allyl(meth)acrylate (meth)acrylic acid/if required other addition-polymerization vinyl monomer]copolymers are preferred.

In addition, polyvinyl pyrrolidone and polyethylene oxide are useful as water-soluble organic polymer. In order to increase strength of the cured film, an alcohol-soluble polyamide or a polyether of 2,2-bis-(4-hydroxyphenyl)-propane and epichlorohydrin may also be used.

In addition, polyurethane resin as described in JP-B Nos.7-120040, 7-120041, 7-120042 and 8-12424, JP-A Nos.63-287944, 63-287947, 1-271741, and 11-352691, may be used.

The cured film of these high molecular polymers can be further strengthened by adding a radical reactive group to the side chain. The functional group allowing addition polymerization includes an ethylenic unsaturated linkage group, amino, epoxy, and the like. The functional group transforming into a radical by light irradiation includes mercapto, thiol, halogen atom, triazine structure, onium salt structure, and the like. As the polar group, carboxyl or imido group can be exemplified. As the functional group adaptable to the addition polymerization reaction, the ethylenic unsaturated linkage groups such as acryl, methacryl, allyl, and styryl are particularly preferred. In addition, a functional group selected from amino, hydroxy, phosphonic acid, phosphoric acid, carbamoyl, isocyanato, ureido, ureylene, sulfonic acid and ammonio groups is useful.

In order to maintain a developing character of the composition, the high molecular polymer is preferable to have a suitable molecular weight and acid number. It is appropriate to use a high molecular polymer of which the weight-average molecular weight is 5,000 to 300,000, and the acid number is 0.2–5.0 meq/g.

These high molecular polymers can be mixed in an optional rate in the entire composition. When it is over 90% by weight, however, no satisfactory result is obtained in view of strength of the image formed. The preferred content is 10–90%, more preferably 30–80%, accordingly. The ratio of the photopolymerizable ethylenic unsaturated compound to the high molecular polymer is preferably in the range of 1/9 to 9/1 by weight, more preferably 2/8 to 8/2, and even more preferably 3/7 to 7/3.

[Acid-Generating Agents]

The acid-generating agents used in the negative working sensitive composition may be the same as those in the positive working sensitive composition.

[Acid Crosslinking Compounds]

The acid-crosslinking compounds used in the negative working sensitive composition indicate those which have a crosslink structure in the presence of an acid and include aromatic compounds and heteroaromatic compounds which are poly-substituted, for example, by hydroxymethyl, acetoxymethyl or alkoxymethyl group. Particularly preferred are compounds prepared by condensation of phenols with an aldehyde in a basic condition.

Examples of the preferred compounds include those derived from phenols and formaldehyde by condensation in a basic condition as mentioned above, as well as compounds derived from m-cresol and formaldehyde, from bisphenol A and formaldehyde, or from 4,4'-bisphenol and formaldehyde, and a compound disclosed as resol resin in GB No.2,082,339.

These acid crosslinking compounds are preferred to have the weight-average molecular weight of 500–100,000 and the number average molecular weight of 200–50,000.

The other preferred examples are aromatic compounds substituted by an alkoxymethyl or oxiranylmethyl group as disclosed in EP-A No.0,212,482; monomers and oligomer melamine-formaldehyde condensates as well as urea-formaldehyde condensates as disclosed in EP-A No.0,133,216, DE-A No.3,634,671 and DE No.3,711,264; and alkoxy-substituted compounds as disclosed in EP-A No.0,212,482.

Even more preferred examples are melamine-formaldehyde derivatives having at least two free N-hydroxymethyl, N-alkoxymethyl or N-acyloxymethyl groups. Among them, the N-alkoxymethyl derivatives are particularly preferred.

The low molecular weight or oligomer silanol can be used as a silicon-containing crosslinking agent. Such silanols are exemplified by dimethyl-and diphenyl-silanediol as well as preliminarily condensed oligomers containing these units; for example, those described in EP-A No.0,377,155 can be used.

[Other Components]

Into the positive and negative image-forming layers (hereinafter referred simply to as image-forming layer) on the planographic printing plate precursor of the invention, a variety of compounds in addition to the above-mentioned compounds may be added if necessary in order to attain the characteristics of various planographic printing plates.

(Thermal Polymerization Inhibitors)

Among the image-forming layers of the invention, it is desirable to add a small amount of a thermal polymerization inhibitor to the photo or thermally polymerizing negative image-forming layer in order to prevent unnecessary thermal polymerization of the polymerizable compound having an ethylenic unsaturated double bond during production or storage. The suitable thermal polymerization inhibitor includes hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium (I) salt, N-nitrosophenyl hydroxylamine aluminum salt, and the like. The amount of the thermal polymerization inhibitors to be added is preferably in about 0.01% by weight to about 5% by weight based on the weight of nonvolatile components in the entire composition of the photosensitive layer. If required, in order to inhibit polymerization by oxygen, it is appropriate to add a higher fatty acid derivative such as behenic acid or behenic acid amide so as to be localized on the surface of the photosensitive layer during drying after coating. The amount of the higher fatty acid derivative to be added is preferably in about 0.5% by weight to about 10% by weight based on the entire composition.

(Coloring Agents)

In the image-forming layer on the planographic printing plate precursor of the invention, it is possible to use as a coloring agent a dye or pigment having an strong absorption in a visible light region.

Specifically, oil yellow #101, oil yellow #103, oil pink #312, oil green BG, oil blue BOS, oil blue #603, oil black BY, oil black BS, oil black T-505 (the above-mentioned dyes are the products of Orient Chemical Ind., Co.), Victoria pure blue, crystal violet (CI42555), methyl violet (CI42535), ethyl violet, Rhodamine B (CI145170B), malachite green (CI42000), methylene blue (CI52015), and the like, are included. In addition, dyes as described in JP-A No.62-293247, and pigments such as phthalocyanine pigment, azo pigment, carbon black and titanium oxide are also included.

These dyes or pigments are preferably added to the layer because the addition of them allows easy discrimination between an image area and a non-image area after the formation of an image. The amount to be added is 0.01–10% by weight for the entire solid component in the image-forming layer.

In order to expand the stability of treatment in the development condition, it is appropriate to add a non-ionic surface active agent as described in JP-A Nos. 62-251740 and 3-208514, or an amphoteric surface active agent as described in JP-A Nos.59-121044 and 4-13149.

Specific examples of the non-ionic surface active agents include sorbitan tristearate, sorbitan monopalmitate, sorbitan trioleate, stearic acid monoglyceride, polyoxyethylene nonyl phenyl ether, and the like.

Specific examples of the amphoteric surface active agents include alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine type (e.g., "Amorgen K" (trade name), Daiichi Kogyo Co.). The rate of the non-ionic surfactant and the amphoteric surfactant contained in the image-forming layer of the planographic printing plate precursor is preferably in 0.05–15% by weight, more preferably 0.1–5% by weight.

Moreover, it is possible if necessary to add a plasticizer to the image-forming layer of the planographic printing plate precursor of the invention in order to give flexibility to the coating film. For example, butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, are used.

In addition, it is also possible to add the above-mentioned onium salt or haloalkylated s-triazine and an epoxy compound, vinyl ether, as well as a phenol compound having a hydroxymethyl group or alkoxymethyl group as described in JP-A No.7-18120.

3-3. Formation of the Image-Forming Layer

In forming the image-forming layer in the invention, generally, the above-mentioned respective components are dissolved in a solvent and coated on the hydrophilic surface. The solvents used in this stage include but are not limited to ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, water, and the like. These solvents are used alone or as mixtures. The concentration of the above components in the solvent (entire solid portion including additives) is preferably 1–50% by weight. The preferred coating amount (solid component) on the hydrophilic surface obtained after coating and drying, though depending on the utility, is generally 0.5–5.0 g/m$^2$ for the planographic printing plate precursor. The coating can be achieved in various methods, for example, bar coater coating, rotation coating, spray coating, curtain coating, dipping coating, air knife coating, blade coating, roll coating, and so on. Apparent sensitivity is increased with decrease of the coating amount, but the film character for image recording is decreased.

In the image-forming layer of the planographic printing plate precursor of the invention, it is possible to add a surface active agent to improve a coating property, for example, fluorine-type surfactant as described in JP-A No.62-170950. The preferred amount to be added is 0.01–1% by weight for the entire solid component in the image-forming layer, and more preferably 0.05–0.5% by weight.

The thickness of the image-forming layer of the planographic printing plate precursor in the invention is in 0.1 g/m$^2$ to 10 g/m$^2$, preferably in 0.5 g/m$^2$ to 5 g/m$^2$, in view of press life and reproducibility of fine lines.

3-5. Exposure and Development of the Planographic Printing Plate Precursor

Thus prepared planographic printing plate precursor of the invention is usually subjected to image exposure and treatment for development.

As for a light source of active light used in the image exposure, for example, a mercury lamp, metal halide lamp, xenon lamp, chemical lamp, carbon arc lamp, and the like are exemplified. Radiation is made with X-ray, ion beam, far-infrared ray, and the like. Additionally, i-ray or high-density energy beam (laser beam) may be used. The laser beam includes helium neon laser, argon laser, krypton laser, helium cadmium laser, KrF excimer laser, and the like. In the invention, it is appropriate to use a light source which has an emission wavelength in the range of from near-infrared to infrared, preferably solid laser or semiconductor laser.

The output of laser is preferably 100 mW or higher, and it is appropriate to use a multi-beam laser device in order to reduce the time of exposure. The time of exposure per one pixel is preferably within 20µ seconds. The energy irradiated to the negative image-forming layer is preferably in 10–300 mJ/cm$^2$.

The planographic printing plate precursor of the invention after image exposure is preferably developed in water or an alkaline aqueous solution.

As a developing solution and a supplementary solution used in development, a so far known alkaline aqueous solution may be used. Such a solution includes, for example, those of inorganic alkali salts such as sodium silicate, potassium silicate, tertiary sodium phosphate, tertiary potassium phosphate, tertiary ammonium phosphate, secondary sodium phosphate, secondary potassium phosphate, secondary ammonium phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide. Organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylenimine, ethylene diamine, and pyridine, can also be used.

These alkali agents may be used alone or in combination of two or more species.

Particularly preferred developing solution among these alkali agents is an aqueous solution of a silicate such as sodium silicate or potassium silicate. The reason is that the developing character can be controlled by adjusting the rate of silicon oxide SiO$_2$ (one component of the silicate) to an alkali metal oxide M$_2$O and their concentrations. For example, an alkali metal silicate as described in JP-A No.54-62004 and JP-B No.57-7427 can effectively be used.

In addition, it has been known that, when the development is carried out by an automatic developer, a large number of planographic printing plate precursor can be treated by adding to the developing solution the same developing solution or a stronger-alkaline aqueous solution (supplementary solution) without changing the initial developing solution in a developing tank over a long period of time. In the invention, the same way of supplementation is preferably applicable, too.

It is also possible to add a variety of surface active agents and organic solvents to the developing solution and supplementary solution if necessary in order to accelerate or suppress the developing character or enhance dispersion of developing sediment and affinity of ink to the image area of the printing plate.

The surface active agent may be added to the developing solution preferably in the range of 1–20% by weight, more preferably in 3–10% by weight. When the amount of the surface active agent is less than 1% by weight, sufficient improvement of the developing characteristic cannot be attained, and when it is over 20% by weight, strength such as abrassion resistance of image is decreased disadvantageously in many cases.

The preferred surface active agents include those of anionic type, cationic type, non-ionic type and amphoteric type. In addition, it is also possible to add if necessary a reducing agent such as hydroquinone, resorcin, the sodium or potassium salt of inorganic acid such as sulfurous acid or hydrogen sulfurous acid, and/or an organic carboxylic acid, defoamer, water softener, to the developing solution and supplementary solution.

Specifically, the surface active agents include, for example, sodium salt of lauryl alcohol sulfate, ammonium salt of lauryl alcohol sulfate, sodium salt of octyl alcohol sulfate, alkylarylsulfonic acid salts such as sodium salt of isopropylnaphthalenesulfonic acid, sodium salt of isobutylnaphthalenesulfonic acid, sodium salt of polyoxyetrhylene glycol mononaphthyl ether sulfate, sodium salt of dodecylbenzenesulfonic acid, sodium salt of m-nitrobenzenesulfonic acid, higher alcohol sulfates of 8 to 22 carbons such as secondary sodium alkylsulfate; aliphatic alcohol phosphate ester salts such as sodium salt of cetyl alcohol phosphate; alkylamide sulfonates such as $C_{17}H_{33}CON(CH_3)CH_2CH_2SO_3Na$; dibasic aliphatic ester sulfonate salts such as dioctyl sodium sulfosuccinate or dihexyl sodium sulfosuccinate; ammonium salts such as lauryl trimethylammonium chloride or lauryl trimethylammonium metosulfate; amine salts such as stearamide ethyldiethylamine acetate; polyhydric alcohols such as fatty acid monoester of glycerol or fatty acid monoester of pentaerythritol; and polyethylene glycol ethers such as polyethylene glycol mononaphthyl ether or polyethylene glycol mono(nonylphenol) ether.

As organic solvents preferably used, those of which the solubility in water is about 10% by weight or lower, more preferably 5% by weight or lower, are chosen. Such solvents include, for example, 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. The content of the organic solvent is preferably 1–5% by weight for the total weight of the developing solution at the time of use. The content closely relates to the amount of the surface active agent to be used, and it is appropriate to increase the amount of the surfactant with increase of that of the organic solvent. The reason is that when a large quantity of organic solvent is used in a state of using a small amount of surfactant, the solvent does not dissolve and as a result an expected better developing character is not assured.

In addition, it is also possible to add an additive such as defoamer or water softener if necessary to the developing solution and supplementary solution. The water softener includes, for example, polyphosphoric acid salts such as $Na_2P_2O_7$, $Na_5P_3O_3$, $Na_3P_3O_9$, $Na_2O_4P(NaO_3P)PO_3Na_2$, calgon (sodium polymetaphosphate); ethylenediaminetetraacetic acid, potassium salt and sodium salt thereof, diethylenetriaminepentaacetic acid, potassium salt and sodium salt thereof, triethylenetetramine hexaacetic acid, potassium salt and sodium salt thereof, and hydroxyethylethylenediaminetriacetic acid, potassium salt and sodium salt thereof; aminopolycarboxylic acids such as nitrilotriacetic acid, potassium salt and sodium salt thereof, 1,2-diaminocyclohexanetetraacetic acid, potassium salt and sodium salt thereof, 1,3-diamino-2-propanol tetraacetic acid, potassium salt and sodium salt thereof; as well as organic phosphonic acids such as 2-phosphonobutanetricarboxylic acid-1,2,4, potassium salt and sodium salt thereof, 2-phosphonobutanetricarboxylic acid-2,3,4, potassium salt and sodium salt thereof, 1-phosphonoethanetricarboxylic acid-1,2,2, potassium salt and sodium salt thereof, 1-hydroxyethane-1,1-diphosphonic acid, potassium salt and sodium salt thereof, and aminotri(methylenephosphonic acid), potassium salt and sodium salt thereof. In general, the optimum amount of such a water softener to be added to the developing solution at the time of use is in the range of 0.01–5% by weight, preferably 0.01–0.5% by weight, though it depends on the hardness and amount of hard water to be used.

When the planographic printing plate is developed using an automatic developer, the developing solution is fatigued depending on the scale of development, and so it is appropriate to make the treating capacity recover with a supplementary solution or a fresh developing solution. In such a case, the supplementation may preferably be carried out according to the method as described in U.S. Pat. No. 4,882,246.

As for such a developing solution containing a surface active agent, organic solvent and reducing agent, a developing solution composition comprising benzyl alcohol, anionic surfactant, alkaline agent and water as described in JP-A No.51-77401; a developing solution composition comprising an aqueous solution containing benzyl alcohol, anionic surfactant, and water-soluble sulfite as described in JP-A No.53-44202; and a developing solution composition comprising an organic solvent of which the solubility in water is 10% by weight or lower at usual temperature, alkaline agent, and water. These compositions can be used suitably in the invention.

The printing plate through the development processing with the developing solution and supplementary solution is then treated with washing water, a rinsing solution containing a surfactant, and a desensitizing solution containing gum arabic or starch derivatives. In the invention, various methods for treatment are used in combination to carry out the post-treatment of the planographic printing plate.

In recent years, for the purpose of the rationalization and standardization of the make-up working in the photoengraving and printing industries, automatic developing machines for materials of printing plates have widely be used. The automatic developing machines generally comprise a developing part and a post-treatment part, equipped with an apparatus for conveying the materials of printing plates, respective processing solution tanks and a spraying apparatus, wherein the respective pumped-up treating solutions are sprayed from the nozzles of sprays on the exposed printing plate to be developed while horizontally conveying. In a recent known process, the planographic printing plate precursor is immersed in and conveyed through a treating solution filled in a tank with a guide roll dipped in the solution. In such an automatic treatment, the treatment can be carried out while supplying a supplementary solution to the respective treating solutions corresponding to the scale of treatment or the time of operation. In such a case, the solution can be supplied automatically by perceiving the electric conductivity with a sensor.

Additionally, a process for treatment with a substantially fresh solution for treatment, the so-called disposable way for treatment may be applied.

Thus resulting planographic printing plate is if required coated with a desensitizing gum and sent to a printing process, but if much higher press life is required, burning treatment is applied.

When burning is made for the planographic printing plate, it is appropriate to treat the plate with a counter-etching solution before burning as described in JP-B Nos.61-2518 and 55-28062, JP-A Nos.62-31859 and 61-159655.

In coating, the planographic printing plate is rubbed with a sponge or absorbent cotton dampened with the counter-etching solution or the plate is immersed in the counter-etching solution placed in a vessel. The coating may be made with an automatic coater. After coating, the coated amount is homogenized with a squeegee or squeegee roller to give a better effect.

The appropriate amount of the counter-etching solution is generally 0.03–0.8 $g/m^2$ (dry weight).

The planographic printing plate coated with the counter-etching solution is if required dried and then heated at high temperature with a burning processor (e.g., Burning Processor BP-1300 commercially available from Fuji Photo Film Co., Ltd.). This operation is preferably carried out at a temperature of 180–300° C. for a period of 1–20 minutes, though it depends on the sort of the component forming an image.

The planographic printing plate after burning treatment is if required suitably subjected to the common processing such as washing or gumming. When a counter-etching solution containing a water-soluble polymer compound is used, however, the so-called desensitization such as gumming can be omitted.

Thus resulting planographic printing plate can be used in multiple printing on an offset press.

4. Pattern Forming Materials and Pattering Method

The followings will explain in details the pattern forming materials as the fourth aspect of the invention and the pattern forming method as the fifth aspect.

The pattern forming material of the invention comprises: a support; a polymerization initiating layer formed on the support by immobilizing a polymer having, on a side chain thereof, a crosslinking group and a functional group having polymerization initiating capability, by a crosslinking reaction; and a pattern forming layer formed by contacting a polymerizable compound having a functional group whose hydrophilicity/hydrophobicity changes due to heat, acid, or radiation, with the polymerization initiating layer, and supplying energy thereto, so as to generate a graft polymer on a surface of the polymerization initiating layer by graft polymerization.

The pattern forming method of the invention comprises the steps of: providing a polymerization initiating layer on a support by immobilizing a polymer having, on a side chain thereof, a crosslinking group and a functional group having polymerization initiating capability, by a crosslinking reaction; generating a graft polymer on a surface of the polymerization initiating layer by graft polymerization by contacting a polymerizable compound having a functional group whose hydrophilicity/hydrophobicity changes due to heat, acid or radiation, with the polymerization initiating layer, and supplying energy thereto; and imagewise supplying heat, acid or radiation to the graft polymer to form a hydrophilic/ hydrophobic pattern.

The followings will explain the polymerization initiating layer and the process for formation thereof as well as the pattern forming layer and the process for formation thereof (the process for graft polymer generation) in the pattern forming materials and the pattern forming method of the invention.

4-1. Polymerization Initiating Layer Formed on the Support by Immobilizing a Polymer Having, on a Side Chain Thereof, a Crosslinking Group and a Functional Group Having Polymerization Initiating Capability, by a Crosslinking Reaction, and the Process for Formation Thereof As for the polymerization initiating layer in the pattern forming materials and the pattern forming method of the invention, the same layer as that prepared by the process for formation of the polymerization initiating layer in the graft polymerization can be applied.

In this connection, in the specific polymerization initiating polymer adaptable to this aspect, the mole percentages for copolymerization of the copolymer component (A) having a polymerization initiating group and of the copolymer component (B) having a crosslinking group are: preferably 1 mole % or more for (A) and 10 mole % or more for (B); more preferably 1–50 mole % for (A) and 10–70 mole % for (B); and even more preferably 5–30 mole % for (A) and 20–70 mole % for (B), in view of the film characteristics of the polymerization initiating layer after the graft polymerization and crosslinking reaction.

4-2. Pattern Forming Layer Formed by Contacting a Polymerizable Compound Having a Functional Group whose Hydrophilicity/Hydrophobicity Changes Due to Heat, Acid, or Radiation, with the Polymerization Initiating Layer, and Supplying Energy Thereto, so as to Generate a Graft Polymer on a Surface of the Polymerization Initiating Layer by Graft Polymerization The pattern forming layer of this aspect comprises a graft polymer generated on the surface of the polymerization initiating layer by graft polymerization of a polymerizable compound having a functional group of which the hydrophilicity/hydrophobicity changes due to heat, acid or radiation.

[Graft Polymerization]

The process for formation of the pattern forming layer in the invention is generally carried out in a way of the so-called surface graft polymerization. The graft polymerization means a method for synthesizing a graft polymer by giving an active species onto the chain of a polymer compound and bonding and polymerizing thereto another monomer for initiating polymerization. Particularly, the formation of the solid surface with a polymer compound giving an active species is called surface graft polymerization.

Specifically, the surface graft polymerization usually comprises supplying energy, for example, by plasma or electron beam directly to the polymer surface such as PET constituting the support to produce radicals thereon and generate polymerization initiating capability, and then allowing the active surface to react with a monomer (in the invention, a polymerizable compound having a polarity-changing group) to form a graft polymer surface layer, that is, the pattern forming layer of the invention.

In the invention, since a polymerization initiating layer is preliminarily formed on a support as mentioned above, such an active point can readily be formed with low energy. In addition, since the active point is generated abundantly, it is possible to form a pattern forming layer having much better hydrophilicity/hydrophobicity in a simple way.

The graft polymerization in the invention also includes a method for synthesizing graft polymers by bonding a desired polymer to the active species on polymer compounds. In the invention, the polymer compounds producing the active species are the specific polymerization initiating polymers as mentioned above.

[Supply of Energy for Producing an Active Species on the Polymerization Initiating Layer]

There is no particular limitation in a method for supplying energy to a polymerization initiating layer, i.e., a specific polymerization initiating polymer constituting the polymerization initiating layer to produce an active species. As far as the polymerization initiating group contained in a polymerization initiating layer is activated and the resulting active species can be polymerized by graft polymerization to a polymerizable compound having a functional group changing hydrophilicity/hydrophobicity by heat, acid or radiation, all of the methods for supplying energy, for example, heating by a thermal head or write by irradiation of active light such as exposure, can be applied. In view of cost and convenience of apparatus, however, it is appropriate to use a way of irradiation of active light.

As for the active light used in energy supply, ultraviolet, visible light, and infrared are included. Among them, ultraviolet and visible light are preferred, and ultraviolet is particularly preferred in view of a superior polymerization rate. The major wavelength of the active light is preferably in the range of 250 nm to 800 nm.

As a light source, for example, a low pressure mercury lamp, high pressure mercury lamp, fluorescent lamp, xenon lamp, carbon arc lamp, tungsten incandescent lamp, sunlight, and the like are exemplified. The time required for irradiation of the active light is usually several seconds to 24 hours, though it may vary depending on the desired graft polymerization degree and the kind of the light source used.

The followings will explain the polymerizable compounds having a functional group of which the hydrophilicity/hydrophobicity changes due to heat, acid or radiation in the invention. In this connection, the functional group of which the hydrophilicity/hydrophobicity changes due to heat, acid or radiation of the invention is sometimes referred to as a polarity-changing group.

The polymerizable compounds having a polarity-changing group of the invention are required to have a polymerizable double bond and a polarity-changing group as mentioned above. Any type of compounds including polymers, macromonomers and monomers can be used as far as they have the two structures in the molecule. In this situation, the macromonomers indicate these having the structure in which the double bond exists only on the terminal of main chain.

In the surface graft polymerization, when polymerizing polymer containing a polarity-changing group having a polymerizable double bond and a polarity-changing group is used as a polymerizable compounds having a polarity-changing group, it is not always necessary to carry out a chain polymerization reaction during the graft polymerization on the polymerization initiating layer surface, as far as a small quantity of polymerizing group is allowed to react. Particularly preferred polymerizable compounds having a polarity-changing group are monomers having a polarity-changing group (hereinafter referred to as a monomer containing a polarity-changing group).

First, the polarity-changing group will be explained. The polarity-changing groups can be classified into two types, that is, a functional group changing from hydrohobicity to hydrophilicity and a functional group changing from hydrophilicity to hydrophobicity.

(Functional Group Changing from Hydrohobicity to Hydrophilicity)

The functional groups changing from hydrohobicity to hydrophilicity are exemplified by the publicly known functional groups as described in documents.

Useful examples of these functional groups include but not limited to alkylsulfonic acid esters, disulfones, and sulfonimides as described in JP-A No.10-282672; alkoxyalkyl esters as described in EPO,652,483, WO92/9934; t-butyl esters as described in H. Ito et al., Macromolecules, vol.21, p.1477; and other carboxylic acid esters protected by an acid-decomposing group as described in documents such as silyl esters or vinyl esters. Among these groups, particularly excellent ones are secondary alkylsulfonic acid esters as mentioned below, tertiary carboxylic acid esters, and alkoxyalkyl esters as mentioned below.

In the invention, the secondary alkylsulfonic acid esters particularly excellent as functional groups changing from hydrohobicity to hydrophilicity are represented by the following general formula (A).

General formula (A)

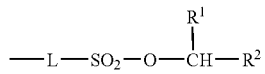

(In the general formula (A), L represents an organic group comprising a polyvalent non-metal atom or atoms required for connecting to a polymer skeleton; $R^1$ and $R^2$ each represents a substituted or unsubstituted alkyl group. Alternatively, $R^1$ and $R^2$ may be taken together with a secondary carbon atom (CH) to which they are bonded to form a ring)

In the general formula (A), $R^1$ and $R^2$ each represents a substituted or unsubstituted alkyl, or substituted or unsubstituted aryl group, or alternatively, $R^1$ and $R^2$ may be taken together with a secondary carbon atom (CH) to which they are bonded to form a ring. When $R^1$ and $R^2$ each represents a substituted or unsubstituted alkyl group, as the alkyl group, straight chain, branched chain or cyclic alkyl groups of 1 to 25 carbons such as methyl, ethyl, isopropyl, t-butyl or cyclohexyl are preferably used. When $R^1$ and $R^2$ are substituted or unsubstituted aryl groups, the aryl groups include carbocyclic aryl groups and heterocyclic aryl groups. As the carbocyclic aryl groups, those of 6 to 19 carbons such as phenyl, naphthyl, anthracenyl or pyrenyl can be used. The heterocyclic aryl groups include those containing 3 to 20 carbons and 1 to 5 heteroatoms such as pyridyl, furyl, as well as those condensed with a benzene ring or rings, for example, quinolyl, benzofuryl, thioxanthone, carbazole, and the like.

When $R^1$ and $R^2$ are substituted alkyl groups or substituted aryl groups, the substituents include alkoxy groups of 1 to 10 carbons such as methoxy or ethoxy; halogen atoms such as fluorine atom, chlorine atom or bromine atom; halogenated alkyl groups such as trifluoromethyl or trichloromethyl; alkoxycarbonyl or aryloxycarbonyl groups of 2 to 15 carbons such as methoxycarbonyl, ethoxycarbonyl, t-butyloxycarbonyl, or p-chlorophenyloxycarbonyl; hydroxyl; acyloxy groups such as acetyloxy, benzoyloxy, or p-diphenylaminobenzoyloxy; carbonate groups such as t-butyloxycarbonyloxy; ether groups such as t-butyloxycarbonylmethyloxy or 2-pyranyloxy; substituted or unsubstituted amino groups such as amino, dimethylamino, diphenylamino, morpholino, or acetylamino; thio ether groups such as methylthio or phenylthio; alkenyl groups such as vinyl or styryl; nitro; cyano; acyl groups such as formyl, acetyl, or benzoyl; aryl groups such as pheny or naphthyl; and heteroaryl groups such as pyridyl. When $R^1$ and $R^2$ are substituted aryl groups, as the substituents, alkyl groups such as methyl or ethyl may be used in addition to the above-mentioned groups.

As for $R^1$ and $R^2$, the substituted or unsubstituted alkyl groups are preferably used because they are superb in storage stability as sensitive materials. In view of stability over time, the alkyl groups substituted by an electron-attracting group or groups such as alkoxy, carbonyl, alkoxycarbonyl, cyano or halogen, or alkyl group such as cyclohexyl and norbornyl are particularly preferred. In the physicochemical properties, the compounds of which the chemical shift of the secondary methylenic hydrogen in proton-NMR in chloroform-d appears at a lower magnetic field than 4.4 ppm, more preferably at 4.6 ppm or lower, are particularly preferred. The reason why the alkyl group substituted by an electron-attracting group is preferred is considered that the carbocation possibly generated as intermediate during thermal decomposition might be unstabilized by the electron-attracting group and its decomposition would be suppressed. Specifically, the structures represented by the following formulae are particularly preferred as —$CHR^1R^2$.

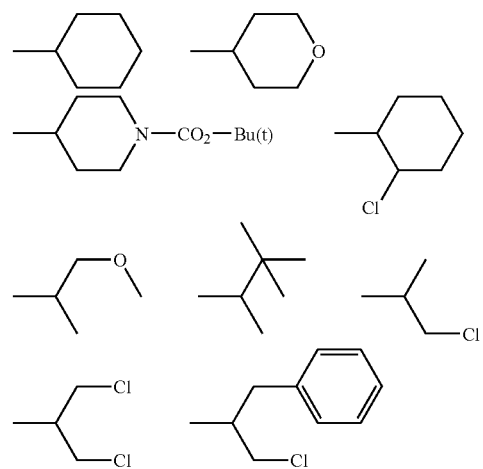

-continued

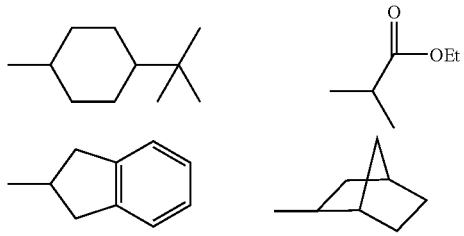

The polyvalent connecting group comprising a non-metal atom or atoms represented by the symbol L in the general formula (A) is constructed by 1 to 60 carbon atoms, 0 to 10 nitrogen atoms, 0 to 50 oxygen atoms, 1 to 100 hydrogen atoms, and 0 to 20 sulfur atoms. More specifically, the connecting group is that constructed by the following structural units in combination.

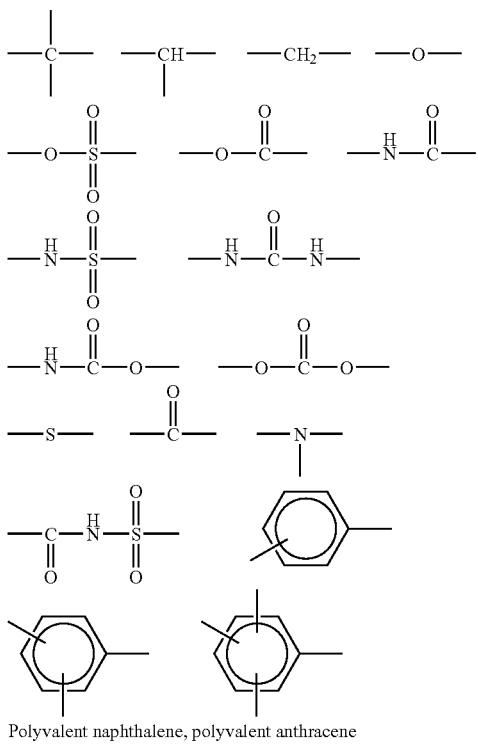

Polyvalent naphthalene, polyvalent anthracene

When the polyvalent connecting groups have a substituent or substituents, such substituents include alkyl groups of 1 to 20 carbons such as methyl or ethyl; aryl groups of 6 to 16 carbons such as phenyl or napththyl; hydroxyl; carboxyl; sulfonamido; N-sulfonamido; acyloxy groups of 1 to 6 carbons such as acetoxy; alkoxy groups of 1 to 6 carbons such as methoxy or ethoxy; halogen atoms such as chlorine or bromine; alkoxycarbonyl groups of 2 to 7 carbons such as methoxycarbonyl, ethoxycarbonyl or cyclohexyloxycarbonyl; cyano; and carbonate groups such as t-butyl carbonate.

In the invention, the alkoxyalkyl ester group particularly superb as a functional group changing from hydrophobicity to hydrophilicity may be represented by the following general formula (B).

General formula (B)

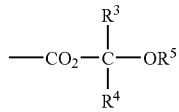

In general formula (B), $R^3$ represents a hydrogen atom; $R^4$ represents a hydrogen atom or alkyl group of up to 18 carbons; and $R^5$ represents an alkyl group of up to 18 carbons. Alternatively, two of $R^3$, $R^4$ and $R^5$ may bond with each other to form a ring. Particularly, it is preferred that $R^4$ and $R^5$ are bonded to each other to form a 5- or 6-membered ring.

As mentioned above, in the invention, the secondary alkylsulfonic acid ester groups represented by the formula (A) are particularly preferred as functional groups changing from hydrophobicity to hydrophilicity.

The followings illustrate specific examples of the functional groups of the general formulae (A) and (B).

 (1)

 (2)

 (3)

 (4)

 (5)

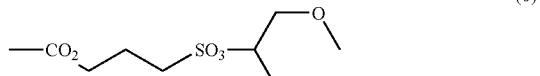 (6)

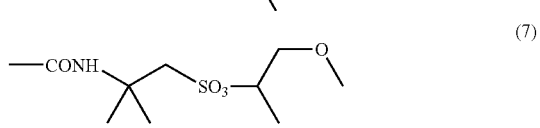 (7)

 (8)

 (9)

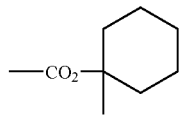 (10)

-continued

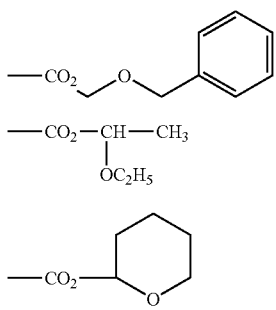

In the invention, functional groups of which the hydrophilicity/hydrophobicity are changeable by irradiation at 700 nm or shorter may also be used as the groups changing from hydrophobicity to hydrophilicity.

Thus, the functional groups of which the polarity changes by irradiation at 700 nm or shorter are characterized in that the groups allow direct decomposition, ring-opening or dimerization by irradiation at a prefixed wavelength in high sensitivity without exposure to long wavelength light such as infrared ray or heat to change the polarity.

As the functional groups of which the hydrophobicity changes into hydrophilicity by irradiation at 700 nm or shorter, for example, the groups represented by the following general formulae (C) to (K) can be used.

In the invention, the following groups represented by the general formula (C) can be exemplified as functional groups of which the hydrophobicity changes into hydrophilicity by irradiation at 700 nm or shorter.

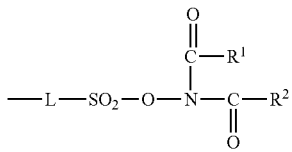

(In the formula (C), L represents an organic group comprising a polyvalent non-metal atom or atoms required for connecting to a polymer skeleton; $R^1$ and $R^2$ each independently represents an alkyl group or aromatic cyclic group. Alternatively, $R^1$ and $R^2$ may bond with each other to form a ring)

In the formula (C), $R^1$ and $R^2$ each independently represents an alkyl group or aromatic cyclic group. Alternatively, $R^1$ and $R^2$ may bond with each other to form a ring.

The alkyl groups represented by $R^1$ and $R^2$ are preferably those of 1 to 8 carbon atoms, for example, methyl, ethyl, propyl, butyl, pentyl, hexyl, heptyl, octyl, isopropyl, isobutyl, s-butyl, t-butyl, cyclohexyl, isopentyl, neopentyl, 1-methylbutyl, isohexyl, 2-ethylhexyl, 2-methylhexyl, and cyclopentyl. Or $R^1$ and $R^2$ may bond with each other with a unit of $-(CH_2)_n-$ (n=1 to 4).

Among these groups, it is particularly preferred that $R^1$ and $R^2$ are bonded to each other with a unit of $-(CH_2)_n-$ (n=1 to 4) to form a ring.

The alkyl groups represented by $R^1$ and $R^2$ may be substituted or unsubstituted, and the substituents to be introduced are monovalent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, and the like.

The aromatic cyclic groups represented by $R^1$ and $R^2$ may preferably be those of 6 to 14 carbon atoms, for example, phenyl, biphenyl, naphthyl, and mesityl, with phenyl and naphthyl being preferred.

The aromatic cyclic groups represented by $R^1$ and $R^2$ may be substituted or unsubstituted, and the substituents to be introduced are monovalent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, and the like.

As the specific examples of $R^1$ and $R^2$, the groups of which the terminal structure is represented by the following formula including the bonded carbonyl group and the nitrogen atom bonded to the carbonyl group are particularly preferred.

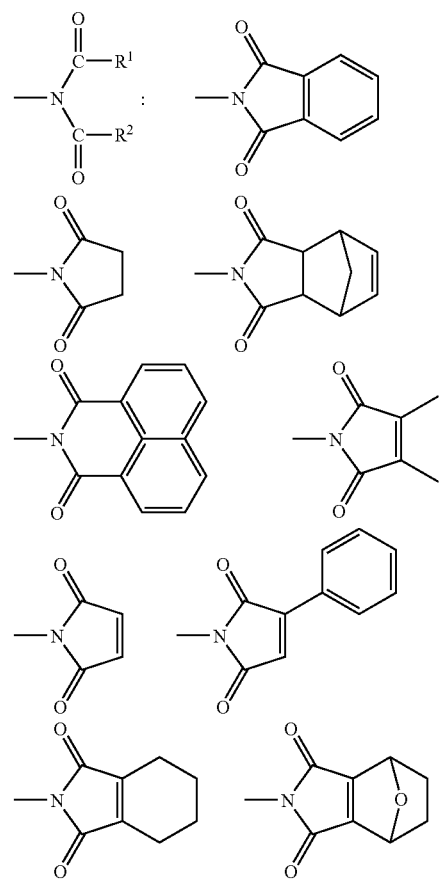

The polyvalent connecting group comprising a non-metal atom or atoms represented by L of the general formula (C) has the same significance as L of the general formula (A), and the preferred examples are the same, too.

More specifically, the connecting group is the same as that constructed by combination of the structural unit represented by the general formula (A). When the polyvalent connecting group has a substituent, it is the same as that used in the general formula (A).

In the invention, the following groups represented by the general formula (D) can be exemplified as a functional group of which the hydrophobicity changes into hydrophilicity by irradiation at 700 nm or shorter.

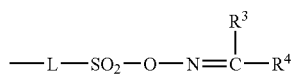
(D)

(In the formula (D), L represents an organic group comprising a polyvalent non-metal atom or atoms required for connecting to a polymer skeleton; $R^3$ and $R^4$ each independently represents a mono-valent substituent. Alternatively, $R^3$ and $R^4$ may bond with each other to form a ring)

In the formula (D), $R^3$ and $R^4$ each independently represents a mono-valent substituent, specifically, alkyl group, hydroxyl, alkoxy group, amino, formyl, acyl group, carboxyl, cyano, or aromatic cyclic group.

When $R^3$ and $R^4$ are alkyl groups, they preferably contain 1 to 8 carbon atoms and are exemplified by methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl, and cyclopentyl. Or $R^3$ and $R^4$ may bond with each other with a unit of $-(CH_2)_n-$ (n=1 to 4).

Among these groups, it is particularly preferred that $R^3$ and $R^4$ are methyl groups, or bonded to each other with a unit of $-(CH_2)_n-$ (n=1 to 4) to form a ring, or cyano.

The alkyl groups, hydroxyl, alkoxy group, amino, formyl, acyl group, carboxyl, or cyano represented by $R^3$ and $R^4$ may be substituted or unsubstituted, and the substituents to be introduced are mono-valent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, and the like.

The aromatic cyclic groups represented by $R^3$ and $R^4$ may preferably be those of 6 to 14 carbon atoms, for example, phenyl, biphenyl, naphthyl, and mesityl, with phenyl and naphthyl being preferred.

The aromatic cyclic groups represented by $R^3$ and $R^4$ may be substituted or unsubstituted, and the substituents to be introduced are monovalent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, and the like.

Particularly, $R^3$ and $R^4$ are preferably substituted or unsubstituted aromatic cyclic groups of 6 to 14 carbon atoms having at least one nitro group.

More specifically, the groups of which the terminal structure including ($-N=C$) of the general formula (D) is represented by the following formulae are particularly preferred as $R^3$ and $R^4$.

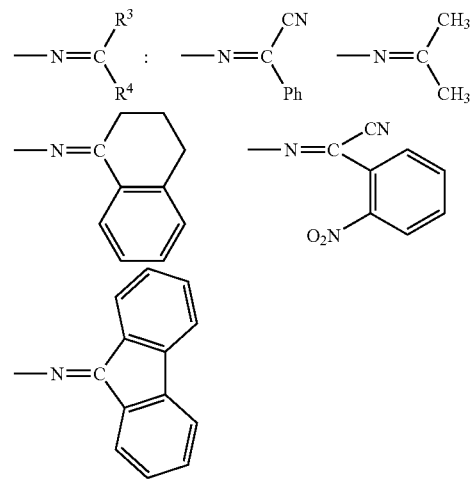

The polyvalent connecting group comprising a non-metal atom or atoms represented by L of the general formula (D) has the same significance as L of the general formula (A), and the preferred examples are the same, too.

More specifically, the connecting group is the same as that constructed by combination of the structural unit represented by the general formula (A). When the polyvalent connecting group has a substituent, it is the same as that used in the general formula (A).

In the invention, the following groups represented by the general formula (E) can be exemplified as a functional group of which the hydrophobicity changes into hydrophilicity by irradiation at 700 nm or shorter.

(E)

(In the formula (E), L represents an organic group comprising a polyvalent non-metal atom or atoms required for connecting to a polymer skeleton; $R^5$ and $R^6$ each independently represents an alkyl group or aromatic cyclic group)

In the formula (E), $R^5$ and $R^6$ each independently represents an alkyl group or aromatic cyclic group. Alternatively, $R^5$ and $R^6$ each represents an organic group comprising a polyvalent non-metal atom or atoms required for connecting to a polymer skeleton.

The preferred alkyl groups represented by $R^5$ and $R^6$ include, for example, straight chain alkyl groups of 1 to 25 carbon atoms such as methyl, ethyl, propyl, butyl or pentyl, or branched chain alkyl groups of 1 to 8 carbon atoms such as isopropyl, t-butyl, s-butyl, isopentyl or neopentyl. Among them, methyl, ethyl, isopropyl, and t-butyl are particularly preferred.

The alkyl groups represented by $R^5$ and $R^6$ may be substituted or unsubstituted, and the substituents to be introduced are monovalent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, and the like.

The aromatic cyclic groups represented by $R^5$ and $R^6$ include carbocyclic aromatic groups and heterocyclic aromatic groups. As the carbocyclic aromatic groups, preferably those of 6 to 19 carbons, more preferably formed by 1 to 4 benzene rings, such as phenyl, naphthyl, anthracenyl, pyrenyl, biphenyl, xylyl or mesityl. The heterocyclic aromatic groups include preferably those containing 3 to 20 carbon atoms and 1 to 5 heteroatoms, more preferably, pyridyl, furyl, as well as those condensed with a benzene ring or rings, for example, quinolyl, benzofuryl, thioxanthone, carbazole, and the like.

The aromatic cyclic groups represented by $R^5$ and $R^6$ may be substituted or unsubstituted, and the substituents to be introduced are monovalent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, and the like.

The polyvalent connecting group comprising a non-metal atom or atoms represented by L of the general formula (F) has the same significance as L of the general formula (A), and the preferred examples are the same, too.

More specifically, the connecting group is the same as that constructed by combination of the structural unit represented by the general formula (A). When the polyvalent connecting group has a substituent, it is the same as that used in the general formula (A).

In the invention, the following groups represented by the general formula (F) can be exemplified as a functional group of which the hydrophobicity changes into hydrophilicity by irradiation at 700 nm or shorter.

(F)

(In the formula (F), L represents an organic group comprising a polyvalent non-metal atom or atoms required for connecting to a polymer skeleton; $R^7$ represents an alkyl group or aromatic cyclic group)

In the formula (F), $R^7$ represents an alkyl group or aromatic cyclic group.

The alkyl groups represented by $R^7$ are preferably those of 1 to 8 carbon atoms and are exemplified by methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl, and cyclopentyl.

The alkyl groups represented by $R^7$ may be substituted or unsubstituted, and the substituents to be introduced are monovalent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, carbamoyl, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, and the like.

The aromatic cyclic groups represented by $R^7$ may preferably be those of 6 to 14 carbon atoms, for example, phenyl, biphenyl, naphthyl, and mesityl, with phenyl and naphthyl being preferred.

The aromatic cyclic groups represented by $R^7$ may be substituted or unsubstituted, and the substituents to be introduced are monovalent non-metal atomic groups except hydrogen. The preferred examples include halogen atoms such as F, Br, Cl and I, hydroxyl, alkoxy groups, amino, formyl, acyl groups, carboxyl, alkoxycarbonyl groups, aryloxycarbonyl groups, and the like.

As more specific examples of $R^7$, the structure represented by the following formulae are particularly preferred.

$R^7$:

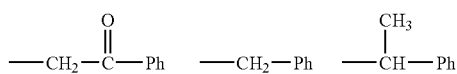

The polyvalent connecting group comprising a non-metal atom or atoms represented by L of the general formula (F) has the same significance as L of the general formula (A), and the preferred examples are the same, too.

More specifically, the connecting group is the same as that constructed by combination of the structural unit represented by the general formula (A). When the polyvalent connecting group has a substituent, it is the same as that used in the general formula (A).

In the invention, the following groups represented by the general formulae (G) and (H) can be exemplified as functional groups of which the hydrophobicity changes into hydrophilicity by irradiation at 700 nm or shorter.

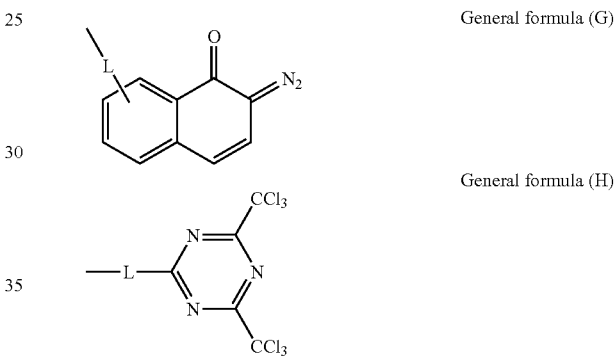

General formula (G)

General formula (H)

(In the formulae (G) and (H), L represents an organic group comprising a polyvalent non-metal atom or atoms required for connecting to a polymer skeleton)

The polyvalent connecting group comprising a non-metal atom or atoms represented by L of the general formulae (G) and (H) has the same significance as L of the general formula (A), and the preferred examples are the same, too.

More specifically, the connecting group is the same as that constructed by combination of the structural unit represented by the general formula (A). When the polyvalent connecting group has a substituent, it is the same as that used in the general formula (A).

In the invention, the following publicly known groups represented by the general formulae (I) to (K) described in documents can be exemplified as functional groups of which the hydrophobicity changes into hydrophilicity by irradiation at 700 nm or shorter. The symbol L in the general formula has the same significance as L in the formula (A).

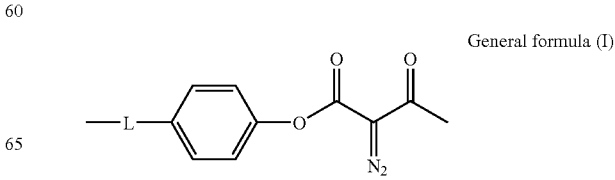

General formula (I)

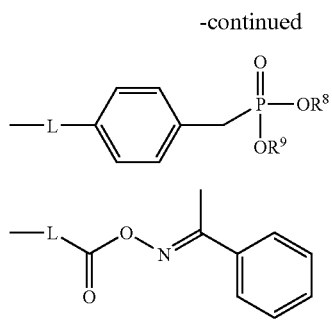

General formula (J)

General formula (K)

The group of the general formula (I) is a quinone diazide polymer as described in P. Jagannathan, SPIE (1994), P.2195.

The group of the general formula (J) is a phosphonic acid polymer as described in M. L. Schilling, Macromol (1995), P.110. In the general formula (J), $R^8$ and $R^9$ each independently represents an alkyl group of 1 to 5 carbon atoms.

The group of the general formula (K) is a polymer containing an oxime ester group as described in Hiroo Iwata, J. Polym. Sci., Chem. Ed. (1996) P.2181.

(Functional Groups of which the Hydrophilicity Changes into Hydrophobicity)

In the invention, the functional groups of which the hydrophilicity changes into hydrophobicity by heat, acid or radiation are exemplified by the publicly known groups, preferably including but not limited to the carboxylic acids and salts thereof represented by the following general formula (L).

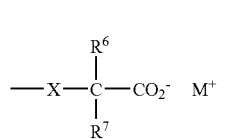

General formula (L)

(In the general formula (L), X represents —O—, —S—, —Se—, —NR$^8$—, —CO—, —SO—, —SO$_2$—, —PO—, —SiR$^8$R$^9$— or —CS—; $R^6$, $R^7$, $R^8$ and $R^9$ each independently represents a mono-valent group; and M indicates an ion with a positive charge)

Specific examples of $R^6$, $R^7$, $R^8$ and $R^9$ include —F, —Cl, —Br, —I, —CN, —R$^{10}$, —OR$^{10}$, —OCOR$^{10}$, —OCOOR$^{10}$, —OCONR$^{10}$R$^{11}$, —OSO$_2$R$^{10}$, —COR$^{10}$, —COOR$^{10}$, —CONR$^{10}$OR$^{11}$, —NR$^{10}$R$^{11}$, —NR$^{10}$—COR$^{11}$, —NR$^{10}$—COOR$^{11}$, —NR$^{10}$—CONR$^{11}$R$^{12}$, —SR$^{10}$, —SOR$^{10}$, —SO$_2$R$^{10}$, —SO$_3$R$^{10}$, and the like.

$R^{10}$, $R^{11}$ and $R^{12}$ include hydrogen, alkyl group, aryl group, alkenyl group, and alkynyl group.

Among them, $R^6$, $R^7$, $R^8$ and $R^9$ preferably include hydrogen, alkyl group, aryl group, alkynyl group and alkenyl group.

Specific example of M includes ions with positive charge as mentioned above.

The followings illustrate the specific examples of the functional groups represented by the general formula (L).

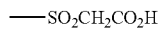

(14)

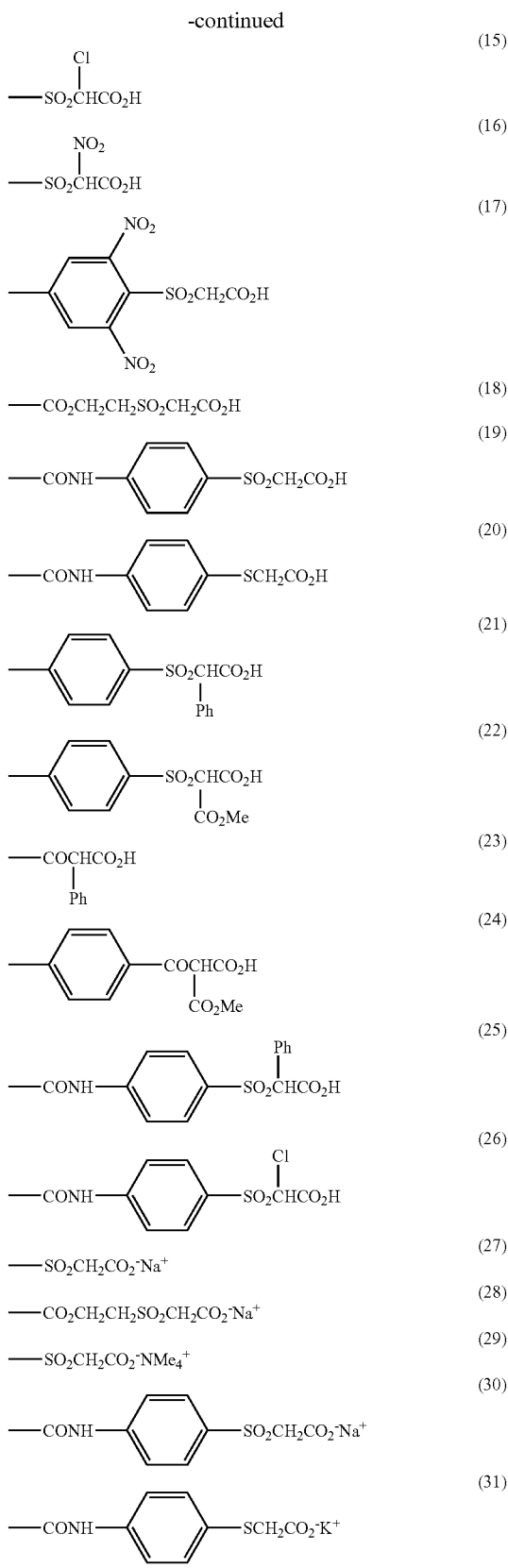

In the invention, functional groups of which the hydrophilicity/hydrophobicity are changeable by irradiation at 700 nm or shorter may also be used as the groups changing from hydrophilicity to hydrophobicity.

As the functional groups changing from hydrophilicity to hydrophobicity by irradiation at 700 nm or shorter, the groups represented by the following general formula (M) are included.

-L-N=N—SO₃M   General formula (M)

(In the formula (M), L represents an organic group comprising a polyvalent non-metal atom or atoms required for connecting to a polymer skeleton. M represents a monovalent cation containing $NH^{4+}$ or metal atom) The polyvalent connecting group comprising a non-metal atom or atoms represented by L of the general formula (M) has the same significance as L of the general formula (A) in the functioned groups changing from hydrophobicity to hydrophilicity, and the preferred examples are the same, too.

More specifically, the connecting group is the same as that constructed by combination of the structural unit represented by the general formula (A). When the polyvalent connecting group has a substituent, it is the same as that used in the general formula (A).

The metal atom contained in M of the general formula (M) includes alkali metal atoms, as well as polyvalent metal atoms such as Al, Cu, Zn, and alkaline earth metals. When the metal atom contained in M is a mono-valent metal atom, e.g., sodium (Na), M is bonded directly to $—SO_3^-$ at the terminal of the functional group represented by the general formula (M), and as a result the formula (M) is represented by -L-N=N—SO₃Na.

When the metal atom contained in M is a polyvalent metal atom, the polyvalent metal forms a mono-valent cation together with a ligand to bond to the $—SO_3^-$ at the terminal of the functional group represented by the general formula (M). Alternatively, the polyvalent metal atom as a polyvalent cation may have a structure bonding to the plural $—SO_3^-$ at the terminal of the functional group represented by the general formula (M).

In the invention, as another example of the functional groups changing from hydrophilicity to hydrophobicity by irradiation at 700 nm or shorter, a bispyridinioethylene group is exemplified.

The followings illustrate specific examples of monomers containing a polarity-changing group preferred as the polymerizable compounds having a polarity-changing group in the invention.

Specific examples of monomers containing a polarity-changing group which have the functional groups represented by the general formulae (A) and (B)

Specific examples of monomers containing a polarity-changing group which have the functional groups represented by the general formula (L)

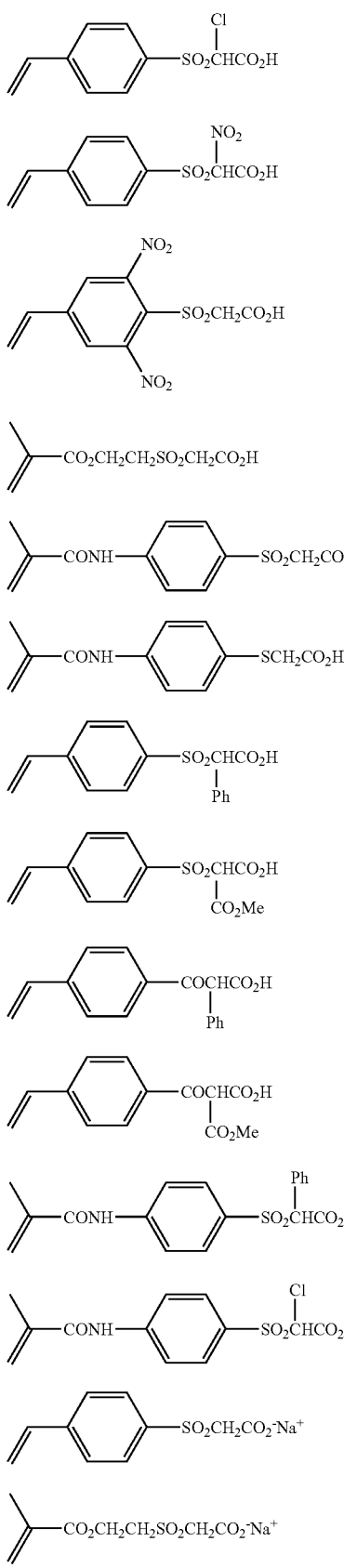

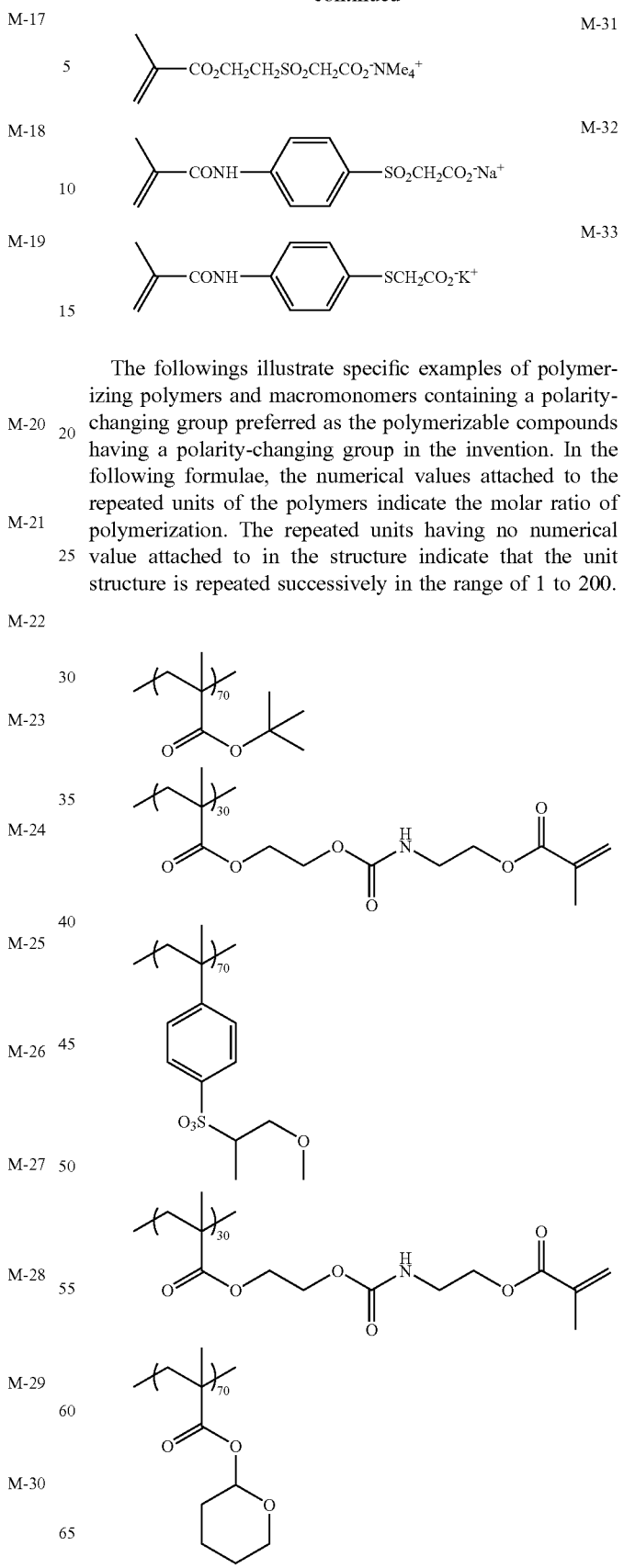

The followings illustrate specific examples of polymerizing polymers and macromonomers containing a polarity-changing group preferred as the polymerizable compounds having a polarity-changing group in the invention. In the following formulae, the numerical values attached to the repeated units of the polymers indicate the molar ratio of polymerization. The repeated units having no numerical value attached to in the structure indicate that the unit structure is repeated successively in the range of 1 to 200.

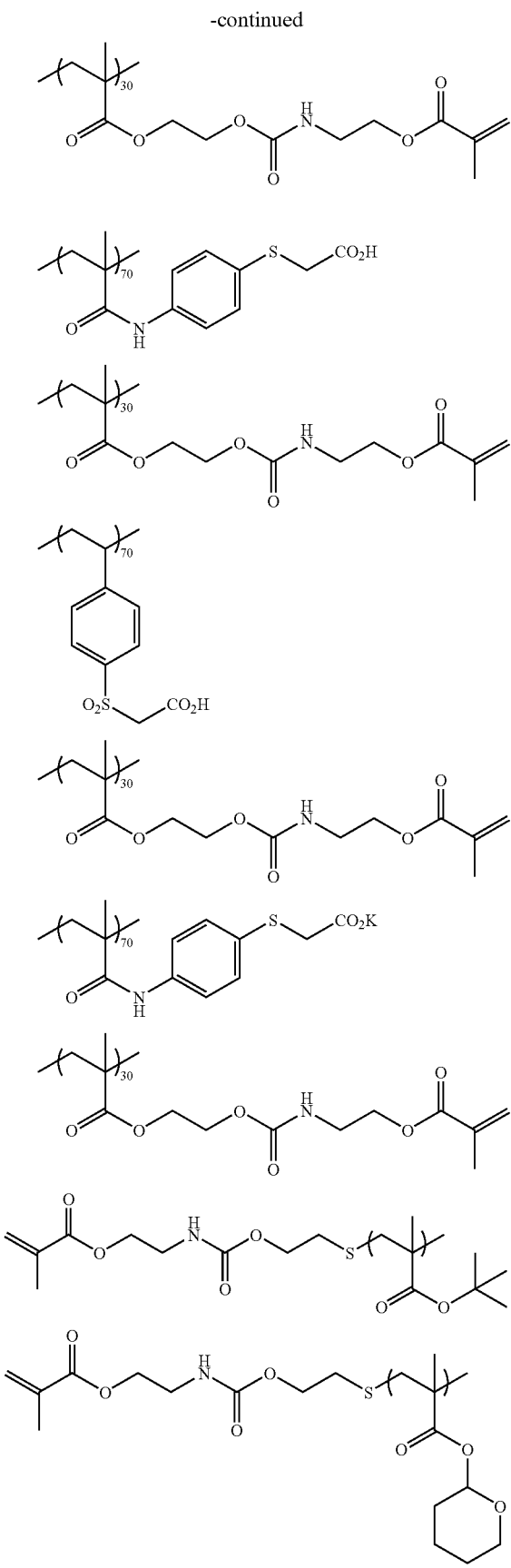

In a specific example of a method for forming a pattern forming layer of the invention, the polymerization initiating layer provided on a support is immersed in a solution of a polymerizable compound containing a polarity-changing group (e.g., monomer containing a polarity-changing group), and then light is irradiated to generate an active species on the polymerization initiating layer, to which the monomer is polymerized by graft polymerization to form a graft polymer.

Thus, a pattern forming layer which comprises a graft polymer can be provided on the surface of the polymerization initiating layer. The thickness of the pattern forming layer can be chosen depending on the purpose, though it is generally fixed, preferably in the range of 0.001 μm to 10 μm, more preferably in 0.01 μm to 5 μm, most preferably in 0.1 μm to 2 μm.

In the pattern forming method of the invention, a polymerization initiating layer and a pattern forming layer comprising a graft polymer are provided in this order on a support as mentioned above, and thereafter a step for forming a hydrophilic/hydrophobic pattern is carried out by applying heat, acid or radiation to the graft polymer like an image.

The step for forming a hydrophilic/hydrophobic pattern will be explained as follows.

<Step for Forming a Hydrophilic/Hydrophobic Pattern by Applying Heat, Acid or Radiation to the Graft Polymer Like an Image>

In this step, the polarity of the graft polymer is changed like an image by applying heat, acid or radiation like an image to the graft polymer produced on the surface of the polymerization initiating layer to form a hydrophilic/hydrophobic pattern. The heat, acid or radiation applied for changing the polarity of the graft polymer may be used alone or in combination of two or more.

In order to change the polarity of the graft polymer with heat, a thermal head may be used; for example, scan exposure with a laser beam is carried out in the presence of a light-to-heat converting substance as mentioned below placed in the vicinity of the graft polymer to heat the exposed area. In a usually used specific embodiment, for example, a direct image-like record by a thermal recording head is carried out, or scan exposure with a infrared laser to a graft polymer near which a light-to-heat converting substance exists is carried out for direct lithography.

(Light-to-Heat Converting Substance)

In order to change the polarity of a pattern forming layer comprising the graft polymer of the invention utilizing the heat generated by laser beam scan exposure, it is appropriate to place a light-to-heat converting substance for converting photo-energy of the laser into heat energy in the vicinity of the graft polymer. The light-to-heat converting substance may preferably be placed on any portion of a support, polymerization initiating layer or pattern forming layer, or in the middle layer between the polymerization initiating layer and the support.

Such a light-to-heat converting substance also works to increase sensitivity to the light irradiated. This effect can be used similarly in the conversion of the polarity of graft polymer by irradiation of light.

As the light-to-heat converting substance, all of the substances which can absorb light such as ultraviolet, visible light, infrared or white light to convert into heat can be used, including, for example, carbon black, carbon graphite, pigment, phthalocyanine pigment, iron powder, graphite powder, iron oxide powder, lead oxide, silver oxide, chromium oxide, iron sulfide, chromium sulfide, and the like. Particularly preferred is a combination of scan exposure by infrared laser with a dye, pigment or metal which effectively absorbs infrared ray at a wavelength of from 760 nm to 1200 nm.

As the dye, a commercially available one or a publicly known one described in documents (e.g., "Dye Handbook", edited by Society of Synthetic Organic Chemistry, Japan, 1970) can be utilized. Specifically, azo dye, metal complex azo dye, pyrazolone azo dye, anthraquinone dye, phthalocyanine dye, carbonium dye, quinone imine dye, methine dye, cyanine dye, metal thiolate complex, and the like, are included. The preferred dye includes, for example, cyanine dyes as described in JP-A Nos.58-125246, 59-84356, 59-202829 and 60-78787; methine dyes as described in JP-A Nos.58-173696, 58-181690, and 58-194595; naphthoquinone dyes as described in JP-A Nos. 58-112793, 58-224793, 59-48187, 59-73996, 60-52940, and 60-63744; squarylium pigments as described in JP-A No.58-112792; and cyanine dyes as described in British Patent No.434,875, are included.

In addition, a near-infrared absorption sensitizer as described in U.S. Pat. No. 5,156,938; a substituted arylbenzo (thio) pyrylium salt as described in U.S. Pat. No. 3,881,924; trimethine thiapyrylium salt as described in JP-A No.57-142645 (U.S. Pat. No. 4,327,169); pyrylium compounds as described in JP-A Nos.58-181051, 58-220143, 59-41363, 59-84248, 59-84249, 59-146063, and 59-146061; a cyanine pigment as described in JP-A No.59-216146; pentamethine thiopyrylium salts as described in U.S. Pat. No. 4,283,475; and a pyrylium compound as described in JP-B Nos.5-13514 and 5-19702, can be used preferably. As other examples of the preferred dyes, near-infrared absorption dyes described as formulae (I) and (II) in U.S. Pat. No. 4,756,993 can be exemplified. Among these dyes, particularly preferred are cyanine pigments, squarylium pigments, pyrylium salts, and nickel thiolate complexes.

As for the pigments used in the invention, commercially available pigments and those as described in Color Index (C.I.) Handbook, "Current Pigment Handbook" (edited by Japan Association of Pigment Technology, 1977), "Current Technology for Application of Pigments" (CMC PRESS, 1986), and "Technology of Printing Ink" (CMC PRESS, 1984) can be utilized. The type of pigments include black pigment, yellow pigment, orange pigment, brown pigment, red pigment, violet pigment, blue pigment, green pigment, fluorescent pigment, metal powder pigment, others, and polymer-bonding pigment. Specifically, insoluble azo pigment, azo lake pigment, condensed azo pigment, chelate azo pigment, phthalocyanine pigment, anthraquinone pigment, perylene and perynone pigment, thioindigo pigment, quinacridone pigment, dioxazine pigment, isoindolinone pigment, quinophthalone pigment, dye lake pigment, azine pigment, nitroso pigment, nitro pigment, natural pigment, fluorescent pigment, inorganic pigment, carbon black, and the like can be used. Among these pigments, particularly preferred is carbon black.

These pigments can be used with or without surface treatment. The surface treatment is considered to be achieved by coating of the surface with resin or wax, by adhesion of a surface active agent, or by bonding of a reactive material (for example, silane-coupling agent, epoxy compound, polyisocyanate) to the pigment surface. The above-mentioned methods for treatment have been described in "Properties and Application of Metal Soap" (Sachi Syobo), "Technology of Printing Ink" (CMC PRESS, 1984), and "Current Technology for Application of Pigments" (CMC PRESS, 1986).

The particle size of the pigments is preferably in the range of 0.01 µm–10 µm, more preferably in 0.05 µm–1 µm, particularly in 0.1 µm–1 µm, in view of stability and homogeneity in a coating solution.

Dispersion of the pigment can be achieved by a publicly known technique used in production of ink or toner. As for a dispersing machine, ultrasonic dispersing machine, sand mill, atriter, pearl mill, super mill, ball mill, impeller, disperser, KD mill, colloid mill, Dynatron, three-roll mill, pressure kneader, and the like are exemplified. Details are described in "Current Technology for Application of Pigments" (CMC PRESS, 1986).

The amount of the pigment or dye to be added is in 0.01–50% by weight, preferably 0.1–10% by weight, for the entire solid component constituting the layer containing light-to-heat converting substance, in view of sensitivity and film strength. Particularly, the dye may preferably be used in 0.5–10% by weight, and the pigment may preferably be used in 3.1–10% by weight.

In order to change the polarity of the graft polymer by irradiation of radiation such as light, irradiation of light by an infrared laser, ultraviolet lamp or visible light, or irradiation of electron beam such as γ-ray is conducted. As for a light source, for example, a mercury lamp, metal halide lamp, xenon lamp, chemical lamp, carbon arc lamp, and the like are exemplified. Radiation is made with electron beam, X-ray, ion beam, far-infrared ray, and the like. Additionally, g-ray, i-ray, deep UV light, or high-density energy beam (laser beam) may be used.

As for a specific embodiment generally employed, scan exposure with a infrared laser, flash exposure at high illuminance with a xenon discharge lamp, or exposure with an infrared lamp is preferably exemplified.

In addition, it is essential that an acid-generating substance as shown below exists in the vicinity of the graft polymer in order to change the polarity of the graft polymer with an acid. The acid-generating substance is decomposed by light or heat to generate an acid, by which the polarity-changing group of the graft polymer is hydrolyzed, and as a result the polarity is changed.

(Acid-Generating Substances)

In order to change the polarity of the pattern forming layer comprising a graft polymer with an acid in the invention, it is necessary to place an acid-generating substance in the vicinity of the graft polymer. The acid-generating substance may be added to a polymerization initiating layer, pattern forming layer or an optional layer provided on the pattern forming layer.

The acid-generating substances are compounds which generate an acid under heating or lighting, generally including known compounds generating an acid by light and their mixtures used as photo-initiators in light cationic polymerization or light radical polymerization, photobleaching agents in pigments, photo-discoloring agents, and microresist. These compounds may optionally be chosen and used.

For example, the following compounds are specifically included: onium salts, for example, diazonium salts as described in S. I. Schlesinger, Photogr. Sci. Eng., 18, 387 (1974), T. S. Bal et al., Polymer, 21, 423 (1980); ammonium salts as described in U.S. Pat. Nos.4,069,055 and 4,069,056, JP-A No.3-140140; phosphonium salts as described in D. C. Necker et al., Macromolecules, 17, 2468 (1984), C. S. Wen et al., Teh, Proc. Conf. Rad. Curing ASIA, p.478, Tokyo, October (1988), U.S. Pat. Nos. 4,069,055 and 4,069,056; iodonium salts as described in J. V. Crivello et al., Macromolecules, 10(6), 1307 (1977), Chem. & Eng. News, November 28, p.31 (1988), EP No.104,143, U.S. Pat. Nos. 5,041,358 and 4,491,628, JP-A Nos.2-150848 and 2-296514; sulfonium salts as described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP No.370,693, U.S. Pat. No.3,902,114, EP Nos.233,567, 297, 443 and 297,442, U.S. Pat. Nos.4,933,377, 4,491,628, 5,041,358, 4,760,013, 4,734,444 and 2,833,827, German Pat.Nos.2,904,626, 3,604,580 and 3,604,581; selenonium salts as described in J. V. Crivello et al., Macromolecules, 10(6), 1307 (1977), J. V. Crivello et al., J. Polymer Sci., Polymer Chem. Ed., 17, 1047 (1979); and arsonium salts as described in C. S. Wen et al., Teh, Proc. Conf. Rad. Curing ASIA, p.478, Tokyo, October (1988); organic halides as described in U.S. Pat. No.3,905,815, JP-B No.46-4605, JP-A Nos.48-36281, 55-32070, 60-239736, 61-169835, 61-169837, 62-58241, 62-212401, 63-70243 and 63-298339; organometallic/organic halides as described in K. Meier et al., J. Rad. Curing, 13(4), 26 (1986), T. P. Gill et al., Inorg. Chem., 19, 3007 (1980), D. Astruc, Acc. Chem. Res., 19(12), 377 (1986), JP-A No.2-161445; light acid-generating agents having o-nitrobenzyl type protecting groups as described in S. Hayase et al., J. Polymer Sci., 25, 753 (1987), E. Reichman et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17) 1445 (1975), J. W. Walker et al., J. Am. Chem. Soc., 110, 7170 (1988), S. C. Busman et al., J. Imaging Technol., 11(4) (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130(6), F. M. Houlihan et al., Macromolecules, 21, 2001 (1988), EP Nos. 0290,750, 046,083, 156,535, 271,851 and 0,388,343, U.S. Pat. Nos. 3,901,710 and 4,181,531, JP-A Nos.60-198538 and 53-133022; compounds generating sulfonic acid by photo-decomposition exemplified by iminosulfonates as described in TUNOOKA et al., Polymer Preprints Japan, 35(8), G. Berner et al., J. Rad. Curing, 13(4), W. J. Mijs et al., Coating Technol., 55(697), 45(1983), Akzo, H.Adachi et al., Polymer Preprints, Japan, 37(3), EP Nos. 0,199,672, 84,515, 199,672, 044,115 and 0,101,122, U.S. Pat. Nos. 4,618,554, 4,371,605, 4,431,774, JP-A Nos.64-18143, 2-245756 and 3-140109; and disulfone compounds as described in JP-A No.61-166544.

These acid-generating substances may optionally be used at the rate corresponding to the components of the layer containing an acid-generating substance.

In order to change the polarity of the graft polymer comprising a polymerizable compound which has a polarity-changing group sensitizing to irradiation at 700 nm or shorter, it is necessary to cause the change of polarity, that is, to use some measures for photo-irradiation by which the polarity-changing group can be decomposed, ring-opened or dimerized to change hydrophilicity/hydrophobicity. For example, photo-irradiation with a UV lamp or by visible light can be employed. As for a light source, a mercury lamp, metal halide lamp, xenon lamp, chemical lamp, and carbon arc lamp are exemplified.

In the invention, in order to form a hydrophilic/hydrophobic pattern directly from the digital data of a computer, it is preferred to use a method of changing the polarity by laser exposure. As a laser, gaseous laser such as carbon dioxide gas laser, nitrogen laser, Ar laser, He/Ne laser, He/Cd laser, and Kr laser, liquid (pigment) laser, solid laser such as ruby laser and Nd/YAG laser, semiconductor laser such as GaAs/GaAlAs, InGaAs laser, and excimer laser such as KrF laser, XeCl laser, XeF laser, $Ar_2$, and so on, can be used.

<Support>

There is no limitation in the support used in the invention as far as it is a dimensionally stable plate. Such a support is exemplified by paper, paper laminated with plastic (e.g., polyethylene terephthalate, polyethylene, polypropylene, polystyrene, etc.), metal plate (e.g., aluminum, zinc, copper, etc.), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal, etc.), and paper or plastic film laminated or vapor-deposited with the metal as mentioned above.

As the support used in the invention, polyester film or aluminum plates is preferred, and above all polyester film is particularly preferred.

The particularly preferred aluminum plate used in the invention is a pure aluminum plate or an alloy plate consisting of aluminum as a major component and a small amount of other elements or plastic film laminated or vapor-deposited with aluminum. The other elements contained in aluminum alloy include silicon, iron, manganese, copper, magnesium, chromium, zinc, bismuth, nickel, titanium, and so on. The content of the other elements in the alloy is at most 10% by weight or less. Particularly preferred aluminum in the invention is pure aluminum, but since it is difficult to produce perfectly pure aluminum due to limitation of the refinement technique, the aluminum may contain a trace of other elements. Since the constitution of the aluminum plate adaptable to the invention cannot be specified, any of aluminum plates made from publicly known raw materials can be utilized. The thickness of the aluminum plates used in the invention is in approximately 0.1 mm-0.6 mm, preferably in 0.15 mm-0.4 mm, more preferably in 0.2 mm-0.8 mm.

The polymerization initiating layer of the invention is formed by immobilizing a polymer by the crosslinking reaction, which polymer has a functional group having a polymerization initiating capability on the side chain and a crosslinking group. Since a graft polymer is produced on the surface of the polymerization initiating layer, it is possible to prevent dissolution of the polymerization initiating component (component having polymerization initiating capability) contained in the polymerization initiating layer when it is allowed to contact with a solution containing a polymerizable compound having a polarity-changing group during the step of producing the graft polymer. As a result, it is possible to more effectively prevent the dissolution of the polymerization initiating component contained in the polymerization initiating layer and to suppress the generation of homopolymer as by-product not bonding directly to the surface of the polymerization initiating layer. Thus, the only graft polymer bonding directly to the surface of the polymerization initiating layer is produced.

Therefore, the pattern forming layer in the pattern forming materials of the invention as well as the hydrophilic/hydrophobic pattern produced by the pattern forming method of the invention are not readily peeled off by friction, etc.

The followings will explain in details the planographic printing plate precursor to which the pattern forming materials and the pattern forming method of the invention are preferably applied.

[Planographic Printing Plate Precursor]

The planographic printing plate precursor to which the pattern forming materials and the pattern forming method of the invention are applied comprises:

polymerization initiating layer formed on the support by immobilizing a polymer having, on a side chain thereof, a crosslinking group and a functional group having polymerization initiating capability, by a crosslinking reaction; and a polymer layer comprising a polymer compound which is chemically bonded directly to the polymerization initiating layer and has a functional group of which the hydrophilicity/hydrophobicity changes due to heat, acid or radiation.

The polymer layer in the planographic printing plate precursor of the invention is characterized by comprising the graft polymer (polymer compound having a functional group of which the hydrophilicity/hydrophobicity changes due to heat, acid or radiation) produced on the surface of the polymerization initiating layer by graft polymerization as mentioned above.

That is, the planographic printing plate precursor of this aspect comprises using as image and non-image areas the hydrophilic/hydrophobic patterns prepared by the pattern forming method of the invention. For example, when the graft polymer is produced using a polymerizable compound of which the polarity is converted from hydrophilicity into hydrophobicity, dampening water and oil ink are supplied to the type area, and thus dampening water is absorbed into the generated hydrophilic region (area of no change of polarity) to form non-image area; the hydrophobic region generated by change of the polarity becomes the region receiving oil ink to form an image area.

In the planographic printing plate precursor of this aspect, the hydrophilic region in which a hydrophilic graft polymer with no change of the polarity is directly bonded to the polymerization initiating layer, is superior in water-holding capacity and durability because of its high hydrophilicity, and accordingly occurrence of blots in the non-image area is effectively suppressed. Additionally, the hydrophilicity and water-holding capacity work to thin the polymer layer as an image-forming layer and enhance sensitivity.

The image area which comprises a hydrophobic graft polymer with changed polarity is able to form an image of high quality since the difference between the hydrophilic region and the hydrophobic region becomes large because of high hydrophilicity of the hydrophilic region. In addition, since the hydrophobic graft polymer is also bonded directly to the polymerization initiating layer to give high hydrophobic durability, highly effective press life as a printing plate is expected.

5. Particle-Adsorbed Material and a Method of Producing the Particle Adsorbed Material The followings will illustrate as the sixth aspect of the invention a method for producing a particle-adsorbed material and the particle-adsorbed material prepared by the method in detail.

The method for producing a particle-adsorbed material of the invention comprises the steps of: providing a polymerization initiating layer on a surface of a support by immobilizing a polymer having, on a side chain thereof, a crosslinking group and a functional group having polymerization initiating capability, by a crosslinking reaction; contacting a compound having a polymerizable functional group and a polar group with the polymerization initiating layer, and irradiating radiation thereto, so as to bond the compound to the surface of the polymerization initiating layer by graft polymerization; and adsorbing particles which are able to mutually interact with the polar group.

The particle-adsorbed material produced by the method for producing a particle-adsorbed material of the invention is characterized in that the material is produced by providing a polymerization initiating layer on the surface of a support by immobilizing a polymer having on the side chain thereof a crosslinking group and a functional group having polymerization initiating capability by crosslinking reaction; contacting a compound having a polymerizable functional group and a polar group with the polymerization initiating layer, followed by irradiation of radiation, to make the compound bond to the surface of the polymerization initiating layer by graft polymerization; and adsorbing the particles which are able to mutually interact with the polar group.

The followings will illustrate the method for producing a particle-adsorbed material of the invention, as well as, in the particle-adsorbed material to which the above method is applied, a polymerization initiating layer and a process for formation thereof, graft polymerization, and particles capable of forming an interaction with a polar group and a process for adsorption thereof.

5-1. Polymerization Initiating Layer and a Process for Formation Thereof, and Graft Polymerization In the method for producing a particle-adsorbed material of the invention, the "polymerization initiating layer and a process for formation thereof" and "graft polymerization" in this section have the same meanings as those illustrated above in details in Graft polymerization and the hydrophilic members thereby in the invention.

In the specific polymerization initiating polymer applied to this embodiment, the mole percentage for copolymerization of the copolymer component (A) having a polymerization initiating group is preferably 5 mole % or more and that of the copolymer component (B) having a crosslinking group is preferably 10 mole % or more, more preferably 5–50 mole % for (A) and 30–70 mole % for (B), and even more preferably 10–20 mole % for (A) and 30–40 mole % for (B), in view of the graft polymerization and the film characteristic of polymerization initiating layer after crosslinking reaction.

In the method for producing a particle-adsorbed material of the invention, "a compound having a polymerizable functional group and a polar group" has the same meanings as "a compound having a polymerizable functional group and a polar group" as described in the above graft polymerization and corresponds to "a hydrophilic compound having a polymerizing group" as described in the above hydrophilic members, though they are not limited thereto.

As for the support used in the method for producing a particle-adsorbed material of the invention, for example, those described above as the supports in the graft polymerization method may optionally be chosen in accordance with the relation with the utility and the adsorbed particles. In view of workability and transparency, the substrate having the surface of polymer resin is preferably used, specifically, resinous film, transparent support such as glass of which the surface is coated with a resin, or composite material of which the surface is composed of a resin layer.

The support of which the surface is coated with a resin is exemplified by a laminated substrate in which a resinous film is stuck on the surface, primer-treated substrate, and hard coat-treated substrate. The composite material of which the surface is composed of a resin layer is exemplified by a resin seal material in which an adhesive layer is placed on the back, or laminated glass comprising glass and resin.

When the particle-adsorbed material of the invention is used as roughed member, i.e., antireflection material, in a image display for high resolution equipped with high-dense pixels or a small and highly resolving image display used in mobile phones, it is appropriate to use a smooth and transparent support in order to adjust the surface unevenness to be formed. In order to further improve macroscopically the antireflection capability, it is also possible to rough the surface of the support in advance to increase the surface area and introduce much more polar groups.

Method for roughing the support may be chosen from the known methods adaptable to the quality of the substrate. Specifically, for example, the resinous film as a substrate may be roughed by means of glow discharge treatment, sputtering, sand blast polishing, buffing polishing, particle adhesion, particle coating, and so on. When the substrate is a metal plate such as aluminum plate, a mechanically roughing method, an electrochemical method for dissolving and roughing the surface, and a chemical method for selectively dissolving the surface can be applied. The mechanical method includes publicly known ones, for example, ball polishing, brush polishing, blast polishing, buffing polishing, and so on. The electrochemical method of roughing the surface may be carried out in an electrolyte of hydrochloric acid or nitric acid under alternating current or direct current. Both methods may be combined.

5-2. Particles Capable of Forming the Interaction with a Polar Group and a Process for Adsorption Thereof After formation of the graft polymer having a polymerizable functional group and a polar group on the surface of the polymerization initiating layer, particles are adsorbed thereon to give the particle-adsorbed material of the invention, the particles having the following functionality and being capable of forming the interaction with a polar group of the graft polymer.

5-2-1. Particles Having a Physical Property Capable of Forming the Interaction with a Polar Group to Exhibit Adsorbability (1) Example of Particles The followings will illustrate the particles having a physical property capable of forming the interaction with a polar group to adsorb. The particles to be used may be chosen optionally according to the purpose for the functional surface. The size of the particles may also be chosen according to the purpose. In the preferred embodiment of the invention, the size and amount of the particles to be adsorbed are naturally limited depending on the surface charge and the number of the ionic group in the particles because they are ionically adsorbed to the ionic polar groups. The particle size is typically in the range of 0.1 nm to 1 μm, preferably 1 nm to 300 nm, particularly preferably 5 nm to 100 nm.

In the invention, the particles capable of forming the interaction with the interface of the graft polymer to adsorb, as illustrated by an example of an ionic group as polar group, are arranged with regularity in an approximately monolayer state depending on the state of the existing ionic group, or arranged in a multi-layer state as a result of the nano-scale particles by ones being adsorbed on the respective ionic groups of the long graft polymer chain.

The followings will illustrate the functional particles used in the invention according to the purpose for the particle-adsorbed materials.

(1-1) Particles for Use in Antireflection Members

When the particle-adsorbed material of the invention is used as antireflection member, it is preferred to use as functional particles at least one of particles selected from resinous particles and metal oxide particles. By using such particles, it is possible to provide antireflection members which can suitably be applied to the surface of an image display which has an even and excellent antireflection capability, affords a clear image without decreasing the image contrast, and is superior in durability.

The resinous particles include organic polymers of which the so-called core particle center is an organic polymer. The metal oxide particles include preferably silica ($SiO_2$), titanium oxide ($TiO_2$), zinc oxide (ZnO), and stannic oxide ($SnO_2$). In addition, the so-called clear or white pigment particles such as calcium carbonate, aluminum hydroxide, magnesium hydroxide, clay, talc, and the like may be used if they have the preferred shape (particle size) as mentioned below.

As resinous particles, those having high hardness are preferred in view of durability, specifically spherical resin including for example acrylic resin, polystyrene resin, polyethylene resin, epoxy resin, silicone resin, and the like, with particles of crosslinked resin being preferred.

In the utility of this antireflection member, the size of the particles is preferably in the range of 100 nm to 300 nm, more preferably 100 nm to 200 nm. In this embodiment, the particles ionically bonding to the interface of graft polymer are arranged with regularity in an approximately monolayer state. When the particle-adsorbed material is used as an antireflection member, it is appropriate to control the film thickness so as to be $\lambda/4$ of the reflected wavelength ($\lambda$) to be prevented in view of the effect. Considering that the size of particles becomes approximately the same as the thickness of the roughed layer (particle-adsorbed layer), when the size is smaller than 100 nm, the roughed layer is inclined to become so thin that the antireflection capability might be decreased. On the other hand, when the size is larger than 300 nm, diffuse reflection becomes so large to cause marked cloudiness and poor transparency, and the strength of the roughed layer is inclined to decrease because the contact area ionically adsorbed on the interface of graft polymer becomes too small.

(1-2) Particles for Use in Conductive Film

When the particle-adsorbed material of the invention is used as electrically conductive film, at least one species of particles selected from conductive resin particles, conductive or semi-conductive metal particles, metal oxide particles, and metal compound particles is preferably selected as the functional particles.

As for the conductive metal particles or metal oxide particles, those of specific resistance of $1\times10^3$ $\Omega\cdot$cm or less can widely be used as a simple substance or alloy thereof, specifically including, for example, silver (Ag), gold (Au), nickel (Ni), copper (Cu), aluminum (Al), tin (Sn), lead (Pb), zinc (Zn), iron (Fe), platinum (Pt), iridium (Ir), osmium (Os), palladium (Pd), rhodium (Rh), ruthenium (Ru), tungsten (W), molybdenum (Mo), and the like, as well as stannic oxide ($SnO_2$), indium oxide ($In_2O_3$), indium tin oxide (ITO), ruthenium oxide ($RuO_2$), and the like.

The metal oxide or metal compound particles having the characteristic as semi-conductors may be used, and includes, for example, oxide semi-conductor particles such as $In_2O_3$, $SnO_2$, ZnO, CdO, $TiO_2$, $CdIn_2O_4$, $Cd_2SnO_2$, $Zn_2SnO_4$, and $In_2O_3$—ZnO, and those particles doped with suitable impurities, particles of spinel compounds such as MgInO, $CaGaO$, etc., conductive nitride particles such as TiN, ZrN, HfN, etc., and conductive boride particles such as $LaB$. These may be used alone or as a mixture of two or more.

(1-3) Particles for Use in Surface Anti-Microbial Materials

When the particle-adsorbed material of the invention is used as anti-microbial material, metal or metal oxide particles having antimicrobial activity or bactericidal activity may be used as functional particles.

The materials capable of forming such metal (compound) particles are specifically exemplified by bactericidal metal simple substances such as silver (Ag) or copper (Cu) and alloys containing one or more of the metals, or their oxides. The semi-conductors of metal compounds, which exhibit a bactericidal activity under irradiation with light containing a wavelength of the ultraviolet range such as fluorescent light or sunlight, including titanium oxide, iron oxide, tungsten oxide, zinc oxide, strontium titanate, and metal compounds derived from these compounds by modification with platinum, gold, palladium, silver, copper, nickel, cobalt, rhodium, niobium, tin, etc., are also exemplified.

(1-4) Particles for Use in Ultraviolet Absorbent Members

When the particle-adsorbed material of the invention is used as ultraviolet absorbent member, it is appropriate to use metal oxide particles such as iron oxide, titanium oxide, zinc oxide, cobalt oxide, chromium oxide, tin oxide, antimony oxide, etc., as functional particles, since they are highly effective in blocking the light in the range of ultraviolet rays A and B (wavelength 280 to 400 nm).

In this invention, a polymer compounds is used as a substrate, which is formed into a composite showing a high function and workability as a UV-blocking film/sheet, which is expected to be applied to a variety of uses. In addition, it is also expected to be used in improvement of light resistance of polymer materials utilizing a UV-blocking effect of the metal oxide.

(1-5) Particles for Use in Optical Materials

When the particle-adsorbed material of the invention is used as optical materials such as color filter, sharp-cut filter, non-linear optical materials, etc., semi-conductors such as CdS or CdSe or metal particles such as gold are exemplified as functional particles. The use of silica glass or alumina glass as a substrate permits the application to color filter, etc., and moreover, they are expected to be used as non-linear optical material such as optical switch or optical memory since a tertiary huge non-linear light sensitivity has been confirmed. As the particles used for that purpose, noble metals such as gold, platinum, silver and palladium or their alloys are exemplified. In view of the stability, such a metal as gold or platinum is exemplified as a preferred material which is not dissolved rapidly in alkali.

Ultrafine particles of metal (compounds) preferred as a non-linear optical material specifically include simple substances, for example, gold (Au), silver (Ag), copper (Cu), platinum (Pt), palladium (Pd), rhodium (Rh), osmium (Os), iron (Fe), nickel (Ni), or ruthenium (Ru), or alloys containing 1 or more of these substance, of which the average particle size is 10–1000 angstrom. The particle size may be of primary particle or of secondary particle, though those which do not scatter visible light are preferred. Particularly, noble metal or normal metal particles of 10 nm or less in particle size dispersed independently in a solvent such as toluene, are preferred, wherein the noble metal is selected from Au, Pt, Pd, Rh and Ag, and the normal metal is selected from Ti, V, Cr, Mn, Fe, Ni, Cu, Zn, Cd, Y, W, Sn, Ge, In and Ga.

When a non-linear optical material was prepared from these ultrafine particles in a conventional manner such as sol-gel method, immersion method, sputtering method, ion infusion method, or fusion-deposition method, there was a problem that it was difficult to increase the concentration of the particles in the composite to decrease the productivity because the particles readily agglutinated. Particularly, when the particle concentration was low and the particles slightly contributed to the physical properties, there was a limitation in its utility, and as a result it was unsuitable for image memory or optical integrated circuit utilizing the tertiary non-linear optical effect. According to the composition of the particle-adsorbed material of the invention, since the particles ionically bond directly to the ionic group of the graft polymer (adsorption) and the ionic group exist in the graft polymer in high density, it is possible to easily increase the particle concentration. Therefore, the particle-adsorbed material of the invention as optical material is considered to be suitable for use in such a non-linear optical material.

(1-6) Particles for Use in Gas Barrier Film

When the particle-adsorbed material of the invention is used as gas barrier film, superfine powder prepared from inorganic compounds such as silicon oxide, zirconium oxide, titanium oxide, alumina, magnesium oxide, or tin oxide, or metals such as aluminum, tin, zinc, etc., of which the average particle size is 100 nm or less, preferably 50 nm or less, are preferably employed as functional particles. The superfine powder may be used in a state of a single species or as a mixture of 2 or more species selected from the inorganic compounds or metals. The use of an insulating inorganic compound such as silicon oxide as superfine powder permits insulation of the entire functional member. As for the superfine powder, silicon oxide is preferred since it can readily be pulverized finely.

As for the substrate, organic resinous film having high gas barrier properties, for example, polyethylene terephthalate, polyamide, polypropylene, ethylene-vinyl alcohol copolymer, polyvinyl alcohol, etc., is preferred.

(1-7) Particles for Use in Organic Luminous Elements

When the particle-adsorbed material of the invention is used as organic luminous elements, it is appropriate to use particles as functional particles in which aggregated organic pigment molecules emit light by excitation by a hot carrier. The organic luminous element can be prepared by forming a layer comprising the aggregated particles of the organic pigment molecules on the surface of a substrate containing electrodes. The organic pigments used for that purpose include but are not limited to the followings, which may be optionally chosen in consideration of the application of the solid optical functional element.

The organic pigment includes blue-emitting oxazole pigments such as p-bis[2-(5-phenyloxazole)]benzene (POPOP); green-emitting coumalin pigments such as coumalin-2, coumalin 6, coumalin 7, coumalin 24, coumalin 30, coumalin 102, and coumalin 540; red-emitting rhodamine (red) pigments such as rhodamine 6G, rhodamine B, rhodamine 101, rhodamine 110, rhodamine 590, and rhodamine 640; and oxazine pigments which emit light of near infrared region and are suitable for optical functional element particularly adaptable to optical communications, for example, oxazine 1, oxazine 4, oxazine 9, and oxazine 118.

In addition, cyanine pigments such as phthalocyanine, cyanine iodide compounds, and the like are also included. When these pigments are chosen, it is preferred to choose those readily soluble in a polymer such as acrylic resin for that purpose. Such a pigment includes POPOP, coumalin 2, coumalin 6, coumalin 30, rhodamine 6G, rhodamine B, and rhodamine 101.

The particles may be prepared from organic molecules used in organic electro-luminescence (EL) films, for example, 8-hydroxyquinoline aluminum ($AlQ_3$), 1,4-bis(2, 2-diphenylvinyl)biphenyl, polyparaphenylene vinylene (PPV) derivative, distyryl arylene derivative, styrylbiphenyl derivative, phenanthroline derivative, and the like, or from media of the organic molecules to which an additive is added.

In the sections 1-1 to 1-7, the application of the particle-adsorbed material of the invention and the particles preferably used in such fields were exemplified for the purpose of illustration, which are not intended to limit the invention. In principle, the invention includes a variety of members having the functional surface based on the function of particles, which are prepared by producing a graft polymer having a polar group, e.g., ionic group, on at least one surface of the substrate, and selecting and properly combining particles physically adsorbed to the ionic group contained in the graft polymer.

(2) On the Physical Properties of the Particle Surface (the Charge Capable of Bonding Ionically to an Ionic Group)

The above-mentioned respective particles, if they per se have a charge, for example, as silica particles, can be adsorbed onto the substrate surface on which a counter-ionic group has been introduced, based on the selection of a compound which is able to form a surface having an ionic group as a polar group. For the purpose of adsorption to an ionic group, it is possible to prepare particles having a charge in high density on the surface, whereby the particles can be adsorbed to the ionic group on the substrate surface. The range of choice of the particles can be expanded by the latter method.

In view of the durability, it is preferred that these particles are adsorbed at the maximum possible amount onto the ionic group present on the substrate surface. Considering from the efficiency of expression of the function in the functional surface, the dispersion concentration of the dispersed solution is preferably about 10–20% by mass.

In order to provide a particle-adsorbed layer in the substrate having an ionic group on the surface by adsorbing the particles to the ionic group, the following methods are applicable: a method for coating a dispersed solution of particles having a charge on the surface onto the surface graft polymer, i.e., substrate surface having an ionic group; and a method for immersing a substrate having an ionic group on the surface into a dispersed solution of particles having a charge on the surface. In both of coating and immersion, an excess amount of the charged particles is supplied and thus a sufficient amount of ionic bonds are introduced between the ionic groups. Therefore, the contact time of the dispersed solution with a substrate having an ionic group on the surface is preferably approximately from 10 seconds to 180 minutes, more preferably 1 minute to 100 minutes.

5-2-2. Adsorption of Particles onto a Polar Group

In a specific embodiment of adsorption, for example, a graft polymer chain having an ionic polar group is introduced onto the surface of a substrate utilizing an ionic monomer such as ammonium having a positive charge as a polar group, and then, the substrate is immersed in a dispersed solution of silica particles for a certain time, and then excess of the dispersed solution is washed out with water to give a particle-adsorbed layer in which silica particles are adsorbed on the surface of the transparent substrate tightly in a state of monolayer to multi-layer responding to the existing density of the ionic group.

Thus, the particle-adsorbed layer having the desired function can be provided by introducing an ionic polar group into a substrate and making the particles absorb thereon. The thickness of the particle-adsorbed layer may be chosen according to the purpose, and is typically in the range of 0.001–10 μm, preferably 0.01–5 μm, more preferably 0.1–2 μm. When the thickness is less than 0.001 μm, resistance to flaws in some cases is decreased to spoil the desired functionality. When the thickness is over 10 μm, transparency to light is reduced and sometimes the transparency is spoiled when the transparency is required in the particle-adsorbed material.

In the particle-adsorbed material of the invention, for example, particularly functionalized particles typically exemplified by metal oxide particles such as silica are adsorbed electrostatically onto the ionic group introduced on a substrate in high density to give an evenly adsorbed layer, on which the surface layer is formed in a state that the particles are adsorbed in high flexibility on a graft polymer chain having an ionic group as monolayer or multi-layer, and thus the surface is obtained as a functional surface which is even in the film thickness and reflects as such the physical properties of the particles. For example, when the particles for making a surface-roughing member is used, it is possible to form a roughed-surface layer which has homogeneous and dense unevenness coincident with the shape of particles.

Moreover, when the surface-roughing member is used as an antireflection material, since a high antireflection effect is attained and a thin layer is formed, there is no anxiety that the transparency of the transparent substrate used is hindered. Therefore, they can be applied preferably to image displays of not only a reflection type but also a transparency type.

By properly choosing the functional particles, it is possible to prepare a particle-adsorbed layer which reflects the physical properties of the functional particles, on the surface of an optional substrate in a relatively simple operation. In addition, the resulting particle-adsorbed layer having an excellent functionality shows better homogeneity and durability, and therefore it can be applied to a variety of purposes as mentioned above.

Utility based on the selected particles will be further exemplified by the followings. The use of electrically conductive organic or inorganic particles affords an electronic or electric function on the functional surface. The use of magnetic particles such as ferrite particles permits a magnetic function. The use of optical particles which absorb or reflect or diffuse light of a certain wavelength permits an optical function. This means that a variety of functions can be expressed on functional surfaces and applied to a variety of industrial goods, medical drugs, catalysts, varistor (variable resistor), paints, cosmetics, and the like in various areas. In addition to a wide variety of functions possessed by various particulate constituting materials, it is possible to utilize easy workability of polymer materials as substrates. Thus, it is also expected to be developed a new type of materials.

Specific examples of the utility in various areas includes, for example, optical parts, sunglass; application to screen to light such as ultraviolet, visible and infrared rays, e.g., shielding film, shielding glass, shading window, shading vessels, shading plastic boxes, etc.; antimicrobial film, sterilizing filter, antimicrobial plastic molds, fishing nets; OA instruments or household electric goods, e.g., parts for televisions, parts for phones, parts for OA instruments, parts for vacuum cleaners, parts for electric fans, parts for air conditioners, parts for refrigerators, parts for washing machines, parts for humidifiers, parts for table ware driers, and the like; sanitary goods, e.g., toilet seat, parts for washing stands; and other building materials, car parts, daily goods, toys, and miscellaneous goods.

6. Metal Particle-Dispersed Thin Layer Films and a Method for Formation Thereof

The followings will illustrate a method for forming particle-dispersed films and the films formed thereby as the seventh aspect of the invention.

A metal particle-dispersed thin layer film of the invention comprises the steps of: providing a polymerization initiating layer on the surface of a support by immobilizing a polymer having, on a side chain thereof, a crosslinking group and a functional group having polymerization initiating capability, by a crosslinking reaction; contacting a polymerizable compound having a polar group with the polymerization initiating layer, and irradiating radiation thereto, so as to make the compound graft-polymerize to the surface of the polymerization initiating layer to provide a graft polymer layer, and adding a metal salt to the graft polymer layer; and reducing the metal salt.

The metal particle-dispersed thin layer film of the invention is characterized in that the film is prepared by providing a polymerization initiating layer on the surface of a support by immobilizing a polymer having, on a side chain thereof, a crosslinking group and a functional group having polymerization initiating capability, by a crosslinking reaction; then providing a graft polymer layer containing a metal salt on the surface of the polymerization initiating layer; and then reducing the metal salt.

The followings will illustrate the polymerization initiating layer and a process for formation thereof, the graft polymer layer containing a metal salt and a process for formation thereof (graft polymerization), and a process for reducing the metal salt (production of the metal particle-dispersed film) in the method for producing a metal particle-dispersed thin layer film and the metal particle-dispersed thin layer film.

6-1. Polymerization Initiating Layer and a Process for Formation Thereof

The polymerization initiating layer and a process for formation thereof in the method for producing a metal particle-dispersed thin layer film can be attained in the same manner as in that as described in details in the above-mentioned graft polymerization method.

In the specific polymerization initiating polymer applied to this embodiment, the mole percentage for copolymerization of the copolymer component (A) having a polymerization initiating group is preferably 5 mole % or more and that of the copolymer component (B) having a crosslinking group is preferably 10 mole % or more, more preferably 5–50 mole % for (A) and 30–70 mole % for (B), and even more preferably 10–20 mole % for (A) and 30–40 mole % for (B), in view of the graft polymerization and the film characteristic of polymerization initiating layer after crosslinking reaction.

6-2. Graft Polymer Layer Containing a Metal Salt and a Process for Formation Thereof (Graft Polymerization)

The followings will illustrate the graft polymer layer containing a metal salt provided on the surface of polymerization initiating layer.

According to the method for producing a metal-dispersed thin layer film of the invention, the graft polymer layer containing a metal salt may be provided by graft-polymerizing a graft-polymerizable compound having a polar group on the surface of polymerization initiating layer.

As for the polymerizable compound having a polar group used in this stage, any type of compounds can be employed as far as they can retain a metal salt in the graft polymer layer produced by graft polymerization. Specific examples of such compounds are: polymerizable compounds having a metal salt structure; polymerizable compounds having an acidic group capable of adsorbing a metal ion; polymerizable compounds having a functional group highly affinitive to a metal salt; and polymerizable compounds having a hydrophilic group. When a polymerizable compound having a metal salt structure is used in preparing the graft polymer layer, the step for producing the graft polymer layer may be carried out in one step combined with the step for adding a metal salt.

[Formation of Graft Polymer Layer]

The graft polymer layer containing a metal salt may be formed according to the following 4 specific methods.

(1) Method for graft-polymerizing a polymerizable compound having a metal salt structure onto the polymerization initiating layer.
(2) Method which comprises producing a graft polymer chain having an acidic group on the polymerization initiating layer, and then making a metal ion adsorb to the acidic group.

(3) Method which comprises producing a graft polymer chain having a high affinity for a metal salt of polyvinylpyrrolidone etc. on the polymerization initiating layer, and immersing the polymer chain into a solution in which a metal salt is dispersed or dissolved to incorporate the metal salt in the graft polymer layer.

(4) Method which comprises producing a hydrophilic graft polymer chain on the polymerization initiating layer, and immersing the polymer chain into a solution in which a metal salt is dispersed or dissolved to incorporate the metal salt in the graft polymer layer.

According to the embodiment of the item (4), even if the graft polymer has a positive charge, a desired metal salt could be incorporated into the graft polymer layer.

According to these methods, a graft polymer chain (hereinafter properly referred to as a functional graft polymer chain) which contains a functionally acting functional group such as functional group having a metal salt structure, hydrophilic group like acidic group, or functional group having an affinity to a metal, is produced on the polymerization initiating layer to give the graft polymer layer of the invention. In this connection, the polymerizable compound having a polar group used in the invention are hereinafter referred to as a polymerizable compound having a functionally acting functional group, as mentioned below.

Such a graft polymer is generally produced by means of a so-called surface graft polymerization.

(Surface Graft Polymerization)

The graft polymerization means a method for synthesizing a graft polymer by giving an active species onto the chain of a polymer compound and polymerizing thereto another monomer for initiating polymerization. Particularly, the formation of the solid surface with a polymer compound giving an active species is called surface graft polymerization. In the invention, a polymer compound to which an active species is given is the specific polymerization initiating polymer.

The graft polymer of the invention also includes that prepared by bonding a desired polymer to an active species on the chain of a polymer compound.

As for the method of surface active polymerization by which the invention is achieved, any of the publicly known methods as described in literatures can be applied. For example, a method of photo-graft polymerization and a method of graft polymerization by plasma irradiation have been described in Shin Kobunshi Jikken-gaku (New Polymer Experimentation) 10, Society of Polymer Science, Japan, 1994, p.135, Kyoritsu Shuppan Co., Ltd. In Handbook of Adsorption Technology, NTS Co., Ltd., Edited by Takeuchi, 1999, 2nd Ed., p.203 and p.695, a method of graft polymerization by irradiation of γ-ray or electron ray has been described. As for a specific method of photograft polymerization, those as described in JP-A Nos. 63-92658, 10-296895, 11-119413, and 2000-80189 can be used. As for the methods of graft polymerization by plasma irradiation or by irradiation of radiation, those as described in the above-mentioned documents and in Y. Ikeda et al., Macromolecules vol.19, page 1804 (1986) can be applied.

Specifically, the surface of the polymerization initiating layer is treated with UV light, plasma, or electron ray to generate radical, and the activated surface is then allowed to react with a compound having a polymerizable functional group and containing a desired functionally active functional group to give a graft polymer in which the compound is directly attached to the polymerization initiating layer.

(Supply of Energy for Producing an Active Species on the Polymerization Initiating Layer)

There is no particular limitation in a method for supplying energy to a polymerization initiating layer, i.e., a specific polymerization initiating polymer constituting the polymerization initiating layer to produce an active species. As far as the polymerization initiating group contained in a polymerization initiating layer is activated and the resulting active species can be polymerized by graft polymerization to a compound having a polymerizable double bond, any kind of methods for supplying energy can be applied. In view of cost and convenience of apparatus, for example, it is appropriate to use a way of irradiation of active light.

As for the active light used in energy supply, ultraviolet, visible light, and infrared are included. Among them, ultraviolet and visible light are preferred, and ultraviolet is particularly preferred in view of a superior polymerization rate. The major wavelength of the active light is preferably in the range of 250 nm to 800 nm.

As a light source, for example, a low pressure mercury lamp, high pressure mercury lamp, fluorescent lamp, xenon lamp, carbon arc lamp, tungsten incandescent lamp, sunlight, and the like are exemplified.

The time required for irradiation of the active light varies depending on the condition such as the light source to be used, and is usually several seconds to 24 hours.

The characteristics of the graft polymer layer of the invention is that the terminal of the functional graft polymer chain is bonded to the surface of the polymerization initiating layer and that the functional graft polymer chain portion which expresses the particular physical properties such as hydrophilicity and affinity to metals has an essentially non-crosslinked structure. Thus, the graft polymer layer having such a structure is characterized in that the polymer portion expressing an affinity to metals or metal ions can freely move without being restricted in its mobility and buried in the firm crosslinked structure. In comparison with other polymers having ordinary crosslinking structure, accordingly, the polymer layer of the invention is considered to have high affinity to metal salts.

The molecular weight of the functional graft polymer chain is in the range of Mw 500–5,000,000, preferably Mw 1,000–1,000,000, more preferably Mw 2,000–500,000.

(Polymerizable Compounds having a Functionally Acting Functional Group Useful in the Surface Graft Polymerization)

The polymerizable compounds having a functionally acting functional group useful in the surface graft polymerization is required to have a polymerizable double bond and a functional group showing the above-mentioned respective functions. Such a compound may be a functional polymer, functional oligomer, functional macromer, or functional monomer, as far as it has a polymerizable double bond in the molecule. In this situation, when a functional polymer is used in the surface graft polymerization, it is not always necessary to achieve chain polymerization reaction in the graft polymerization on the surface of polymerization initiating layer, but it is sufficient to induce the reaction of a small quantity of the polymerizing group. Particularly preferred compound having a functionally acting functional group used in the surface graft polymerization includes functional monomers and functional macromers.

Among the functional monomers useful in the invention, the hydrophilic monomer includes those having a positive charge, e.g., ammonium, phosphonium, and those having a negative charge or having an acidic group capable of dissociating into a negative charge, e.g., sulfonate, carboxyl, phosphate, phosphonate. These monomers may optionally be chosen depending on the metal salt used in combination. In addition, as hydrophilic monomers those having a non-ionic group such as hydroxyl, amido, sulfonamido, alkoxy or cyano may be used.

Particularly useful hydrophilic monomers used in the invention are specifically exemplified by the following monomers. For example, (meth)acrylic acid or alkali metal salts or amine salts thereof, itaconic acid or alkali metal salts or amine salts thereof, allylamine or hydrohalic acid salts thereof, 3-vinylpropionic acid or alkali metal salts or amine salts thereof, vinylsulfonic acid or alkali metal salts or amine salts thereof, styrenesulfonic acid or alkali metal salts or amine salts thereof, 2-sulfoethylene (meth)acrylate, 3-sulfopropylene (meth)acrylate or alkali metal salts or amine salts thereof, 2-acrylamido-2-methylpropanesulfonic acid or alkali metal salts or amine salts thereof, acid phosphooxypolyoxyethylene glycol mono(meth)acrylate or salts thereof, 2-dimethylaminoethyl (meth)acrylate or hydrohalic acid salts thereof, 3-trimethylammonium propyl(meth)acrylate, 3-trimethylammonium propyl(meth)acrylamido, N, N, N-trimethyl-N-(2-hydroxy-3-methacryloyloxypropyl)ammonium chloride, and the like may be used. In addition, 2-hydroxyethyl (meth)acrylate, (meth)acrylamide, N-monomethylol (meth) acrylamide, N-dimethylol (meth) acrylamide, N-vinylpyrrolidone, N-vinylacetamide, and polyoxyethylene glycol mono(meth)acrylate are also useful.

Among the useful functional monomers of the invention, the above-mentioned metal salts of hydrophilic monomers, preferably the silver salt of(meth)acrylic acid or styrenesulfonic acid, are exemplified as the monomers having a metal salt structure. Specifically, silver acrylate, silver methacrylate, silver styrenesulfonate, etc. are exemplified.

In addition, among the useful functional monomers of the invention, the monomers having a high affinity to metal salts include polyvinylpyrrolidone, sodium polystyrenesulfonate, polyvinylpyridine, polyvinylaniline, and the like.

Among the useful functional macromers of the invention, the particularly useful hydrophilic macromer includes: macromers derived from carboxyl-containing monomers such as acrylic acid or methacrylic acid; sulfonic acid macromers derived from monomer of 2-acrylamido-2-methylpropanesulfonic acid, styrenesulfonic acid and salts thereof; amide-type macromers such as acrylamide or methacrylamide; amide-type macromers derived from N-vinylcarboxylic acid amide monomers such as N-vinylacetamide or N-vinylformamide; macromers derived from hydroxyl-containing monomers such as hydroxyethyl methacrylate, hydroxyethyl acrylate or glycerol monomethacrylate; and macromers derived from alkoxy-or ethylene oxide-containing monomers such as methoxyethyl acrylate, methoxypolyethylene glycol acrylate or polyethylene glycol acrylate. In addition, monomers having a polyethylene glycol chain or polypropylene glycol chain may also be used as macromers of the invention.

Among the useful functional macromers of the invention, the useful macromer having a metal salt structure includes, for example, those derived from silver (meth)acrylate or silver syrenesulfonate.

In addition, among the useful functional macromers of the invention, the useful macromer having an affinity to metal salts includes those derived from polyvinylpyrrolidone or sodium polystyrenesulfonate.

The preferred molecular weight of these macromers is in the range of 400 to 100,000, more preferably in the range of 1,000 to 50,000, particularly in the range of 1,500 to 20,000. When the molecular weight is 400 or less, the effect is insufficient in some cases, and when it is over 100,000, the polymerization effect becomes poor in some cases.

Specifically, these macromers may be synthesized from the functional monomers as described above specifically as hydrophilic monomers, such as acrylic acid, acrylamide, 2-acrylamido-2-methylpropanesulfonic acid, N-vinylacetamide, and the like, according to the method as described in documents.

Thus, it is possible to provide the graft polymer layer having a functional graft polymer chain on the surface of polymerization initiating layer. The thickness of the graft polymer layer may be chosen according to the purpose, and is typically in the range of 0.001 μm–10 μm, preferably 0.01 μm–5 μm, more preferably 0.1 μm–2 μm. When the layer is too thin, resistance to flaws is inclined to decrease. When the layer is too thick, improvement of adhesion is inclined to decrease.

In the invention, except the method described in the above item (1), incorporation of a metal salt into the graft polymer layer may be carried out by dispersing or dissolving a metal salt individually in a suitable solvent and coating the solution containing the dispersed metal salt or dissociated metal ion on the surface of graft polymer layer, or by immersing a substrate having the graft polymer layer into the solution.

Thus, the metal ion is ionically adsorbed on the hydrophilic group or acidic group of the functional graft polymer chain by contact with a solution containing the metal ion. Alternatively, a solution in which a metal salt is dispersed or dissolved is made contact with the graft polymer layer which has a functional graft polymer chain highly affinitive to the metal salt or a hydrophilic functional graft polymer chain, whereby the metal salt or metal ion is adsorbed and immobilized in the graft polymer layer together with the solution. That is, in the graft polymer layer containing a hydrophilic functional graft polymer chain, the metal ion is adsorbed ionically on the hydrophilic group in some cases, and in another case the metal salt or metal ion is absorbed in the layer together with the solution.

In order to sufficiently adsorb the metal ion or metal salt, the concentration of the metal ion or metal salt is made in the range of 1–50% by mass, preferably 10–30% by mass. The time for contact is preferably about 1 to 12 hours.

6-4. Process for Reduction of the Metal Salts (Preparation of Metal Particle-Dispersed Film)

In the resulting graft polymer layers, (1) those having a functional graft polymer chain having a metal salt structure are successively subjected to reduction to give metal particle-dispersed thin layer films. On the other hand, (2) in the graft polymer layers having a functional graft polymer chain having an acidic group, adsorption of a metal ion onto the acidic group and the subsequent reduction afford metal particle-dispersed thin layer films. Moreover, (3) in the layers having a highly functional graft polymer chain, and (4) in the layers having a hydrophilic functional graft polymer chain, (even if they have a positive charge), a solution in which a metal salt is dispersed or dissolved is incorporated and adsorbed into the graft polymer layer, followed by reduction to give metal particle-dispersed thin layer films.

[Metal Salts]

There is no particular limitation in metal salts used in the invention as far as they are dissociated into metal ions and bases (anions) when dissolved in a proper solvent, including M(NO$_3$)$_n$, MCl$_n$, M$_{2/n}$(SO$_4$), and M$_{3/n}$(PO$_4$) (wherein M is an n-valent optional metal atom suitable for the utility as mentioned below).

Specific examples of the metals represented by M in the metal salts used in the invention, when they are used in order to give magnetic properties to the metal particle-dispersed thin layer films of the invention, include Co, Ni, Fe, and the like. They may be used as a major component in alloys. Particularly, Co and Ni are preferred since they are superior in magnetic properties.

When the metal particle-dispersed thin layer film is used in an optical switch, the metal atom represented by M includes Au, Ag, Cu, Pd, and the like. In particular, Au and Ag are preferred since they have a high tertiary non-linear effect.

[Reducing Agents]

As for the reducing agents used in the invention for reducing the metal salt or metal ion contained in the graft polymer layer to give a metal particle-dispersed thin layer film, there is no particular limitation as far as they can reduce the metal salt (compound) used to deposit the metal. For example, hypophosphite, tetrahydroborate, hydrazine, or formalin may be used in an aqueous solution.

These reducing agents may properly be selected with relation to the metal salt or metal ion employed. For example, when an aqueous solution of silver nitrate is used as a metal salt aqueous solution to supply a metal ion or metal salt, sodium tetrahydroborate is preferably used.

The reducing agent may be added as follows: for example, a metal ion or metal salt is adsorbed on the graft polymer layer, which is then washed with water to remove excess of metal salt or ion and then immersed as a substrate in water like ion-exchange water, to which is then added a reducing agent; or an aqueous solution of reducing agent at a predetermined concentration is coated or dropped directly on the graft polymer layer. The reducing agent may be used in an amount equivalent or excess to the metal ion, preferably in 10 equivalent or more.

In addition to the water-soluble reducing agents, it is also possible to use a compound showing a reducing action by heating. As the compound showing a reducing action by heating, a thermally decomposing radical generating agent such as azobisbutyronitrile (AIBN) may be used. Alternatively, a thermally base-generating agent like guanidine sulfonate and a reducing agent like hydroquinone are heated to release a basic compound, which activates the reducing agent to achieve the reduction.

The structure of the metal particle-dispersed thin layer films (the metal particle-dispersed thin layer film of the invention) produced by the method for producing a metal particle-dispersed thin layer film of the invention can be confirmed by observation of the surface with a transmission electron microscope or an AFM (atomic force microscope). The thickness of the metal particle-dispersed thin layer film in which metal particles are dispersed in the graft polymer layer can easily be confirmed in a conventional manner, for example, by observation of the cross-section by an electron microscope.

The metal particle-dispersed thin layer film of the invention can be formed on the surface of an optional support in high density as a metal-containing layer in a simple manner, and is superb in strength (adhesion) and durability. The metal particle-dispersed thin layer film of the invention is very thin and expected to be employed in a wide variety of uses such as high-dense magnetic disc, magnetic head, magnetic tape, magnetic sheet, magnetic disc, and so on.

EXAMPLES

The present invention will be explained in detail according to the following examples, but is not inteded to be limited thereto.

1. Examples of Graft Polymerization

Example 1

(Synthesis of Specific Polymerization Initiating Polymer)

30 g of propylene glycol monomethyl ether (MFG) was placed in a 300 ml three-necked flask and heated to 75° C. A solution of 8.1 g of [2-(acryloyloxy)ethyl](4-benzoylbenzyl)dimethyl ammonium bromide, 9.9 g of 2-hydroxyethyl methacrylate, 13.5 g of isopropyl methacrylate, and 0.43 g of dimethyl-2,2'-azobis(2-methylpropionate) was dropwise added to 30 g of MFG over 2.5 hours. Thereafter, the reaction temperature was raised to 80° C., and the reaction continued for 2 hours to provide the specific polymerization initiating polymer A as shown below.

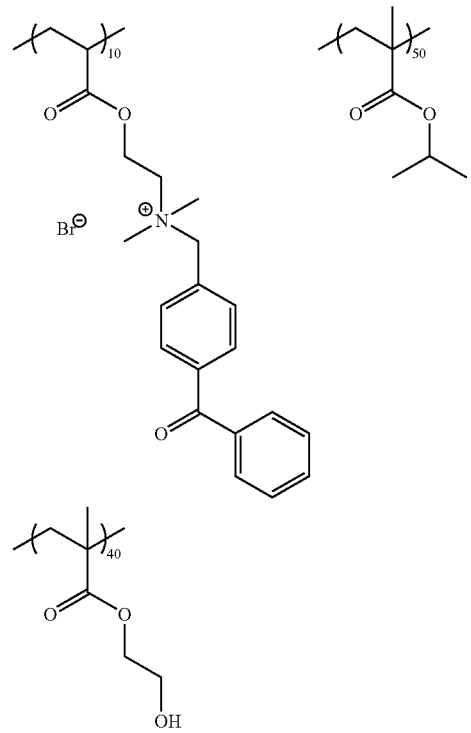

(Step of Forming a Polymerization Initiating Layer)

A polyethylene terephthalate film (Product Name: M4100, Toyobo Co., Ltd.) of 0.188 mm in thickness was used as a support, to which a coating solution 1 for a polymerization initiating layer as described below was applied on the surface with a rod bar no. 18, and dried and crosslinked at 110° C. for 10 minutes. The resulting polymerization initiating layer was of 9.3 μm in thickness.

<Coating Solution 1 for a Polymerization Initiating Layer>

| | |
|---|---|
| Specific polymerization initiating polymer A | 0.4 g |
| TDI (tolylene-2,4-diisocyante) | 0.16 g |
| Propylene glycol monomethyl ether (MFG) | 1.6 g |

(Step of Graft Formation)

The support on which the polymerization initiating layer was formed was immersed in an ethylethoxy acrylate solution (10 wt %) and irradiated with a 400W high-pressure mercury lamp under an argon atmosphere for 30 minutes. Thereafter, the support was washed well with MFG to provide the support of Example 1 on which ethylethoxy acrylate was graft-polymerized.

Example 2

(Step of Forming a Polymerization Initiating Layer)

A polyethylene terephthalate film (Product Name: M4100, Toyobo Co., Ltd.) of 0.188 mm in thickness was used as a support, to which a coating solution 2 for a polymerization initiating layer as described below was applied on the surface with a rod bar no. 18, and dried and crosslinked at 110° C. for 10 minutes. The resulting polymerization initiating layer was of 9.3 μm in thickness.

<Coating Solution 2 for a Polymerization Initiating Layer>

| Specific polymerization initiating polymer A | 0.4 g |
|---|---|
| TDI (tolylene-2,4-diisocyante) | 0.16 g |
| Methyl ethyl ketone (MEK) | 1.6 g |

(Step of Graft Formation)

The support on which the polymerization initiating layer was formed was immersed in an ethylethoxy acrylate solution (30 wt %; Solvent: MFG) and irradiated with a 1.5 kW high-pressure mercury lamp under an argon atmosphere for 5 minutes. Thereafter, the support was washed well with MFG to provide the support of Example 2 on which ethylethoxy acrylate was graft-polymerized.

Example 3

A support prepared in the same manner as in Example 2, on which a polymerization initiating layer was formed, was immersed in an acrylic acid aqueous solution (30 wt %) and irradiated with a 1.5 kW high-pressure mercury lamp under an argon atmosphere for 5 minutes. Thereafter, the support was washed well with water to provide the support of Example 3 on which acrylic acid was graft-polymerized.

Example 4

(Synthesis of Specific Polymerization Initiating Polymer B)

30 g of propylene glycol monomethyl ether (MFG) was placed in a 300 ml three-necked flask and heated to 75° C. A solution of 5.1 g of 4-methacryloyloxybenzophenone, 9.9 g of 2-hydroxyethyl methacrylate, 9.8 g of isopropyl methacrylate, 3.97 g of [2-(methacryloyloxy)ethyl] trimethylammonium chloride, and 0.43 g of dimethyl-2,2'-azobis(2-methylpropionate) was dropwise added to 30 g of propylene glycol monomethyl ether (MFG) over 2.5 hours. Thereafter, the reaction temperature was raised to 80° C., and the reaction continued for 2 hours to provide the specific polymerization initiating polymer B as shown below.

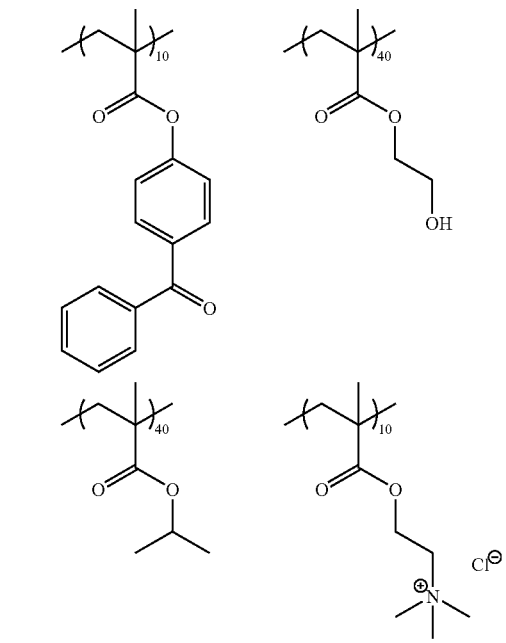

(Step of Forming a Polymerization Initiating Layer)

A polyethylene terephthalate film (Product Name: M4100, Toyobo Co., Ltd.) of 0.188 mm in thickness was used as a support, to which a coating solution 3 for a polymerization initiating layer as described below was applied on the surface with a rod bar no. 18, and dried and crosslinked at 110° C. for 10 minutes. The resulting polymerization initiating layer was of 9.0 μm in thickness.

<Coating Solution 3 for a Polymerization Initiating Layer>

| Specific polymerization initiating polymer B | 0.4 g |
|---|---|
| TDI (tolylene-2,4-diisocyante) | 0.16 g |
| Methyl ethyl ketone | 1.6 g |

(Step of Graft Formation)

In the same manner as in Example 2, the support of Example 4 on which ethylethoxy acrylate was graft-polymerized was obtained.

Example 5

(Synthesis of Specific Polymerization Initiating Polymer C)

30 g of propylene glycol monomethyl ether (MFG) was placed in a 300 ml three-necked flask and heated to 75° C. A solution of 8.1 g of [2-(acryloyloxy)ethyl] (4-benzoylbenzyl)dimethylammonium bromide, 9.9 g of 2-aminoethyl methacrylate, 13.5 g of isopropyl methacrylate, and 0.43 g of dimethyl-2,2'-azobis(2-methylpropionate) was droppwise added to 30 g of propylene glycol monomethyl ether (MFG) over 2.5 hours. Thereafter, the reaction temperature was raised to 80° C., and the reaction continued for 2 hours and then further continued for 2 hours to provide the specific polymerization initiating polymer C as shown below.

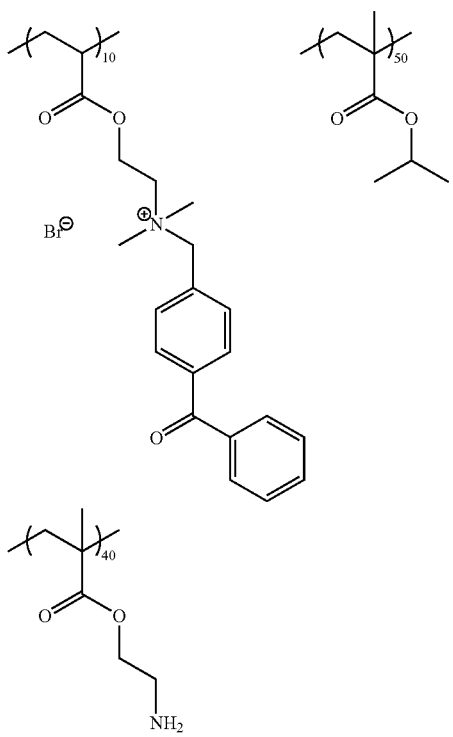

(Step of Forming a Polymerization Initiating Layer)

A polyethylene terephthalate film (Product Name: M4100, Toyobo Co., Ltd.) of 0.188 mm in thickness was used as a support, to which a coating solution 3 for a polymerization initiating layer as described below was applied on the surface with a rod bar no. 18, and dried and crosslinked at 110° C. for 10 minutes. The resulting polymerization initiating layer was of 9.1 μm in thickness.

<Coating Solution 4 for a Polymerization Initiating Layer>

| Specific polymerization initiating polymer C | 0.4 g |
| TDI (tolylene-2,4-diisocyante) | 0.16 g |
| Methyl ethyl ketone | 1.6 g |

(Step of Graft Formation)

In the same manner as in Example 2, the support of Example 5 on which ethylethoxy acrylate was graft-polymerized was obtained.

Comparative Example 1

(Step of Forming a Polymerization Initiating Layer)

A polyethylene terephthalate film (Product Name: M4100, Toyobo Co., Ltd.) of 0.188 mm in thickness was used as a support, to which a photo-polymerizing composition 1 as described below was applied on the surface with a rod bar no. 18, and dried at 80° C. for 2 minutes. The support on which the photo-polymerizing composition 1 was coated was irradiated with a 400 W high pressure mercury lamp (UVL-400P, Riko Kagaku Sangyo Co.) for 10 minutes for preliminary curing. The resulting polymerization initiating layer comprising the photo-polymerizing composition was of 6.2 μm in thickness.

(Photo-Polymerizing Composition 1)

| Allyl metacrylate/methacrylic acid copolymer (Molar ratio: 80/20; MW: 100,000) | 4 g |
| Ethylene oxide denatured bisphenol A diacrylate (Toagosei Co., Ltd.; M210) | 4 g |
| 1-Hydroxycyclohexyl phenyl ketone | 1.6 g |
| 1-Methoxy-2-propanol | 16 g |

(Step of Graft Formation)

The support on which the polymerization initiating layer was formed was immersed in an ethylethoxy acrylate solution (10 wt %) and irradiated with a 400W high-pressure mercury lamp under an argon atmosphere for 30 minutes. Thereafter, the support was washed well with MFG to provide the support of Comparative Example 1 on which ethylethoxy acrylate was graft-polymerized.

Comparative Example 2

A support prepared in the same manner as in Comparative Example 1, on which the polymerization initiating layer was formed, was immersed in an ethylethoxy acrylate solution (30 wt %; solvent: MFG) and irradiated with a 1.5 kW high-pressure mercury lamp under argon atmosphere for 30 minutes. Thereafter, the support was washed well with MFG to provide the support of Comparative Example 2 on which ethylethoxy acrylate was graft-polymerized.

Comparative Example 3

(Step of Forming a Polymerization Initiating Layer)

A polyethylene terephthalate film (Product Name: M4100, Toyobo Co., Ltd.) of 0.188 mm in thickness was used as a support, to which a photo-polymerizing composition 2 as described below was applied on the surface with a rod bar no. 18, and dried and crosslinked at 110° C. for 10 minutes. The resulting polymerization initiating layer comprising the photo-polymerizing composition 2 was of 9.1 μm in thickness.

<Photo-Polymerizing Composition 2>

| Ethylene oxide denatured bisphenol A diacrylate (Trade name: New Frontier BPE-4, Daiichi Kogyo Seiyaku Co., Ltd.) | 4 g |
| Urethane acrylate (Trade name: Unidic V-4263, Dainippon Ink & Chemicals, Inc.) | 6 g |
| 1-Hydroxycyclohexyl phenyl ketone | 0.2 g |

(Step of Graft Formation)

In the same manner as in Example 2, the support of Comparative Example 3 on which ethylethoxy acrylate was graft-polymerized was obtained.

Comparative Example 4

The support of Comparative Example 4 was prepared in the same manner as in Example 2, except in that TDI (tolylene-2,4-diisocyante) was not used in the coating solution 2 for a polymerization initiating layer of Example 2.

Comparative Example 5

A support was prepared in the same manner as in Comparative Example 1, then acrylic acid was graft-polymerized thereto in the same manner as in Example 3, wherby the support of Comparative Example 5 was obtained.

Evaluation of Examples 1 to 5 and Comparative Examples 1 to 4

The supports prepared accroding to Examples 1, 2, 4 and 5 and Comparative Examples 1, 2, 3, 4 and 5 were immersed in an MFG solvent overnight, and supports prepared according to Example 3 and Comparative Example 5 were immersed in water overnight. Thereafter, the surfaces on which a graft structure was formed was washed while being rubbed. As a result, it was found that there was no weight change in the supports of Examples 1, 2, 3, 4 and 5 (the supports prepared by the graft polymerization of the invention) from before to after the immersion. On the other hand, the weight loss was observed in the supports of Comparative Examples 1, 2, 3, 4 and 5 after the immersion.

Thus, it was found that in the supports of Examples 1, 2, 4 and 5, all of the graft chains (macromolecular chains) comprising ethylethoxy acrylate were bonded directly to the polymerization initiating layer and no dissolution of the polymerization initiating layer occurred. Further, it was also found that in the supports of Example 3 all of the graft chains (macromolecular chains) comprising acrylic acid were bonded directly to the polymerization initiating layer and no dissolution of the polymerization initiating layer occurred As described above, according to the graft polymerization of the invention, it is possible to prevent dissolution of the polymerization initiator contained in the initiating layer into the monomer solution and provide the graft structure in which all of the macromolecular chains are chemically bonded directly to the polymerization initiating layer.

2. Examples of Hydrophilic Members

Example 6

(Synthesis of Specific Polymerization Initiating Polymer)

The specific polymerization initiating polymer A used in this Example was prepared in the same manner as in Example 1.

(Formation of a Polymerization Initiating Layer)

A polyethylene terephthalate film (Product Name: M4100, Toyobo Co., Ltd.) of 0.188 mm in thickness was used as a substrate, to which a coating solution for a polymerization initiating layer as described below was applied on the surface with a rod bar no. 18, and dried and crosslinked at 110° C. for 10 minutes. The resulting polymerization initiating layer was of 9.3 μm in thickness.

<Coating Solution for a Polymerization Initiating Layer>

| | |
|---|---|
| Specific polymerization initiating polymer A | 0.4 g |
| TDI (tolylene-2,4-diisocyante) | 0.16 g |
| Propylene glycol monomethyl ether (MFG) | 1.6 g |

(Synthesis of Hydrophilic Polymer having a Polymerizing Group)

To a solution of 18 g of polyacrylic acid (average molecular weight: 25,000) dissolved in 300 g of DMAC were added 0.41 g of hydroquinone, 19.4 g of 2-methacryloyloxyethyl isocyanate and 0.25 g of dibutyltin dilaurate, and the mixture was allowed to react at 65° C. for 4 hours. The acid value of the resulting polymer was 7.02 meq/g. The carboxyl group was neutralized with 1N sodium hydroxide aqueous solution, and the mixture was added to ethyl acetate to precipitate the polymer, which was washed well to provide 18.4 g of hydrophilic polymer (P-1) having a polymerizing group on the side chain.

(Formation of the Upper Layer)

On the substrate on which the polymerization initiating layer was formed, a coating solution for a upper layer composition 1 was applied with a rod bar no.6 and then dried at 80° C. for 2 minutes. The surface coated with the composition 1 was homogeneous.

On the substrate surface on which the polymerization initiating layer and the upper layer were formed was supplied energy as follows to prepare the hydrophilic member.

Energy was supplied and irradiated with a 400W high-pressure mercury lamp (UVL-400P, Riko Kagaku Sangyo Co.) in argon atmosphere for 80 minutes. After completion of the irradiation, the resulting film was washed well with ion-exchange water to provide a hydrophilic member 1 which had hydrophilic graft chains of hyper branch structure.

(Coating Solution for a Upper Layer Composition 1)

| | |
|---|---|
| Hydrophilic polymer (P-1) having a polymerizing group on the side chain | 2 g |
| Water | 18 g |

The surface of the resulting hydrophilic member 1 was better in smoothness in visual observation. The hydrophilicity of the surface was measured with a CA-Z (Kyowa Interface Science Co., Ltd.), which indicated that the contact angle (contact angle of water drops in the air) was 15.0°, confirming that the surface was superb in hydrophilicity.

In addition, the hydrophilic member 1 was immersed in water for 1 month, after which the surface on which a graft structure was formed was washed with a rub. As a result, it was confirmed that there was no weight change at all before and after immersion.

Example 7

The hydrophilic member 2 was prepared in the same manner as in Example 2, except in that the coating solution of the upper layer composition 1 used in Example 6 was replaced by a coating solution for a upper layer composition 2 as shown below.

(Synthesis of an Amide Macromonomer having a Terminal Polymerizing Group)

A solution of 30 g of acrylamide and 3.8 g of 3-mercaptopropionic acid dissolved in 70 g of ethanol was heated up to 60° C. under nitrogen atmosphere, to which was then added 300 mg of AIBN (2,2-azobisisobutylnitrile), and the mixture was allowed to react for 6 hours. After the reaction completion, the white precipitate was collected by filtration and washed well with methanol to provide 30.8 g of a terminal-carboxylic acid prepolymer (acid value: 0.787 meq/g; molecular weight $1.29 \times 10^3$).

The prepolymer (20 g) was dissolved in 62 g of dimethylsulfoxide, to which was added 6.71 g of glycidyl methacrylate, 504 mg of N,N-dimethyldodecylamine (catalyst), and 62.4 mg of hydroquinone (polymerization inhibitor), and the mixture was allowed to react at 140° C. for 7 hours in nitrogen atmosphere. The reaction mixture was added to acetone to provide a polymer as precipitate, which was washed well to provide 23.4 g of a terminal methacrylate macromonomer (P-2)(molecular weight $1.43 \times 10^3$).

(Coating Solution for a Upper Layer Composition 2)

| | |
|---|---|
| Acrylamide macromonomer (P-2) | 2 g |
| Water | 18 g |

The surface of the resulting hydrophilic member 2 was better in smoothness in visual observation. The hydrophilicity of the surface was measured with a CA-Z (Kyowa Interface Science Co., Ltd.), which indicated that the contact angle (contanct angle of water drops in the air) was 18.0°, confirming that the surface was superb in hydrophilicity.

In addition, the hydrophilic member 2 was immersed in water for 1 month, after which the surface on which a graft structure was formed was washed with a rub. As a result, it was confirmed that there was no weight change at all before and after immersion.

Example 8

The substrate on which the polymerization initiating layer used in Example 6 was formed was immersed in a solution of Na acrylate (10 wt %; solvent: water), and irradiated with a 400 W high-pressure mercury lamp under argon atmosphere for 30 minutes. Thereafter, the resulting substrate was washed well with ion exchange water to provide a hydrophilic member 3 on which acrylic acid was graft-polymerized.

The surface of the resulting hydrophilic member 3 was better in smoothness in visual observation. The hydrophilicity of the surface was measured with a CA-Z (Kyowa Interface Science Co., Ltd.), which indicated that the contact angle (contact angle of water drops in the air) was 10.0°, confirming that the surface was superb in hydrophilicity.

In addition, the hydrophilic member 3 was immersed in water for 1 month, after which the surface on which a graft structure was formed was washed with a rub. As a result, it was confirmed that there was no weight change at all before and after immersion.

Thus, it became apparent that, in the hydrophilic members of Examples 6 to 8, (hydrophilic members of the invention) the hydrophilic compound attached thereon was not removed by immersion in water over a long period of time. Therefore, it can be assumed that in these hydrophilic members all of the graft polymer chains comprising the hydrophilic cookmpounds (macromolecular chains) are bonded directly to the polymerization initiating layer, so that they have high hydrophilicity with high durability of the hydrophilicity.

As described above, according to the second aspect of the invention, it is possible to provide the hydrophilic members which have high hydrophilicity with high durability of the hydrophilicity by preventing dissolution of the polymerization initiator component contained in the initiating layer into the monomer solution and by making all of the hydrophilic compounds chemically bonded directly to the polymerization initiating layer.

3. Examples of Printing Plate Precursor

Example 9

[Preparation of a Support having a Hydrophilic Surface]

(Synthesis of the Specific Polymerization Initiating Polymer)

In the same manner as in Example 1, the specific polymerization initiating polymer A used in this Example was prepared.

(Formation of a Polymerization Initiating Layer)

A polyethylene terephthalate film (Product Name: M4100, Toyobo Co., Ltd.) of 0.188 mm in thickness was used as a substrate, to which a coating solution for a polymerization initiating layer as described below was applied on the surface with a rod bar no.18, and dried and crosslinked at 110° C. for 10 minutes. The resulting polymerization initiating layer was of 9.3 µm in thickness.

<Coating Solution for a Polymerization Initiating Layer>

| | |
|---|---|
| Specific polymerization initiating polymer A | 0.4 g |
| TDI (tolylene-2,4-diisocyante) | 0.16 g |
| Propylene glycol monomethyl ether (MFG) | 1.6 g |

(Formation of the Hydrophilic Surface)

The substrate on which the polymerization initiating layer was formed was immersed in a solution of Na acrylate (10 wt %; solvent: water), and irradiated with a 400 W high-pressure mercury lamp under argon atmosphere for 30 minutes. Thereafter, the resulting substrate was washed well with ion exchange water to provide a hydrophilic surface on which acrylic acid was graft-polymerized. As a result, a PET film support having a hydrophilic surface according to Example 1 was obtained.

[Formation of a Positive Image-Forming Layer]

To the resulting support was applied a coating solution for a positive image-forming layer as described below at the rate of 1.0 g/m². This was then dried in a PERFECT OVEN PH200 (TABAI Co.) at the Wind Control of 7 at 140° C. for 50 seconds to provide a positive image-forming layer. Thus, a positive planographic printing plate precursor (planographic printing plate precursor 1) of Example 9 was prepared.

(Coating Solution for a Positive Image-Forming Layer)

| | |
|---|---|
| Ester compound of naphthoquinone-1,2-diazido-4-sulfonyl chloride and pyrogallol acetone resin | 0.9 g |
| Victoria pure blue BOH | 0.05 g |
| Novolac resin derived from cresol and formaldehyde (meta/para ratio = 6:4:weight-average mol.wt. 1800) | 2.0 g |
| Methyl ethyl ketone | 20 g |
| Methyl alcohol | 7 g |

Evaluation of the Planographic Printing Plate Precursor of Example 9

The positive planographic printing plate precursor prepared in Example 9 was subjected to exposure, development and printing as described below, and the resulting printed matter was evaluated on scumming.

The positive planographic printing plate precursor prepared in Example 9 was passed through a step guide made by Fuji Photo Film Co., Ltd., then exposed with a PS light, and then passed through an automatic developer to treat with a developing solution DP-4 (1:8)(Fuji Photo Film Co., Ltd.). Then, this was printed with a Heidel KOR-D press.

As a result, printing with the positive planographic printing plate prepared according to Example 9 gave the printed matters less in scumming and having high image quality. Thereafter, the printing was continued successively on the planographic printing plate precursor of Example 5, and it was found that better printed matters having no scumming in the non-image area were obtained even after the printing of 10,000 sheets and excellent hydrophilicity was maintained with high press life.

Example 10

The support having a hydrophilic surface used in Example 9 was used. To this support was applied a coating solution for a negative image-forming layer as described below at the rate of 1.0 g/m$^2$. This was then dried in a PERFECT OVEN PH200 (TABAI Co.) at the Wind Control of 7 at 140° C. for 50 seconds to provide a negative image-forming layer. Thus, a negative planographic printing plate precursor (planographic printing plate precirsor 2 g) of Example 10 was prepared.

(Coating Solution for a Negative Image-Forming Layer)

| | |
|---|---|
| IRG22 (IR dye; Nippon Kayaku Co., Ltd.) | 0.1 g |
| Crosslinking agent A as shown below | 0.21 g |
| Phenol-formaldehyde novolac (Weight-average mol. wt. 12000) | 2.1 g |
| Diphenyl iodonium-9,10-dimethoxyanthracene sulfonate | 0.02 g |
| Megaface F-176 (Dainippon Ink & Chemicals, Inc.) (Fluorine-type surfactant) | 0.06 g |
| Methyl ethyl ketone | 15 g |
| 2-Methoxy-1-propanol | 12 g |

(Synthesis of the Crosslinking Agent A)

1-[α-methyl-α-(4-hydroxyphenyl)ethyl]-4-[α,α-bis(4-hydroxyphenyl)ethyl]benzene (20 g) was dissolved in 100 ml of an aqueous solution of potassium hydroxide (10%). To this solution was dropwise added 60 ml of 37% formalin at room temperature with stirring over 1 hour. The reaction mixture was further stirred at room temperature for 6 hours and then poured into an aqueous solution of sulfuric acid to precipitate out. The resulting pasty precipitate was washed well with water and recrystallized from 30 ml of methanol to provide white powder. Yield: 20 g.

The resulting compound was confirmed to be the hexamethylol compound of 1-[α-methyl-α-(4-hydroxyphenyl)ethyl]-4-[α,α-bis(4-hydroxyphenyl)ethyl]benzene by means of NMR. The reverse phase HPLC (column: Shimpac CLC-ODS (Shimadzu Corporation); solvent: methanol/water=6/40 to 90/10) indicated that the purity of the hexamethylol compound was 92%.

The hexamethylol compound (20 g) was dissolved in 1000 ml of methanol under warming, to which was added 1 ml of concentrated sulfuric acid, and the mixture was refluxed under heating for 12 hours. After cooling, 2 g of potassium carbonate was added, and the mixture was further stirred, concentrated, added 300 ml of ethyl acetate, washed with water, dried and evaporated to provide white solid material. Yield: 22 g.

This compound (crosslinking agent A) was confirmed to be the hexamethoxymethyl compound of 1-[α-methyl-α-(4-hydroxyphenyl)ethyl]-4-[α,α-bis(4-hydroxyphenyl)ethyl] benzene by means of NMR. The reverse phase HPLC (column: Shimpac CLC-ODS (Shimadzu Corporation); solvent: methanol/water=6/40 to 90/10) indicated that the purity of the hexamethoxymethyl compound was 90%.

Evaluation of the Planographic Printing Plate Precursor of Example 10

The resulting negative original plate for lithographic printing of Example 10 was subjected to exposure, development and printing, as described below and the resulting printed matters were evaluated on scumming.

The resulting negative planographic printing plate precursor of Example 10 was exposed with a semiconductor laser (wavelength: 825 nm; beam diameter: 1/e$^2$=6 μm) as heat mode laser under control of 8 m/sec of linear velocity and 110 mW of type area power. Thereafter, the plate was heated at 110° C. for 1 minutes and passed through an automatic developer to treat with a developing solution DP-4 (1:8) and rinse solution FR-3 (1:7)(Fuji Photo Film Co., Ltd.). Then, this type area was treated with a gum GU-7 (1:1) (Fuji Photo Film Co., Ltd.) and printed with a Heidel KOR-D press.

As a result, printing with the negative planographic printing plates prepared according to Example 10 gave the printed matters less in scumming and having high image quality. Thereafter, the printing was continued successively on the planographic printing plate of Example 10, and it was found that better printed matters having no scumming in the non-image area were obtained even after the printing of 10,000 sheets and excellent hydrophilicity was maintained with high press life.

Next, the negative planographic printing plate precursor of Example 10 were preserved at 45° C. and a relative humidity of 75% for 14 days, and then subjected to exposure, development and printing in the same manner as above. As a result, similarly, better printed matters having no scumming in the non-image area were obtained. Thus, 12,000 sheets of better printed matters were obtained.

From these data, it became apparent that the negative planographic printing plate precursor of Example 10 have excellent stability during preservation even in an atmosphere of high temperature and high humidity.

Example 11

[Preparation of the Support having a Hydrophilic Surface]

In the same manner as in Example 9, a PET film support having a hydrophilic surface used in Example 11 was prepared.

[Formation of an Image-Forming Layer]

To the resulting support was applied a coating solution for an image-forming layer as described below at the rate of 1.0 g/m$^2$. This was then dried in a PERFECT OVEN PH200 (TABAI Co.) at the Wind Control of 7 at 140° C. for 50 seconds to provide a positive image-forming layer. Thus, an original plate 3 for lithographic printing of Example 11 was prepared.

(Coating Solution for an Image-Forming Layer)

| | |
|---|---|
| N-(4-Aminosulfonylphenyl)methacrylamide/ acrylonitrile/methyl methacrylate (35/35/30; weight-average mol. wt. 50,000) | 1.896 g |
| Novolac resin (Sumitomo Duress; Sumilite resin PR54020) | 0.332 g |
| Cyanine dye A (Structure as described below) | 0.155 g |
| 4,4'-Bishydroxyphenylsulfone | 0.063 g |
| Tetrahydrophthalic anhydride | 0.190 g |
| p-Toluenesulfonic acid | 0.008 g |
| 6-Hydroxynaphthalenesulfonic acid converted from the counter ion of ethyl violet | 0.05 g |
| Fluorine-type surfactant (Megaface F176, Dainippon Ink & Chemicals, Inc.) | 0.145 g |
| Fluorine-type surfactant (Megaface MCF-312 (30%) Dainippon Ink & Chemicals, Inc.) | 0.120 g |
| Methyl ethyl ketone | 26.6 g |
| 1-Methoxy-2-propanol | 13.6 g |
| γ-butyrolactone | 13.8 g |

Cyanine dye A

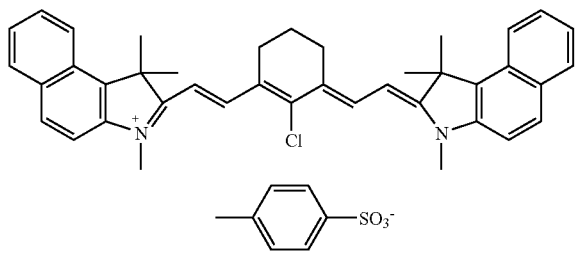

Evaluation of the Planographic Printing Plate Precursor of Example 11

The resulting planographic printing plate precursor 3 of Example 11 was subjected to exposure, development and printing, as described below and the resulting printed matters were evaluated on scumming.

The planographic printing plate precursor 3 was permitted to writing of a test pattern with a Trend setter (Creo Co.) at a beam strength of 9W and a drum rotation speed of 150 rpm. Thereafter, the plate was developed with a PS processor 900H (Fuji Photo Film Co., Ltd.) containing a developing solution DT-1 (1:8 dilution)(Fuji Photo Film Co., Ltd.) and a Finisher FP2W (1:1 dilution)(Fuji Photo Film Co., Ltd.) under the condition of a liquid temperature of 30° C. and the developing time of 12 second. The conductivity of the developing solution at this time was 45 mS/cm.

Then, the developed planographic printing plate 3 was fitted to a press (Ryoubi 3200 (trade name); Ryoubi Magics Co.) to put into print. IF201 (2.5%) and IF202 (0.75%) (Fuji Photo Film Co., Ltd.) were used as dampening water, and GEOS-G black (Dainippon Ink & Chemicals, Inc.) was used as ink.

As a result, printing with the planographic printing plate precursor 3 prepared according to Example 11 gave the printed matters less in scumming and having high image quality. Thereafter, the printing was continued successively on the pla planographic printing plate precursor 3, and it was found that better printed matters having no scumming in the non-image area were obtained even after the printing of 13,000 sheets and excellent hydrophilicity was maintained with high press life.

Example 12

In the same manner as in Example 11, a support which had a hydrophilic surface and on which acrylic acid was graft-polymerized was prepared, provided that sodium styrenesulfonate was replaced by acrylic acid. Thereafter, a positive recording layer was formed on the support in the same manner as in Example 11 to provide a planographic printing plate precursor 4 of Example 12.

Example 13

In the same manner as in Example 11, a support which had a hydrophilic surface and on which acrylamide was graft-polymerized was prepared, provided that sodium styrenesulfonate was replaced by acrylamide. Thereafter, a positive recording layer was formed on the support in the same manner as in Example 11 to provide a planographic printing plate precursor 5 of Example 13.

[Evaluation of the Planographic Printing Plate Precursor]

The resulting planographic printing plate precursors 4 and 5 of Examples 12 and 13 were subjected to exposure, development and printing in the same conditions as in Example 11, and the resulting printed matters were evaluated on scumming.

As a result, printing with the planographic printing plates 4 and 5 also gave printed matters less in scumming and having high image quality. Thereafter, the printing was continued planographic printing plate, and it was found that better printed matters having no scumming in the non-image area were obtained even after the printing of 15,000 sheets in the plate 4 and 17,000 sheets in the plate 5 and excellent hydrophilicity was maintained with high press life in both plates.

As described above, the positive and negative planographic printing plate precursor, which are the preferred embodiment of printing plate precursor of the invention, can effectively produce a large number of blotless images of high quality even in a severe condition. Thus, the planographic printing plate precursor which have been improved in printing scumming and are superior in press life can be obtained.

4. Examples of Pattern Forming Materials and Pattern Forming Method

Example 14

[Preparation of a Negative Planographic Printing Plate Precursor]

(Synthesis of the Specific Polymerization Initiating Polymer)

In the same manner as in Example 1, the specific polymerization initiating polymer A used in this Example was prepared.

(Formation of a Polymerization Initiating Layer)

A polyethylene terephthalate film (Product Name: M4100, Toyobo Co., Ltd.) of 0.188 mm in thickness was used as a support, to which a coating solution of polymerization initiating layer as described below was applied on the surface with a rod bar no.18, and dried and crosslinked at 110° C. for 10 minutes. The resulting polymerization initiating layer was of 9.3 μm in thickness.

<Coating Solution of Polymerization Initiating Layer>

| Specific polymerization initiating polymer A | 0.4 g |
| --- | --- |
| TDI (tolylene-2,4-diisocyante) | 0.16 g |
| Light-to-heat conversion substance (IR125, Wako Pure Chemical Co., Ltd.) | 0.1 g |
| Propylene glycol monomethyl ether (MFG) | 1.6 g |

(Formation of a Polymer Compound Layer)

The supports on which the polymerization initiating layer was formed was immersed in a 10 wt % aqueous solution of Na (styrene-4-sulfonyl)acetate, and irradiated with a 400 W high-pressure mercury lamp under argon atmosphere for 30 minutes. Thereafter, the resulting support was washed well with ion exchange water to provide a negative planographic printing plate precursor A on which Na (styrene-4-sulfonyl) acetate was graft-polymerized.

Example 15

[Preparation of a Negative Planographic Printing Plate Precursor B]

In the same manner as in Example 1, a polymerization initiating layer was formed, provided that IR125 used as a light-to-heat converting substance in Example 14 was replaced by carbon black (MHI black, Mikuni Shikiso Co.). The resulting polymerization initiating layer was of 9.3 μm in thickness. Thereafter, in the same manner as in Example 1, a negative planographic printing plate precursor B on which Na (styrene-4-sulfonyl) acetate was graft-polymerized was prepared.

Example 16

[Preparation of a Positive Original Plate C for Lithographic Printing]

In the same manner as in Example 1, a positive original plate C for lithographic printing in which 1-methoxy-2-propyl styrene-4-sulfonate was graft-polymerized on the surface of the polymerization initiating layer was prepared, provided that 10 wt % aqueous solution of Na α-(styrene-4-sulfonyl)acetate used in Example 14 was replaced by a 10 wt % solution of 1-methoxy-2-propanol styrene-4-sulfonate in methyl ethyl ketone.

Example 17

[Preparation of a Positive Planographic Printing Plate Precursor D]

In the same manner as in Example 3, a positive planographic printing plate precursor D in which 2-ethoxyethyl acrylate was graft-polymerized on the surface of the polymerization initiating layer was prepared, provided that 1-methoxy-2-propanol styrene-4-sulfonate used in Example 16 was replaced by 2-ethoxyethyl acrylate (A-EE; Shin-Nakamura Kagaku Co.).

[Evaluation of the Negative Planographic Printing Plate Precursors A and B]

The resulting negative planographic printing plate precursors A and B were exposed to an IR laser (beam diameter 20 μm) which emitted infrared at a wavelength of 830 nm. Thereafter, printing was carried out as usual in Lithrone Press. During this operation, it was observed whether the image area of the printed matter was formed successfully and whether or not blot occurred in the non-image area. In addition, the laser scan portions of the planographic printing plate precursors A and B were observed under a microscope to estimate the sensitivity by measuring the resulting line width. As the line width approaches the irradiated beam diameter 20 μm, the sensitivity is increased. The results are shown in Table 10.

[Evaluation of the Positive Planographic Printing Plate Precursor s C and D]

The resulting positive planographic printing plate precursors C and D were typed (recorded) with a thermal head using a word processor Shoin (Sharp Co., Ltd.), and the same evaluation as above was made using the same press as used in printing with the positive planographic printing plate precursors A and B. The results are shown in Table 10.

TABLE 10

| | Planographic printing plate precursor | Faint image | Blot in non-image area | Sensitivity (μm) |
| --- | --- | --- | --- | --- |
| Ex. 14 | Negative planographic printing plate precursor A | None | None | 20 |
| Ex. 15 | Negative planographic printing plate precursor B | None | None | 19 |
| Ex. 16 | Positive planographic printing plate precursor C | None | None | — |
| Ex. 17 | Positive planographic printing plate precursor D | None | None | — |

As shown in Table 10, there were no faint of image area and no blot in non-image area in the negative and positive planographic printing plates A to D in the Examples. Moreover, more than 15,000 sheets of better printed matters superb in press life were obtained. The negative planographic printing plates A and B both were satisfactory in sensitivity.

Example 18

[Preparation of a Pattern Forming Material A]

In the same manner as in Example 16, a pattern forming material A in which 2-ethoxyethyl acrylate was graft-polymerized on the surface of the polymerization initiating layer was prepared, provided that 10 wt % solution of 1-methoxy-2-propanol styrene-4-sulfonate in methyl ethyl ketone used in Example 16 was replaced by a solution of 2-ethoxyethyl acrylate (A-EE; Shin-Nakamura Kagaku Co.) in propylene glycol monomethyl ether (MFG).

[Formation of Hydrophilic/Hydrophobic Patterns and Evaluation thereof]

The resulting pattern forming material A was exposed as patterning to a laser (beam diameter 20 μm) emitting blue light at 400 nm of wavelength.

Thereafter, the pattern forming material A was immersed in 0.1 wt % aqueous solution of methylene blue (Wako Pure Chemicals) for 10 minutes and then washed with distilled water. As a result, it was confirmed that methylene blue adhered as patterning selectively to the laser-exposed region to form a clear blue image.

Example 19

[Preparation of a Pattern Forming Material B]

In the same manner as in Example 1, acrylic acid was graft polymerized on the surface of polymerization initiating layer, provided that 10 wt % aqueous solution of Na α-(styrene-4-sulfonyl)acetate used in Example 14 was replaced by 10 wt % acrylic acid aqueous solution. The support on which acrylic acid was graft polymerized was immersed in a solution of 40 g of N-ethyl-N'-(3-dimethylaminopropyl) carbodiimide hydrochloride and 6 g of N-hydroxysuccinimide in 1L of water to conduct esterification. Then, 6 g of 2-nitrobenzylphenol was allowed to react to provide the pattern forming material B in which a graft polymer having a photo-decomposing functional group was immobilized on the surface of the polymerization initiating layer.

[Formation of Hydrophilic/Hydrophobic Patterns and Evaluation thereof]

The resulting pattern forming material B was exposed as patterning to a laser (beam diameter 20 µm) emitting blue light at 400 nm of wavelength.

Thereafter, the pattern forming material B was immersed in 0.1 wt % aqueous solution of methylene blue (Wako Pure Chemicals) for 10 minutes and then washed with distilled water. As a result, it was confirmed that methylene blue adhered as patterning selectively to the laser-exposed region to form a clear blue image.

As described above, the invention provides a pattern forming material and a pattern forming method which are applicable to a planographic printing plate precursor requiring no development processing, and by which the patterning is achieved in a simple operation to provide a firm and stable pattern.

According to the planographic printing plate precursor to which the pattern forming materials and pattern forming method of the invention are applied, it is possible to prevent dissolution of the polymerization initiating component contained in the initiating layer into the monomer solution, to form a stable image recording layer and to form an image in high sensitivity with heat by heating or generated by light-to-heat conversion. Thus, it is possible to provide the positive or negative planographic printing plate precursors which require no development processing after image write. In addition, it is also possible to provide the positive or negative planographic printing plate precursors which are improved in sensitivity and scumming property and particularly in press life and can be made up directly by operation of an infrared laser based on digital signals.

5. Examples of a Method for Producing Particle-Adsorbed Materials and Particle-Adsorbed Materials Example 20

(Synthesis of Specific Polymerization Initiating Polymer)

The specific polymerization initiating polymer A was prepared in the same manner as in Example 1.

(Formation of the Polymerization Initiating Layer)

A polyethylene terephthalate film (Product Name: M4100, Toyobo Co., Ltd.) of 0.188 mm in thickness was used as a support, to which a coating solution of polymerization initiating layer as described below was applied on the surface with a rod bar no. 18, and dried and crosslinked at 110° C. for 10 minutes. The resulting polymerization initiating layer was of 9.3 µm in thickness.

In order to examine the degree of crosslinking of the resulting polymerization initiating layer, the substrate on which the polymerization initiating layer was formed was immersed in acetone as a solvent for 24 hours. The weight of the substrate was measured before and after the immersion. As a result, it was found that there was no change in the weight, indicating that the specific polymerization initiating polymer A constructing the polymerization initiating layer was firmly immobilized on the substrate by crosslinking reaction.

(Coating Solution of Polymerization Initiating Layer)

| | |
|---|---|
| Specific polymerization initiating polymer A | 0.4 g |
| TDI (tolylene-2,4-diisocyante) | 0.16 g |
| Propylene glycol monomethyl ether (MFG) | 1.6 g |

(Graft Polymerization)

The substrate on which the polymerization initiating layer was formed was immersed in an aqueous solution of sodium styrenesulfonate (10 wt %) and irradiated with a 400W high pressure mercury lamp under argon atmosphere for 30 minutes. Thereafter, the substrate was washed well with ion-exchange water to provide the substrate A of Example 1 on which sodium styrenesulfonate was graft-polymerized.

In the same manner as in Example 1, the substrate B of Example 2 on which acrylic acid was graft-polymerized was prepared, provided that the aqueous solution of sodium styrenesulfonate was replaced with an aqueous solution of acrylic acid (10 wt %).

(Adsorption of Particles)

Positively charged $TiO_2$ granules was used as functional particles. The substrate A and substrate B having the surface graft polymer were respectively immersed in a dispersed solution of 5 g of $TiO_2$ particles dispersed in water [H40; Taki Chemical Co.] and 5 g of water for 20 minutes. Thereafter, the surface was washed well with running water to remove an excess of particles dispersed in water. Thus, the particle-adsorbed material A having a roughed layer in which $TiO_2$ particles were adsorbed on the graft polymer interface as well as the particle-adsorbed material B having a roughed layer in which $TiO_2$ particles were adsorbed on the graft polymer interface were obtained.

The surfaces of the particle-adsorbed materials A and B were observed by a transmission electron microscope (JEOL JEM-200CX) at 100,000 magnifications. It was confirmed that dense unevenness made by $TiO_2$ particles was formed on the surfaces of both materials.

(Evaluation of the Particle-Adsorbed Materials A and B)

[Evaluation of Antireflection Capability]

The ratio $(\phi_r/\phi_i)$ of the incident luminous flux $\phi_i$ to the reflex luminous flux $\phi_r$ on the respective surfaces of the resulting particle-adsorbed materials A and B, i.e., luminous reflectance (%), was measured by a spectroscope. As a result, the ratio was 0.2% for the material A and 0.3% for B, indicating that both had an excellent antireflection capability.

[Evaluation of Abrassion Resistance]

The resulting particle-adsorbed materials A and B were rubbed back and forth 60 times with a hand using a moistened cloth (BEMCOT, Asahi Chem. Ind.). After rubbing, the surfaces were observed by a transmission electron microscope (JEOL JEM-200CX) at 100,000 magnifications. It was confirmed that the same dense unevenness caused by $TiO_2$ particles as that before rubbing was observed on the surfaces of both materials, indicating that the dense unevenness on the surface was not spoiled by rubbing.

Example 22

In the same manner as in Example 1, the substrate C of Example 3 on which cationic ammonium chloride was graft-polymerized was prepared, provided that the aqueous solution of sodium styrenesulfonate was replaced with N,N,N-trimethyl-N-(2-hydroxy-3-methacryloyloxypropyl)ammonium chloride (Blemer QA; NOF Corporation).

(Adsorption of Particles)

Positively charged $SiO_2$ particles were used as functional particles. The substrate C having the surface graft polymer was immersed in a dispersed solution of 10 g of silica particles [Seahoster P-20; Nipponn Shokubai Co.] of 200 nm of average particle size dispersed in 90 g of cyclohexane for 20 minutes. Thereafter, the surface was washed well with running water to remove an excess of particles dispersed in water. Thus, the particle-adsorbed material C having a roughed layer in which $SiO_2$ particles were adsorbed on the graft polymer interface was obtained.

The surface of the particle-adsorbed material C was observed by a transmission electron microscope (JEOL JEM-200CX) at 100,000 magnifications. It was confirmed that dense unevenness made by $SiO_2$ particles was formed on the surface.

The resulting particle-adsorbed material C was evaluated on its antireflection capability and abrassion resistance in the same manner as in Examples 1 and 2. As a result, it was confirmed that the luminous reflectance was 0.2% and there was no change in the surface unevenness after the rubbing, indicating that high antireflection and abrasion resistance on the surface were attained similarly even in this Example involving the cationic surface.

Example 23

The substrate A used in Example 20, on which sodium styrenesulfonate was graft-polymerized, was immersed in 5 wt % positively charged $TiO_2$-dispersed solution [Nanotec; C. I. Kasei] for 20 minutes. Thereafter, the surface was washed well with running water to remove an excess of particles dispersed in water. Thus, the particle-adsorbed material D having a roughed layer in which $TiO_2$ particles were adsorbed on the graft polymer interface of the substrate A was obtained.

The surface of the resulting particle-adsorbed material D was observed by a transmission electron microscope (JEOL S800) at 100,000 magnifications. As a result, it was confirmed that $TiO_2$ particles were adsorbed to form 10 laminated layers.

(Evaluation of the Particle-Adsorbed Material D)

[Evaluation of Ultraviolet Blocking Capability]

The resulting particle-adsorbed material D was irradiated on its surface with ultraviolet ray at 280–400 nm wavelength to measure the UV transmittance. As a result, it was confirmed that the transmittance was 1.0%, indicating that the material had a good ultraviolet blocking capability.

[Evaluation of Abrassion Resistance]

The resulting particle-adsorbed material D was rubbed back and forth 60 times with a hand using a moistened cloth (BEMCOT, Asahi Chem. Ind.). After rubbing, the surfaces were observed by a transmission electron microscope (JEOL S800) at 100,000 magnifications. It was confirmed that the same multi-layers of $TiO_2$ particles as those before rubbing was observed, indicating that the particle-adsorbed layer was not spoiled by rubbing.

From the above results in the respective Examples, it was confirmed that the particle-adsorbed materials (the particle-adsorbed materials of the invention) produced by the method for producing a particle-adsorbed material in the invention exhibited excellent performance depending on the function of the adsorbed particles and the particle-adsorbed layer formed on the surface had a good durability (evaluated by abrassion resistance). Thus, the products of the invention were confirmed to be useful as materials with a variety of practically utilizable functional surfaces.

According to the invention, as described above, it is possible to provide a particle-adsorbed material in which functional particles are firmly adsorbed on the surface in a single layer or in a laminated state, which has a highly durable particle-adsorbed layer, and in which the effect of the adsorbed functional particles is sustained. The invention also provides a method for producing a particle-adsorbed material by which a particle-adsorbed layer of a multi-layered structure having the above-mentioned characteristics can easily be formed.

6. Examples of a Method for Producing a Metal Particle-Dispersed Thin Layer Film and Metal Particle-Dispersed Thin Layer Films

Example 24

(Synthesis of Specific Polymerization Initiating Polymer)

The specific polymerization initiating polymer A was prepared in the same manner as in Example 1.

(Formation of the Polymerization Initiating Layer)

A polyethylene terephthalate film (Product Name: M4100, Toyobo Co., Ltd.) of 0.188 mm in thickness was used as a substrate, to which a coating solution of polymerization initiating layer as described below was applied on the surface with a rod bar no. 18, and dried and crosslinked at 110° C. for 10 minutes. The resulting polymerization initiating layer was of 9.3 μm in thickness.

In order to examine the degree of crosslinking of the resulting polymerization initiating layer, the substrate on which the polymerization initiating layer was formed was immersed in acetone as a solvent for 24 hours. The weight of the substrate was measured before and after the immersion. As a result, it was found that there was no change in the weight, indicating that the specific polymerization initiating polymer A constructing the polymerization initiating layer was firmly immobilized on the substrate by crosslinking reaction.

(Coating Solution of Polymerization Initiating Layer)

| | |
|---|---|
| Specific polymerization initiating polymer A | 0.4 g |
| TDI (tolylene-2,4-diisocyante) | 0.16 g |
| Infrared absorbent (IR125, Wako Pure Chemical) | |
| Propylene glycol monomethyl ether (MFG) | 1.6 g |

(Graft Polymerization)

The substrate on which the polymerization initiating layer was formed was immersed in an aqueous solution containing an acrylic acid aqueous solution (10 wt %) and sodium periodate ($NaIO_4$, 0.1 wt %) and irradiated with a 400W high pressure mercury lamp under argon atmosphere for 30 minutes. Thereafter, the substrate was washed well with ion-exchange water to provide the substrate 1 of Example 1 on which acrylic acid was graft-polymerized.

(Incorporation of a Metal Salt into the Graft Polymer Layer and Reduction of the Metal Salt)

The resulting substrate 1 (10 cm×10 cm) was immersed in 15% by mass aqueous solution of silver nitrate (Wako Pure Chemical) for 12 hours and then washed with distilled water. Then, the substrate 1 was immersed in 100 mL of distilled water, into which 30 mL of 0.2 mol/L(M) sodium tetrahydroborate was dropwise added to reduce silver nitrate.

The resulting metal particle-dispersed thin layer film 1 was cut and the section was observed by an electron microscope to confirm the graft polymer layer in which Ag particles of 25 nm in size were dispersed.

Example 25

The substrate 1 (10 cm×10 cm) used in Example 24 was immersed in 15% by mass aqueous solution of chloroauric acid (Aldrich) for 12 hours and then washed with distilled water. Then, the substrate 1 was immersed in 100 mL of distilled water, into which 30 mL of 0.2 mol/L(M) sodium tetrahydroborate was dropwise added to reduce chloroauric acid.

The resulting metal particle-dispersed thin layer film 2 was cut and the section was observed by an electron microscope to confirm the graft polymer layer in which Au particles of 25 nm in size were dispersed.

Example 26

The substrate 1 (10 cm×10 cm) used in Example 24 was immersed in 15% by mass aqueous solution of silver nitrate (Wako Pure Chemical) for 12 hours and then washed with distilled water. Thereafter, a dispersed solution (A) as described below was applied thereto with a coater of lot no. 14, and then heated at 150° C. for 1 minute to reduce silver nitrate.

The resulting metal particle-dispersed thin layer film 3 was cut and the section was observed by an electron microscope to confirm the graft polymer layer in which Ag particles of 25 nm in size were dispersed.

[Dispersed Solution (A)]

| | |
|---|---|
| Basic activator (1) as described below | 1.9 g |
| Hydroquinone (Reducing agent) | 1.0 g |
| Polyvinyl alcohol (PVA205, Kuraray Co.) | 32.0 g |
| 5% by mass aqueous solution of surfactant (2) as shown below | 0.4 g |
| Water | 300 g |

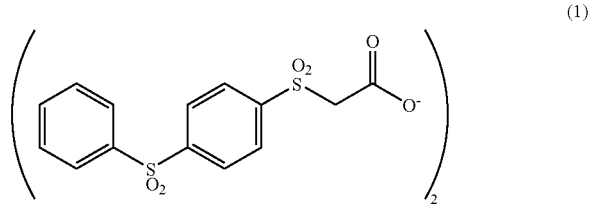

(1)

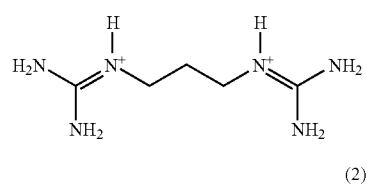

(2)

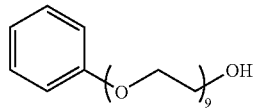

[Evaluation of Metal Particle-Dispersed Thin Layer Films]

1. Strength (Adhesion)

The metal particle-dispersed thin layer films 1 to 3 obtained respectively in Examples 24 to 26 were evaluated by means of an in-line arrangement taping method (JIS5400) concerning the film adhesion. A tape-peeling-off test was conducted on the cut rectangular arrangement, but no rectangle peeled-off was observed, indicating good adhesion between the polymerization initiating layer and the metal particle-dispersed film. This test was repeated 10 times, but still no rectangle peeling was observed, indicating very good adhesion.

2. Durability

The resulting metal particle-dispersed thin layer films 1 to 3 were rubbed 150 times with a hand using a moistened cloth (BEMCOT, Asahi Chem. Ind.). After rubbing, the surfaces were observed macroscopically and confirmed to have no peeling-off of the metal thin film. In addition, each sample after rubbing was evaluated again by an in-line arrangement taping method as described above on adhesion. It was also confirmed that no peeling-off was observed in any cases, indicating that adhesion between the polymerization initiating layer and the metal particle-dispersed film was not decreased even after rubbing. Thus, excellent durability was confirmed.

According to the invention, a highly dense and highly durable metal particle-dispersed thin layer film in which metal particles are dispersed in high density is provided. Additionally, according to the invention, a method for producing a metal particle-dispersed thin layer film is provide, by which a metal particle-dispersed thin layer film showing the above-mentioned characteristics can be produced in a simple manner in high productivity.

What is claimed is:

1. A method of graft polymerization comprising the steps of:

forming a polymerization initiating layer in which a polymer having, on a side chain thereof, a crosslinking group and a functional group having polymerization initiating capability is immobilized on a support by a crosslinking reaction; and contacting a compound having a polymerizable functional group with the polymerization initiating layer, and then bonding the compound to the polymerization initiating layer by supplying energy thereto.

2. The method of graft polymerization of claim 1, wherein the polymer has on the side chain thereof a structure having a polymerization initiating capability selected from the group consisting of (a) aromatic ketones, (b) onium salt compounds, (c) organic peroxides, (d) thio compounds, (e) hexaaryl biimidazole compounds, (f) ketoxime ester compounds, (g) borate compounds, (h) azinium compounds, (i) active ester compounds, (j) compounds containing a carbon-halogen linkage, and (k) pyridinium compounds.

3. The method of graft polymerization of claim 1, wherein the crosslinking group is a group selected from a carboxylic acid group, a hydroxyl group, an amino group and an isocyanate group.

4. The method of graft polymerization of claim 1, wherein the immobilization of the polymer by the crosslinking reaction is carried out using a crosslinking agent.

5. The method of graft polymerization of claim 1, wherein the compound having a polymerizable functional group is selected from hydrophilic monomers, hydrophilic macromers and hydrophilic polymers.

6. The method of graft polymerization of claim 1, wherein the compound having a polymerizable functional group is a polymerizable compound having a functional group whose hydrophilicity/hydrophobicity is changed by heat, acid or radiation.

7. The method of graft polymerization of claim 6, wherein the functional group whose hydrophilicity/hydrophobicity is changed is at least one selected from the group consisting of secondary alkylsulfonic acid esters, tertiary carboxylic acid esters, and alkoxyalkyl esters.

8. The method of graft polymerization of claim 6, wherein the functional group whose hydrophilicity/hydrophobicity is changed is a group represented by the following general formula (L):

General formula (L)

wherein in general formula (L), X represents —O—, —S—, —Se—, —NR$^8$—, —CO—, —SO—, —SO$_2$—, —PO—, SiR$^8$R$^9$— or —CS—; R$^6$, R$^7$, R$^8$ and R$^9$ each independently represents a mono-valent group; and M indicates an ion having a positive charge.

9. A hydrophilic member comprising:
a support;
a polymerization initiating layer formed on the support by immobilizing a polymer having, on a side chain thereof, a crosslinking group and a functional group having polymerization initiating capability, by a crosslinking reaction; and
a hydrophilic layer formed by bonding a hydrophilic compound having a polymerizable group, directly to the polymerization initiating layer.

10. A printing plate precursor comprising:
a substrate including a support and a hydrophilic surface; and
an image forming layer provided on the substrate,
wherein the hydrophilic surface is formed by directly bonding a hydrophilic compound having a polymerizable group to a polymerization initiating layer formed on the support by immobilizing a polymer having, on a side chain thereof, a crosslinking group and a functional group having polymerization initiating capability, by a crosslinking reaction.

11. The printing plate precursor of claim 10, wherein the image-forming layer is a positive image-forming layer whose solubility in an alkaline aqueous solution is increased by exposure to light.

12. The printing plate precursor of claim 11, wherein the positive image-forming layer comprises naphthoquinone diazide and novolac resin.

13. The printing plate precursor of claim 11, wherein the positive image-forming layer comprises a substance which absorbs light to generate heat and a polymer compound that is insoluble in water but soluble in alkali, and a solubility of the positive image-forming layer in an alkaline aqueous solution is increased by exposure to light.

14. The printing plate precursor of claim 13, wherein the substance which absorbs light to generate heat is at least one substance selected from cyanine dyes, phthalocyanine dyes, oxonol dyes, squarylium dyes, pyrylium salts, thiopyrylium dyes and nickel thiolate complexes.

15. The printing plate precursor of claim 13, wherein the polymer compound that is insoluble in water but soluble in alkali contains on at least one of a main chain and a side chain an acidic group selected from a phenolic hydroxyl group, a sulfonamide group, a substituted sulfonamide-type acid group, a carboxylic acid group, a sulfonic acid group, and a phosphoric acid group.

16. The printing plate precursor of claim 10, wherein the image-forming layer is a negative image-forming layer whose solubility in an alkaline aqueous solution is decreased by exposure to light.

17. The printing plate precursor of claim 16, wherein the negative image-forming layer comprises an alkali-soluble polymer compound, an acid-generating agent, and an acid-crosslinking compound.

18. The printing plate precursor of claim 16, wherein the negative image-forming layer comprises a photo or thermal polymerization initiator, an unsaturated addition-polymerization compound, and an alkali-soluble polymer compound.

19. A pattern forming material comprising:
a support;
a polymerization initiating layer formed on the support by immobilizing a polymer having, on a side chain thereof, a crosslinking group and a functional group having polymerization initiating capability, by a crosslinking reaction; and
a pattern forming layer formed by contacting a polymerizable compound having a functional group whose hydrophilicity/hydrophobicity changes due to heat, acid, or radiation, with the polymerization initiating layer, and supplying energy thereto, so as to generate a graft polymer on a surface of the polymerization initiating layer by graft polymerization.

20. A pattern forming method comprising the steps of:
providing a polymerization initiating layer on a support by immobilizing a polymer having, on a side chain thereof, a crosslinking group and a functional group having polymerization initiating capability, by a crosslinking reaction;
generating a graft polymer on a surface of the polymerization initiating layer by graft polymerization by contacting a polymerizable compound having a functional group whose hydrophilicity/hydrophobicity changes due to heat, acid or radiation, with the polymerization initiating layer, and supplying energy thereto; and
imagewise supplying heat, acid or radiation to the graft polymer to form a hydrophilic/hydrophobic pattern.

21. A method of producing a particle-adsorbed material, the method comprising the steps of:
providing a polymerization initiating layer on a surface of a support by immobilizing a polymer having, on a side chain thereof, a crosslinking group and a functional group having polymerization initiating capability, by a crosslinking reaction;

contacting a compound having a polymerizable functional group and a polar group with the polymerization initiating layer, and irradiating radiation thereto, so as to bond the compound to the surface of the polymerization initiating layer by graft polymerization and form a graft polymer having a polar group; and adsorbing particles onto the graft polymer having a polar group, wherein the particles are particles which are able to mutually interact with the polar group.

22. A method of producing a metal particle-dispersed thin layer film, the method comprising the steps of:

providing a polymerization initiating layer on the surface of a support by immobilizing a polymer having, on a side chain thereof, a crosslinking group and a functional group having polymerization initiating capability, by a crosslinking reaction;

contacting a polymerizable compound having a polar group with the polymerization initiating layer, and irradiating radiation thereto, so as to make the compound graft-polymerize to the surface of the polymerization initiating layer to provide a graft polymer layer, and adding a metal salt to the graft polymer layer; and reducing the metal salt.

* * * * *